(12) United States Patent
Kim et al.

(10) Patent No.: US 12,159,742 B2
(45) Date of Patent: Dec. 3, 2024

(54) ACTIVE CURRENT COMPENSATION DEVICE CAPABLE OF DETECTING MALFUNCTION

(71) Applicants: EM CORETECH INC., Ulsan (KR); UNIST( ULSAN NATIONAL INSTITUTE OF SCIENCE AND TECHNOLOGY), Ulsan (KR)

(72) Inventors: Jin Gook Kim, Ulsan (KR); Sang Yeong Jeong, Ulsan (KR)

(73) Assignees: EM CORETECH INC., Ulsan (KR); UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 0 days.

(21) Appl. No.: 18/402,760

(22) Filed: Jan. 3, 2024

(65) Prior Publication Data

US 2024/0203641 A1    Jun. 20, 2024

Related U.S. Application Data

(63) Continuation of application No. 17/474,558, filed on Sep. 14, 2021, now Pat. No. 11,908,614, which is a
(Continued)

(30) Foreign Application Priority Data

Dec. 23, 2020  (KR) .......................... 10-2020-0182641
Dec. 23, 2020  (KR) .......................... 10-2020-0182642
(Continued)

(51) Int. Cl.
*H02M 1/44*     (2007.01)
*G01R 19/165*   (2006.01)
(Continued)

(52) U.S. Cl.
CPC ..... *H01F 27/427* (2013.01); *G01R 19/16576* (2013.01); *H02M 1/44* (2013.01);
(Continued)

(58) Field of Classification Search
CPC .. H01F 27/427; G01R 19/16576; H02M 1/44; H03F 1/305
See application file for complete search history.

(56) References Cited

U.S. PATENT DOCUMENTS 8,823,448 B1    9/2014  Shen
2018/0295758 A1  10/2018  Chu et al.
(Continued)

FOREIGN PATENT DOCUMENTS

JP    48061161       8/1973
JP    55-113977      8/1980
(Continued)

OTHER PUBLICATIONS

NCP1034 100V Synchronous PWM Buck Controller. (Aug. 2008). Retrieved from http://www.digchip.com.
(Continued)

*Primary Examiner* — Jue Zhang
*Assistant Examiner* — Afework S Demisse
(74) *Attorney, Agent, or Firm* — PnK IP LLC

(57) ABSTRACT

This application relates to an active current compensation device which actively compensates for a noise occurring in a common mode in each of two or more high-current paths. In one aspect, the active current compensation device includes a sensing unit configured to generate an output signal corresponding to a common-mode noise current on each of the two or more high-current paths, and an amplification unit configured to amplify the output signal to generate an amplified current. The device may also include a compensation unit configured to generate a compensation
(Continued)

current on the basis of the amplified current and allow the compensation current to flow to each of the two or more high-current paths, and a malfunction detection unit configured to detect a malfunction of the amplification unit. The malfunction detection unit and at least a portion of the amplification unit may be embedded in one integrated circuit (IC) chip.

6 Claims, 52 Drawing Sheets

Related U.S. Application Data continuation-in-part of application No. PCT/KR2021/007359, filed on Jun. 11, 2021.

(30) Foreign Application Priority Data

| Dec. 24, 2020 | (KR) | 10-2020-0183864 |
| Feb. 24, 2021 | (KR) | 10-2021-0024761 |

(51) Int. Cl.
  *H01F 27/42* (2006.01)
  *H03F 1/30* (2006.01)
  *H01F 17/00* (2006.01)
  *H01F 17/06* (2006.01)

(52) U.S. Cl.
  CPC ..... *H03F 1/305* (2013.01); *H01F 2017/0093* (2013.01); *H01F 2017/065* (2013.01)

(56) References Cited

U.S. PATENT DOCUMENTS

| 2022/0014178 A1* | 1/2022 | Jeong | H03H 7/427 |
| 2022/0029548 A1* | 1/2022 | Jeong | H02M 3/1588 |

FOREIGN PATENT DOCUMENTS

| JP | 01-062906 | 3/1989 |
| JP | 10-4325 | 1/1998 |
| JP | 10-013159 | 1/1998 |
| JP | 2002-010650 | 1/2002 |
| JP | 2005-086611 | 3/2005 |
| JP | 2005-124339 | 5/2005 |
| JP | 2005-197860 | 7/2005 |
| JP | 2005-532027 | 10/2005 |
| JP | 2006-105900 | 4/2006 |
| JP | 2011-142795 | 7/2011 |
| JP | 2013-021816 | 1/2013 |
| JP | 2016-201934 | 12/2016 |
| JP | 2018-191443 | 11/2018 |
| JP | 2019-180043 | 10/2019 |
| KR | 10-0200117 | 6/1999 |
| KR | 10-2016-0117703 | 10/2016 |
| KR | 10-2019-0096689 | 8/2019 |
| KR | 10-2019-0105849 | 9/2019 |
| KR | 10-2071480 | 3/2020 |
| KR | 10-2020-0122264 | 10/2020 |
| WO | 2020/213997 | 10/2020 |

OTHER PUBLICATIONS

Notice of Allowance dated Nov. 24, 2022, issued in the Korean Patent Application No. 10-2020-0182641.
Office Action dated May 20, 2022, issued in the Korean Patent Application No. 10-2020-0182641.
Final Office Action dated Nov. 23, 2022, issued in the Korean Patent Application No. 10-2020-0182642.
Notice of Allowance dated May 12, 2023, issued in the Korean Patent Application No. 10-2020-0182642.
Office Action dated May 20, 2022, issued in the Korean Patent Application No. 10-2020-0182642.
Notice of Allowance dated Jun. 28, 2023, issued in the Korean Patent Application No. 10-2020-0183864.
Office Action dated May 20, 2022, issued in the Korean Patent Application No. 10-2020-0183864.
Office Action dated Nov. 23, 2022, issued in the Korean Patent Application No. 10-2020-0183864.
Office Action dated Jul. 20, 2022, issued in the Korean Patent Application No. 10-2021-0024761.
Office Action dated Jan. 29, 2023, issued in the Korean Patent Application No. 10-2021-0024761.
International Search Report dated Dec. 14, 2021, issued in the International Patent Application No. PCT/KR2021/007359.
J. Schmenger, R. Kramer and M. März, "Active hybrid common mode filter for a highly integrated on-board charger for automotive applications," 2015 IEEE 13th Brazilian Power Electronics Conference and 1st Southern Power Electronics Conference (COBEP/SPEC), Fortaleza, Brazil, 2015, pp. 1-7, doi: 10.1109/COBEP.2015.7420018.
D. Shin et al., "A common-mode active filter in a compact package for a switching mode power supply," 2014 IEEE International Symposium on Electromagnetic Compatibility (EMC), Raleigh, NC, USA, 2014, pp. 340-345, doi: 10.1109/ISEMC.2014.6898994.
Notice of Reasons for Refusal issued in Japanese Patent Application No. 2023-535960 on May 21, 2024.
Extended European Search Report issued in European Patent Application No. 21911153.1 on May 28, 2024.

* cited by examiner

ACTIVE CURRENT COMPENSATION DEVICE CAPABLE OF DETECTING MALFUNCTION

CROSS REFERENCE TO RELATED APPLICATIONS

This application is a Continuation Application of U.S. application Ser. No. 17/474,558, filed on Sep. 14, 2021, which is a Continuation-In-Part Application of International Patent Application No. PCT/KR2021/007359, filed on Jun. 11, 2021, which claims priority from and the benefit of Korean patent application No. 10-2020-0182641 filed on Dec. 23, 2020, Korean patent application No. 10-2020-0182642 filed on Dec. 23, 2020, Korean patent application No. 10-2020-0183864 filed on Dec. 24, 2020, and Korean patent application No. 10-2021-0024761 filed on Feb. 24, 2021, each of which is hereby incorporated by reference for all purposes as if fully set forth herein.

BACKGROUND

Field

Embodiments of the present disclosure relate to an active current compensation device capable of detecting a malfunction, and more particularly, to an active current compensation device configured to actively compensate for common-mode noise input through two or more high-current paths connected to a power system.

Embodiments of the present disclosure relate to an active current compensation device including a power conversion unit embedded therein, and more particularly, to an active current compensation device configured to actively compensate for a common-mode noise current input through two or more high-current paths connected to a power system.

Embodiments of the present disclosure relate to an active current compensation device including an integrated circuit unit and a non-integrated circuit unit, and more particularly, to an active current compensation device configured to actively compensate for common-mode noise input through two or more high-current paths connected to a power system.

Embodiments of the present disclosure relate to an active current compensation device including a one-chip integrated circuit (IC), and more particularly, to an active current compensation device configured to actively compensate for common-mode noise input through two or more high-current paths connected to a power system.

Discussion of the Background

In general, electronic/electrical apparatuses such as home appliances, industrial electrical products, or electric vehicles emit noise during operation. For example, noise may be emitted through a power line due to a switching operation of a power converter in the electronic apparatus. When the noise is left untreated, the noise may be harmful to a human body and cause malfunctions or failures of surrounding components and other electronic apparatuses. Electronic interference that the electronic apparatus affects other apparatuses as described above are referred to as electromagnetic interference (EMI), and of the EMI, noise transmitted through wires and substrate lines is referred to as conductive emission (CE) noise.

In order to ensure that electronic apparatuses operate without causing malfunctions in peripheral components and other apparatuses, the amount of EMI noise emission is strictly regulated in all electronic products. Accordingly, most of the electronic products essentially include a noise reduction device (e.g., an EMI filter) that reduces an EMI noise current in order to satisfy regulations on the noise emission amount. For example, an EMI filter is essentially included in white home appliances such as an air conditioner, electric vehicles, airplanes, energy storage systems (ESSs), and the like. A conventional EMI filter uses a common-mode (CM) choke to reduce CM noise among CE noise. The CM choke is a passive filter and serves to "suppress" a common-mode noise current.

Meanwhile, in order to maintain the noise reduction performance of the passive EMI filter in a high power system, the size or number of CM chokes should be increased. Accordingly, the size and price of the passive EMI filter may be greatly increased in the high-power system.

SUMMARY

In order to overcome the limitations of a passive electromagnetic interference (EMI) filter, interest in an active EMI filter has emerged. The active EMI filter may remove EMI noise by detecting the EMI noise and generating a signal that cancels the noise. The active EMI filter includes an active circuit unit capable of generating an amplified signal from the detected noise signal.

However, it is difficult to identify a malfunction of the active circuit unit, with the naked eye. In addition, since the active EMI filter just performs a noise reduction function, the power system may still operate normally even when the active circuit unit is malfunctioning, and thus it is difficult to determine the malfunction of the active circuit unit from the phenomenon.

The present disclosure is designed to overcome the above problems, and the objective thereof is to provide an active current compensation device capable of detecting a malfunction. In particular, the objective of the present disclosure is to provide an active current compensation device in which an active circuit unit and a malfunction detection circuit are integrated together in one integrated circuit (IC) chip.

However, these problems are exemplary, and the scope of the present disclosure is not limited thereto.

An active circuit unit should be powered to operate in an active EMI filter. For example, an output of a switching mode power supply (SMPS) may be used as a power source for the active circuit unit. A specific voltage (e.g., 12 V) may be required in the active circuit unit, but the required voltage may not exist in an existing system. That is, the direct current (DC) voltage input to the active circuit unit varies depending on a system.

In summary, depending on the system, the SMPS may not output the specific voltage for driving the active circuit unit, and in this case, an operation of the active circuit unit becomes unstable.

The present disclosure has been made in view of the above problems, and it is an object of the present disclosure to provide an active current compensation device including a power conversion unit embedded therein.

However, these problems are exemplary, and the scope of the present disclosure is not limited thereto.

Meanwhile, in order to actually apply an active EMI filter to electronic products, it is necessary to mass-produce semiconductor devices that meet various demands. When discrete elements (or components) are used to produce an active EMI filter for actual use, in order to improve an active EMI filter function, the number of elements for an active circuit is increased and various components are required. Accordingly, the size and cost of the active EMI filter may be increased to achieve a higher function.

Thus, there is a need for an active EMI filter, which uses a customized IC that may be used in various power systems.

The present disclosure is designed to overcome the above problems, and the objective thereof is to provide an active current compensation device including an integrated circuit unit and a non-integrated circuit unit. The integrated circuit unit may be one chip including essential components of the active current compensation device, and the non-integrated circuit unit may be a configuration to implement an active EMI filter of various designs.

The active EMI filter may include, for example, bipolar junction transistors (BJTs). However, when a current flows through the BJT and heat is generated, there is an effect of increasing a current gain of the BJT (or an effect of reducing an internal resistance of the BJT). Then, positive feedback, in which heat is further generated due to the increased current, occurs. Due to the positive feedback, the heat may continue to increase, resulting in a problem that the BJT is damaged or loses its original properties. This phenomenon is referred to as a thermal runaway phenomenon.

The thermal runaway problem should be solved when configuring an amplification unit of the active EMI filter using BJTs.

The present disclosure has been made in view of the above problems, and it is an object of the present disclosure to provide an active current compensation device including a one-chip IC.

However, these problems are exemplary, and the scope of the present disclosure is not limited thereto.

Additional aspects will be set forth in part in the description which follows and, in part, will be apparent from the description, or may be learned by practice of the presented embodiments of the disclosure.

According to an embodiment of the present disclosure, an active current compensation device which actively compensates for a noise occurring in a common mode in each of two or more high-current paths, includes a sensing unit configured to generate an output signal corresponding to a common-mode noise current on the high-current paths, an amplification unit configured to amplify the output signal to generate an amplified current, a compensation unit configured to generate a compensation current on the basis of the amplified current and allow the compensation current to flow to each of the two or more high-current paths, and a malfunction detection unit configured to detect a malfunction of the amplification unit, wherein the malfunction detection unit and at least a portion of the amplification unit may be embedded in one integrated circuit (IC) chip.

According to an embodiment, signals at two nodes included in the amplification unit may be differentially input to the malfunction detection unit.

According to an embodiment, the amplification unit may include a first transistor and a second transistor, and one node of the first transistor and one node of the second transistor may be respectively connected to input terminals of the malfunction detection unit.

According to an embodiment, the malfunction detection unit may detect a differential direct current (DC) voltage at two nodes included in the amplification unit, and detect whether the differential DC voltage is in a predetermined range.

According to an embodiment, the IC chip may include a terminal to be connected to a power supply, which is configured to supply power to the amplification unit and the malfunction detection unit, a terminal to be connected to a reference potential of the amplification unit and the malfunction detection unit, and an output terminal of the malfunction detection unit.

According to an embodiment, the IC chip may include a terminal to be connected to a switch for selectively supplying power to the malfunction detection unit.

Other aspects, features and advantages other than those described above will become apparent from the following drawings, claims, and detailed description of the disclosure.

According to an embodiment of the present disclosure, an active current compensation device which actively compensates for a noise occurring in a common mode in each of two or more high-current paths, includes a sensing unit configured to generate an output signal corresponding to a common-mode noise current on the high-current paths, a power management unit configured to receive a first voltage from a power supply for supplying power and convert the first voltage into a second voltage of a specified magnitude, an amplification unit driven by the second voltage and configured to amplify the output signal to generate an amplified current, and a compensation unit configured to generate a compensation current on the basis of the amplified current and allow the compensation current to flow to each of the two or more high-current paths, wherein active elements included in the amplification unit and active elements included in the power management unit may be embedded in one integrated circuit (IC) chip.

According to an embodiment, the power management unit may include a power conversion unit configured to generate a switching signal for outputting the second voltage of a constant magnitude from the first voltage of any magnitude, a feedback unit configured to transmit a voltage signal output from the power conversion unit back to the power conversion unit so that the power management unit outputs the second voltage of a constant magnitude, and a filter unit configured to pass only a direct current (DC) component of the voltage signal.

According to an embodiment, the power conversion unit may be embedded in the one-chip IC, and the filter unit and at least a portion of the feedback unit may be commercial discrete elements disposed outside the one-chip IC.

According to an embodiment, the power conversion unit may include a regulator configured to generate a DC low voltage for driving an internal circuit of the power conversion unit.

According to an embodiment, the power conversion unit may include a pulse width modulation circuit configured to generate the switching signal using the DC low voltage provided from the regulator, and a first switch and a second switch that are selectively turned on according to the switching signal.

According to an embodiment, a high current supplied by a second device may be transmitted to a first device through the two or more high-current paths, and the power supply may be a power supply device of the first device or the second device.

According to an embodiment of the present disclosure, an active current compensation device which actively compensates for a noise occurring in a common mode in each of two or more high-current paths, includes two or more high-current paths through which is power supplied by a second device is transmitted to a first device, a sensing unit configured to generate an output signal corresponding to a common-mode noise current on the high-current paths, an amplification unit configured to amplify the output signal to generate an amplified current, and a compensation unit configured to generate a compensation current on the basis of the amplified current and allow the compensation current to flow to each of the two or more high-current paths, wherein the amplification unit may include a non-integrated circuit unit and a one-chip integrated circuit unit, the non-integrated circuit unit may be designed according to a power system of at least one of the first device and the second device, and the one-chip integrated circuit unit may be independent of power rating specifications of the first device and the second device.

According to an embodiment, the non-integrated circuit unit may be designed according to power rating of the first device.

According to an embodiment, the one-chip integrated circuit unit may include a first transistor, a second transistor, and one or more resistors.

According to an embodiment, the non-integrated circuit unit may include a first impedance (Z1) connecting an emitter node side of each of the first transistor and the second transistor to an input terminal of the compensation unit, and a second impedance (Z2) connecting a base node side of each of the first transistor and the second transistor to an input terminal of the compensation unit.

According to an embodiment, the sensing unit may include a sensing transformer, the compensation unit may include a compensation transformer, a value of the first impedance or the second impedance may be determined on the basis of a turns ratio of each of the sensing transformer and the compensation transformer and a target current gain of the amplification unit, and a configuration of the one-chip integrated circuit unit may be independent of the turns ratio and the target current gain.

According to an embodiment, the one-chip integrated circuit unit may be used for the first device of various power systems depending on a design of the first impedance and the second impedance.

According to an embodiment of the present disclosure, an active current compensation device which actively compensates for a noise occurring in a common mode in each of two or more high-current paths, includes a sensing unit configured to generate an output signal corresponding to a common-mode noise current on the high-current paths, an amplification unit configured to amplify the output signal to generate an amplified current, and a compensation unit configured to generate a compensation current on the basis of the amplified current and allow the compensation current to flow to each of the two or more high-current paths, wherein the amplification unit may include a non-integrated circuit unit and a one-chip integrated circuit, active elements whose element characteristics change according to a change in temperature may be embedded in the one-chip integrated circuit, and the one-chip integrated circuit may be designed so that the amplification unit maintains a performance in a certain range even when a temperature changes.

According to an embodiment, an npn bipolar junction transistor (BJT) and a pnp BJT may be embedded in the one-chip integrated circuit, and a diode may be connected between a base node of the npn BJT and a base node of the pnp BJT.

According to an embodiment, a resistor may be connected between an emitter node of the npn BJT and an emitter node of the pnp BJT.

According to an embodiment, the diode may serve to reduce an emitter current flowing through the resistor.

According to an embodiment, the diode and the resistor may adjust a direct current (DC) bias current of each of the npn BJT and the pnp BJT.

According to an embodiment, an emitter current flowing through the resistor may be maintained in a predetermined range in response to a change in temperature.

Other aspects, features and advantages other than those described above will become apparent from the following drawings, claims, and detailed description of the disclosure.

One aspect of the present disclosure provides an isolated type active electromagnetic interference (EMI) filter having no additional elements on a power line, the filter including a common-mode (CM) choke which is disposed on a power source side from which power is supplied and has a form in which a winding is wound on each of a live line and a neutral line connected to an EMI source, a Y-cap which is disposed on an EMI source side at which EMI occurs and includes two capacitors connected in series, wherein the two capacitors are connected in parallel between the live line and the neutral line and are commonly connected to the ground, a sensing winding formed by winding a coil on the CM choke and configured to sense a noise current of the CM choke, an amplifier configured to amplify the noise current sensed by the sensing winding, and a transformer which is installed in front of the Y-cap, includes a primary coil that receives a signal amplified by the amplifier and a secondary coil that is isolated from the power line by being connected to the ground connected to the Y-cap, and injects a signal of the secondary coil into the Y-cap as a compensation signal.

Another aspect of the present disclosure provides an isolated type active electromagnetic interference (EMI) filter having no additional elements on a power line, the filter including a common-mode (CM) choke which is disposed on a power source side from which is power is supplied and has a form in which a winding is wound on each of a live line and a neutral line connected to an EMI source, a Y-cap which is disposed on an EMI source side at which EMI occurs and includes two capacitors connected in series, wherein the two capacitors are connected in parallel between the live line and the neutral line and are commonly connected to the ground, a transformer which is installed in front of the Y-cap, includes a primary coil that senses a noise voltage of the Y-CAP and a secondary coil through which the noise voltage is transformed, and is isolated from the power line, an amplifier configured to amplify the noise voltage that is sensed and transformed by the transformer, and a compensation winding formed by winding a coil on the CM choke and configured to inject the noise signal amplified by the amplifier into the CM choke.

Still another aspect of the present disclosure provides an isolated type active electromagnetic interference (EMI) filter having no additional elements on a power line, the filter including a common-mode (CM) choke which is disposed on an EMI source side at which EMI occurs and has a form in which a winding is wound on each of a live line and a neutral line connected to an EMI source, a Y-cap which is disposed on a power source side from which power is supplied and includes two capacitors connected in series, wherein the two capacitors are connected in parallel between the live line and the neutral line and are commonly connected to the ground, a sensing winding formed by winding a coil on the CM choke and configured to sense a noise current of the CM choke, an amplifier configured to amplify the noise current sensed by the sensing winding, and a transformer which is installed in front of the Y-cap, includes a primary coil that receives a signal amplified by the amplifier and a secondary coil that is isolated from the power line by being connected to the ground connected to the Y-cap, and injects the signal transformed through the secondary coil into the Y-cap as a compensation signal.

Yet another aspect of the present disclosure provides an isolated type active electromagnetic interference (EMI) filter having no additional elements on a power line, the filter including a common-mode (CM) choke which is disposed on an EMI source side at which EMI occurs and has a form in which a winding is wound on each of a live line and a neutral line connected to an EMI source, a Y-cap which is disposed on a power source side from which power is supplied and includes two capacitors connected in series, wherein the two capacitors are connected in parallel between the live line and the neutral line and are commonly connected to the ground, a transformer which is installed in front of the Y-cap, includes a primary coil that senses a noise voltage of the Y-CAP and a secondary coil through which the noise voltage is transformed, and is isolated from the power line, an amplifier configured to amplify the noise voltage that is transformed by the transformer, and a compensation winding formed by winding a coil on the CM choke and configured to inject the noise signal amplified by the amplifier into the CM choke as a compensation signal.

Still yet another aspect of the present disclosure provides a method of reducing electromagnetic interference (EMI) noise using the isolated type active EMI filter having no additional elements on a power line, which is a method of reducing EMI noise by adding an active element to a passive EMI filter including a common-mode (CM) choke which is disposed on a power source side from which power is supplied and has a form in which a winding is wound on each of a live line and a neutral line connected to an EMI source and a Y-cap which is disposed on an EMI source side at which EMI occurs and includes two capacitors connected in series, wherein the two capacitors are connected in parallel between the live line and the neutral line and are commonly connected to the ground, the method including sensing a noise current of the CM choke through a sensing winding formed by winding a coil on the CM choke, amplifying the noise current sensed through the sensing winding, and transforming the amplified signal received through a primary coil of a transformer, which is installed in front of the Y-cap, through a secondary coil of the transformer and injecting the transformed signal into the Y-cap, wherein the secondary coil of the transformer is isolated from the power line by being connected to the ground connected to the Y-cap.

Still yet another aspect of the present disclosure provides a method of reducing electromagnetic interference (EMI) noise using the isolated type active EMI filter having no additional elements on a power line, which is a method of reducing EMI noise by adding an active element to a passive EMI filter including a common-mode (CM) choke which is disposed on a power source side from which power is supplied and has a form in which a winding is wound on each of a live line and a neutral line connected to an EMI source and a Y-cap which is disposed on an EMI source side at which EMI occurs and includes two capacitors connected in series, wherein the two capacitors are connected in parallel between the live line and the neutral line and are commonly connected to the ground, the method including sensing a noise voltage by a primary coil of a transformer installed in front of the Y-cap using the Y-cap as a sensing capacitor and transforming the sensed noise voltage through a secondary coil of the transformer, amplifying the noise voltage transformed through the secondary coil, and injecting the amplified noise signal into the CM choke through a compensation winding that is formed by winding a coil on the CM choke, wherein the secondary coil of the transformer is isolated from the power line by being connected to the ground connected to the Y-cap.

Still yet another aspect of the present disclosure provides a method of reducing electromagnetic interference (EMI) noise using the isolated type active EMI filter having no additional elements on a power line, which is a method of reducing EMI noise by adding an active element to a passive EMI filter including a common-mode (CM) choke which is disposed on an EMI source side at which EMI occurs and has a form in which a winding is wound on each of a live line and a neutral line connected to an EMI source and a Y-cap which is disposed on a power source side from which power is supplied and includes two capacitors connected in series, wherein the two capacitors are connected in parallel between the live line and the neutral line and are commonly connected to the ground, the method including sensing a noise current of the CM choke through a sensing winding formed by winding a coil on the CM choke, amplifying the noise current sensed through the sensing winding, and transforming the amplified signal input through a primary coil of a transformer, which is installed in front of the Y-cap, through a secondary coil of the transformer and injecting the transformed signal into the Y-cap as a compensation signal, wherein the secondary coil of the transformer is isolated from the power line by being connected to the ground connected to the Y-cap.

Still yet another aspect of the present disclosure provides a method of reducing electromagnetic interference (EMI) noise using the isolated type active EMI filter having no additional elements on a power line, which is a method of reducing EMI noise by adding an active element to a passive EMI filter including a common-mode (CM) choke which is disposed on an EMI source side at which EMI occurs and has a form in which a winding is wound on each of a live line and a neutral line connected to an EMI source and a Y-cap which is disposed on a power source side from which power is supplied and includes two capacitors connected in series, wherein the two capacitors are connected in parallel between the live line and the neutral line and are commonly connected to the ground, the method including sensing a noise voltage of the Y-cap by a primary coil of a transformer installed in front of the Y-cap and transforming the sensed noise voltage through a secondary coil of the transformer, amplifying the noise voltage, and injecting the amplified noise signal into the CM choke through a compensation winding, which is formed by winding a coil on the CM choke, as a compensation signal, wherein the secondary coil of the transformer is isolated from the power line by being connected to the ground connected to the Y-cap.

In order to prevent conducted electromagnetic interference (EMI) noise emitted through a power line cable, EMI filters should be installed in most home/industrial electrical and electronic devices, and according to an isolated type active EMI filter having no additional elements on a power line and a method of reducing EMI noise using the same of the present disclosure, the same noise reduction performance can be obtained with a smaller size and a lower price than a case in which only a passive filter is used.

Further, according to the present disclosure, when an isolated type active EMI filter having no additional elements on a power line of the present disclosure is added to a case in which a multi-stage passive EMI filter is previously used to sufficiently reduce noise, the stage number of filters can be reduced, and the size and cost of most electrical and electronic devices can be reduced.

BRIEF DESCRIPTION OF THE DRAWINGS

The above and other aspects, features, and advantages of certain embodiments of the disclosure will be more apparent from the following description taken in conjunction with the accompanying drawings.

FIGS. 35A and 35B are graphs illustrating curves of an impedance $Z_{line}$ of the power line when viewed from the position of the Y-cap toward a power source, wherein FIG. 35A is the graph illustrating the curve in a case in which $N_{sen}$ violates Equation 19, and FIG. 35B is the graph illustrating the curve in a case in which $N_{sen}$ satisfies Equation 19.

FIGS. 36A and 36B illustrate the comparison of loop gains, wherein FIG. 36A illustrates the loop gain in an unstable situation without damping components $R_{d1}$, Cd, and $R_{d2}$ and a phase compensator of $R_c$ and $C_c$, and FIG. 36B illustrates the loop gain in a stable situation with the damping components $R_{d1}$, $C_d$, and $R_{d2}$ and the phase compensator of $R_c$ and $C_c$.

DETAILED DESCRIPTION

Figure 1:
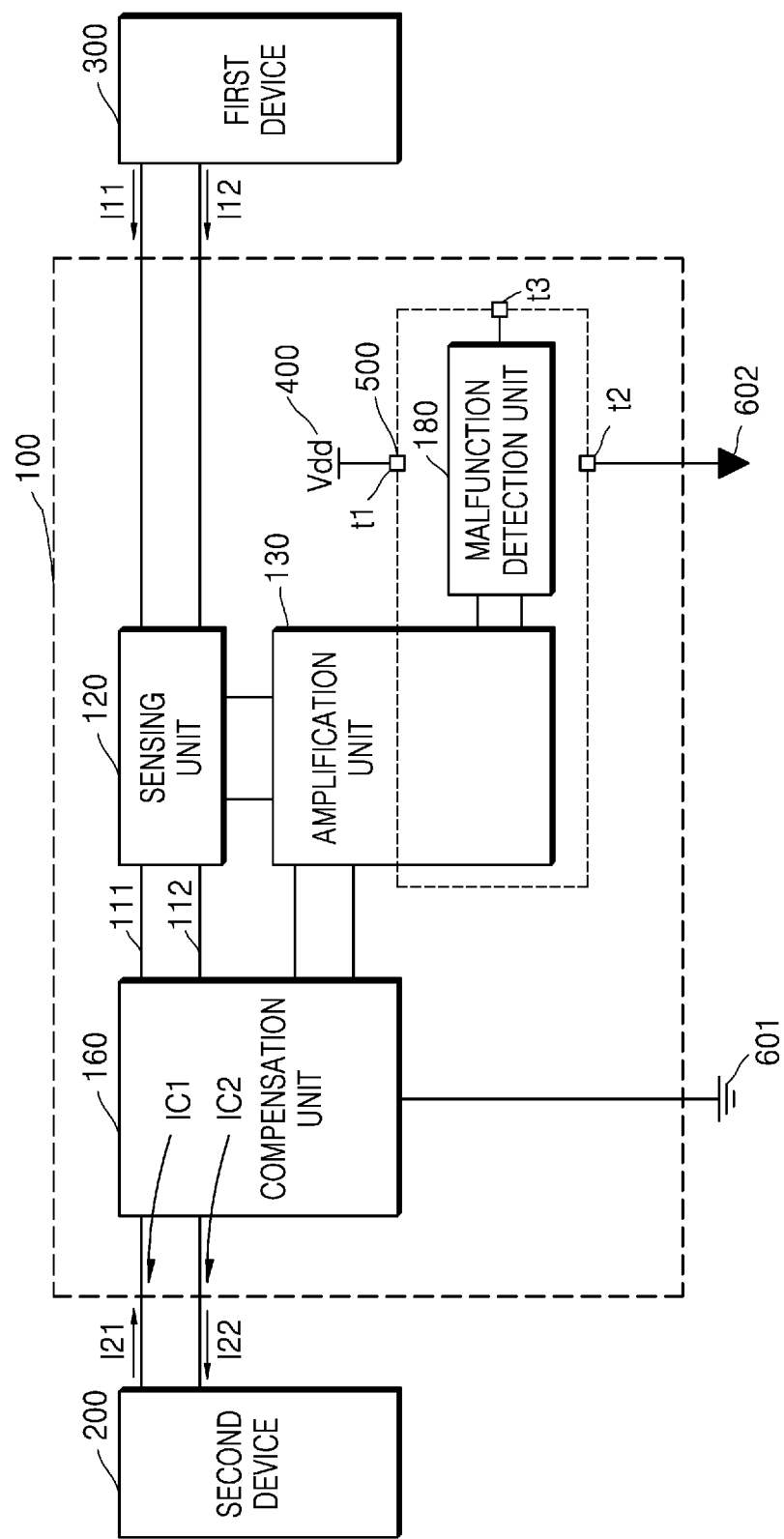
FIG. 1 schematically illustrates a configuration of a system including an active current compensation device according to an embodiment of the present disclosure.

While the present disclosure is susceptible to various modifications and alternative embodiments, specific embodiments thereof are shown by way of example in the drawings and will herein be described in detail. Advantages and features of the present disclosure and a method of achieving the same should become clear with embodiments described in detail below with reference to the drawings. However, the present disclosure is not limited to the embodiments disclosed below, but may be implemented in various forms.

Hereinafter, the embodiments of the present disclosure will be described below in detail with reference to the accompanying drawings, and when the embodiments of the present disclosure are described with reference to the drawings, the same or corresponding components are given the same reference numerals, and repetitive descriptions thereof will be omitted.

In the following embodiments, the terms "first," "second," and the like have been used to distinguish one component from another, rather than limitative in all aspects. In the following embodiments, singular forms are intended to include plural forms as well, unless the context clearly indicates otherwise. In the following embodiments, the terms such as "including," "having," and "comprising" are intended to indicate the existence of features or components disclosed in the specification, and are not intended to preclude the possibility that one or more other features or components may be added. For convenience of description, sizes of components shown in the drawings may be exaggerated or reduced. In the following embodiments, when a component, part, unit, module, or the like is referred to as being connected to another part, unit, module, or the like, this includes not only a case in which the component, part, unit, module, or the like is directly connected to another part, unit, module, or the like, but also a case in which the component, part, unit, module, or the like indirectly connected to another part, unit, module, or the like with still another component, part, unit, module, or the like interposed therebetween.

Meanwhile, the embodiments described in the detailed description of the present specification may each belong to one of four categories of embodiments for convenience. The four categories of embodiments are as follows:

[1] Active current compensation device capable of detecting malfunction;
[2] Active current compensation device including power conversion unit embedded therein;
[3] Active current compensation device including integrated circuit unit and non-integrated circuit unit; and
[4] Active current compensation device including one-chip integrated circuit (IC).
[5] Isolated type active emi filter having no additional elements on power line.

Four categories [1] to [4] of embodiments are classified only for convenience of description, and it goes without saying that each of the embodiments described herein may belong to a plurality of categories overlappingly.

In addition, the drawings appended to the present specification may each belong to one of the categories of embodiments. In more detail, FIGS. 1 to 9 may belong to category [1], FIGS. 10 to 16 may belong to category [2], FIGS. 17 to 22 may belong to category [3], FIGS. 23 to 28 may belong to category [4], and FIGS. 29 to 51 may belong to category [5]. In the present specification, the same reference number may be assigned to the same or corresponding component in the drawings in the same category. However, in the drawings in different categories, even though the same reference number is assigned, the reference number may refer to different components. For example, a malfunction detection unit 180 of FIG. 1 belonging to category [1] and a power management unit 180 of FIG. 10 belonging to category [2] may indicate different components although the same reference numeral is assigned thereto.

[1] Active Current Compensation Device Capable of Detecting Malfunction

FIG. 1 schematically illustrates a configuration of a system including an active current compensation device 100 according to an embodiment of the present disclosure. The active current compensation device 100 may actively compensate for first currents I11 and I12 (e.g., electromagnetic interference (EMI) noise current) that are input as a common-mode (CM) current through two or more high-current paths 111 and 112 from a first device 300.

Referring to FIG. 1, the active current compensation device 100 may include a sensing unit 120, an amplification unit 130, a malfunction detection unit 180, and a compensation unit 160.

In the present specification, the first device 300 may be any of various types of power systems using power supplied by a second device 200. For example, the first device 300 may be a load that is driven using the power supplied by the second device 200. In addition, the first device 300 may be a load (e.g., an electric vehicle) that stores energy using the power supplied by the second device 200 and is driven using the stored energy. However, the present disclosure is not limited thereto.

In the present specification, the second device 200 may be any of various types of systems for supplying power to the first device 300 in the form of current and/or voltage. For example, the second device 200 may be a device that produces and supplies power, and may also be a device (e.g., an electric vehicle charging device) that supplies power produced by another device. Of course, the second device 200 may also be a device that supplies stored energy. However, the present disclosure is not limited thereto.

A power converter may be located on the first device 300 side. For example, the first currents I11 and I12 may be input to the current compensation device 100 due to a switching operation of the power converter. That is, the first device 300 side may correspond to a noise source and the second device 200 side may correspond to a noise receiver.

The two or more high-current paths 111 and 112 may be paths for transmitting the power supplied from the second device 200, that is, second currents I21 and I22, to the first device 300, for example, may be power lines. For example, the two or more high-current paths 111 and 112 may be a live line and a neutral line. At least some portions of the high-current paths 111 and 112 may pass through the current compensation device 100. The second currents I21 and I22 may be an alternating current having a frequency of a second frequency band. The second frequency band may be, for example, a band having a range of 50 Hz to 60 Hz.

Further, the two or more high-current paths 111 and 112 may also be paths through which noise generated by the first device 300, that is, the first currents I11 and I12, is transmitted to the second device 200. The first currents I11 and I12 may be input as a common-mode current with respect to each of the two or more high-current paths 111 and 112. The first currents I11 and I12 may be currents that are unintentionally generated in the first device 300 due to various causes. For example, the first currents I11 and I12 may be noise currents generated by virtual capacitance between the first device 300 and the surrounding environment. Alternatively, the first currents I11 and I12 may be noise currents generated due to a switching operation of the power converter of the first device 300. The first currents I11 and I12 may be currents having a frequency of a first frequency band. The first frequency band may be a frequency band higher than the second frequency band described above. The first frequency band may be, for example, a band having a range of 150 KHz to 30 MHz.

Figure 9:
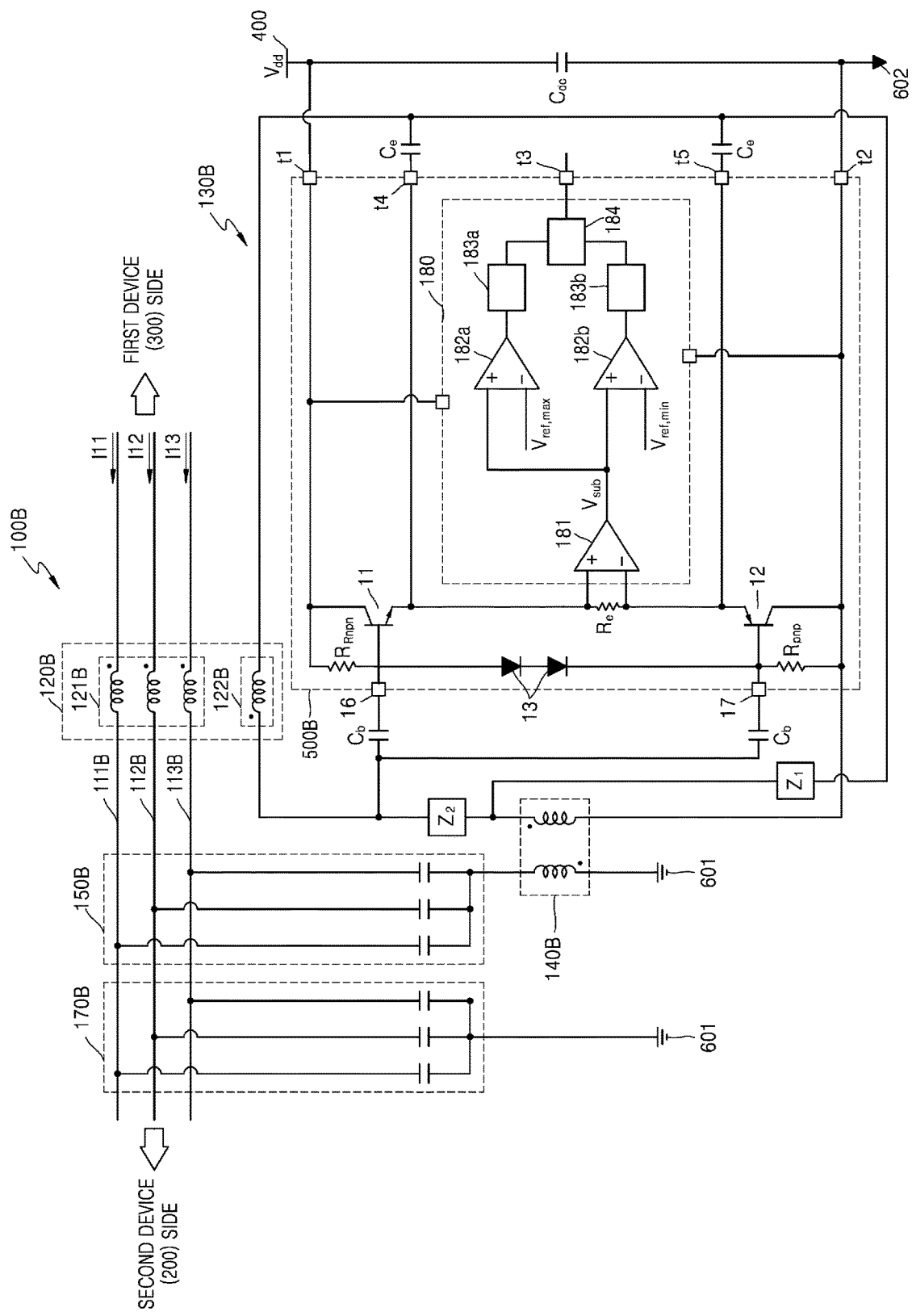
FIG. 9 schematically illustrates a configuration of an active current compensation device according to an embodiment of the present disclosure.

Meanwhile, the two or more high-current paths 111 and 112 may include two paths as shown in FIG. 1, may include three paths as shown in FIG. 9, or may include four paths.

The number of the high-current paths 111 and 112 may vary depending on the type and/or form of power used by the first device 300 and/or the second device 200.

The sensing unit 120 may sense the first currents I11 and I12 on the two or more high-current paths 111 and 112 and generate an output signal corresponding to the first currents I11 and I12. That is, the sensing unit 120 may refer to a component that senses the first currents I11 and I12 on the high-current paths 111 and 112. In order for the sensing unit 120 to sense the first currents I11 and I12, at least some portions of the high-current paths 111 and 112 may pass through the sensing unit 120, but a portion of the sensing unit 120, which generates the output signal according to the sensing result, may be isolated from the high-current paths 111 and 112. For example, the sensing unit 120 may be implemented as a sensing transformer. The sensing transformer may sense the first currents I11 and I12 on the high-current paths 111 and 112 in a state of being isolated from the high-current paths 111 and 112.

According to an embodiment, the sensing unit 120 may be differentially connected to input terminals of the amplification unit 130.

The amplification unit 130 may be electrically connected to the sensing unit 120, and may amplify the output signal output from the sensing unit 120 to generate an amplified output signal. The term "amplification" by the amplification unit 130, as used herein, may mean that the magnitude and/or phase of an object to be amplified is adjusted. The amplification unit 130 may be implemented by various components, and may include active elements. In an embodiment, the amplification unit 130 may include bipolar junction transistors (BJTs). For example, the amplification unit 130 may include a plurality of passive elements, such as resistors and capacitors, in addition to the BJTs. However, the present disclosure is not limited thereto, and the component for the "amplification" described in the present disclosure may be used without being limited to the amplification unit 130 of the present disclosure. A second reference potential 602 of the amplification unit 130 and a first reference potential 601 of the current compensation device 100 may be distinguished from each other.

The malfunction detection unit 180 may detect a malfunction or failure of the amplification unit 130. According to an embodiment, signals at two nodes included in the amplification unit 130 may be differentially input to the malfunction detection unit 180. The malfunction detection unit 180 may detect a differential signal between the two nodes included in the amplification unit 130. The malfunction detection unit 180 may detect the malfunction of the amplification unit 130 using the input differential signal. For example, the malfunction detection unit 180 may detect the malfunction of the amplification unit 130 by determining whether the differential signal satisfies a predetermined condition. The malfunction detection unit 180 may output a signal indicating whether the amplification unit 130 is malfunctioning. According to an embodiment, the malfunction detection unit 180 may include active elements.

The malfunction detection unit 180 and at least a portion of the amplification unit 130 may be physically embedded into one IC chip 500.

Figure 2:
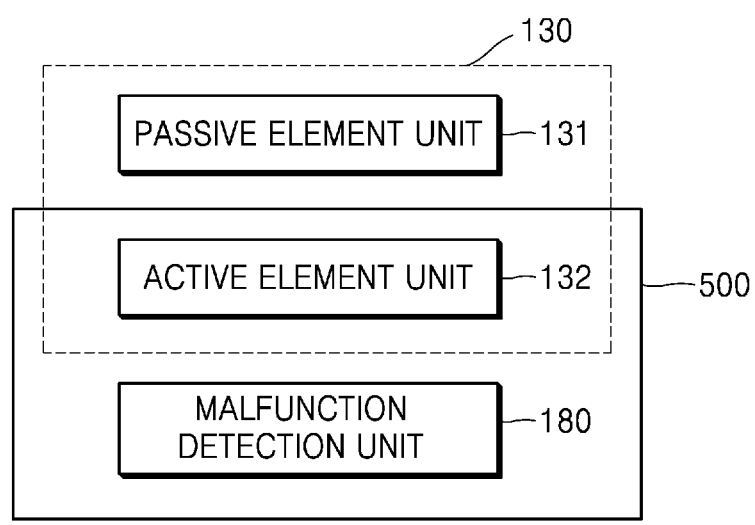
FIG. 2 illustrates an inclusion relation of an amplification unit and a malfunction detection unit with respect to an integrated circuit (IC) chip, according to an embodiment of the present disclosure.

FIG. 2 illustrates an inclusion relation of the amplification unit 130 and the malfunction detection unit 180 with respect to the IC chip 500, according to an embodiment of the present disclosure.

Referring to FIG. 2, the amplification unit 130 may include a passive element unit 131 and an active element unit 132. The passive element unit 131 includes only passive elements, and the active element unit 132 includes active elements. In an embodiment, the active element unit 132 may further include passive elements as well as the active elements. Examples of a detailed configuration of the amplification unit 130 including the passive element unit 131 and the active element unit 132 will be described below with reference to FIGS. 4 and 5.

Referring to FIGS. 1 and 2 together, a combination of the passive element unit 131 and the active element unit 132 may perform a function of generating an amplified signal from the output signal output from the sensing unit 120. The amplified signal may be input to the compensation unit 160.

As described above, signals at two nodes included in the amplification unit 130 may be differentially input to the malfunction detection unit 180. The malfunction detection unit 180 may sense a differential signal of the two nodes. The two nodes may be two nodes included in the active element unit 132. In an embodiment, the two nodes may also be connected to the passive element unit 131.

In an embodiment, the active element unit 132 of the amplification unit 130 and the malfunction detection unit 180 may be physically integrated into the single IC chip 500. However, this is merely an embodiment, and of course, in other embodiments, the passive element unit 131 and the active element unit 132 of the amplification unit 130 and the malfunction detection unit 180 may be physically integrated into the single IC chip 500.

The malfunction detection unit 180 may include active elements. Here, a reference potential of the malfunction detection unit 180 may be equal to the second reference potential 602, which is the reference potential of the amplification unit 130. The reference potential of the malfunction detection unit 180 may be different from the first reference potential 601, which is the reference potential of the current compensation device 100 (e.g., a reference potential of the compensation unit 160).

The amplification unit 130 and the malfunction detection unit 180 may receive power from a power supply 400 that is distinguished from the first device 300 and/or the second device 200. The amplification unit 130 may receive the power from the power supply 400, and amplify the output signal output from the sensing unit 120 to generate an amplified current. The malfunction detection unit 180 may receive power from a power supply 600 and generate an output signal indicating whether a differential signal input from the amplification unit 130 is in a predetermined range. The output signal may indicate whether the amplification unit 130 is malfunctioning.

The power supply 400 may be a device that receives power from a power source that is independent of the first device 300 and the second device 200 and generates input power of the amplification unit 130 and the malfunction detection unit 180. Alternatively, the power supply 400 may also be a device that receives power from any one of the first device 300 and the second device 200 and generates input power of the amplification unit 130 and the malfunction detection unit 180.

The IC chip 500 may include a terminal t1 to be connected to the power supply 400, a terminal t2 to be connected to the second reference potential 602, and a terminal t3 for outputting the output signal of the malfunction detection unit 180. The IC chip 500 may further include other terminals.

For example, in an embodiment in which only the active element unit 132 of the amplification unit 130 other than the passive element unit 131 is integrated into the IC chip 500 together with the malfunction detection unit 180, the other terminals may be connected to the passive element unit 131.

For another example, in an embodiment in which the passive element unit 131 and the active element unit 132, which are included in the amplification unit 130, and the malfunction detection unit 180 are all integrated into the single IC chip 500, the other terminals may be connected to an output terminal of the sensing unit 120 and an input terminal of the compensation unit 160.

The compensation unit 160 may generate a compensation current on the basis of the amplified output signal generated by the amplification unit 130. An output side of the compensation unit 160 may be connected to the high-current paths 111 and 112 to allow compensation currents IC1 and IC2 to flow to the high-current paths 111 and 112, but may be isolated from the amplification unit 130. For example, the compensation unit 160 may include a compensation transformer for the isolation. For example, the output signal of the amplification unit 130 may flow through a primary side of the compensation transformer, and the compensation current based on the output signal may be generated on a secondary side of the compensation transformer.

In order to cancel the first currents I11 and I12, the compensation unit 160 may inject the compensation currents IC1 and IC2 into the high-current paths 111 and 112 through the two or more high-current paths 111 and 112, respectively. The compensation currents IC1 and IC2 may have the same magnitude and an opposite phase compared to the first currents I11 and I12.

Figure 3:
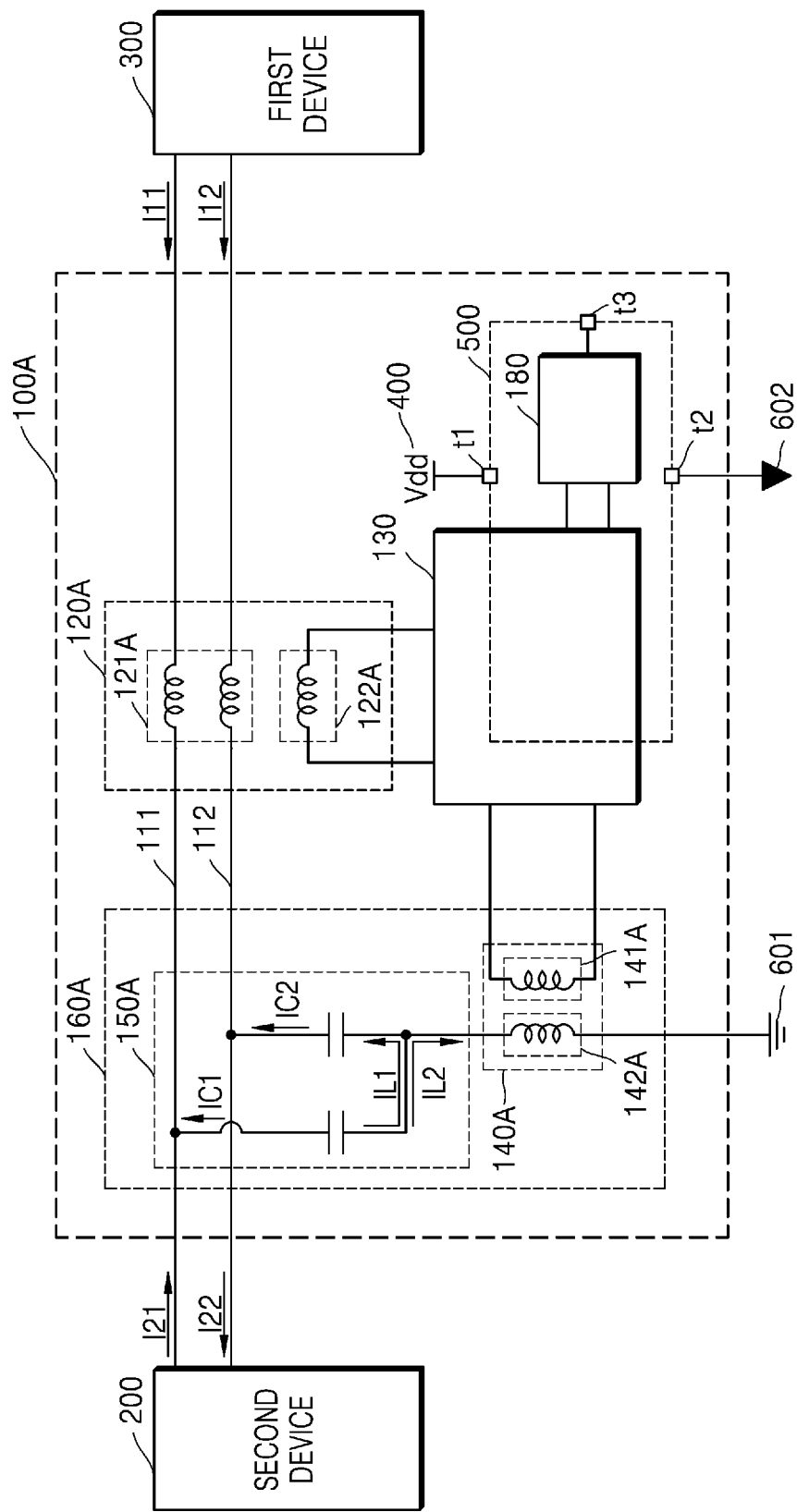
FIG. 3 illustrates a more specific example of the embodiment described with reference to FIG. 1, and schematically illustrates an active current compensation device according to an embodiment of the present disclosure.

FIG. 3 illustrates a more specific example of the embodiment described with reference to FIG. 1, and schematically illustrates an active current compensation device 100A according to an embodiment of the present disclosure. The active current compensation device 100A may actively compensate for first currents I11 and I12 (e.g., a noise current) input as a common-mode current with respect to each of two high-current paths 111 and 112 connected to the first device 300.

Referring to FIG. 3, the active current compensation device 100A may include a sensing transformer 120A, an amplification unit 130, a malfunction detection unit 180, and a compensation unit 160A.

In an embodiment, the sensing unit 120 described above may include the sensing transformer 120A. In this case, the sensing transformer 120A may be a component for sensing the first currents I11 and I12 on the high-current paths 111 and 112 in a state of being isolated from the high-current paths 111 and 112. The sensing transformer 120A may sense the first currents I11 and I12 that are noise currents input through the high-current paths 111 and 112 (e.g., power lines) from the first device 300 side.

The sensing transformer 120A may include a primary side 121A disposed on the high-current paths 111 and 112 and a secondary side 122A differentially connected to input terminals of the amplification unit 130. The sensing transformer 120A may generate an induced current, which is directed to the secondary side 122A (e.g., a secondary winding), on the basis of magnetic flux densities induced due to the first currents I11 and I12 at the primary side 121A (e.g., a primary winding) disposed on the high-current paths 111 and 112. The primary side 121A of the sensing transformer 120A may be, for example, a winding in which each of a first high-current path 111 and a second high-current path 112 is wound around one core. However, the present disclosure is not limited thereto, and the primary side 121A of the sensing transformer 120A may have a form in which the first high-current path 111 and the second high-current path 112 pass through the core.

Specifically, the sensing transformer 120A may be configured such that the magnetic flux density induced due to the first current I11 on the first high-current path 111 (e.g., a live line) and the magnetic flux density induced due to the first current I12 on the second high-current path 112 (e.g., neutral line) are overlapped (or reinforced) with each other. In this case, the second currents I21 and I22 also flow through the high-current paths 111 and 112, and thus the sensing transformer 120A may be configured such that a magnetic flux density induced due to the second current I21 on the first high-current path 111 and a magnetic flux density induced due to the second current I22 on the second high-current path 112 cancel each other. In addition, as an example, the sensing transformer 120A may be configured such that magnitudes of the magnetic flux densities, which are induced due to the first currents I11 and I12 of a first frequency band (e.g., a band having a range of 150 KHz to 30 MHz), are greater than magnitudes of the magnetic flux densities induced due to the second currents I21 and I22 of a second frequency band (for example, a band in a range of 50 Hz to 60 Hz).

As described above, the sensing transformer 120A may be configured such that the magnetic flux densities induced due to the second currents I21 and I22 may cancel each other so that only the first currents I11 and I12 may be sensed. That is, the current induced in the secondary side 122A of the sensing transformer 120A may be a current into which the first currents I11 and I12 are converted at a predetermined ratio.

For example, in the sensing transformer 120A, when a turns ratio of the primary side 121A and the secondary side 122A is 1:Nsen, and a self-inductance of the primary side 121A of the sensing transformer 120A is Lsen, the secondary side 122A may have a self-inductance of Nsen2*Lsen. In this case, the current induced in the secondary side 122A has a magnitude that is 1/Nsen times that of the first currents I11 and I12. For example, the primary side 121A and the secondary side 122A of the sensing transformer 120A may be coupled with a coupling coefficient of Ksen.

The secondary side 122A of the sensing transformer 120A may be connected to the input terminals of the amplification unit 130. For example, the secondary side 122A of the sensing transformer 120A may be differentially connected to the input terminals of the amplification unit 130 and supply the induced current to the amplification unit 130.

The amplification unit 130 may amplify the current that is sensed by the sensing transformer 120A and induced in the secondary side 122A. For example, the amplification unit 130 may amplify the magnitude of the induced current at a predetermined ratio and/or adjust a phase of the induced current.

The malfunction detection unit 180 may detect a malfunction or failure of the amplification unit 130. According to an embodiment, a differential signal between two nodes included in the amplification unit 130 may be input to the malfunction detection unit 180. The malfunction detection unit 180 may detect whether the amplification unit 130 is malfunctioning by detecting whether the input differential signal is in a predetermined range. The malfunction detection unit 180 may output a signal, which indicates whether the amplification unit 130 is malfunctioning, through an output terminal t3. The malfunction detection unit 180 may include active elements.

According to various embodiments of the present disclosure, the malfunction detection unit 180 and at least a portion of the amplification unit 130 may be physically integrated together into the single IC chip 500.

The amplification unit 130 and the malfunction detection unit 180 may be connected to the second reference potential 602, and the second reference potential 602 may be distinguished from the first reference potential 601 of the current compensation device 100A (or the compensation unit 160A). The amplification unit 130 and the malfunction detection unit 180 may be connected to a power supply 400.

The IC chip 500 may include a terminal t1 to be connected to the power supply 400, a terminal t2 to be connected to the second reference potential 602, and the terminal t3 through which the output signal of the malfunction detection unit 180 is output.

According to an embodiment, only an active element unit 132 of the amplification unit 130 other than a passive element unit 131 may be integrated into the IC chip 500 together with the malfunction detection unit 180. In this case, the IC chip 500 may further include a terminal to be connected to the passive element unit 131.

According to an embodiment, both the passive element unit 131 and the active element unit 132 included in the amplification unit 130 may be integrated into the IC chip 500 together with the malfunction detection unit 180. In this case, the IC chip 500 may further include a terminal to be connected to an output terminal of the sensing unit 120 and a terminal to be connected to an input terminal of the compensation unit 160.

The compensation unit 160A may be an example of the compensation unit 160 described above. The compensation unit 160A may include a compensation transformer 140A and a compensation capacitor unit 150A. An amplified current amplified by the above-described amplification unit 130 flows through a primary side 141A of the compensation transformer 140A.

The compensation transformer 140A may be a component for isolating the amplification unit 130 including active elements from the high-current paths 111 and 112. That is, the compensation transformer 140A may be a component for generating a compensation current (in a secondary side 142A) to be injected into the high-current paths 111 and 112 on the basis of the amplified current in a state of being isolated from the high-current paths 111 and 112.

The compensation transformer 140A may include the primary side 141A differentially connected to output terminals of the amplification unit 130 and the secondary side 142A connected to the high-current paths 111 and 112. The compensation transformer 140A may induce a compensation current, which is directed toward the secondary side 142A (e.g., a secondary winding), on the basis of a magnetic flux density induced due to the amplified current flowing through the primary side 141A (e.g., a primary winding).

In this case, the secondary side 142A may be disposed on a path connecting the compensation capacitor unit 150A, which will be described below, and the first reference potential 601 of the current compensation device 100A. That is, one end of the secondary side 142A is connected to the high-current paths 111 and 112 through the compensation capacitor unit 150A, and the other end of the secondary side 142A may be connected to the first reference potential 601 of the active current compensation device 100A. Meanwhile, the primary side 141A of the compensation transformer 140A, the amplification unit 130, the malfunction detection unit 180, and the secondary side 122A of the sensing transformer 120A may be connected to the second reference potential 602, which is distinguished from the reference potential of the other components of the active current compensation device 100A. The first reference potential 601 of the current compensation device 100A and the second reference potential 602 of the amplification unit 130 may be distinguished from each other.

As described above, in an embodiment of the present disclosure, the component generating the compensation current uses a reference potential (i.e., the second reference potential 602) different from that of the other components and uses the separate power supply 400 and thus may operate in a state of being isolated from the other components, thereby improving the reliability of the active current compensation device 100A.

In the compensation transformer 140A, when a turns ratio of the primary side 141A and the secondary side 142A is 1:$N_{inj}$, and a self-inductance of the primary side 141A of the compensation transformer 140A is Linj, the secondary side 142A may have a self-inductance of $N_{inj}2$*Linj. In this case, the current induced in the secondary side 142A has a magnitude that is 1/$N_{inj}$ times that of the current (i.e., the amplified current) flowing in the primary side 141A. The primary side 141A and the secondary side 142A of the compensation transformer 140A may be coupled with a coupling coefficient of kinj.

The current converted through the compensation transformer 140A may be injected into the high-current paths 111 and 112 (e.g., power lines) through the compensation capacitor unit 150A as compensation currents IC1 and IC2. Accordingly, the compensation currents IC1 and IC2 may have the same magnitude and an opposite phase compared to the first currents I11 and I12 to cancel the first currents I11 and I12. Accordingly, a magnitude of a current gain of the amplification unit 130 may be designed to be Nsen*$N_{inj}$.

As described above, the compensation capacitor unit 150A may provide a path through which the current generated by the compensation transformer 140A flows to each of the two high-current paths 111 and 112.

The compensation capacitor unit 150A may include two Y-capacitors (Y-caps) each having one end connected to the secondary side 142A of the compensation transformer 140A and the other end connected to the high-current paths 111 and 112. One ends of the two Y-caps share a node connected to the secondary side 142A of the compensation transformer 140A, and the opposite ends of the two Y-caps may have a node connected to the first high-current path 111 and the second high-current path 112.

The compensation capacitor unit 150A may allow the compensation currents IC1 and IC2 induced by the compensation transformer 140A to flow in the power line. As the compensation currents IC1 and IC2 compensate (cancel) for the first currents I11 and I12, the current compensation device 100A may reduce noise.

Meanwhile, the compensation capacitor unit 150A may be configured such that a current IL1 flowing between the two high-current paths 111 and 112 through the compensation capacitors has a magnitude less than a first threshold magnitude. In addition, the compensation capacitor unit 150A may be configured such that a current IL2 flowing between each of the two high-current paths 111 and 112 and the first reference potential 601 through the compensation capacitors has a magnitude less than a second threshold magnitude.

The active current compensation device 100A may be implemented as an isolated structure by using the compensation transformer 140A and the sensing transformer 120A.

Figure 4:
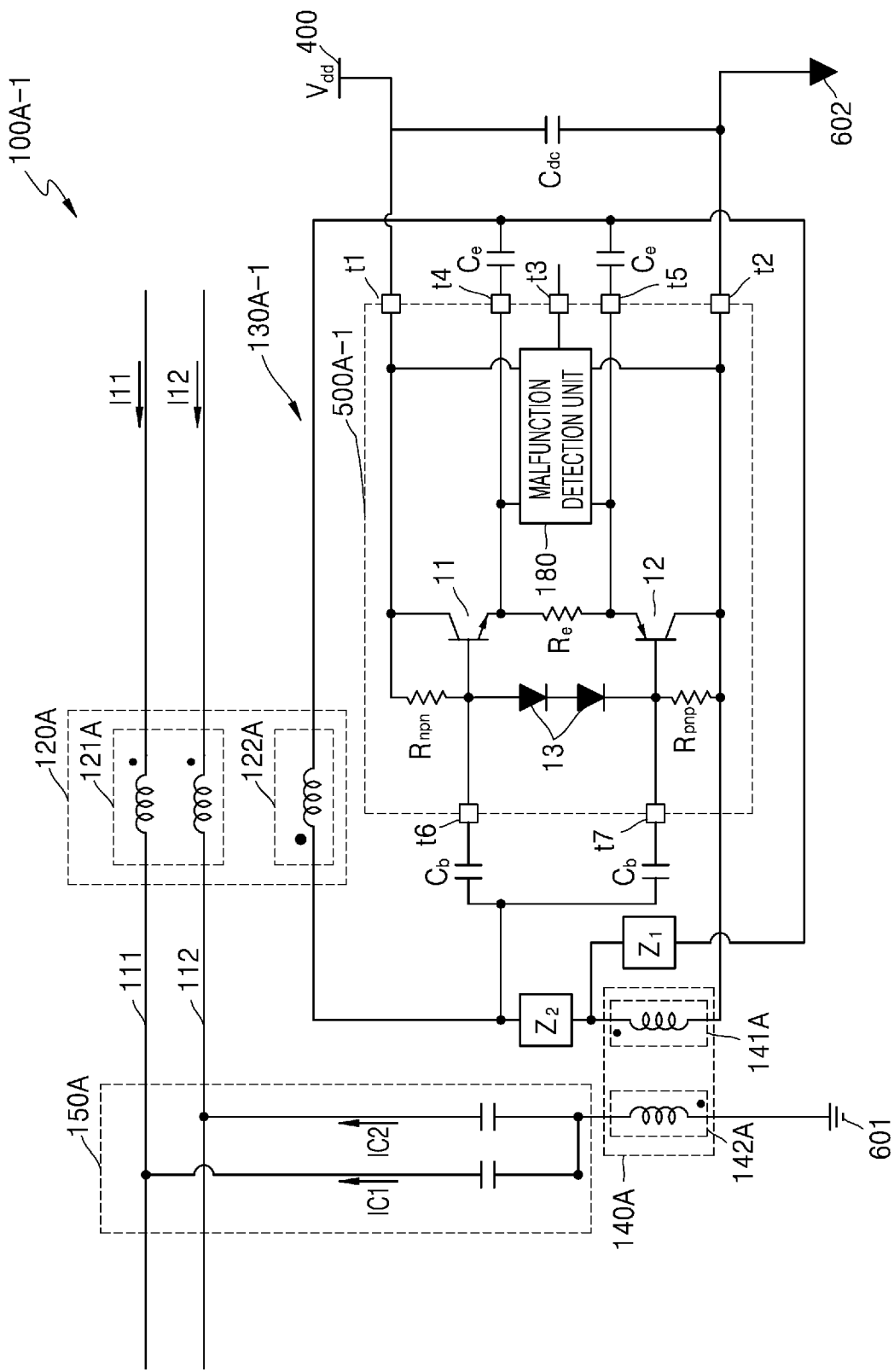
FIG. 4 illustrates a more specific example of the embodiment described with reference to FIG. 3, and schematically illustrates an active current compensation device according to an embodiment of the present disclosure.

FIG. 4 illustrates a more specific example of the embodiment described with reference to FIG. 3, and schematically illustrates an active current compensation device 100A-1 according to an embodiment of the present disclosure. The active current compensation device 100A-1 shown in FIG. 4 is an example of the active current compensation device 100A shown in FIG. 3. An amplification unit 130A-1 included in the active current compensation device 100A-1 is an example of the amplification unit 130 of the active current compensation device 100A.

The amplification unit 130A-1 included in the active current compensation device 100A-1 may include a passive element unit and an active element unit. The passive element unit of the amplification unit 130A-1 may include Cb, Ce, Z1, Z2, and Cdc. The active element unit of the amplification unit 130A-1 may include a first transistor 11, a second transistor 12, a diode 13, Rnpn, Rpnp, and Re.

In an embodiment, the first transistor 11 may be an npn BJT, and the second transistor 12 may be a pnp BJT. For example, the amplification unit 130A-1 may have a push-pull amplifier structure including an npn BJT and a pnp BJT.

An induced current induced in a secondary side 122A by a sensing transformer 120A may be differentially input to the amplification unit 130A-1. Only alternating current (AC) signals may be selectively coupled through Cb and Ce included in the amplification unit 130A-1.

The power supply 400 supplies a DC voltage Vdd, which is based on the second reference potential 602, to drive the amplification unit 130A-1 and a malfunction detection unit 180. Cdc is a DC decoupling capacitor for the DC voltage Vdd, and may be connected in parallel between the power supply 400 and the second reference potential 602. Only AC signals may be coupled between both collectors of the first transistor 11 (e.g., an npn BJT) and the second transistor 12 (e.g., a pnp BJT) through Cdc.

In the active element unit of the amplification unit 130A-1, an operating point of each of the first and second transistors 11 and 12 may be controlled through Rnpn, Rpnp, and Re. Rnpn may connect a collector terminal of the first transistor 11 (e.g., an npn BJT), which is a terminal of the power supply 400, and a base terminal of the first transistor 11 (e.g., npn BJT). Rpnp may connect a collector terminal of the second transistor 12 (e.g., a pnp BJT), which is a terminal of the second reference potential 602, and a base terminal of the second transistor 12 (e.g., a pnp BJT). Re may connect an emitter terminal of the first transistor 11 and an emitter terminal of the second transistor 12.

The secondary side 122A of the sensing transformer 120A according to an embodiment may be connected between a base side and an emitter side of each of the first and second transistors 11 and 12. A primary side 141A of a compensation transformer 140A according to an embodiment may be connected between a collector side and the base side of each of the first and second transistors 11 and 12. Here, the connection includes an indirectly connected case. The amplification unit 130A-1 according to an embodiment may have a regression structure in which an output current is injected back into the base of each of the first and second transistors 11 and 12. Due to the regression structure, the amplification unit 130A-1 may stably obtain a constant current gain for operating the active current compensation device 100A-1.

When an input voltage of the amplification unit 130A-1 has a positive swing of greater than zero due to a noise signal, the first transistor 11 (e.g., an npn BJT) may operate. In this case, an operating current may flow through a first path passing through the first transistor 11. When the input voltage of the amplification unit 130A-1 has a negative swing of less than zero due to a noise signal, the second transistor 12 (e.g., a pnp BJT) may operate. In this case, the operating current may flow through a second path passing through the second transistor 12.

In various embodiments, noise to be compensated for may have a high level depending on the first device 300, and thus it may be desirable to use the power supply 400 with voltage as high as possible. For example, the power supply 400 may be independent of the first device 300 and the second device 200.

As power is supplied from the power supply 400, the nodes of the first transistor 11 and the second transistor 12 may swing greatly in a common mode. For example, voltages at base and emitter nodes of each of the first and second transistors 11 and 12 may swing in a common mode.

By confirming whether the active element unit of the amplification unit 130A-1 operates normally as described above, it is possible to confirm whether the active current compensation device 100A-1 itself operates normally. In other words, it is possible to confirm whether the active current compensation device 100A-1 operates normally by confirming whether a DC bias of the amplification unit 130A-1 is normal.

As described above, since the voltage swings at the nodes of each of the first and second transistors 11 and 12 in a common mode, a malfunction may be detected by sensing only a differential DC voltage between the first transistor 11 and the second transistor 12. That is, in order to detect the malfunction of the amplification unit 130A-1, only the differential DC voltage between the first transistor 11 and the second transistor 12 may be selectively sensed.

For example, when the differential DC voltage between one node of the first transistor 11 and one node of the second transistor 12 satisfies a predetermined condition, the active current compensation device 100A-1 may be determined to be normal.

Accordingly, the malfunction detection unit 180 according to an embodiment may output a signal indicating the malfunction of the amplification unit 130A-1 by using the differential DC voltage between two nodes included in the amplification unit 130A-1.

For example, a differential signal between one node of the first transistor 11 and one node of the second transistor 12 may be input to the malfunction detection unit 180. In an embodiment, the differential signal may be a differential DC voltage between the emitter of the first transistor 11 and the emitter of the second transistor 12.

According to an embodiment, the malfunction detection unit 180 may output a signal indicating a normal state through an output terminal t3 when the differential DC voltage between the emitter of the first transistor 11 and the emitter of the second transistor 12 is in a predetermined range. The malfunction detection unit 180 may output a signal indicating a malfunction state through the output terminal t3 when the differential DC voltage is outside the predetermined range.

In embodiments of the present disclosure, the malfunction detection unit 180 and at least a portion of the amplification unit 130A-1 may be physically integrated into one IC chip 500A-1.

In an embodiment, as shown in FIG. 4, the active element unit of the amplification unit 130A-1 and the malfunction detection unit 180 may be integrated into the single IC chip 500A-1. For example, the first transistor 11, the second transistor 12, the diode 13, Rnpn, Rpnp, and Re of the active element unit and the malfunction detection unit 180 may be integrated into the single IC chip 500A-1. In this case, the IC chip 500A-1 may include a terminal t1 to be connected to the power supply 400, a terminal t2 to be connected to the second reference potential 602, the terminal t3 through which the output signal of the malfunction detection unit 180 is output, and terminals (e.g., t4, t5, t6, and t7) to be connected to the passive element unit. For example, the terminals to be connected to the passive element unit may include the terminal t4 corresponding to the emitter of the first transistor 11 and the terminal t5 corresponding to the emitter of the second transistor 12. In the embodiment described with reference to FIG. 4, two terminals t4 and t5 each corresponding to the emitter may also correspond to differential inputs of the malfunction detection unit 180. Each of the terminals t4 and t5 corresponding to the emitters may be connected to Ce of the passive element unit. In addition, the terminals to be connected to the passive element unit may include the terminal t6 corresponding to the base of the first transistor 11 and the terminal t7 corresponding to the base of the second transistor 12. Each of the terminals t6 and t7 corresponding to the bases may be connected to Cb of the passive element unit.

However, the present disclosure is not limited thereto. In other embodiments, the IC chip 500A-1 may further include at least a portion of the passive element unit of the amplification unit 130A-1. In other embodiments, the IC chip 500A-1 may include all of the active element unit and the passive element unit of the amplification unit 130A-1 and the malfunction detection unit 180.

According to embodiments of the present disclosure, by embedding the malfunction detection unit 180 in the IC chip 500A-1 in which the active element unit of the amplification unit 130A-1 is integrated, it is possible to achieve a reduction in size and price as compared to a case of separately configuring the malfunction detection unit 180 using commonly used commercial elements. In addition, by integrating the malfunction detection unit 180 and at least a portion of the amplification unit 130A-1 into the single IC chip 500A-1, the IC chip 500A-1 or the current compensation device 100A-1 may have versatility as an independent component and may be commercialized.

A detailed description of the malfunction detection unit 180 will be given below with reference to FIGS. 6 to 8.

Figure 5:
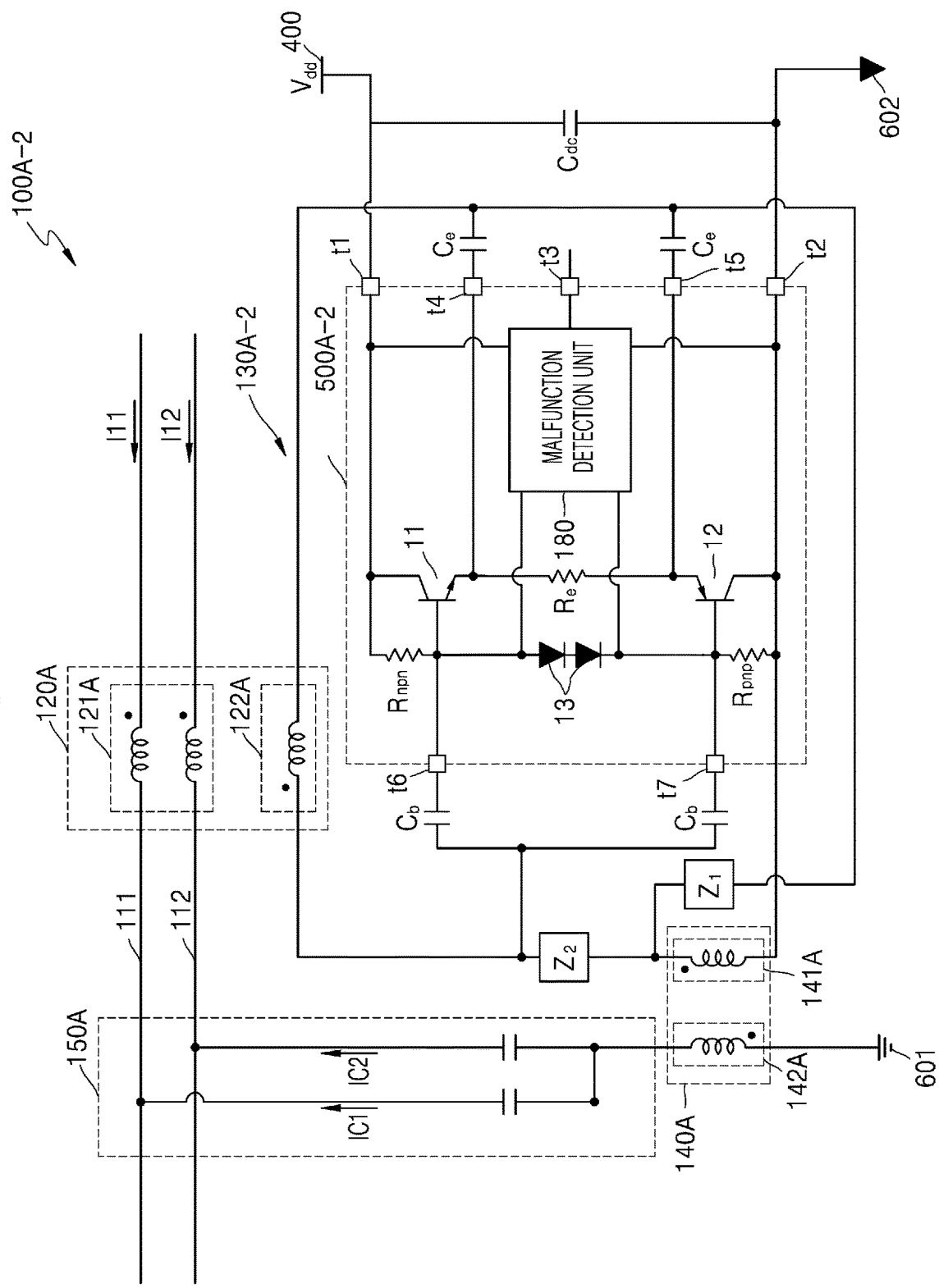
FIG. 5 illustrates another more specific example of the embodiment described with reference to FIG. 3, and schematically illustrates an active current compensation device according to an embodiment of the present disclosure.

FIG. 5 illustrates another more specific example of the embodiment described with reference to FIG. 3, and schematically illustrates an active current compensation device 100A-2 according to an embodiment of the present disclosure. The active current compensation device 100A-2 shown in FIG. 5 is an example of the active current compensation device 100A shown in FIG. 3. An amplification unit 130A-2 included in the active current compensation device 100A-2 is an example of the amplification unit 130 of the active current compensation device 100A.

The amplification unit 130A-2 shown in FIG. 5 corresponds to the amplification unit 130A-1 shown in FIG. 4, but positions (nodes) to which a malfunction detection unit 180 is connected are different. Specifically, in an IC chip 500A-2, a differential DC voltage between a base of a first transistor 11 and a base of a second transistor 12 may be input to the malfunction detection unit 180. Accordingly, since a description of the amplification unit 130A-2 corresponds to the description of the amplification unit 130A-1, the amplification unit 130A-2 will be briefly described.

In an embodiment, a passive element unit of the amplification unit 130A-2 may include Cb, Ce, Z1, Z2, and Cdc. An active element unit of the amplification unit 130A-2 may include the first transistor 11, the second transistor 12, a diode 13, Rnpn, Rpnp, and Re. In an embodiment, the first transistor 11 may be an npn BJT, and the second transistor 12 may be a pnp BJT. For example, the amplification unit 130A-2 may have a push-pull amplifier structure including an npn BJT and a pnp BJT. The amplification unit 130A-2 according to an embodiment may have a regression structure in which an output current is injected back into the base of each of the first and second transistors 11 and 12.

When an input voltage of the amplification unit 130A-2 has a positive swing of greater than zero due to a noise signal, the first transistor 11 (e.g., an npn BJT) may operate. When the input voltage of the amplification unit 130A-2 has a negative swing of less than zero due to a noise signal, the second transistor 12 (e.g., a pnp BJT) may operate.

As power is supplied from the power supply 400, a voltage may swing greatly at base and emitter nodes of each of the first and second transistors 11 and 12 in a common mode. Here, it is possible to confirm whether the active current compensation device 100A-2 operates normally by confirming whether a DC bias of the amplification unit 130A-2 is normal.

As described above, since the voltage swings at the base and emitter nodes of each of the first and second transistors 11 and 12 in a common mode, a malfunction may be detected by sensing only a differential DC voltage between one node of the first transistor 11 and one node of the second transistor 12.

According to the embodiment described with reference to FIG. 5, the differential DC voltage between the base of the first transistor 11 and the base of the second transistor 12 may be input to the malfunction detection unit 180. According to an embodiment, the malfunction detection unit 180 may output a signal indicating a normal state through an output terminal t3 when the differential DC voltage between the base of the first transistor 11 and the base of the second transistor 12 is in a predetermined range. The malfunction detection unit 180 may output a signal indicating a malfunction state through the output terminal t3 when the differential DC voltage between the base of the first transistor 11 and the base of the second transistor 12 is outside the predetermined range.

In embodiments of the present disclosure, the malfunction detection unit 180 and at least a portion of the amplification unit 130A-2 may be physically integrated into the single IC chip 500A-2.

In an embodiment, as shown in FIG. 5, the active element unit of the amplification unit 130A-2 and the malfunction detection unit 180 may be integrated into the single IC chip 500A-2. For example, the first transistor 11, the second transistor 12, the diode 13, Rnpn, Rpnp, and Re of the active element unit and the malfunction detection unit 180 may be integrated into the single IC chip 500A-2. In this case, the IC chip 500A-2 may include a terminal t1 to be connected to the power supply 400, a terminal t2 to be connected to the second reference potential 602, the terminal t3 through which the output signal of the malfunction detection unit 180 is output, and terminals (e.g., t4, t5, t6, and t7) to be connected to the passive element unit. For example, the terminals to be connected to the passive element unit may include the terminal t4 corresponding to an emitter of the first transistor 11 and the terminal t5 corresponding to an emitter of the second transistor 12. Each of the terminals t4 and t5 corresponding to the emitters may be connected to Ce of the passive element unit. In addition, the terminals to be connected to the passive element unit may include the terminal t6 corresponding to the base of the first transistor 11 and the terminal t7 corresponding to the base of the second transistor 12. In the embodiment described with reference to FIG. 5, two terminals t6 and t7 each corresponding to the base may also correspond to differential inputs of the malfunction detection unit 180. Each of the terminals t6 and t7 corresponding to the bases may be connected to Cb of the passive element unit.

However, the present disclosure is not limited thereto. In other embodiments, the IC chip 500A-2 may further include at least a portion of the passive element unit of the amplification unit 130A-2. In other embodiments, the IC chip 500A-2 may include all of the active element unit and the passive element unit of the amplification unit 130A-2 and the malfunction detection unit 180.

A detailed description of the malfunction detection unit 180 will be given below with reference to FIGS. 6 to 8.

In the following, the description of the amplification unit 130 is equally applicable to the amplification units 130A-1 and 130A-2.

Figure 6:
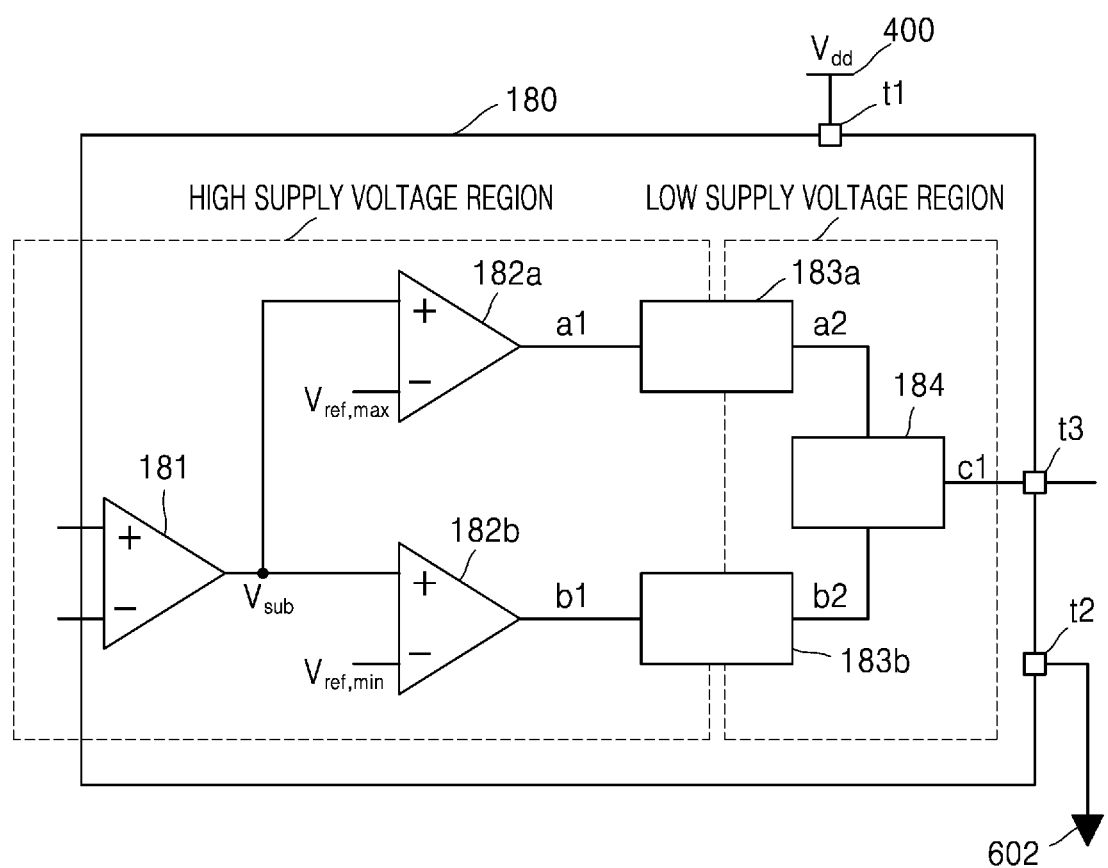
FIG. 6 illustrates a functional configuration of the malfunction detection unit according to an embodiment of the present disclosure.

FIG. 6 illustrates a functional configuration of the malfunction detection unit 180 according to an embodiment of the present disclosure.

Referring to FIG. 6, the malfunction detection unit 180 may include a subtractor 181, a first comparator 182a, a second comparator 182b, a first level shifter 183a, a second level shifter 183b, and a logic circuit 184. However, this is merely an embodiment, the malfunction detection unit 180 of the present disclosure is not limited thereto.

The malfunction detection unit 180 is applicable to the IC chips 500, 500A-1, and 500A-2 according to the various embodiments described above.

In various embodiments, signals of the two nodes included in the amplification unit 130, 130A-1, or 130A-2 may be differentially input to the subtractor 181 of the malfunction detection unit 180. As described above, a signal of one node of the first transistor 11 and a signal of one node of the second transistor 12 may be differentially input to the subtractor 181.

The subtractor 181 may selectively sense only a differential DC voltage between the node of the first transistor 11 and the node of the second transistor 12. Since the subtractor 181 senses a differential voltage at the two nodes, the subtractor 181 may ignore a common mode swing at the two nodes. The subtractor 181 may output the sensed differential DC voltage as a differential DC voltage Vsub.

In an embodiment, in the case of the IC chip 500A-1 shown in FIG. 4, the subtractor 181 may output the differential DC voltage Vsub between the emitter of the first transistor 11 and the emitter of the second transistor 12. In this case, input terminals of the subtractor 181 may share nodes with the emitters of the first and second transistors 11 and 12.

In an embodiment, in the case of the IC chip 500A-2 shown in FIG. 5, the subtractor 181 may output the differential DC voltage Vsub between the base of the first transistor 11 and the base of the second transistor 12. In this case, the input terminals of the subtractor 181 may share nodes with the bases of the first and second transistors 11 and 12.

Meanwhile, a voltage at each input terminal of the subtractor 181 may swing, and the swing may correspond to a magnitude of a rated voltage Vdd of the amplification unit 130. Thus, the subtractor 181 should have a rated voltage corresponding to the rated voltage Vdd of the amplification unit 130. Accordingly, the subtractor 181 may be driven by receiving the supply voltage Vdd of the power supply 400 as it is.

Since the malfunction detection unit 180 should not affect the operation of the amplification unit 130, the subtractor 181 of the malfunction detection unit 180 may have a high input impedance. For example, the subtractor 181 may be configured as a circuit having an input impedance of greater than 10 KOhm.

According to an embodiment, the subtractor 181 may include a rail-to-rail operational amplifier.

The first and second comparators 182a and 182b may detect whether a magnitude of the differential DC voltage Vsub, which is an output of the subtractor 181, is in a predetermined range. When the magnitude of the differential DC voltage Vsub is in the predetermined range, the amplification unit 130 may be determined to be normal, and when the magnitude of the differential DC voltage Vsub is outside the predetermined range, the amplification unit 130 may be determined to be malfunctioning. For example, when the differential DC voltage Vsub is between a maximum reference voltage Vref, max and a minimum reference voltage Vref, min, the amplification unit 130 may be normal. When the differential DC voltage Vsub is higher than the maximum reference voltage Vref, max or lower than the minimum reference voltage Vref, min, the amplification unit 130 may be malfunctioning.

The maximum reference voltage Vref, max and the minimum reference voltage Vref, min may be preset according to various embodiments. Hereinafter, criteria for setting the maximum reference voltage Vref, max and the minimum reference voltage Vref, min will be described.

In the embodiment described with reference to in FIG. 4, the subtractor 181 may sense the differential DC voltage Vsub between the emitter of the first transistor 11 and the emitter of the second transistor 12. When the amplification unit 130 operates normally, the differential DC voltage Vsub may correspond to Ie*Re. Here, Re is a resistor connecting the emitter terminal of the first transistor 11 and the emitter terminal of the second transistor 12, and Ie represents current flowing through Re. Ie and Re may be determined according to the design. In the present embodiment, the maximum reference voltage Vref, max may be set to be higher than Ie*Re by a specified magnitude. The minimum reference voltage Vref, min may be set to be lower than Ie*Re by a specified magnitude.

In the embodiment described with reference to FIG. 5, the subtractor 181 may sense the differential DC voltage Vsub between the base of the first transistor 11 and the base of the second transistor 12. When the amplification unit 130 operates normally, the differential DC voltage Vsub may correspond to Ie*Re+2Vbe, bjt. Here, Re is a resistor connecting the emitter terminal of the first transistor 11 and the emitter terminal of the second transistor 12, and Ie represents current flowing through Re. Ie and Re may be determined according to the design. Vbe, bjt represents voltage between the base and the emitter of the first transistor 11 or the second transistor 12. In the present embodiment, the maximum reference voltage Vref, max may be set to be higher than Ie*Re+2Vbe, bjt by a specified magnitude. The minimum reference voltage VREF, MIN may be set to be lower than Ie*Re+2Vbe, bjt by a specified magnitude. For example, the maximum reference voltage Vref, max may be set to 2 V and the minimum reference voltage Vref, min may be set to 1.4 V. However, the present disclosure is not limited thereto.

The first comparator 182a may output a first signal a1 indicating whether the differential DC voltage Vsub is lower than the maximum reference voltage Vref, max. The second comparator 182b may output a second signal b1 indicating whether the differential DC voltage Vsub is higher than the minimum reference voltage Vref, min.

Meanwhile, a high voltage may still exist at the input terminal of each of the first and second comparators 182a and 182b, and thus the first and second comparators 182a and 182b may each have a rated voltage corresponding to the rated voltage Vdd of the amplification unit 130. Accordingly, the first and second comparators 182a and 182b may be driven by receiving the supply voltage Vdd of the power supply 400 as it is.

According to an embodiment, the first and second comparators 182a and 182b may include an open-loop two-stage operational amplifier.

The first and second level shifters 183a and 183b may lower voltages of the output signals of the comparators 182a and 182b, respectively.

Since a gate voltage of a metal oxide semiconductor field effect transistor (MOSFET) included in the logic circuit 184 is lower than the rated voltage Vdd of each of the comparators 182a and 182b, the first and second signals a1 and b1 may be input to the logic circuit 184 after the voltage thereof is lowered. Accordingly, by using the level shifters 183a and 183b, only the voltage level of the first and second signals a1 and b1 may be lowered while a sign thereof is maintained.

The first signal a1 output from the first comparator 182a may be input to the first level shifter 183a. The first level shifter 183a may output a third signal a2 by lowering the voltage level of the first signal a1.

The second signal b1 output from the second comparator 182b may be input to the second level shifter 183b. The second level shifter 183b may output a fourth signal b2 by lowering the voltage level of the second signal b1.

A rated voltage of an input terminal of each of the level shifters 183a and 183b may correspond to the supply voltage Vdd of the power supply 400. A rated voltage of an output terminal of each of the level shifters 183a and 183b may be lower than the supply voltage Vdd.

For example, the supply voltage Vdd of the power supply 400 may be 12 V, and the rated voltage of the output terminal of each of the level shifters 183a and 183b may be 5 V.

The third signal a2 and the fourth signal b2 may be input to the logic circuit 184. The logic circuit 184 may use the third signal a2 and the fourth signal b2 to output a fifth signal c1 indicating whether the differential DC voltage Vsub is between the maximum reference voltage Vref, max and the minimum reference voltage Vref, min. The fifth signal c1 may be a digital signal of "0" or "1." For example, when the fifth signal c1 indicates "0," the amplification unit 130 may be in a normal state, and when the fifth signal c1 indicates "1," the amplification unit 130 may be in a malfunction state. Of course, the reverse of the above description may be possible.

Figure 7:
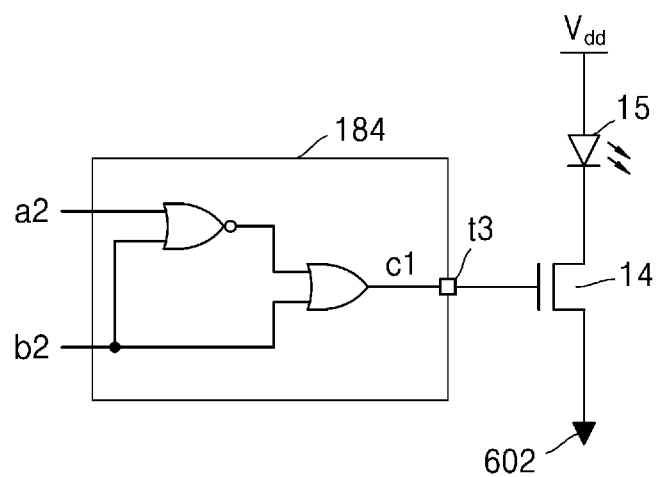
FIG. 7 is a schematic view of a logic circuit according to an embodiment of the present disclosure.

FIG. 7 is a schematic view of the logic circuit 184 according to an embodiment of the present disclosure.

Referring to FIG. 7, the third signal a2, which is an output of the first level shifter 183a, and the fourth signal b2, which is an output of the second level shifter 183b, may be input to the logic circuit 184. The logic circuit may output the fifth signal c1 on the basis of inputs of the third signal a2 and the fourth signal b2. For example, the logic circuit 184 may have a truth table as shown in Table 1 below.

TABLE 1

| Inputs | | Outputs |
|---|---|---|
| a2 | b2 | c1 |
| 0 | 0 | 1 |
| 0 | 1 | 1 |

TABLE 1-continued

| Inputs | | Outputs |
|---|---|---|
| a2 | b2 | c1 |
| 1 | 0 | 0 |
| 1 | 1 | 1 |

In an embodiment, the first comparator 182a may output a high signal indicating "1" when the differential DC voltage Vsub is less than the maximum reference voltage Vref, max. In this case, since the first signal a1 indicates "1," the third signal a2 may also indicate "1."

In an embodiment, the second comparator 182b may output a low signal indicating "0" when the differential DC voltage Vsub is greater than the minimum reference voltage Vref, min. In this case, since the second signal b1 indicate "0," the fourth signal b2 may also indicate "0."

According to the above-described embodiment, when the fifth signal c1 in Table 1 indicates "0," the amplification unit 130 is determined to operate normally. When the fifth signal c1 indicates "1," the amplification unit 130 is determined to be malfunctioning.

However, the logic circuit 184 and the truth table shown in FIG. 7 are merely examples, and the present disclosure is not limited thereto. According to various embodiments, the malfunction detection unit 180 may be designed to output the fifth signal c1 indicating whether the amplification unit 130 is malfunctioning.

Referring to FIG. 7, a light-emitting diode (LED) driver 14 may be connected to the output terminal t3 of the logic circuit 184. The LED driver 14 may drive an LED 15 outside the IC chip 500 on the basis of the fifth signal c1.

For example, when the fifth signal c1 indicates "1," the LED driver 14 may turn on the external LED 15. The turned-on external LED 15 may indicate a malfunction state. When the fifth signal c1 indicates "0," the LED driver 14 may turn off the external LED 15. The turned-off external LED 15 may indicate a normal state.

The logic circuit 184 may be provided as a small size MOSFET for efficiency. The fifth signal c1, which is an output of the logic circuit 184, may have, for example, a magnitude of 0 V or more and 5 V or less. The LED driver 14 connected to the output terminal t3 of the logic circuit 184 may be, for example, an N-type metal-oxide-semiconductor (NMOS) LED driver.

Meanwhile, as described above, the output terminal of each of the level shifters 183a and 183b and the logic circuit 184 may have a rated voltage lower than that of the input terminal of each of the subtractor 181, the comparators 182a and 182b, and the level shifters 183a and 183b.

Accordingly, supply voltage Vdd may be supplied to the input terminal each of the subtractor 181, the comparators 182a and 182b, and the level shifters 183a and 183b. A supply voltage lower than supply voltage Vdd may be supplied to the logic circuit 184 and the output terminals of the level shifters 183a and 183b. As an example, the input terminal of each of the subtractor 181, the comparators 182a and 182b, and the level shifters 183a and 183b may be driven by 12 V. The logic circuit 184 and the output terminals of the level shifters 183a and 183b may be driven by the voltage of 5 V. Accordingly, referring to FIG. 6, the input terminals of the subtractor 181, the comparators 182a and 182b, and the level shifters 183a and 183b are illustrated as being included in a high supply voltage region, and the logic circuit 184 and the output terminals of the level shifters 183a and 183b are illustrated as being included in a low supply voltage region. The high supply voltage region and the low supply voltage region are terms used to distinguish between components driven by a high supply voltage and components driven by a low supply voltage, rather than representing actual physical regions.

Figure 8:
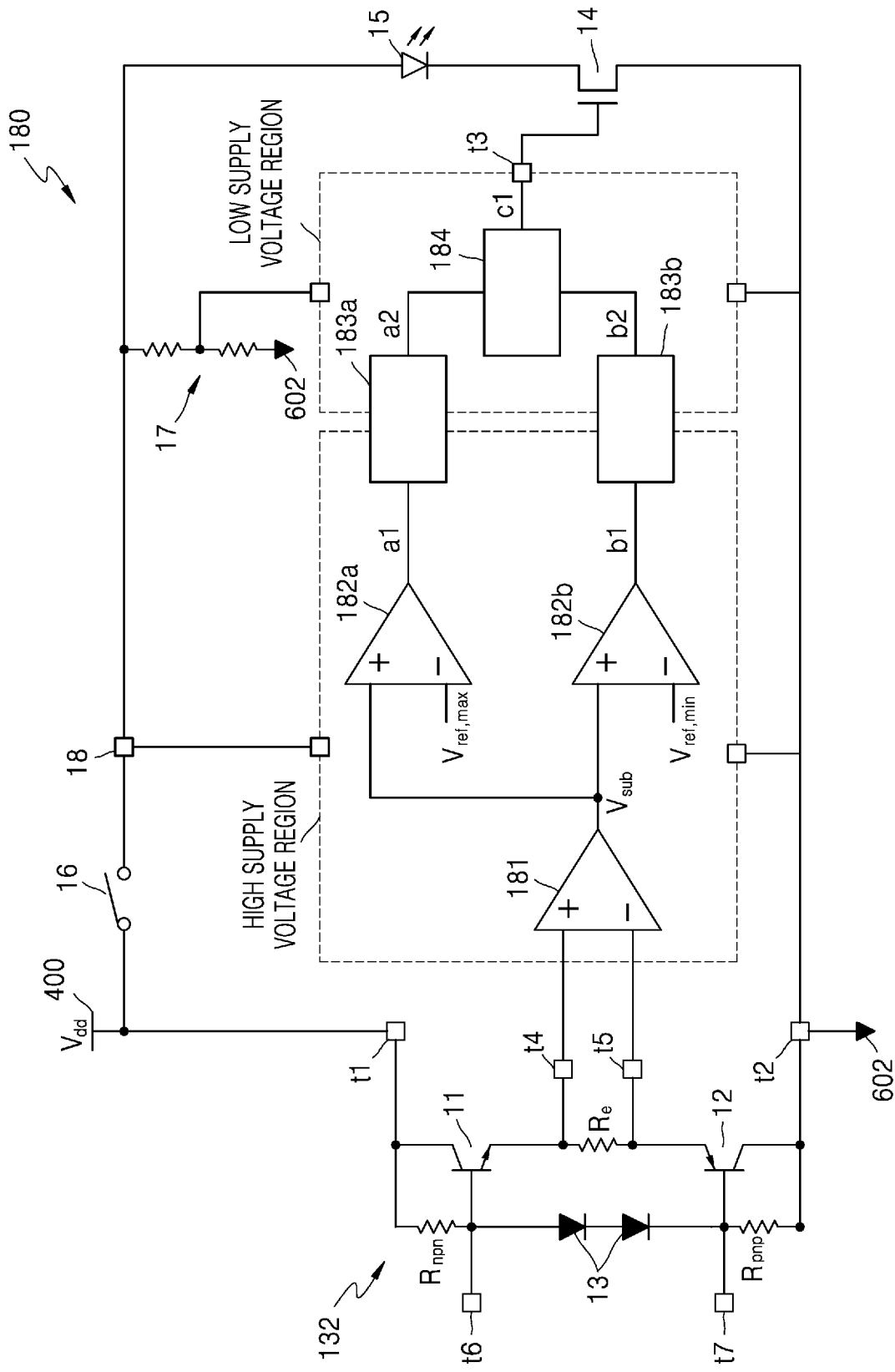
FIG. 8 is a circuit diagram of an active element unit and the malfunction detection unit according to an embodiment of the present disclosure.

FIG. 8 is a circuit diagram of an active element unit 132 and a malfunction detection unit 180 according to an embodiment of the present disclosure.

Referring to FIG. 8, the active element unit 132 of the amplification unit 130 may include a first transistor 11, a second transistor 12, a diode 13, Rnpn, Rpnp, and Re.

The malfunction detection unit 180 may include a subtractor 181, first and second comparators 182a and 182b, first and second level shifters 183a and 183b, and a logic circuit 184. The malfunction detection unit 180 may further include an LED driver 14 at an output terminal of the logic circuit 184.

Since the malfunction detection unit 180 should not affect an operation of the amplification unit 130 including the active element unit 132, the subtractor 181 of the malfunction detection unit 180 may have a high input impedance.

The malfunction detection unit 180 may only operate when a malfunction test is required without having to always operate. Accordingly, in order to reduce unnecessary power consumption, a switch 16 may be provided to selectively turn off only the malfunction detection unit 180.

The switch 16 may be present outside an IC chip 500. The IC chip 500 may further include a separate terminal t8 to selectively supply power to the malfunction detection unit 180 on the basis of the state of the switch 16. The switch 16 may be connected between the power supply 400 and the terminal t8.

Meanwhile, the malfunction detection unit 180 may include components driven by a high supply voltage and components driven by a low supply voltage. For example, input terminals of the subtractor 181, the comparators 182a and 182b, and the level shifters 183a and 183b may be driven by the high supply voltage Vdd. The logic circuit 184 and output terminals of the level shifters 183a and 183b may be driven by a voltage lower than the supply voltage Vdd due to a voltage dividing circuit 17.

In an embodiment, the active element unit 132 and the malfunction detection unit 180 may be physically integrated into the single IC chip 500. For example, the IC chip 500 may include a terminal t1 to be connected to the power supply 400, a terminal t2 to be connected to the second reference potential 602, and an output terminal t3 of the malfunction detection unit 180, terminals (e.g., t4, t5, t6, and t7) to be connected to a passive element unit, and the terminal t8 used for turning on/off the operation of the malfunction detection unit 180.

Meanwhile, the embodiment in which an emitter node of each of the first and second transistors 11 and 12 is connected to the input terminal of the subtractor 181 is illustrated in FIG. 8, but according to an embodiment, a base node of each of the first and second transistors 11 and 12 may be connected to the input terminal of the subtractor 181.

FIG. 9 schematically illustrates a configuration of an active current compensation device 100B according to an embodiment of the present disclosure. Hereinafter, descriptions of contents overlapping with contents described with reference to FIGS. 1 to 8 will be omitted.

Referring to FIG. 9, the active current compensation device 100B may actively compensate for first currents I11, I12, and I13 input as a common-mode current with respect to each of first through third high-current paths 111B, 112B, and 113B connected to the first device 300.

To this end, the active current compensation device 100B according to an embodiment of the present disclosure may include first through third high-current paths 111B, 112B, and 113B, a sensing transformer 120B, an amplification unit 130B, a malfunction detection unit 180, a compensation transformer 140B, and a compensation capacitor unit 150B.

When it is described in comparison with the active current compensation devices 100A, 100A-1, and 100A-2 according to the above-described embodiments, the active current compensation device 100B according to the embodiment described with reference to FIG. 9 includes first through third high-current paths 111B, 112B, and 113B and thus has differences in the sensing transformer 120B and the compensation capacitor unit 150B. Thus, the active current compensation device 100B will now be described below focusing on differences described above.

The active current compensation device 100B may include a first high-current path 111B, a second high-current path 112B, and a third high-current path 113B that are distinguished from each other. According to an embodiment, the first high-current path 111B may be an R-phase power line, the second high-current path 112B may be an S-phase power line, and the third high-current path 113B may be a T-phase power line. The first currents I11, I12, and I13 may be input as a common-mode current with respect to each of the first high-current path 111B, the second high-current path 112B, and the third high-current path 113B.

A primary side 121B of the sensing transformer 120B may be disposed in each of the first to third high-current paths 111B to 113B to generate an induced current in a secondary side 122B. Magnetic flux densities generated by the sensing transformer 120B due to the first currents I11, I12, and I13 on the first through third high-current paths 111B, 112B, and 113B may be reinforced with each other.

Meanwhile, in the active current compensation device 100B, the amplification unit 130B may be implemented as one of the amplification units including the amplification unit 130A-1 and the amplification unit 130A-2. FIG. 9 illustrates the amplification unit 130B corresponding to the amplification unit 130A-1 as an example.

The malfunction detection unit 180 and at least a portion of the amplification unit 130B may be physically integrated into one IC chip 500B. For example, as shown in FIG. 9, an active element unit of the amplification unit 130B and the malfunction detection unit 180 may be integrated into the single IC chip 500B. The active element unit may include, for example, a first transistor 11, a second transistor 12, a diode 13, Rnpn, Rpnp, and Re. However, the present disclosure is not limited thereto, and at least some components of a passive element unit including Cb, Ce, Z1, Z2, and Cdc may also be integrated into the IC chip 500B.

Meanwhile, FIG. 9 illustrates an embodiment in which a voltage of an emitter node of the first transistor 11 and a voltage of an emitter node of the second transistor 12 are differentially input to the malfunction detection unit 180. However, the present disclosure is not limited thereto, and according to an embodiment, the voltage of a base node of the first transistor 11 and a voltage of a base node of the second transistor 12 may be differentially input to the malfunction detection unit 180. The first transistor 11 may be an npn BJT, and the second transistor 12 may be a pnp BJT.

The IC chip 500B may include a terminal t1 to be connected to the power supply 400, a terminal t2 to be connected to the second reference potential 602, a terminal t3 through which an output signal of the malfunction detection unit 180 is output, and terminals (e.g., t4, t5, t6, and t7) to be connected to the passive element unit. However, the present disclosure is not limited thereto, and according to an embodiment, as shown in FIG. 8, the IC chip 500B may further include a terminal t8 to be connected to a switch 16 for selectively supplying power to the malfunction detection unit 180. In this case, the switch 16 may be connected between the power supply 400 and the terminal t8.

Although not shown in FIG. 9, according to an embodiment, as shown in FIG. 8, an LED driver 14 and an external LED 15 may be connected to the output terminal t3 of the malfunction detection unit 180. The external LED 15 may indicate a normal or malfunction state of the active current compensation device 100B.

Meanwhile, the compensation capacitor unit 150B may provide paths through which compensation currents IC1, IC2, and IC3 generated by the compensation transformer 140B flow to the first to third high-current paths 111B to 113B, respectively.

The active current compensation device 100B may further include a decoupling capacitor unit 170B on an output side thereof (i.e., the second device 200 side). One ends of capacitors included in the decoupling capacitor unit 170B may be connected to the first high-current path 111B, the second high-current path 112B, and the third high-current path 113B, respectively. The opposite end of each of the capacitors may be connected to the first reference potential 601 of the current compensation device 100B.

The decoupling capacitor unit 170B may prevent the performance of outputting the compensation current of the active current compensation device 100B from being significantly changed according to a change in an impedance value of the second device 200. An impedance ZY of the decoupling capacitor unit 170B may be designed to have a value less than a value specified in a first frequency band for which noise reduction is to be performed. As the decoupling capacitor unit 170B is coupled, the current compensation device 100B may be used as an independent module in any system (e.g., a three-phase three-wire system).

According to an embodiment, the decoupling capacitor unit 170B may be omitted from the active current compensation device 100B.

The active current compensation device 100B according to the embodiment described above may be used to compensate (or cancel) for the first currents I11, I12, and I13 traveling from a load of a three-phase three-wire power system to a power source.

Of course, according to the technical spirit of the present disclosure, the active current compensation device according to various embodiments may be modified to be also applicable to a three-phase four-wire system.

The active current compensation devices 100, 100A, 100A-1, 100A-2, and 100B according to various embodiments have little increase in size and heat generation, in high-power systems as compared with passive EMI filters. By integrating the active element unit and the malfunction detection unit into the single IC chip 500, 500A-1, 500A-2, or 500B, the IC chip 500, 500A-1, 500A-2, or 500B may have versatility as an independent component and may be commercialized. In addition, the current compensation device 100, 100A, 100A-1, 100A-2, or 100B respectively including the IC chip 500, 500A-1, 500A-2, or 500B may also be manufactured as an independent module and commercialized. The current compensation device 100, 100A, 100A-1, 100A-2, or 100B may detect a malfunction as an independent module regardless of the characteristics of a peripheral electrical system.

Figure 10:
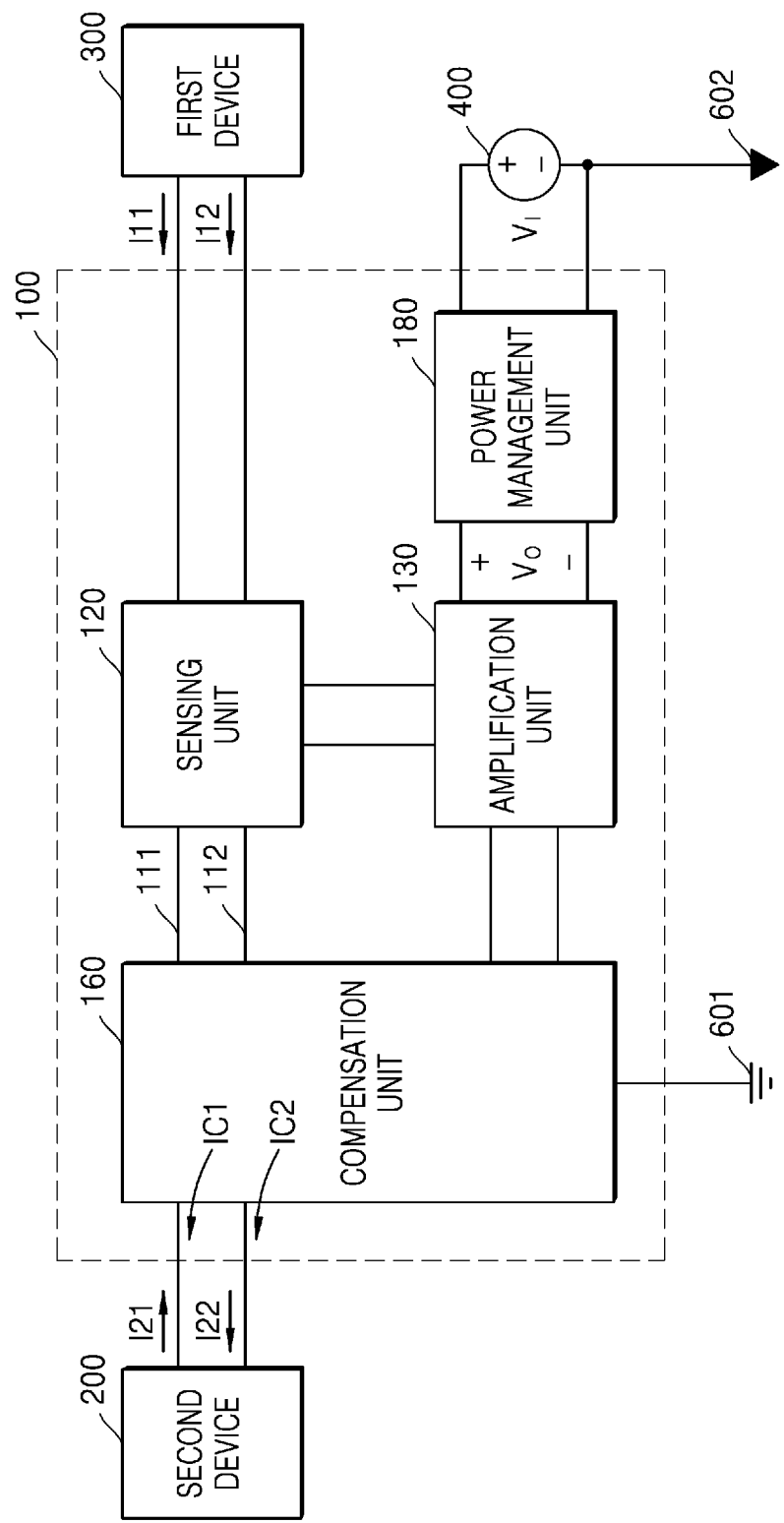
FIG. 10 schematically illustrates a configuration of a system including an active current compensation device according to an embodiment of the present disclosure.

[2] Active Current Compensation Device Including Power Conversion Unit Embedded Therein FIG. 10 schematically illustrates a configuration of a system including an active current compensation device 100 according to an embodiment of the present disclosure. The active current compensation device 100 may actively compensate for first currents I11 and I12 (e.g., EMI noise current) that are input as a common-mode current through two or more high-current paths 111 and 112 from a first device 300.

Referring to FIG. 10, the active current compensation device 100 may include a sensing unit 120, an amplification unit 130, a power management unit 180, and a compensation unit 160.

In the present specification, the first device 300 may be any of various types of power systems using power supplied by a second device 200. For example, the first device 300 may be a load that is driven using the power supplied by the second device 200. In addition, the first device 300 may be a load (e.g., an electric vehicle) that stores energy using the power supplied by the second device 200 and is driven using the stored energy. However, the present disclosure is not limited thereto.

In the present specification, the second device 200 may be any of various types of systems for supplying power to the first device 300 in the form of current and/or voltage. The second device 200 may be a device that supplies stored energy. However, the present disclosure is not limited thereto.

A power converter may be located on the first device 300 side. For example, the first currents I11 and I12 may be input to the current compensation device 100 due to a switching operation of the power converter. That is, the first device 300 side may correspond to a noise source and the second device 200 side may correspond to a noise receiver.

The two or more high-current paths 111 and 112 may be paths for transmitting the power supplied from the second device 200, that is, second currents I21 and I22, to the first device 300, for example, may be power lines. For example, the two or more high-current paths 111 and 112 may be a live line and a neutral line. At least some portions of the high-current paths 111 and 112 may pass through the current compensation device 100. The second currents I21 and I22 may be an alternating current having a frequency of a second frequency band. The second frequency band may be, for example, a band having a range of 50 Hz to 60 Hz.

Further, the two or more high-current paths 111 and 112 may also be paths through which noise generated by the first device 300, that is, the first currents I11 and I12, is transmitted to the second device 200. The first currents I11 and I12 may be input as a common-mode current with respect to each of the two or more high-current paths 111 and 112. The first currents I11 and I12 may be currents that are unintentionally generated in the first device 300 due to various causes. For example, the first currents I11 and I12 may be noise currents generated by virtual capacitance between the first device 300 and the surrounding environment. Alternatively, the first currents I11 and I12 may be noise currents generated due to a switching operation of the power converter of the first device 300. The first currents I11 and I12 may be currents having a frequency of a first frequency band. The first frequency band may be a frequency band higher than the second frequency band described above. The first frequency band may be, for example, a band having a range of 150 KHz to 30 MHz.

Figure 16:
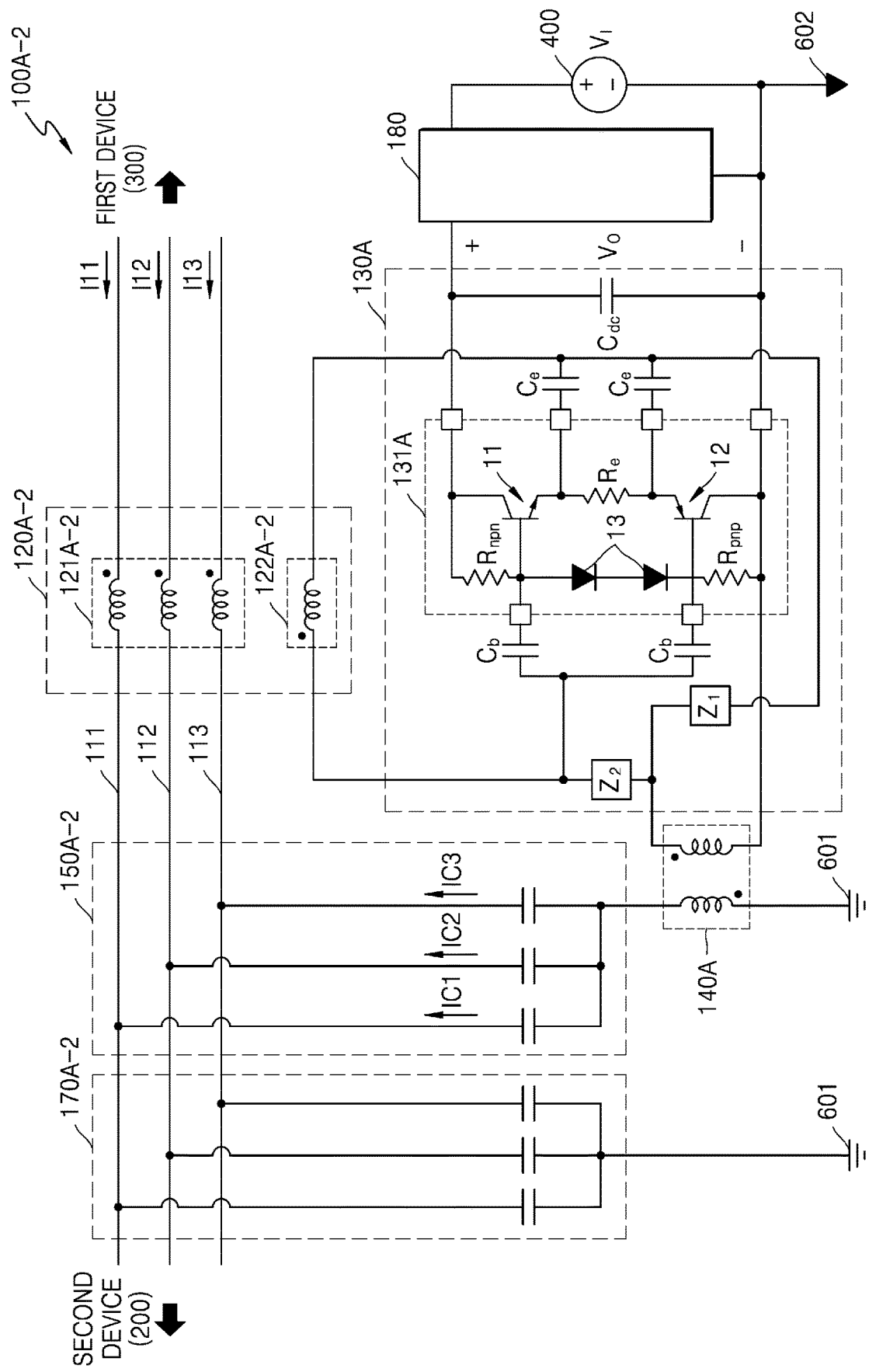
FIG. 16 schematically illustrates a configuration of an active current compensation device according to an embodiment of the present disclosure.

Meanwhile, the two or more high-current paths 111 and 112 may include two paths as shown in FIG. 10, or may include three paths as shown in FIG. 16. In addition, the two or more high-current paths 111 and 112 may include four paths. The number of the high-current paths 111 and 112 may vary depending on the type and/or form of power used by the first device 300 and/or the second device 200.

The sensing unit 120 may sense the first currents I11 and I12 on the two or more high-current paths 111 and 112 and generate an output signal corresponding to the first currents I11 and I12. That is, the sensing unit 120 may refer to a component that senses the first currents I11 and I12 on the high-current paths 111 and 112. In order for the sensing unit 120 to sense the first currents I11 and I12, at least some portion of the high-current paths 111 and 112 may pass through the sensing unit 120, but a portion of the sensing unit 120, which generates an output signal according to the sensing, may be isolated from the high-current paths 111 and 112. For example, the sensing unit 120 may be implemented as a sensing transformer. The sensing transformer may sense the first currents I11 and I12 on the high-current paths 111 and 112 in a state of being isolated from the high-current paths 111 and 112. However, the sensing unit 120 is not limited to the sensing transformer.

According to an embodiment, the sensing unit 120 may be differentially connected to input terminals of the amplification unit 130.

The amplification unit 130 may be electrically connected to the sensing unit 120, and may amplify the output signal output from the sensing unit 120 to generate an amplified output signal. The term "amplification" by the amplification unit 130, as used herein, may mean that the magnitude and/or phase of an object to be amplified is adjusted. The amplification unit 130 may be implemented by various components, and may include active elements. In an embodiment, the amplification unit 130 may include BJTs. For example, the amplification unit 130 may include a plurality of passive elements, such as resistors and capacitors, in addition to the BJTs. However, the present disclosure is not limited thereto, and the component for the "amplification" described in the present disclosure may be used without being limited to the amplification unit 130 of the present disclosure.

According to an embodiment, a second reference potential 602 of the amplification unit 130 and a first reference potential 601 of the current compensation device 100 may be distinguished from each other. For example, when the amplification unit 130 is isolated from the high-current paths 111 and 112, the second reference potential 602 of the amplification unit 130 and the first reference potential 601 of the current compensation device 100 may be distinguished from each other.

However, the present disclosure is not limited thereto. For example, when the amplification unit 130 is not isolated from the high-current paths 111 and 112, the reference potential of the amplification unit and the reference potential of the current compensation device may not be distinguished from each other.

The amplification unit 130 may receive power from a power supply 400 that is distinguished from the first device 300 and/or the second device 200. The amplification unit 130 may receive the power from the power supply 400, and amplify the output signal output from the sensing unit 120 to generate an amplified current.

The power supply 400 may be, for example, a device that receives power from any one of the first device 300 and the second device 200 and generates input power of the amplification unit 130. The power supply 400 may be, for example, a switching mode power supply (SMPS) of the first device 300 or the second device 200. The power supply 400 may output a DC voltage VI based on the second reference potential 602. The output voltage VI of the power supply 400 may be used to drive the amplification unit 130.

Meanwhile, there is an optimized DC voltage level required for the amplification unit 130, but the power supply 400 may not be able to output the optimized voltage level required for the amplification unit 130. Specifically, the output DC voltage VI of the power supply 400 may vary depending on the system (e.g., the first device 300 or the second device 200). For example, although the optimal supply voltage of the amplification unit 130 is 12 V, the output voltage VI of the power supply 400 may vary depending on the system, such as 15 V, 24 V, 48 V, or the like. Thus, when the output voltage VI of the power supply 400 is directly supplied to the amplification unit 130, the amplification unit 130 may be unstable in operation or cause a malfunction.

Accordingly, the active current compensation device 100 according to an embodiment of the present disclosure may include the power management unit 180 between the amplification unit 130 and the power supply 400. The power management unit 180 may receive the voltage VI output from the power supply 400 and convert the voltage VI into an output voltage VO. The output voltage VO of the power management unit 180 may be input to the amplification unit 130. VI may vary as 15 V, 24V, 48V, or the like depending on the system, but VO is a value fixed to the optimized voltage level required for the amplification unit 130.

The power management unit 180 may be a DC-DC converter. The power management unit 180 may be a power management IC (PMIC).

According to an embodiment of the present disclosure, at least a portion of the amplification unit 130 and at least a portion of the power management unit 180 may be integrated into one IC chip. For example, by embedding at least a portion of the amplification unit 130 and at least a portion of the power management unit 180 into the single IC chip, the IC chip may have versatility as an independent component and may be commercialized.

The compensation unit 160 may generate compensation currents IC1 and IC2 on the basis of the amplified output signal generated by the amplification unit 130. An output side of the compensation unit 160 may be connected to the high-current paths 111 and 112 to allow the compensation currents IC1 and IC2 to flow to the high-current paths 111 and 112.

According to an embodiment, the output side of the compensation unit 160 may be isolated from the amplification unit 130. For example, the compensation unit 160 may include a compensation transformer for the isolation. For example, the output signal of the amplification unit 130 may flow through a primary side of the compensation transformer, and the compensation current based on the output signal may be generated on a secondary side of the compensation transformer.

However, the present disclosure is not limited thereto. According to an embodiment, the output side of the compensation unit 160 may also be isolated from the amplification unit 130. In this case, the amplification unit 130 may not be isolated from the high-current paths 111 and 112.

In order to cancel the first currents I11 and I12, the compensation unit 160 may inject the compensation currents IC1 and IC2 into the high-current paths 111 and 112 through the two or more high-current paths 111 and 112, respectively. The compensation currents IC1 and IC2 may have the same magnitude and an opposite phase compared to the first currents I11 and I12.

Figure 11:
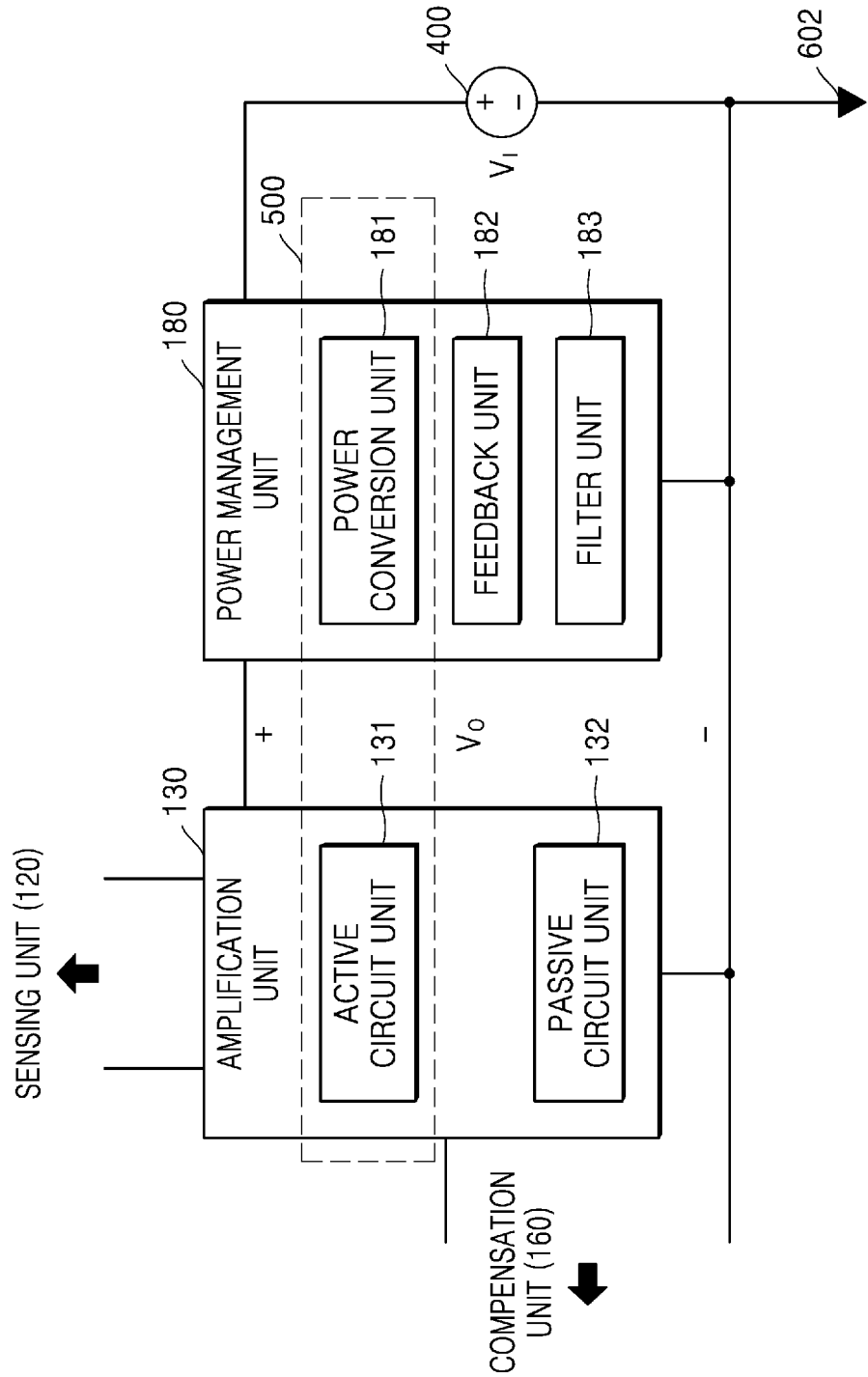
FIG. 11 illustrates an example of a functional configuration of an amplification unit and a power management unit according to an embodiment of the present disclosure.

FIG. 11 illustrates an example of a functional configuration of the amplification unit 130 and the power management unit 180 according to an embodiment of the present disclosure.

Referring to FIG. 11, the amplification unit 130 may include an active circuit unit 131 and a passive circuit unit 132. The passive circuit unit 132 includes only passive elements, and the active circuit unit 131 includes active elements. The active circuit unit 131 may further include passive elements as well as the active elements. Examples of a detailed configuration of the amplification unit 130 including the active circuit unit 131 and the passive circuit unit 132 will be described below with reference to FIG. 13.

The power management unit 180 may include a power conversion unit 181, a feedback unit 182, and a filter unit 183. The power conversion unit 181 may convert the arbitrary input voltage VI into the output voltage VO. The feedback unit 182 is a feedback control system that allows the same output voltage VO to be output even when the arbitrary input voltage VI is input. The filter unit 183 is a DC voltage/current filter. The filter unit 183 may be located at an input terminal or an output terminal of the power management unit 180. Examples of a detailed configuration of the power management unit 180 will be described below with reference to FIGS. 14 and 15.

According to an embodiment, the active circuit unit 131 of the amplification unit 130 and the power conversion unit 181 of the power management unit 180 may be physically integrated into one IC chip 500. However, this is merely an embodiment, and in other embodiments, at least some elements of the active circuit unit 131, the power management unit 180, and the feedback unit 182 may be physically integrated into the single IC chip 500. Of course, in other embodiments, all of the amplification unit 130 and the power management unit 180 may be physically integrated into the single IC chip 500.

The power management unit 180 may include active elements. Here, a reference potential of the power management unit 180 may be equal to the second reference potential 602, which is a reference potential of the amplification unit 130. The reference potential of the power management unit 180 may be different from the first reference potential 601, which is a reference potential of the current compensation device 100 (e.g., a reference potential of the compensation unit 160).

The amplification unit 130 may receive power from the power supply 400 through the power management unit 180. The amplification unit 130 may receive the output voltage VO of the power management unit 180, and amplify the output signal output by the sensing unit 120 to generate the amplified current. The amplified current may be input to the compensation unit 160.

Figure 12:
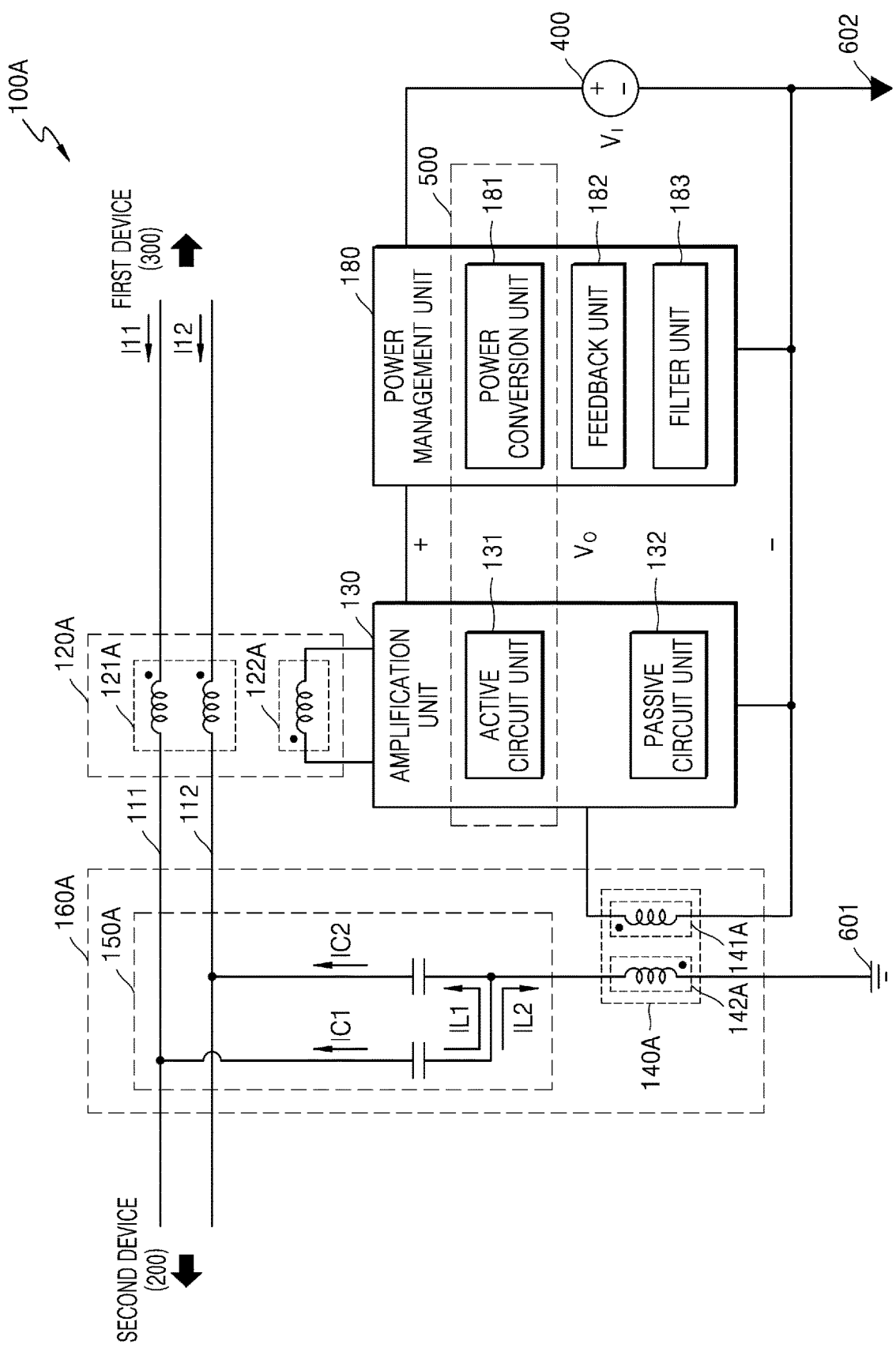
FIG. 12 illustrates a more specific example of the embodiment described with reference to FIG. 10, and schematically illustrates an active current compensation device according to an embodiment of the present disclosure.

FIG. 12 illustrates a more specific example of the embodiment described with reference to FIG. 10, and schematically illustrates an active current compensation device 100A according to an embodiment of the present disclosure. The active current compensation device 100A may actively compensate for first currents I11 and I12 (e.g., a noise current) input as a common-mode current with respect to each of two high-current paths 111 and 112 connected to the first device 300.

Referring to FIG. 12, the active current compensation device 100A may include a sensing transformer 120A, an amplification unit 130, and a compensation unit 160A.

In an embodiment, the sensing unit 120 described above may include the sensing transformer 120A. In this case, the sensing transformer 120A may be a component for sensing the first currents I11 and I12 on the high-current paths 111 and 112 in a state of being isolated from the high-current paths 111 and 112. The sensing transformer 120A may sense the first currents I11 and I12 that are noise currents input through the high-current paths 111 and 112 (e.g., power lines) from the first device 300 side.

The sensing transformer 120A may include a primary side 121A disposed on the high-current paths 111 and 112 and a secondary side 122A differentially connected to input terminals of the amplification unit 130. The sensing transformer 120A may generate an induced current, which is directed to the secondary side 122A (e.g., a secondary winding), on the basis of magnetic flux densities induced due to the first currents I11 and I12 at the primary side 121A (e.g., a primary winding) disposed on the high-current paths 111 and 112. The primary side 121A of the sensing transformer 120A may be, for example, a winding in which each of a first high-current path 111 and a second high-current path 112 is wound around one core. However, the present disclosure is not limited thereto, and the primary side 121A of the sensing transformer 120A may have a form in which the first high-current path 111 and the second high-current path 112 pass through the core.

Specifically, the sensing transformer 120A may be configured such that the magnetic flux density induced due to the first current I11 on the first high-current path 111 (e.g., a live line) and the magnetic flux density induced due to the first current I12 on the second high-current path 112 (e.g., neutral line) are overlapped (or reinforced) with each other. In this case, the second currents I21 and I22 also flow through the high-current paths 111 and 112, and thus the sensing transformer 120A may be configured such that a magnetic flux density induced due to the second current I21 on the first high-current path 111 and a magnetic flux density induced due to the second current I22 on the second high-current path 112 cancel each other. In addition, as an example, the sensing transformer 120A may be configured such that magnitudes of the magnetic flux densities, which are induced due to the first currents I11 and I12 of a first frequency band (e.g., a band having a range of 150 KHz to 30 MHz), are greater than magnitudes of the magnetic flux densities induced due to the second currents I21 and I22 of a second frequency band (for example, a band in a range of 50 Hz to 60 Hz).

As described above, the sensing transformer 120A may be configured such that the magnetic flux densities induced due to the second currents I21 and I22 may cancel each other so that only the first currents I11 and I12 may be sensed. That is, the current induced in the secondary side 122A of the sensing transformer 120A may be a current into which the first currents I11 and I12 are converted at a predetermined ratio.

For example, in the sensing transformer 120A, when a turns ratio of the primary side 121A and the secondary side 122A is 1:Nsen, and a self-inductance of the primary side 121A of the sensing transformer 120A is Lsen, the secondary side 122A may have a self-inductance of Nsen2*Lsen. In this case, the current induced in the secondary side 122A has a magnitude that is 1/Nsen times that of the first currents I11 and I12. In an example, the primary side 121a and the secondary side 122a of the sensing transformer 120a may be coupled with a coupling coefficient of Ksen.

The secondary side 122A of the sensing transformer 120A may be connected to the input terminals of the amplification unit 130. For example, the secondary side 122A of the sensing transformer 120A may be differentially connected to the input terminals of the amplification unit 130 and provide the induced current or an induced voltage to the amplification unit 130.

The amplification unit 130 may amplify the current that is sensed by the sensing transformer 120A and induced in the secondary side 122A. For example, the amplification unit 130 may amplify the magnitude of the induced current at a predetermined ratio and/or adjust a phase of the induced current.

According to various embodiments of the present disclosure, the amplification unit 130 may include an active circuit unit 131 and a passive circuit unit 132 that is a configuration other than the active circuit unit.

The active circuit unit 131 may include active elements. The active circuit unit 131 may be connected to the power supply 400 to drive the active elements. The active circuit unit 131 may receive power from the power supply 400 through a power management unit 180. The power management unit 180 may receive an arbitrary DC voltage VI from the power supply 400 and output a constant output voltage VO to the active circuit unit 131. The power supply 400, the power management unit 180, and the amplification unit 130 may all be connected to the second reference potential 602. Thus, both the input voltage VI and the output voltage VO of the power management unit 180 are voltages based on the second reference potential 602. The second reference potential 602 may be distinguished from the first reference potential 601 of the current compensation device 100A (or the compensation unit 160A).

The power management unit 180 may include a filter unit 183, a feedback unit 182, and a power conversion unit 181 that is a configuration other than the filter unit 183 and the feedback unit 182. According to an embodiment, the active circuit unit 131 of the amplification unit 130 and the power conversion unit 181 of the power management unit 180 may be physically embedded into one IC chip 500. The IC chip 500 may convert the input voltage VI having an arbitrary level into the voltage VO of a level optimized for the active circuit unit 131 and operate the active circuit unit 131. The IC chip 500 may have versatility as an independent component and may be commercialized.

The compensation unit 160A may be an example of the compensation unit 160 described above. In an embodiment, the compensation unit 160A may include a compensation transformer 140A and a compensation capacitor unit 150A. The amplified current amplified by the above-described amplification unit 130 flows through a primary side 141A of the compensation transformer 140A.

The compensation transformer 140A according to an embodiment may be a component for isolating the amplification unit 130 including active elements from the high-current paths 111 and 112. That is, the compensation transformer 140A may be a component for generating compensation current (in a secondary side 142A) to be injected into the high-current paths 111 and 112 on the basis of the amplified current in a state of being isolated from the high-current paths 111 and 112.

The compensation transformer 140A may include the primary side 141A differentially connected to output terminals of the amplification unit 130 and the secondary side 142A connected to the high-current paths 111 and 112. The compensation transformer 140A may induce a compensation current, which is directed toward the secondary side 142A (e.g., a secondary winding), on the basis of a magnetic flux density induced due to the amplified current flowing through the primary side 141A (e.g., a primary winding).

In this case, the secondary side 142A may be disposed on a path connecting the compensation capacitor unit 150A, which will be described below, and the first reference potential 601 of the current compensation device 100A. That is, one end of the secondary side 142A is connected to the high-current paths 111 and 112 through the compensation capacitor unit 150A, and the other end of the secondary side 142A may be connected to the first reference potential 601 of the active current compensation device 100A. Meanwhile, the primary side 141A of the compensation transformer 140A, the amplification unit 130, and the secondary side 122A of the sensing transformer 120A may be connected to the second reference potential 602, which is distinguished from the reference potential of the other components of the active current compensation device 100A. The first reference potential 601 of the current compensation device 100A according to an embodiment and the second reference potential 602 of the amplification unit 130 may be distinguished from each other.

As described above, in the current compensation device 100A according to an embodiment, the component generating the compensation current uses a reference potential (i.e., the second reference potential 602) different from that of the other components and thus may operate in a state of being isolated from the other components, thereby improving the reliability of the active current compensation device 100A. However, the current compensation device according to the present disclosure is not limited to such an isolating structure.

In the compensation transformer 140A according to an embodiment, when a turns ratio of the primary side 141A and the secondary side 142A is 1:$N_{inj}$, and a self-inductance of the primary side 141A of the compensation transformer 140A is Linj, the secondary side 142A may have a self-inductance of $N_{inj}2$*Linj. In this case, the current induced in the secondary side 142A has a magnitude that is 1/$N_{inj}$ times that of the current (i.e., the amplified current) flowing in the primary side 141A. In an example, the primary side 141A and the secondary side 142A of the compensation transformer 140A may be coupled with a coupling coefficient of kinj.

The current converted through the compensation transformer 140A may be injected into the high-current paths 111 and 112 (e.g., power lines) through the compensation capacitor unit 150A as compensation currents IC1 and IC2. Accordingly, the compensation currents IC1 and IC2 may have the same magnitude and an opposite phase compared to the first currents I11 and I12 to cancel the first currents I11 and I12. Accordingly, a magnitude of a current gain of the amplification unit 130 may be designed to be Nsen*$N_{inj}$. However, since a magnetic coupling loss may occur in an actual situation, a target current gain of the amplification unit 130 may be designed to be higher than Nsen*$N_{inj}$.

As described above, the compensation capacitor unit 150A may provide a path through which the current generated by the compensation transformer 140A flows to each of the two high-current paths 111 and 112.

The compensation capacitor unit 150A may include Y-capacitors (Y-cap) each having one end connected to the secondary side 142A of the compensation transformer 140A and the other end connected to the high-current paths 111 and 112. For example, one ends of the two Y-caps share a node connected to the secondary side 142A of the compensation transformer 140A, and the opposite ends of the two Y-caps may have a node connected to the first high-current path 111 and the second high-current path 112.

The compensation capacitor unit 150A may allow the compensation currents IC1 and IC2 induced by the compensation transformer 140A to flow to the power line. As the compensation currents IC1 and IC2 compensate (cancel) for the first currents I11 and I12, the current compensation device 100A may reduce noise.

Meanwhile, the compensation capacitor unit 150A may be configured such that a current IL1 flowing between the two high-current paths 111 and 112 through the compensation capacitors has a magnitude less than a first threshold magnitude. In addition, the compensation capacitor unit 150A may be configured such that a current IL2 flowing between each of the two high-current paths 111 and 112 and the first reference potential 601 through the compensation capacitors has a magnitude less than a second threshold magnitude.

The active current compensation device 100A according to an embodiment may be implemented as an isolated structure by using the compensation transformer 140A and the sensing transformer 120A.

Figure 13:
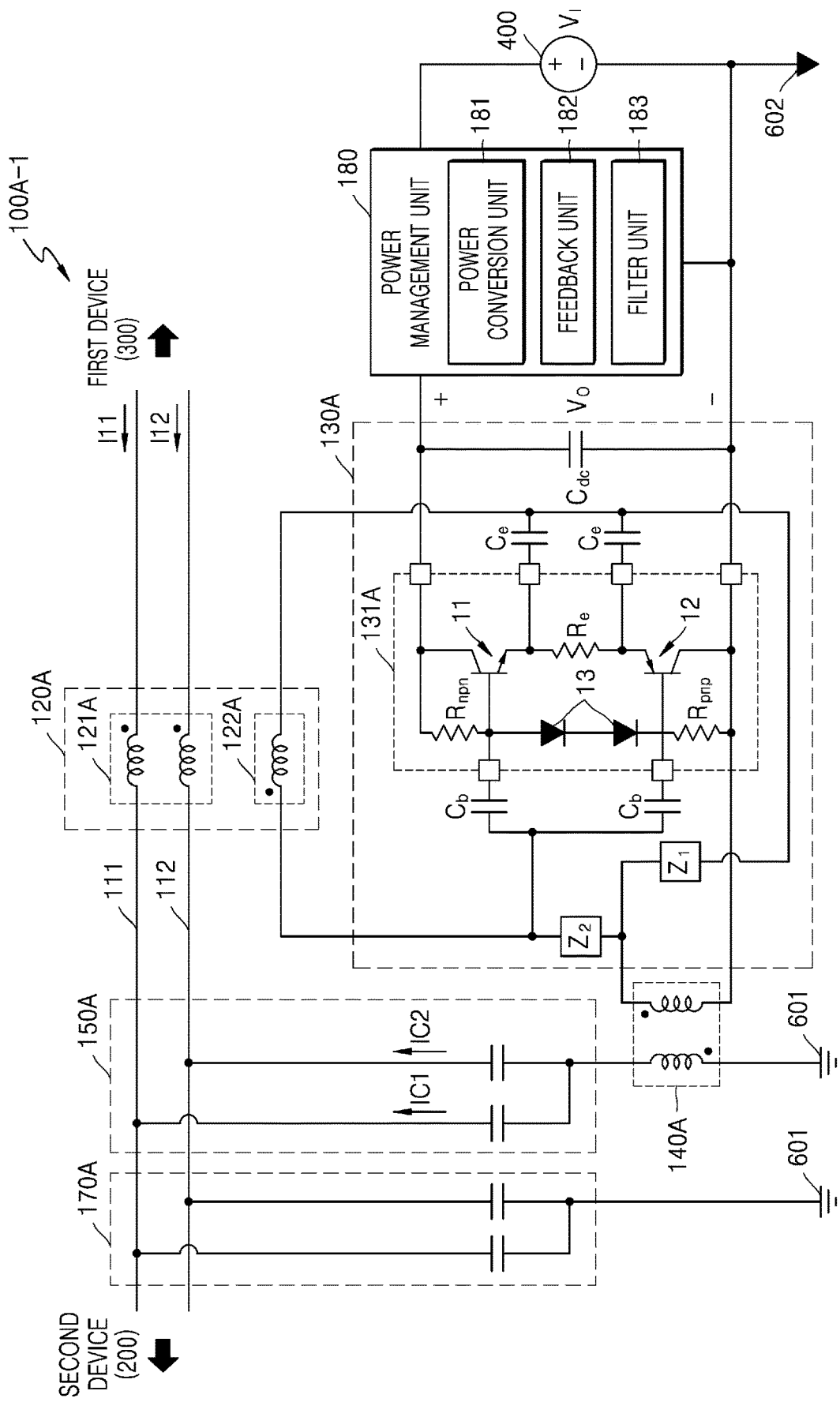
FIG. 13 illustrates a more specific example of the embodiment described with reference to FIG. 12, and schematically illustrates an active current compensation device according to an embodiment of the present disclosure.

FIG. 13 illustrates a more specific example of the embodiment described with reference to FIG. 12, and schematically illustrates an active current compensation device 100A-1 according to an embodiment of the present disclosure. The active current compensation device 100A-1, an amplification unit 130A, and an active circuit unit 131A illustrated in FIG. 13 are respectively exemplary of the active current compensation device 100A, the amplification unit 130, and the active circuit unit 131 illustrated in FIG. 12.

The active current compensation device 100A-1 according to an embodiment may include a sensing transformer 120A, the amplification unit 130A, a compensation transformer 140A, and a compensation capacitor unit 150A. In an embodiment, the active current compensation device 100A-1 may further include a decoupling capacitor unit 170A on an output side thereof (i.e., the second device 200 side). In other embodiments, the decoupling capacitor unit 170A may be omitted. Descriptions of the sensing transformer 120A, the compensation transformer 140A, and the compensation capacitor unit 150A are redundant and thus omitted.

In an embodiment, an induced current induced in a secondary side 122A by the sensing transformer 120A may be differentially input to the amplification unit 130A.

The amplification unit 130A of the active current compensation device 100A-1 according to an embodiment may include the active circuit unit 131A and a passive circuit unit. In the amplification unit 130A, the other components other than the active circuit unit 131A may be included in the passive circuit unit. In embodiments of the present disclosure, the active circuit unit 131A is physically implemented in one chip together with a power conversion unit 181 of a power management unit 180. Components included in the passive circuit unit may be commercial discrete elements. The passive circuit unit may be implemented differently depending on an embodiment. The passive circuit unit may be modified so that the active circuit unit 131A is applicable to the active current compensation device 100 of various designs.

The active circuit unit 131A may include an npn BJT 11, a pnp BJT 12, a diode 13, and one or more resistors.

In an embodiment, the one or more resistors included in the active circuit unit 131A may include Rnpn, Rpnp, and/or Re. In the active circuit unit 131A, the resistor Rnpn may connect a collector node and a base node of the npn BJT 11. In the active circuit unit 131A, the resistor Rpnp may connect a collector node and a base node of the pnp BJT 12. In the active circuit unit 131A, the resistor Re may connect an emitter node of the npn BJT 11 and an emitter node of the pnp BJT 12.

The active circuit unit 131A may be driven by power supplied from the power supply 400 through the power management unit 180. To this end, an output terminal of the power management unit 180 may supply a DC voltage VO between the collector node of the npn BJT 11 and the collector node of the pnp BJT 12. The collector node of the pnp BJT 12 may correspond to the second reference potential 602, and the collector node of the npn BJT 11 may correspond to the output voltage VO of the power management unit 180, which is based on the second reference potential 602.

In an embodiment, in the active circuit unit 131A, the biasing diode 13 may connect the base node of the npn BJT 11 and the base node of the pnp BJT 12. That is, one end of the diode 13 may be connected to the base node of the npn BJT 11, and the other end of the diode 13 may be connected to the base node of the pnp BJT 12.

According to embodiments of the present disclosure, the resistors Rnpn, Rpnp, Re, and/or the biasing diode 13 included in the active circuit unit 131A may be used for DC biasing of the BJTs 11 and 12. In an embodiment of the present disclosure, the resistors Rnpn, Rpnp, and Re, and the biasing diode 13 are general-purpose components in various active current compensation devices 100 and 100A, and thus may be integrated in an IC chip 500.

Although omitted in FIG. 13, the active circuit unit 131A and the power conversion unit 181 may be integrated into the single IC chip 500 in various embodiments of the present disclosure. The IC chip 500 may include a terminal corresponding to a base of the npn BJT 11, a terminal corresponding to a collector of the npn BJT 11, a terminal corresponding to an emitter of the npn BJT 11, and a terminal corresponding to a base of the pnp BJT 12, a terminal corresponding to a collector of the pnp BJT 12, and a terminal corresponding to an emitter of the pnp BJT 12. In addition, the IC chip 500 may further include terminals of the power conversion unit 181 to be described below with reference to FIG. 14.

At least one of the above-described terminals of the IC chip 500 may be connected to the passive circuit unit. The active circuit unit 131A and the passive circuit unit may be combined together to function as the amplification unit 130A.

In an embodiment, the passive circuit unit may include capacitors Cb, Ce, and Cdc, and impedances Z1 and Z2.

According to an embodiment, the capacitors Cb of the passive circuit unit may be connected to base terminals, respectively, in the active circuit unit 131A. The capacitors Ce of the passive circuit unit may be connected to emitter terminals, respectively, in the active circuit unit 131A. In the outside of the IC chip 500, a collector terminal of the pnp BJT 12 may be connected to the second reference potential 602. In the outside of the IC chip 500, the capacitor Cdc of the passive circuit unit may be connected between both collector terminals.

The capacitors Cb and Ce included in the passive circuit unit may respectively block DC voltages at the base node and the emitter node of each of the BJTs 11 and 12. Only AC signals may be selectively coupled through the capacitors Cb and Ce.

The capacitor Cdc is a DC decoupling capacitor for the voltage VO, and may be connected in parallel with respect to the output voltage VO of the power management unit 180. Only AC signals may be selectively coupled between both collectors of the npn BJT 11 and the pnp BJT 12 through the capacitors Cdc.

A current gain of the amplification unit 130A may be controlled by a ratio of the impedances Z1 and Z2. Z1 and Z2 may be flexibly designed depending on a turns ratio of each of the sensing transformer 120A and the compensation transformer 140A and a required target current gain. Thus, Z1 and Z2 may be implemented outside the IC chip 500 (i.e., in the passive circuit unit).

A combination of the active circuit unit 131A and Cb, Ce, Cdc, Z1, and Z2 of the passive circuit unit may function as the amplification unit 130A. For example, the amplification unit 130A may have a push-pull amplifier structure including an npn BJT and a pnp BJT.

In an embodiment, a secondary side 122A of the sensing transformer 120A may be connected between a base side and an emitter side of each of the BJTs 11 and 12. In an embodiment, a primary side 141A side of the compensation transformer 140A may be connected between the collector side and the base side of each of the BJTs 11 and 12. Here, the connection includes an indirectly connected case.

In an embodiment, the amplification unit 130A may have a regression structure in which an output current is injected back into a base of each of the BJTs 11 and 12. Due to the regression structure, the amplification unit 130A may stably obtain a constant current gain for operating the active current compensation device 100A-1.

For example, when an input voltage of the amplification unit 130A has a positive swing of greater than zero due to a noise signal, the npn BJT 11 may operate. In this case, the operating current may flow through a first path passing through the npn BJT 11. When the input voltage of the amplification unit 130A has a negative swing of less than zero due to a noise signal, the pnp BJT 12 may operate. In this case, the operating current may flow through a second path passing through the pnp BJT 12.

In the active circuit unit 131A, an operating point of each of the BJTs may be controlled through the resistors Rnpn, Rpnp, and Re. The resistors Rnpn, Rpnp, and Re may be designed according to the operating point of the BJT.

An inductor, the capacitors (e.g., Cb, Ce, and Cdc), Z1, and Z2 of the passive circuit unit are discrete components, and may be implemented around the IC chip 500.

Capacitance of each of the capacitors Cb, Ce, and Cdc required for an AC signal to couple through each of the capacitors Cb, Ce, and Cdc may be several F or more (e.g., 10 μF). Such a capacitance value is difficult to be implemented in the IC chip 500, and thus the capacitors Cb, Ce, and Cdc may be implemented outside the IC chip 500.

The impedances Z1 and Z2 may be implemented outside the IC chip 500 to achieve design flexibility for various power systems or various first devices 300. Z1 and Z2 may be flexibly designed depending on the turns ratio of each of the sensing transformer 120A and the compensation transformer 140A and the required target current gain.

Meanwhile, the active current compensation device 100A-1 may further include the decoupling capacitor unit 170A on an output side thereof (i.e., the second device 200 side). One ends of capacitors included in the decoupling capacitor unit 170A may be connected to the first high-current path 111 and the second high-current path 112, respectively. The opposite end of each of the capacitors may be connected to the first reference potential 601 of the current compensation device 100A-1.

The decoupling capacitor unit 170A may prevent the performance of outputting the compensation current of the active current compensation device 100A-1 from being significantly changed according to a change in an impedance value of the second device 200. An impedance ZY of the decoupling capacitor unit 170A may be designed to have a value less than a value specified in a first frequency band for which noise reduction is to be performed. As the decoupling capacitor unit 170A is coupled, the current compensation device 100A-1 may be used as an independent module in any system.

According to an embodiment, the decoupling capacitor unit 170A may be omitted from the active current compensation device 100A-1.

Figure 14:
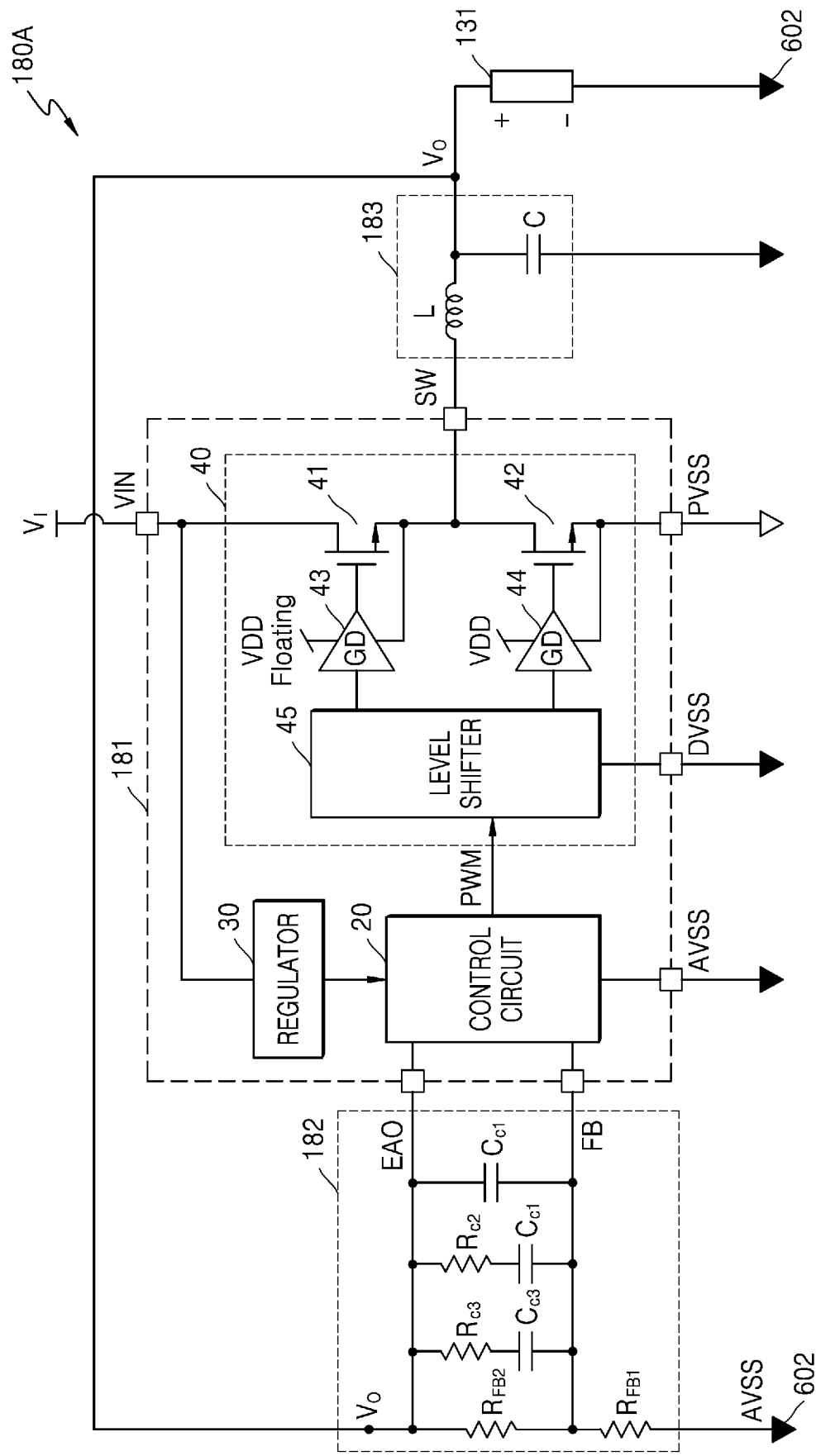
FIG. 14 schematically illustrates the power management unit according to an embodiment of the present disclosure.

FIG. 14 schematically illustrates a power management unit 180 according to an embodiment of the present disclosure. The power management unit 180 may include a power conversion unit 181, a feedback unit 182, and a filter unit 183. FIG. 14 illustrates the components of the power management unit 180 in more detail.

The power management unit 180 may be a PMIC. In an embodiment, the power management unit 180 may be a voltage drop converter, for example, a buck converter.

An output DC voltage VI of the power supply 400 is input through an input terminal VIN of the power conversion unit 181. VI may vary depending on the system, such as 15 V, 24 V, 48 V, or the like.

The power conversion unit 181 may convert the arbitrary input voltage VI into a set output voltage VO. A value of VO may be set to an optimized voltage level (e.g., 12 V) required for the active circuit unit 131.

The power conversion unit 181 may include a control circuit 20, a regulator 30, and a switch portion 40. The components of the power conversion unit 181 are embedded in one IC chip 500 together with the active circuit unit 131.

The regulator 30 may generate a DC low voltage, for driving internal circuits (e.g., the control circuit 20), from the input voltage VI. For example, the input voltage VI may have a high voltage range of 12 V or more, and the internal circuits of the power conversion unit 181 may be efficient only when being driven by a voltage as low as 5 V. Accordingly, the regulator 30 is a circuit configured to supply a DC low voltage (e.g., 5 V) for an internal IC of the power conversion unit 181. The regulator 30 may be referred to as a linear regulator, a pre-regulator, an on-chip supply, a low dropout (LDO) regulator, or the like.

The control circuit 20 is driven by receiving the DC low voltage generated by the regulator 30. The control circuit 20 includes circuits necessary to generate a constant output voltage from an input voltage in an arbitrary range. The control circuit 20 may generate a pulse width modulation (PWM) signal that is a switching signal required to output a constant voltage from the input voltage in an arbitrary range. A detailed configuration of the control circuit 20 will be described below with reference to FIG. 15.

The switch portion 40 may generate a constant output voltage VO by performing a switching operation according to the switching signal (i.e., the PWM signal) input from the control circuit 20. The switch portion 40 may include a level shifter 45, a first driver 43, a second driver 44, a first switch 41, and a second switch 42. The first and second switches 41 and 42 may be MOSFETs. The first switch 41 may be a high-side MOSFET, and the second switch 42 may be a low-side MOSFET. Since an input capacitance of a gate terminal of the MOSFET is high, the first and second drivers 43 and 44, each of which has a sufficient output, may be placed in the front end of the MOSFET.

In various embodiments of the present disclosure, the control circuit 20, the regulator 30, and the switch portion 40 are embedded in the single IC chip 500 together with the active circuit unit 131.

The feedback unit 182 is connected to the control circuit 20 and is disposed outside the IC chip 500. The feedback unit 182 is a feedback control system that allows the same output voltage VO to be output even when the arbitrary input voltage VI is input. The feedback unit 182 may be composed of commercial discrete elements. Accordingly, necessary tuning may be performed on the compensation circuit according to the situation from the outside of the IC chip 500. However, the present disclosure is not limited thereto, and according to embodiments, some elements (e.g., resistors) of the feedback unit 182 may be embedded together in the IC chip 500.

The filter unit 183 is a DC voltage/current filter, and may be located at an output terminal of the power conversion unit 181. However, the present disclosure is not limited thereto, and when the power management unit 180 is a boost converter, the filter unit 183 may be located at an input terminal of the power conversion unit 181. Meanwhile, the filter unit 183 may be configured by commercial discrete elements in the outside of the IC chip 500.

The power management unit 180 may finally output VO through the power conversion unit 181, the feedback unit 182, and the filter unit 183. The final output voltage VO of the power management unit 180 is input to the active circuit unit 131 of the amplification unit 130. VO may be set to an optimal voltage level for driving the active circuit unit 131.

Figure 15:
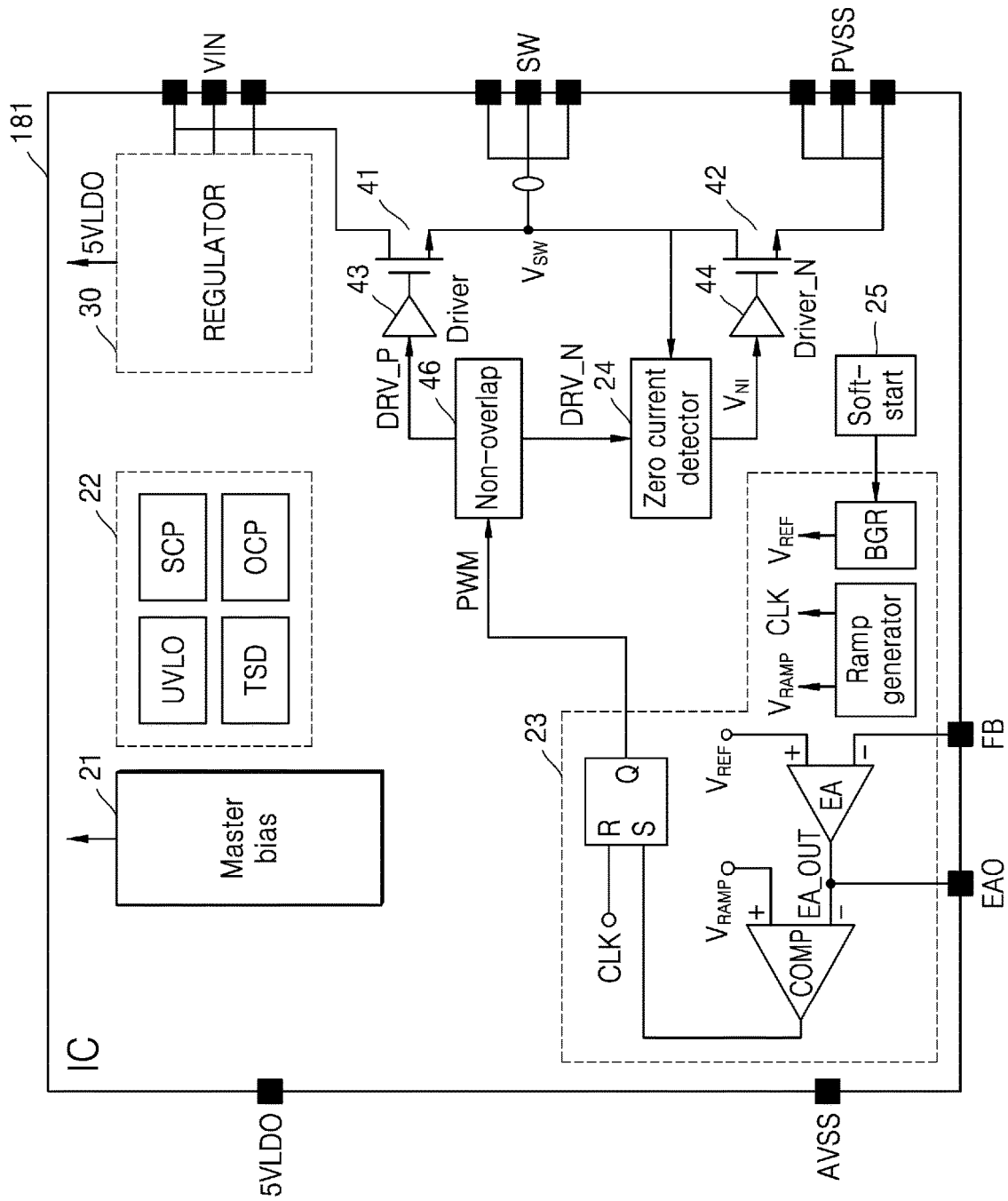
FIG. 15 illustrates a more specific example of a power conversion unit shown in FIG. 14.

FIG. 15 illustrates a more specific example of the power conversion unit 181 shown in FIG. 14.

Referring to FIGS. 14 and 15 together, the control circuit 20 of the power conversion unit 181 may include a voltage redistribution circuit 21, a protection circuit 22, a pulse width modulation circuit 23, a zero current detector 24, and a soft start circuit 25. The regulator 30 of FIG. 15 corresponds to the regulator 30 of FIG. 14.

The regulator 30 may generate a DC low voltage, for driving the internal circuit of the power conversion unit 181, from the input voltage VI. The DC low voltage generated from the regulator 30 may be, for example, about 5 V.

The voltage redistribution circuit 21 may receive the DC low voltage generated by the regulator 30. The voltage redistribution circuit 21 redistributes the DC low voltage input from the regulator 30 into DC bias voltages suitable for IC internal circuit blocks. For example, the voltage redistribution circuit 21 may redistribute the DC bias voltages to a band gap reference (BGR) block, a Ramp generator block, and the like. The voltage redistribution circuit 21 may be referred to as a master bias or the like.

The protection circuit 22 may include one or more protection circuits for various situations. In an embodiment, the protection circuit 22 may include an under voltage lock out (UVLO) circuit. When the output voltage of the regulator 30 drops below a specified voltage, the UVLO circuit may forcibly turn off an operation of the power conversion unit 181 to block unstable operation.

In an embodiment, the protection circuit 22 may include a short current protection (SCP) circuit. The SCP circuit may protect the power conversion unit 181 from a short-circuit current.

In an embodiment, the protection circuit 22 may include an over current protection (OCP) circuit. The OCP circuit may protect the power conversion unit 181 from overcurrent.

In an embodiment, the protection circuit 22 may include a thermal shutdown (TSD) circuit. The TSD circuit may shut down the circuit for protection when a temperature of the IC exceeds a specified value for reasons such as, for example, the overcurrent.

The pulse width modulation circuit 23 performs a core function of the control circuit 20. The pulse width modulation circuit 23 generates a PWM signal that is a switching signal necessary to output a constant output voltage VO from the input voltage in an arbitrary range. The first switch 41 and the second switch 42 may be selectively turned on or off according to the PWM signal generated by the pulse width modulation circuit 23 to generate a voltage signal VSW. The voltage signal output through one terminal SW of the IC chip 500 may be supplied to the active circuit unit 131 as the DC output voltage VO through the filter unit 183 and the feedback unit 182.

According to an embodiment, the pulse width modulation circuit 23 may include a BGR block, a Ramp generator block, an error amplifier EA, a comparator, and an RS latch.

In an embodiment, the BGR block is a voltage bias circuit for outputting a constant voltage VREF even when a temperature or voltage changes. The BGR block may supply the constant voltage VREF to the error amplifier EA even when a temperature or voltage changes.

The Ramp generator block may generate a ramp signal VRAMP and a clock signal CLK that are required to generate the PWM signal.

The error amplifier EA is an amplifier necessary for a feedback circuit. One of input terminals of the error amplifier EA may be connected to the feedback unit 182 through one terminal FB of the IC chip 500. The feedback unit 182 outside the IC chip 500 may be connected to an non-inverting terminal of the error amplifier EA through the terminal FB of the IC chip 500.

The comparator may output a digital signal that is generated based on a comparison between an output signal EA_OUT of the error amplifier EA and the ramp signal VRAMP. Meanwhile, an output terminal of the error amplifier EA may form one terminal EAO of the IC chip 500. The feedback unit 182 outside the IC chip 500 may be connected to the output terminal of the error amplifier EA through the terminal EAO. The terminal EAO may correspond to the non-inverting terminal among the input terminals of the comparator.

The RS latch may transmit the PWM signal to the switch portion 40 in response to the clock signal CLK.

The first switch 41 and the second switch 42 may each be turned on according to an on or off digital signal of the PWM signal. At this point, when the first switch 41 and the second switch 42 are simultaneously turned on even for a short period of time, the MOSFETs may be damaged due to overcurrent. Accordingly, in order to prevent a situation in which the first and second switches 41 and 42 are simultaneously turned on, the switch portion 40 may include a non-overlap circuit 46.

The PWM signal output from the RS latch may be transmitted to the non-overlap circuit 46 of the switch portion 40. The non-overlap circuit 46 may generate a short-time section in which both the first switch 41 and the second switch 42 are turned off. The short period of time may be referred to as a dead-time, and may be, for example, several tens of nanoseconds (nsec). The non-overlap circuit 46 may be referred to as a dead-time generator.

Meanwhile, the first and second switches 41 and 42 may be MOSFETs. The first switch 41 may be a high-side MOSFET, and the second switch 42 may be a low-side MOSFET. Since an input capacitance of a gate terminal of the MOSFET is high, the first and second drivers 43 and 44, each of which has a sufficient output, may be placed in the front end of the MOSFET.

Meanwhile, the control circuit 20 may further include a zero current detector 24.

In a situation in which a current of 0 A or a reverse current is generated in the second switch 42, which is a low-side MOSFET, the power management unit 180 should operate in a discontinuous current mode (DCM) for efficiency. To this end, when the reverse current in the second switch 42 is detected, the zero current detector 24 may block the PWM signal that is input to the second switch 42.

Meanwhile, the control circuit 20 may further include the soft start circuit 25.

When the power management unit 180 (i.e., a converter) is suddenly driven in an OFF state, a voltage may be instantaneously applied to an output capacitor or the like to generate a transient current, and the MOSFET may be malfunctioning. In order to prevent this, the soft start circuit 25 may slowly increase the output voltage or the like even in a situation in which the converter is suddenly driven.

FIG. 16 schematically illustrates a configuration of an active current compensation device 100A-2 according to an embodiment of the present disclosure. Hereinafter, descriptions of contents overlapping with contents described with reference to FIGS. 10 to 15 will be omitted.

Referring to FIG. 16, the active current compensation device 100A-2 may actively compensate for first currents I11, I12, and I13 input as a common-mode current with respect to each of first through third high-current paths 111, 112, and 113 connected to the first device 300.

To this end, the active current compensation device 100A-2 may include first through third high-current paths 111, 112, and 113, a sensing transformer 120A-2, an amplification unit 130A, a compensation transformer 140A, and a compensation capacitor unit 150A-2.

When it is described in comparison with the active current compensation devices 100A and 100A-1 according to the above-described embodiments, the active current compensation device 100A-2 according to the embodiment described with reference to FIG. 16 includes first through third high-current paths 111, 112, and 113, and thus has differences in the sensing transformer 120A-2 and the compensation capacitor unit 150A-2. Thus, the active current compensation device 100A-2 will now be described below focusing on differences described above.

The active current compensation device 100A-2 may include a first high-current path 111, a second high-current path 112, and a third high-current path 113 that are distinguished from each other. According to an embodiment, the first high-current path 111 may be an R-phase power line, the second high-current path 112 may be an S-phase power line, and the third high-current path 113 may be a T-phase power line. The first currents I11, I12, and I13 may be input as a common-mode current with respect to each of the first high-current path 111, the second high-current path 112, and the third high-current path 113.

A primary side 121A-2 of the sensing transformer 120A-2 may be disposed in each of the first to third high-current paths 111 to 113 to generate an induced current in a secondary side 122A-2. Magnetic flux densities generated by the sensing transformer 120A-2 due to the first currents I11, I12, and I13 on the first through third high-current paths 111, 112, and 113 may be reinforced with each other.

In the active current compensation device 100A-2 according to the embodiment described with reference to FIG. 16, the amplification unit 130A may correspond to the above-described amplification unit 130A.

The compensation capacitor unit 150A-2 may provide paths through which compensation currents IC1, IC2, and IC3 generated by the compensation transformer 140A flow to the first to third high-current paths 111 to 113, respectively.

The active current compensation device 100A-2 may further include a decoupling capacitor unit 170A-2 on an output side thereof (i.e., the second device 200 side). One ends of capacitors included in the decoupling capacitor unit 170A-2 may be connected to the first high-current path 111, the second high-current path 112, and the third high-current path 113, respectively. The opposite end of each of the capacitors may be connected to the first reference potential 601 of the current compensation device 100A-2.

The decoupling capacitor unit 170A-2 may prevent the performance of outputting the compensation current of the active current compensation device 100A-2 from being significantly changed according to a change in an impedance value of the second device 200. An impedance ZY of the decoupling capacitor unit 170A-2 may be designed to have a value less than a value specified in a first frequency band for which noise reduction is to be performed. As the decoupling capacitor unit 170A-2 is coupled, the current compensation device 100A-2 may be used as an independent module in any system (e.g., a three-phase three-wire system).

According to an embodiment, the decoupling capacitor unit 170A-2 may be omitted from the active current compensation device 100A-2.

The active current compensation device 100A-2 according to the embodiment described above may be used to compensate (or cancel) for the first currents I11, I12, and I13 traveling from a load of a three-phase three-wire power system to a power source.

Of course, according to the technical spirit of the present disclosure, the active current compensation device according to various embodiments may be modified to be also applicable to a three-phase four-wire system.

In various embodiments of the present disclosure, an active circuit unit 131A included in the amplification unit 130A and a power conversion unit 181 included in a power management unit 180 may be physically integrated into one IC chip 500. Even when a voltage VI in an arbitrary range is input from the power supply 400, the IC chip 500 may convert the voltage VI into a voltage VO optimized for driving the active circuit unit 131A thereinside through the power conversion unit 181, and drive the active circuit unit 131A. Accordingly, the IC chip 500 may have versatility as an independent component and may be commercialized. In addition, the active circuit unit 131A included in the amplification unit 130A may stably operate regardless of the characteristics of a peripheral system.

Figure 17:
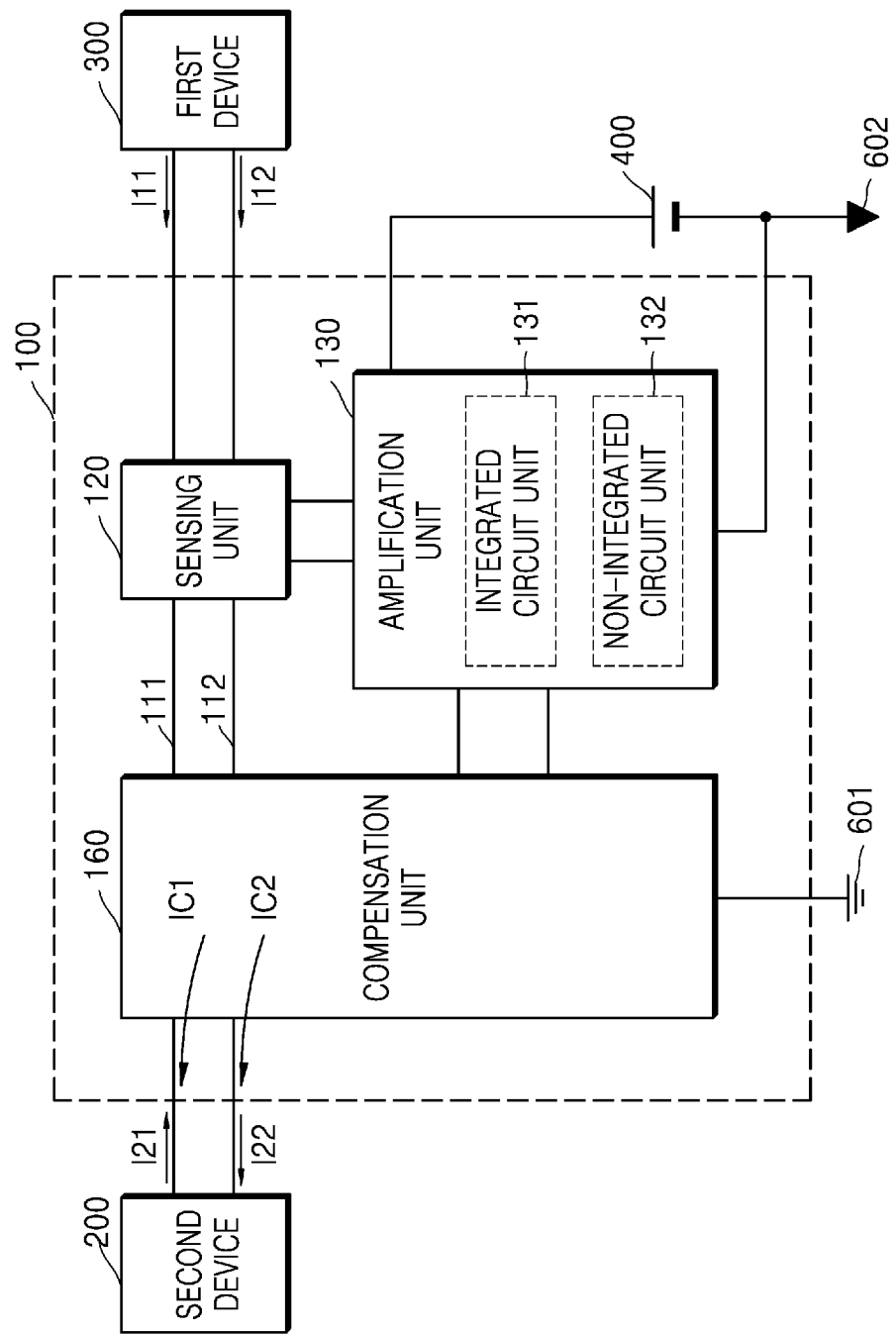
FIG. 17 schematically illustrates a configuration of a system including an active current compensation device according to an embodiment of the present disclosure.

[3] Active Current Compensation Device Including Integrated Circuit Unit and Non-Integrated Circuit Unit FIG. 17 schematically illustrates a configuration of a system including an active current compensation device 100 according to an embodiment of the present disclosure. The active current compensation device 100 may actively compensate for first currents I11 and I12 (e.g., an EMI noise current) that are input as a common-mode current through two or more high-current paths 111 and 112 from a first device 300.

Referring to FIG. 17, the active current compensation device 100 may include a sensing unit 120, an amplification unit 130, and a compensation unit 160.

In the present specification, the first device 300 may be any of various types of power systems using power supplied by a second device 200. For example, the first device 300 may be a load that is driven using the power supplied by the second device 200. In addition, the first device 300 may be a load (e.g., an electric vehicle) that stores energy using the power supplied by the second device 200 and is driven using the stored energy. However, the present disclosure is not limited thereto.

In the present specification, the second device 200 may be any of various types of systems for supplying power to the first device 300 in the form of current and/or voltage. The second device 200 may also be a device that supplies stored energy. However, the present disclosure is not limited thereto.

A power converter may be located on the first device 300 side. For example, the first currents I11 and I12 may be input to the current compensation device 100 due to the switching operation of the power converter. That is, the first device 300 side may correspond to a noise source and the second device 200 side may correspond to a noise receiver.

The two or more high-current paths 111 and 112 may be paths for transmitting the power supplied from the second device 200, that is, second currents I21 and I22, to the first device 300, for example, may be power lines. For example, the two or more high-current paths 111 and 112 may be a live line and a neutral line. At least some portions of the high-current paths 111 and 112 may pass through the current compensation device 100. The second currents I21 and I22 may be an alternating current having a frequency of a second frequency band. The second frequency band may be, for example, a band having a range of 50 Hz to 60 Hz.

Further, the two or more high-current paths 111 and 112 may also be paths through which noise generated by the first device 300, that is, the first currents I11 and I12, is transmitted to the second device 200. The first currents I11 and I12 may be input as a common-mode current with respect to each of the two or more high-current paths 111 and 112. The first currents I11 and I12 may be currents that are unintentionally generated in the first device 300 due to various causes. For example, the first currents I11 and I12 may be noise currents generated by virtual capacitance between the first device 300 and the surrounding environment. Alternatively, the first currents I11 and I12 may be noise currents generated due to a switching operation of the power converter of the first device 300. The first currents I11 and I12 may be currents having a frequency of a first frequency band. The first frequency band may be a frequency band higher than the second frequency band described above. The first frequency band may be, for example, a band having a range of 150 KHz to 30 MHz.

Figure 20:
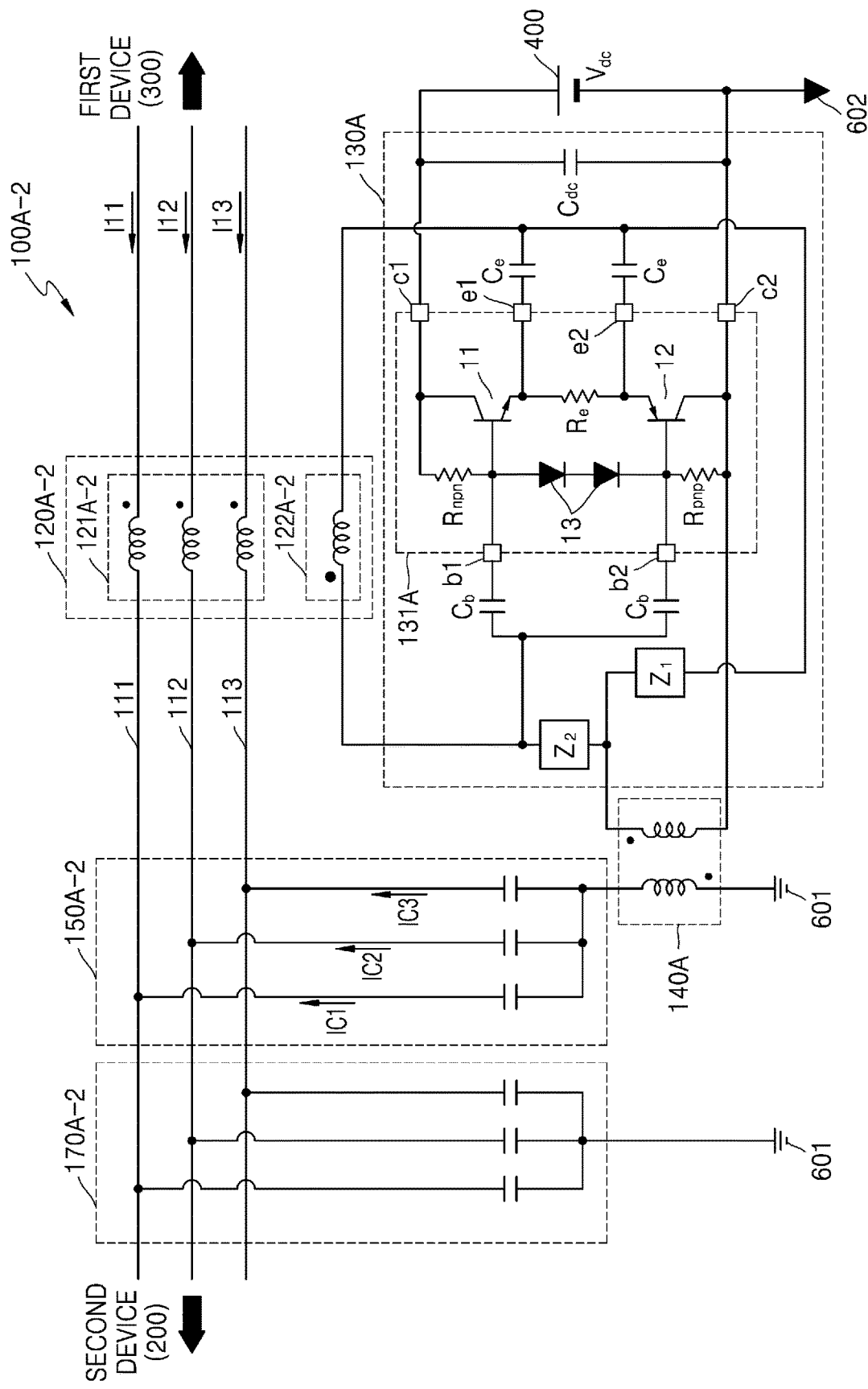
FIG. 20 schematically illustrates a configuration of an active current compensation device according to an embodiment of the present disclosure.
Figure 22:
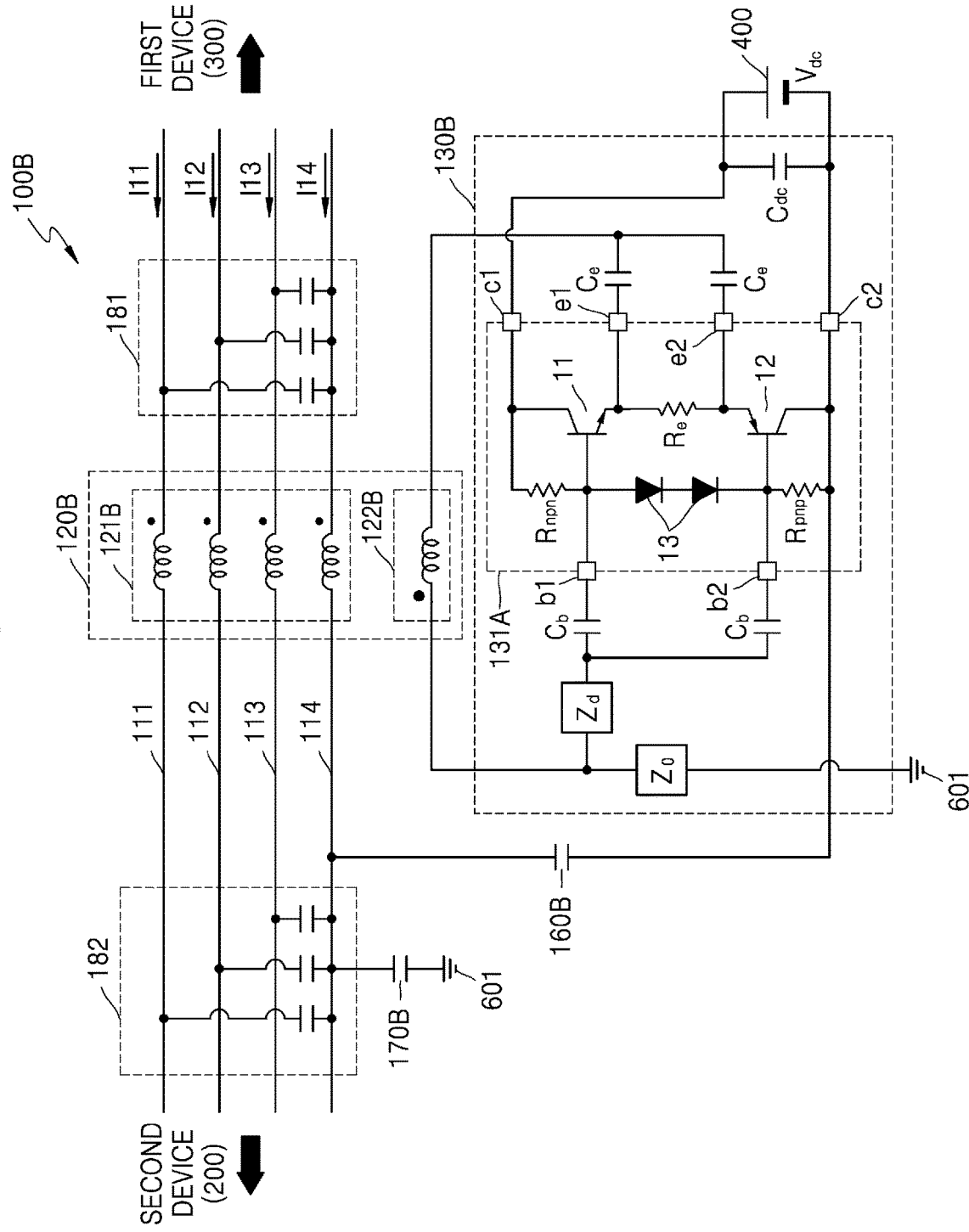
FIG. 22 schematically illustrates a configuration of an active current compensation device according to an embodiment of the present disclosure.

Meanwhile, the two or more high-current paths 111 and 112 may include two paths as shown in FIG. 17, or may include three paths or four paths as shown in FIGS. 20 and 22. The number of the high-current paths 111 and 112 may vary depending on the type and/or form of power used by the first device 300 and/or the second device 200.

The sensing unit 120 may sense the first currents I11 and I12 on the two or more high-current paths 111 and 112 and generate an output signal corresponding to the first currents I11 and I12. That is, the sensing unit 120 may refer to a component that senses the first currents I11 and I12 on the high-current paths 111 and 112. In order for the sensing unit 120 to sense the first currents I11 and I12, at least some portion of the high-current paths 111 and 112 may pass through the sensing unit 120, but a portion of the sensing unit 120, which generates an output signal according to the sensing, may be isolated from the high-current paths 111 and 112. For example, the sensing unit 120 may be implemented as a sensing transformer. The sensing transformer may sense the first currents I11 and I12 on the high-current paths 111 and 112 in a state of being isolated from the high-current paths 111 and 112. However, the sensing unit 120 is not limited to the sensing transformer.

According to an embodiment, the sensing unit 120 may be differentially connected to input terminals of the amplification unit 130.

The amplification unit 130 may be electrically connected to the sensing unit 120, and may amplify the output signal output from the sensing unit 120 to generate an amplified output signal. The term "amplification" by the amplification unit 130, as used herein, may mean that the magnitude and/or phase of an object to be amplified is adjusted. The amplification unit 130 may be implemented by various components, and may include active elements. In an embodiment, the amplification unit 130 may include BJTs. For example, the amplification unit 130 may include a plurality of passive elements, such as resistors and capacitors, in addition to the BJTs. However, the present disclosure is not limited thereto, and the component for the "amplification" described in the present disclosure may be used without being limited to the amplification unit 130 of the present disclosure.

According to an embodiment, a second reference potential 602 of the amplification unit 130 and a first reference potential 601 of the current compensation device 100 may be distinguished from each other. For example, when the amplification unit 130 is isolated from the high-current paths 111 and 112, the second reference potential 602 of the amplification unit 130 and the first reference potential 601 of the current compensation device 100 may be distinguished from each other.

However, the present disclosure is not limited thereto. For example, in a case in which an amplification unit 130B is not isolated from the high-current paths 111 and 112 as shown in FIG. 22, a reference potential of the amplification unit 130B and a reference potential of a current compensation device 100B may not be distinguished from each other.

The amplification unit 130 according to various embodiments of the present disclosure may include an integrated circuit unit 131 and a non-integrated circuit unit 132. The integrated circuit unit 131 may include essential components of the active current compensation device 100. The essential components may include, for example, active elements. Accordingly, the active elements included in the amplification unit 130 may be integrated in the integrated circuit unit 131 of the amplification unit 130. In the amplification unit 130, the non-integrated circuit unit 132 may not include active elements. The integrated circuit unit 131 may further include passive elements as well as the active elements.

The integrated circuit unit 131 according to an embodiment of the present disclosure may physically be one IC chip. The integrated circuit unit 131 according to an embodiment of the present disclosure is applicable to the active current compensation device 100 of various designs. The one-chip integrated circuit unit 131 according to an embodiment of the present disclosure has versatility as an independent module and is applicable to the current compensation device 100 of various designs.

The non-integrated circuit unit 132 according to an embodiment of the present disclosure may be modified according to the design of the active current compensation device 100.

The integrated circuit unit 131 may include terminals to be connected to the non-integrated circuit unit 132. The integrated circuit unit 131 and the non-integrated circuit unit 132 may be combined together to function as the amplification unit 130. The combination of the integrated circuit unit 131 and the non-integrated circuit unit 132 may perform a function of generating an amplified signal from the output signal output from the sensing unit 120. The amplified signal may be input to the compensation unit 160.

Examples of the detailed configuration of the amplification unit 130 including the integrated circuit unit 131 and the non-integrated circuit unit 132 will be described below with reference to FIGS. 19 to 22.

As described above, the active current compensation device 100 according to various embodiments is characterized in that the amplification unit is divided into the integrated circuit unit and the non-integrated circuit unit.

The amplification unit 130 may receive power from a power supply 400 that is distinguished from the first device 300 and/or the second device 200. The amplification unit 130 may receive the power from the power supply 400, and amplify the output signal output from the sensing unit 120 to generate an amplified current.

The power supply 400 may be a device that receives power from a power source that is independent of the first device 300 and the second device 200 and generates input power of the amplification unit 130. Alternatively, the power supply 400 may also be a device that receives power from any one of the first device 300 and the second device 200 and generates input power of the amplification unit 130.

The integrated circuit unit 131, which is an IC chip, may include a terminal to be connected to the power supply 400, a terminal to be connected to the second reference potential 602, and a terminal to be connected to the non-integrated circuit unit 132.

The compensation unit 160 may generate compensation currents IC1 and IC2 on the basis of the amplified output signal generated by the amplification unit 130. An output side of the compensation unit 160 may be connected to the high-current paths 111 and 112 to allow the compensation currents IC1 and IC2 to flow to the high-current paths 111 and 112.

According to an embodiment, the output side of the compensation unit 160 may be isolated from the amplification unit 130. For example, the compensation unit 160 may include a compensation transformer for the isolation. For example, the output signal of the amplification unit 130 may flow through a primary side of the compensation transformer, and the compensation current based on the output signal may be generated on a secondary side of the compensation transformer.

However, the present disclosure is not limited thereto. According to an embodiment, as shown in FIG. 22, an output side of a compensation unit 160B may not be isolated from the amplification unit 130B. In this case, the amplification unit 130B may not be isolated from the high-current paths 111 and 112.

Referring to FIG. 17 again, in order to cancel the first currents I11 and I12, the compensation unit 160 may inject the compensation currents IC1 and IC2 to the high-current paths 111 and 112 through the two or more high-current paths 111 and 112, respectively. The compensation currents IC1 and IC2 may have the same magnitude and an opposite phase compared to the first currents I11 and I12.

Figure 18:
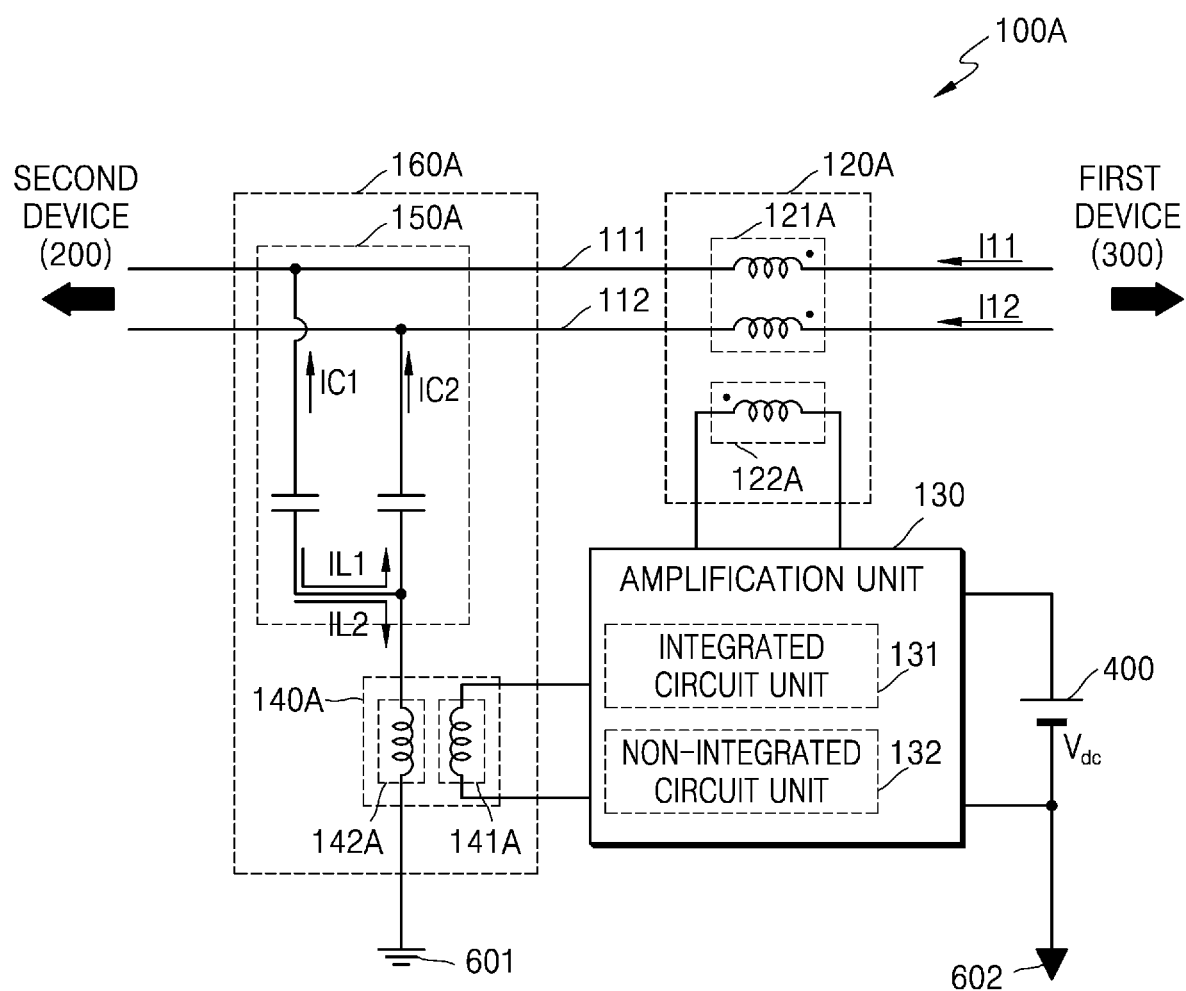
FIG. 18 illustrates a more specific example of the embodiment described with reference to FIG. 17, and schematically illustrates an active current compensation device according to an embodiment of the present disclosure.

FIG. 18 illustrates a more specific example of the embodiment described with reference to FIG. 17, and schematically illustrates an active current compensation device 100A according to an embodiment of the present disclosure. The active current compensation device 100A may actively compensate for first currents I11 and I12 (e.g., a noise current) input as a common-mode current with respect to each of two high-current paths 111 and 112 connected to the first device 300.

Referring to FIG. 18, the active current compensation device 100A may include a sensing transformer 120A, an amplification unit 130, and a compensation unit 160A.

In an embodiment, the sensing unit 120 described above may include the sensing transformer 120A. In this case, the sensing transformer 120A may be a component for sensing the first currents I11 and I12 on the high-current paths 111 and 112 in a state of being isolated from the high-current paths 111 and 112. The sensing transformer 120A may sense the first currents I11 and I12 that are noise currents input through the high-current paths 111 and 112 (e.g., power lines) from the first device 300 side.

The sensing transformer 120A may include a primary side 121A disposed on the high-current paths 111 and 112 and a secondary side 122A differentially connected to input terminals of the amplification unit 130. The sensing transformer 120A may generate an induced current, which is directed to the secondary side 122A (e.g., a secondary winding), on the basis of magnetic flux densities induced due to the first currents I11 and I12 at the primary side 121A (e.g., a primary winding) disposed on the high-current paths 111 and 112. The primary side 121A of the sensing transformer 120A may be, for example, a winding in which each of a first high-current path 111 and a second high-current path 112 is wound around one core. However, the present disclosure is not limited thereto, and the primary side 121A of the sensing transformer 120A may have a form in which the first high-current path 111 and the second high-current path 112 pass through the core.

Specifically, the sensing transformer 120A may be configured such that the magnetic flux density induced due to the first current I11 on the first high-current path 111 (e.g., a live line) and the magnetic flux density induced due to the first current I12 on the second high-current path 112 (e.g., neutral line) are overlapped (or reinforced) with each other. In this case, the second currents I21 and I22 also flow through the high-current paths 111 and 112, and thus the sensing transformer 120A may be configured such that a magnetic flux density induced due to the second current I21 on the first high-current path 111 and a magnetic flux density induced due to the second current I22 on the second high-current path 112 cancel each other. In addition, as an example, the sensing transformer 120A may be configured such that magnitudes of the magnetic flux densities, which are induced due to the first currents I11 and I12 of a first frequency band (e.g., a band having a range of 150 KHz to 30 MHz), are greater than magnitudes of the magnetic flux densities induced due to the second currents I21 and I22 of a second frequency band (for example, a band in a range of 50 Hz to 60 Hz).

As described above, the sensing transformer 120A may be configured such that the magnetic flux densities induced due to the second currents I21 and I22 may cancel each other so that only the first currents I11 and I12 may be sensed. That is, the current induced in the secondary side 122A of the sensing transformer 120A may be a current into which the first currents I11 and I12 are converted at a predetermined ratio.

For example, in the sensing transformer 120A, when a turns ratio of the primary side 121A and the secondary side 122A is 1:Nsen, and a self-inductance of the primary side 121A of the sensing transformer 120A is Lsen, the secondary side 122A may have a self-inductance of Nsen2*Lsen. In this case, the current induced in the secondary side 122A has a magnitude that is 1/Nsen times that of the first currents I11 and I12. For example, the primary side 121A and the secondary side 122A of the sensing transformer 120A may be coupled with a coupling coefficient of Ksen.

The secondary side 122A of the sensing transformer 120A may be connected to the input terminals of the amplification unit 130. For example, the secondary side 122A of the sensing transformer 120A may be differentially connected to the input terminals of the amplification unit 130 and supply the induced current or an induced voltage to the amplification unit 130.

The amplification unit 130 may amplify the current or voltage that is sensed by the sensing transformer 120A and induced in the secondary side 122A. For example, the amplification unit 130 may amplify the magnitude of the induced current or voltage at a predetermined ratio and/or adjust the phase of the induced current or voltage.

According to various embodiments of the present disclosure, the amplification unit 130 may include an integrated circuit unit 131 configured as one IC chip, and a non-integrated circuit unit 132 that is a component other than one IC chip.

According to an embodiment, the amplification unit 130 may be connected to the second reference potential 602, and the second reference potential 602 may be distinguished from the first reference potential 601 of the current compensation device 100A (or the compensation unit 160A). The amplification unit 130 may be connected to the power supply 400.

The IC chip, which is the integrated circuit unit 131, may include a terminal to be connected to the power supply 400, a terminal to be connected to the second reference potential 602, and a terminal to be connected to the non-integrated circuit unit 132.

The compensation unit 160A may be an example of the compensation unit 160 described above. In an embodiment, the compensation unit 160A may include a compensation transformer 140A and a compensation capacitor unit 150A. The amplified current amplified by the above-described amplification unit 130 flows through a primary side 141A of the compensation transformer 140A.

The compensation transformer 140A according to an embodiment may be a component for isolating the amplification unit 130 including active elements from the high-current paths 111 and 112. That is, the compensation transformer 140A may be a component for generating compensation current (in a secondary side 142A) to be injected into the high-current paths 111 and 112 on the basis of the amplified current in a state of being isolated from the high-current paths 111 and 112.

The compensation transformer 140A may include the primary side 141A differentially connected to output terminals of the amplification unit 130 and the secondary side 142A connected to the high-current paths 111 and 112. The compensation transformer 140A may induce a compensation current, which is directed toward the secondary side 142A (e.g., a secondary winding), on the basis of a magnetic flux density induced due to the amplified current flowing through the primary side 141A (e.g., a primary winding).

In this case, the secondary side 142A may be disposed on a path connecting the compensation capacitor unit 150A, which will be described below, and the first reference potential 601 of the current compensation device 100A. That is, one end of the secondary side 142A is connected to the high-current paths 111 and 112 through the compensation capacitor unit 150A, and the other end of the secondary side 142A may be connected to the first reference potential 601 of the active current compensation device 100A. Meanwhile, the primary side 141A of the compensation transformer 140A, the amplification unit 130, and the secondary side 122A of the sensing transformer 120A may be connected to the second reference potential 602, which is distinguished from the reference potential of the other components of the active current compensation device 100A. The first reference potential 601 of the current compensation device 100A according to an embodiment and the second reference potential 602 of the amplification unit 130 may be distinguished from each other.

As described above, in the current compensation device 100A according to an embodiment, the component generating the compensation current uses a reference potential (i.e., the second reference potential 602) different from that of the other components and uses the separate power supply 400, and thus may operate in a state of being isolated from the other components, thereby the improving reliability of the active current compensation device 100A. However, the active current compensation device including the integrated circuit unit 131 and the non-integrated circuit unit 132 according to the present disclosure is not limited to such an isolating structure. The active current compensation device 100B having a non-isolating structure according to an embodiment of the present disclosure will be described below with reference to FIG. 22.

In the compensation transformer 140A according to an embodiment, when a turns ratio of the primary side 141A and the secondary side 142A is 1:$N_{inj}$, and a self-inductance of the primary side 141A of the compensation transformer 140A is Linj, the secondary side 142A may have a self-inductance of $N_{inj}2$*Linj. In this case, the current induced in the secondary side 142A has a magnitude that is 1/$N_{inj}$ times that of the current (i.e., the amplified current) flowing in the primary side 141A. The primary side 141A and the secondary side 142A of the compensation transformer 140A may be coupled with a coupling coefficient of kinj.

The current converted through the compensation transformer 140A may be injected into the high-current paths 111 and 112 (e.g., power lines) through the compensation capacitor unit 150A as compensation currents IC1 and IC2. Accordingly, the compensation currents IC1 and IC2 may have the same magnitude and an opposite phase compared to the first currents I11 and I12 to cancel the first currents I11 and I12. Accordingly, a magnitude of a current gain of the amplification unit 130 may be designed to be Nsen*$N_{inj}$.

As described above, the compensation capacitor unit 150A may provide a path through which the current generated by the compensation transformer 140A flows to each of the two high-current paths 111 and 112.

The compensation capacitor unit 150A may include two Y-capacitors (Y-caps) each having one end connected to the secondary side 142A of the compensation transformer 140A and the other end connected to the high-current paths 111 and 112. One ends of the two Y-caps share a node connected to the secondary side 142A of the compensation transformer 140A, and the opposite ends of the two Y-caps may have a node connected to the first high-current path 111 and the second high-current path 112.

The compensation capacitor unit 150A may allow the compensation currents IC1 and IC2 induced by the compensation transformer 140A to flow to the power line. As the compensation currents IC1 and IC2 compensate (cancel) for the first currents I11 and I12, the current compensation device 100A may reduce noise.

Meanwhile, the compensation capacitor unit 150A may be configured such that a current IL1 flowing between the two high-current paths 111 and 112 through the compensation capacitors has a magnitude less than a first threshold magnitude. In addition, the compensation capacitor unit 150A may be configured such that a current IL2 flowing between each of the two high-current paths 111 and 112 and the first reference potential 601 through the compensation capacitors has a magnitude less than a second threshold magnitude.

The active current compensation device 100A according to an embodiment may be implemented as an isolated structure by using the compensation transformer 140A and the sensing transformer 120A.

Figure 19:
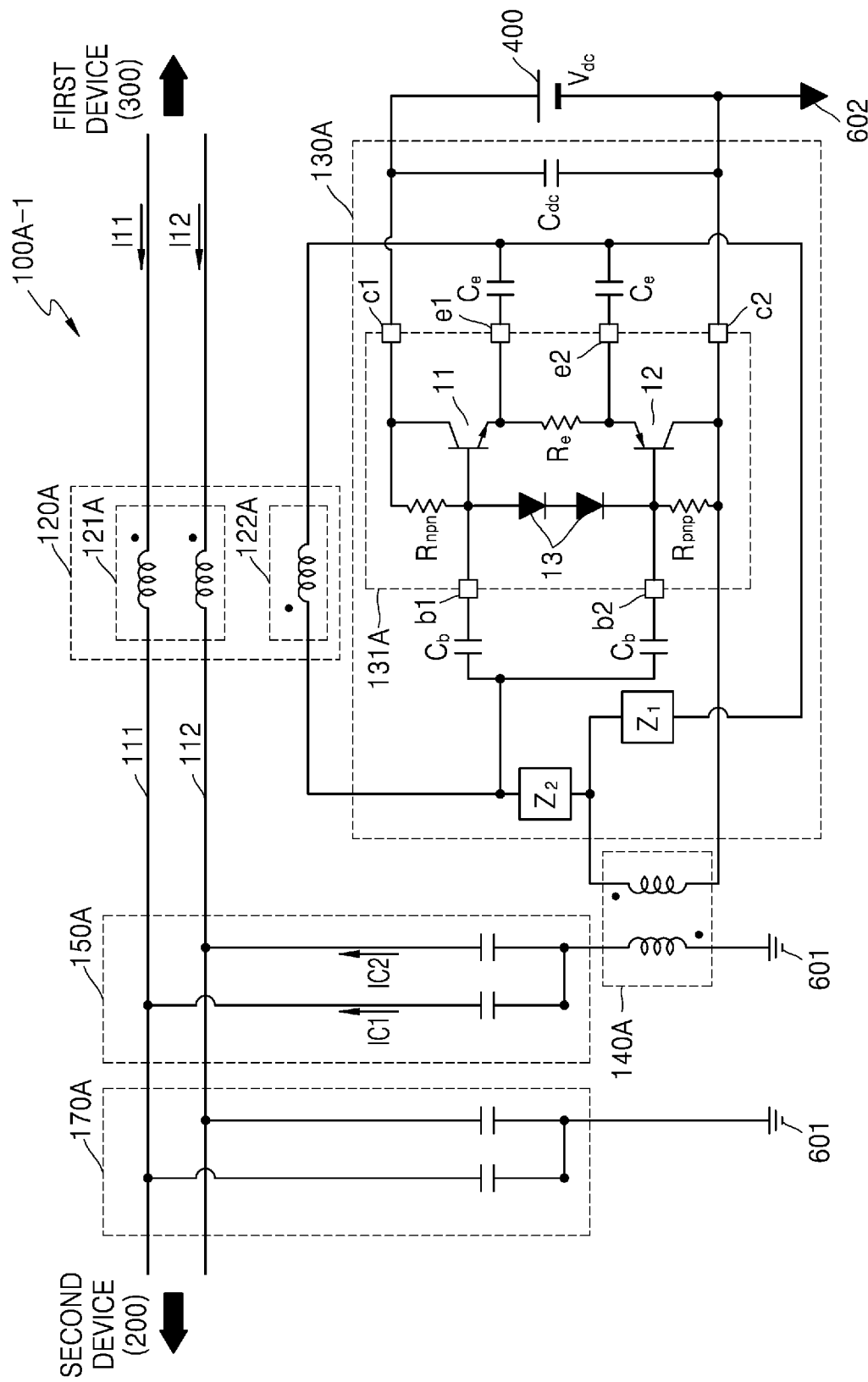
FIG. 19 illustrates a more specific example of the embodiment described with reference to FIG. 18, and schematically illustrates an active current compensation device according to an embodiment of the present disclosure.

FIG. 19 illustrates a more specific example of the embodiment described with reference to FIG. 18, and schematically illustrates an active current compensation device 100A-1 according to an embodiment of the present disclosure. The active current compensation device 100A-1 shown in FIG. 19 is an example of the active current compensation device 100A shown in FIG. 18. An amplification unit 130A included in the active current compensation device 100A-1 is an example of the amplification unit 130 of the active current compensation device 100A.

The active current compensation device 100A-1 according to an embodiment may include a sensing transformer 120A, the amplification unit 130A, a compensation transformer 140A, and a compensation capacitor unit 150A. In an embodiment, the active current compensation device 100A-1 may further include a decoupling capacitor unit 170A on an output side thereof (i.e., the second device 200 side). In other embodiments, the decoupling capacitor unit 170A may be omitted. Descriptions of the sensing transformer 120A, the compensation transformer 140A, and the compensation capacitor unit 150A are redundant and thus omitted.

The amplification unit 130A of the active current compensation device 100A-1 according to an embodiment may include an integrated circuit unit 131A and a non-integrated circuit unit. In the amplification unit 130A, the other components other than the integrated circuit unit 131A may be included in the non-integrated circuit unit. For example, in the amplification unit 130A, components included in the non-integrated circuit unit may be commercial discrete elements, but the present disclosure is not limited thereto.

In an embodiment, the integrated circuit unit 131A may include a first transistor 11, a second transistor 12, and/or one or more resistors. In an embodiment, the first transistor 11 may be an npn BJT, and the second transistor 12 may be a pnp BJT. For example, the amplification unit 130A may have a push-pull amplifier structure including an npn BJT and a pnp BJT.

For example, the one or more resistors included in the integrated circuit unit 131A may include resistors Rnpn, Rpnp, and/or Re. For example, the resistor Rnpn may connect a collector terminal and a base terminal of the first transistor 11, the resistor Rpnp may connect a collector terminal and a base terminal of the second transistor 12, and the resistor Re may connect an emitter terminal of the first transistor 11 and an emitter terminal of the second transistor 12.

In an embodiment, the integrated circuit unit 131A of the amplification unit 130A may further include a diode 13 in addition to the first transistor 11, the second transistor 12, and the one or more resistors. For example, one end of the diode 13 may be connected to the base terminal of the first transistor 11, and the other end of the diode 13 may be connected to the base terminal of the second transistor 12. In an embodiment, the diode 13 may be replaced by a resistor.

In an embodiment, the resistors Rnpn, Rpnp, Re, and/or the biasing diode 13 included in the integrated circuit unit 131A may be used for DC biasing of the BJTs. The above-described components are general-purpose components in various active current compensation devices, and may be integrated into the one-chip integrated circuit unit 131A.

In the amplification unit 130A, the components other than the integrated circuit unit 131A may be included in the non-integrated circuit unit. The integrated circuit unit 131A may be physically implemented as one IC chip. The non-integrated circuit unit may include commercial discrete elements. The non-integrated circuit unit may be implemented differently depending on an embodiment.

In the embodiment described with reference to FIG. 19, the non-integrated circuit unit may include, for example, capacitors Cb, Ce, and Cdc, and impedances Z1 and Z2.

In an embodiment, an induced current induced in a secondary side 122A by the sensing transformer 120A may be differentially input to the amplification unit 130A. Only AC signals may be selectively coupled through the capacitors Cb and Ce included in the amplification unit 130A. The capacitors Cb and Ce may respectively block DC voltages at the base node and the emitter node of each of the first and second transistors 11 and 12.

In an embodiment, the power supply 400 supplies a DC voltage Vdc, which is based on the second reference potential 602, to drive the amplification unit 130A. The capacitor Cdc is a DC decoupling capacitor for the voltage Vdc, and may be connected in parallel between the power supply 400 and the second reference potential 602. Only AC signals may be coupled between both collectors of the first transistor 11 (e.g., an npn BJT) and the second transistor 12 (e.g., a pnp BJT) through the capacitor Cdc.

A current gain of the amplification unit 130A may be controlled by a ratio of the impedances Z1 and Z2. Accordingly, Z1 and Z2 may be implemented outside the one-chip integrated circuit unit 131A. Z1 and Z2 may be flexibly designed depending on a turns ratio of each of the sensing transformer 120A and the compensation transformer 140A and a required target current gain.

In the integrated circuit unit 131A, an operating point of each of the first and second transistors 11 and 12 (e.g., BJT) may be controlled through the resistors Rnpn, Rpnp, and Re. The resistors Rnpn, Rpnp, and Re may be designed according to the operating point of the BJT. The resistor Rnpn may connect the collector terminal of the first transistor 11 (e.g., an npn BJT), which is a terminal of the power supply 400, and the base terminal of the first transistor 11 (e.g., an npn BJT). The resistor Rpnp may connect the collector terminal of the second transistor 12 (e.g., a pnp BJT), which is a terminal of the second reference potential 602, and the base terminal of the second transistor 12 (e.g., a pnp BJT). The resistor Re may connect the emitter terminal of the first transistor 11 and the emitter terminal of the second transistor 12.

The secondary side 122A of the sensing transformer 120A according to an embodiment may be connected between a base side and an emitter side of each of the first and second transistors 11 and 12. A primary side 141A of the compensation transformer 140A according to an embodiment may be connected between a collector side and the base side of each of the first and second transistors 11 and 12. Here, the connection includes an indirectly connected case. The amplification unit 130A according to an embodiment may have a regression structure in which an output current is injected back into a base of each of the first and second transistors 11 and 12. Due to the regression structure, the amplification unit 130A may stably obtain a constant current gain for operating the active current compensation device 100A-1.

When an input voltage of the amplification unit 130A has a positive swing of greater than zero due to a noise signal, the first transistor 11 (e.g., an npn BJT) may operate. In this case, an operating current may flow through a first path passing through the first transistor 11. When the input voltage of the amplification unit 130A has a negative swing of less than zero due to a noise signal, the second transistor 12 (e.g., a pnp BJT) may operate. In this case, the operating current may flow through a second path passing through the second transistor 12.

The integrated circuit unit 131A may be implemented as a one-chip IC. According to an embodiment, the first transistor 11, the second transistor 12, the diode 13, Rnpn, Rpnp, and Re of the integrated circuit unit 131A may be integrated into the one-chip IC.

The one-chip IC may include a terminal b1 corresponding to the base of the first transistor 11, a terminal c1 corresponding to the collector of the first transistor 11, a terminal e1 corresponding to an emitter of the first transistor 11, a terminal b2 corresponding to the base of the second transistor 12, a terminal c2 corresponding to the collector of the second transistor 12, and a terminal e2 corresponding to an emitter of the second transistor 12. However, the present disclosure is not limited thereto, and the one-chip IC of the integrated circuit unit 131A may further include other terminals in addition to the terminals b1, b2, c1, c2, e1, and e2.

In various embodiments, at least one of the terminals b1, b2, c1, c2, e1, and e2 of the integrated circuit unit 131A may be connected to the non-integrated circuit unit. The integrated circuit unit 131A and the non-integrated circuit unit may be combined together to function as the amplification unit 130A according to an embodiment.

According to the embodiment described with reference to FIG. 19, the capacitors Cb of the non-integrated circuit unit may be connected to the base terminal b1 of the first transistor 11 and the base terminal b2 of the second transistor 12, respectively. The capacitors Ce of the non-integrated circuit unit may be connected to the emitter terminal e1 of the first transistor 11 and the emitter terminal e2 of the second transistor 12, respectively. The external power supply 400 may be connected between the collector terminal c1 of the first transistor 11 and the collector terminal c2 of the second transistor 12. The collector terminal c2 of the second transistor 12 may correspond to the second reference potential 602. The decoupling capacitor Cdc of the non-integrated circuit unit may be connected between the collector terminal c1 of the first transistor 11 and the collector terminal c2 of the second transistor 12.

A combination of the integrated circuit unit 131A and Cb, Ce, Cdc, Z1, and Z2 of the non-integrated circuit unit may function as the amplification unit 130A according to the embodiment described with reference to FIG. 19.

According to various embodiments of the present disclosure, essential components of the active current compensation device 100A or 100A-1 may be integrated in the one-chip integrated circuit unit 131A. Accordingly, the size of the amplification unit 130 or 130A may be minimized by using the one-chip integrated circuit unit 131 or 131A as compared with a case of using discrete semiconductor devices.

An inductor, the capacitors (e.g., Cb, Ce, and Cdc), Z1, and Z2 of the non-integrated circuit unit are discrete components, and may be implemented around the one-chip integrated circuit unit 131A.

Capacitance of each of the capacitors Cb, Ce, and Cdc required for an AC signal to couple through each of the capacitors Cb, Ce, and Cdc may be several F or more (e.g., 10 μF). Such a capacitance value is difficult to be implemented in the one-chip integrated circuit unit, and thus the capacitors Cb, Ce, and Cdc may be implemented outside the integrated circuit unit, that is, in the non-integrated circuit unit.

The impedances Z1 and Z2 may be implemented outside the integrated circuit unit, i.e., in the non-integrated circuit unit, to achieve design flexibility for various power systems or various first devices 300. Z1 and Z2 may be flexibly designed depending on a turns ratio of each of the sensing transformer 120A and the compensation transformer 140A and a required target current gain. It is possible to design various current compensation devices that allow the same integrated circuit unit 131A to be applied to various power systems by adjusting the impedances Z1 and Z2. In particular, the size and impedance characteristics of the sensing transformer 120A should vary depending on a maximum rated current of the first device 300. Thus, in order to make a ratio of an injected current to a sensed noise current uniform in a wide frequency range, a proper design of Z1 and Z2 is required. Z1 and Z2 may be designed so that the ratio of the injected current to the sensed noise current becomes 1 in a wide frequency range by adjusting the turns ratio of each of the sensing transformer 120A and the compensation transformer 140A and a ratio of Z1 and Z2. To this end, the impedances Z1 and Z2 may be implemented outside the integrated circuit unit 131A for design flexibility. In an embodiment, each of Z1 and Z2 may include a series connection of a resistor and a capacitor.

The integrated circuit unit 131A according to various embodiments of the present disclosure is designed in consideration of scalability, and thus may be used in various types of active current compensation devices. For example, the integrated circuit unit 131A may use the current compensation device 100A-1 shown in FIG. 19, a current compensation device 100A-2 shown in FIG. 20, and a current compensation device 100A-3 shown in FIG. 21, and the current compensation device 100B shown in FIG. 22. The same type of integrated circuit unit 131A may be used in various embodiments, and the non-integrated circuit unit may be designed differently depending on an embodiment.

In various embodiments of the present disclosure, since the amplification unit 130 is divided into the integrated circuit unit and the non-integrated circuit unit, various types of active current compensation devices may be mass-produced by mass-producing the integrated circuit unit. In addition, the size of the active current compensation device may be minimized.

As described above, the active current compensation devices 100, 100A, 100A-1, 100A-2, 100A-3, and 100B according to various embodiments are characterized in that the amplification unit is divided into the integrated circuit unit and the non-integrated circuit unit.

Meanwhile, the active current compensation device 100A-1 may further include the decoupling capacitor unit 170A on an output side thereof (i.e., the second device 200 side). One ends of capacitors included in the decoupling capacitor unit 170A may be connected to the first high-current path 111 and the second high-current path 112, respectively. The opposite end of each of the capacitors may be connected to the first reference potential 601 of the current compensation device 100A-1.

The decoupling capacitor unit 170A may prevent the performance of outputting the compensation current of the active current compensation device 100A-1 from being significantly changed according to a change in an impedance value of the second device 200. An impedance ZY of the decoupling capacitor unit 170A may be designed to have a value less than a value specified in a first frequency band for which noise reduction is to be performed. As the decoupling capacitor unit 170A is coupled, the current compensation device 100A-1 may be used as an independent module in any system.

According to an embodiment, the decoupling capacitor unit 170A may be omitted from the active current compensation device 100A-1.

FIG. 20 schematically illustrates a configuration of the active current compensation device 100A-2 according to an embodiment of the present disclosure. Hereinafter, descriptions of contents overlapping with contents described with reference to FIGS. 18 and 19 will be omitted.

Referring to FIG. 20, the active current compensation device 100A-2 may actively compensate for first currents I11, I12, and I13 input as a common-mode current with respect to each of first through third high-current paths 111, 112, and 113 connected to the first device 300.

To this end, the active current compensation device 100A-2 may include first through third high-current paths 111, 112, and 113, a sensing transformer 120A-2, an amplification unit 130A, a compensation transformer 140A, and a compensation capacitor unit 150A-2.

When it is described in comparison with the active current compensation devices 100A and 100A-1 according to the above-described embodiments, the active current compensation device 100A-2 according to the embodiment described with reference to FIG. 20 includes first through third high-current paths 111, 112, and 113, and thus has differences in the sensing transformer 120A-2 and the compensation capacitor unit 150A-2. Thus, the active current compensation device 100A-2 will now be described below focusing on differences described above.

The active current compensation device 100A-2 may include a first high-current path 111, a second high-current path 112, and a third high-current path 113 that are distinguished from each other. According to an embodiment, the first high-current path 111 may be an R-phase power line, the second high-current path 112 may be an S-phase power line, and the third high-current path 113 may be a T-phase power line. The first currents I11, I12, and I13 may be input as a common-mode current with respect to each of the first high-current path 111, the second high-current path 112, and the third high-current path 113.

A primary side 121A-2 of the sensing transformer 120A-2 may be disposed in each of the first to third high-current paths 111 to 113 to generate an induced current in a secondary side 122A-2. Magnetic flux densities generated by the sensing transformer 120A-2 due to the first currents I11, I12, and I13 on the first through third high-current paths 111, 112, and 113 may be reinforced with each other.

In the active current compensation device 100A-2 according to the embodiment described with reference to FIG. 20, the amplification unit 130A may correspond to the above-described amplification unit 130A.

The compensation capacitor unit 150A-2 may provide paths through which compensation currents IC1, IC2, and IC3 generated by the compensation transformer 140A flow to the first to third high-current paths 111 to 113, respectively.

The active current compensation device 100A-2 may further include a decoupling capacitor unit 170A-2 on an output side thereof (i.e., the second device 200 side). One ends of capacitors included in the decoupling capacitor unit 170A-2 may be connected to the first high-current path 111, the second high-current path 112, and the third high-current path 113, respectively. The opposite end of each of the capacitors may be connected to the first reference potential 601 of the current compensation device 100A-2.

The decoupling capacitor unit 170A-2 may prevent the performance of outputting the compensation current of the active current compensation device 100A-2 from being significantly changed according to a change in an impedance value of the second device 200. An impedance ZY of the decoupling capacitor unit 170A-2 may be designed to have a value less than a value specified in a first frequency band for which noise reduction is to be performed. As the decoupling capacitor unit 170A-2 is coupled, the current compensation device 100A-2 may be used as an independent module in any system (e.g., a three-phase three-wire system).

According to an embodiment, the decoupling capacitor unit 170A-2 may be omitted from the active current compensation device 100A-2.

The active current compensation device 100A-2 according to the embodiment described above may be used to compensate (or cancel) for the first currents I11, I12, and I13 traveling from a load of a three-phase three-wire power system to a power source.

Of course, according to the technical spirit of the present disclosure, the active current compensation device according to various embodiments may be modified to be also applicable to a three-phase four-wire system.

The amplification unit 130A according to an embodiment of the present disclosure is applicable to the single-phase (two-wire) system shown in FIG. 18, the three-phase three-wire system shown in FIG. 19, and a three-phase four-wire system not shown in the drawing. Since a one-chip integrated circuit unit 131A is applicable to several systems, the integrated circuit unit 131A may have versatility in the active current compensation devices according to various embodiments.

As described above with reference to FIG. 19, the integrated circuit unit 131A may include a first transistor 11, a second transistor 12, and/or one or more resistors. In addition, according to an embodiment, the integrated circuit unit 131A may further include a diode 13. In an embodiment, the diode 13 may be replaced by a resistor.

An IC chip having the integrated circuit unit 131A embedded therein may include a base terminal b1 of the first transistor 11, a collector terminal c1 of the first transistor 11, an emitter terminal e1 of the first transistor 11, a base terminal b2 of the second transistor 12, a collector terminal c2 of the second transistor 12, and an emitter terminal e2 of the second transistor 12. However, the present disclosure is not limited thereto, and the one-chip IC of the integrated circuit unit 131A may further include other terminals in addition to the terminals b1, b2, c1, c2, e1, and e2.

The integrated circuit unit 131A may be combined with a non-integrated circuit unit including discrete components such as an inductor, capacitors (e.g., Cb, Ce, and Cdc), Z1 and Z2 to configure the current compensation device according to various embodiments. For example, the discrete components of the non-integrated circuit unit may be commonly used commercial elements. However, the present disclosure is not limited thereto.

Discrete components such as the inductor, the capacitors (e.g., Cb, Ce, and Cdc), Z1 and Z2 are implemented around the IC chip in which the integrated circuit unit 131A is embedded.

Capacitance of each of the capacitors Cb, Ce, and Cdc required for a low-frequency AC signal to couple through each of the capacitors Cb, Ce, and Cdc may be several F or more. Such a capacitance value is difficult to be implemented in the IC chip in which the integrated circuit unit 131A is embedded, and thus the capacitors Cb, Ce, and Cdc may be implemented outside the integrated circuit unit, that is, in the non-integrated circuit unit.

The impedances Z1 and Z2 may be implemented outside the integrated circuit unit, i.e., in the non-integrated circuit unit, to achieve design flexibility for various first devices 300. It is possible to design various current compensation devices that allow the same integrated circuit unit 131A to be applied to various power systems by adjusting the impedances Z1 and Z2. In particular, the size and impedance characteristics of the sensing transformer 120A should vary depending on a maximum rated current of the first device 300. Thus, in order to make a ratio of an injected current to a sensed noise current uniform in a wide frequency range, a proper design of Z1 and Z2 is required. Accordingly, Z1 and Z2 may be implemented outside the integrated circuit unit 131A, that is, in the non-integrated circuit unit for design flexibility. In an embodiment, Z1 may be a series connection of a resistor R1 and a capacitor C1, and Z2 may be a series connection of a resistor R2 and a capacitor C2. Since C1 and C2 are additionally implemented in series next to R1 and R2 respectively, the ratio of the injected current to the sensed noise current in a low-frequency range may exhibit better performance.

Figure 21:
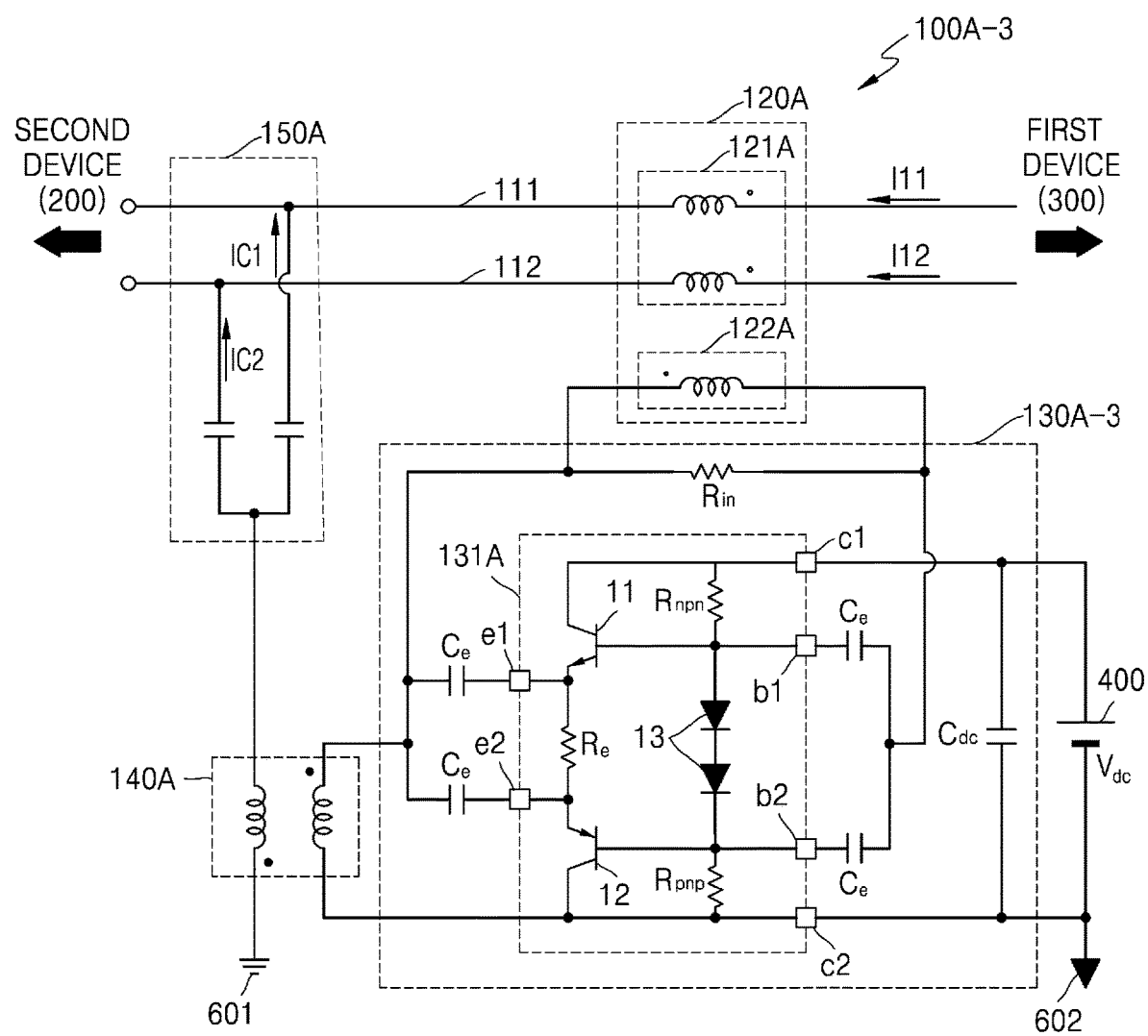
FIG. 21 schematically illustrates a configuration of an active current compensation device according to an embodiment of the present disclosure.

FIG. 21 schematically illustrates a configuration of the active current compensation device 100A-3 according to an embodiment of the present disclosure. Hereinafter, descriptions of contents overlapping with contents described with reference to FIGS. 18 and 19 will be omitted.

Referring to FIG. 21, the active current compensation device 100A-3 may actively compensate for first currents I11 and I12 input as a common-mode current with respect to each of high-current paths 111 and 112 connected to the first device 300.

To this end, the active current compensation device 100A-3 may include two high-current paths 111 and 112, a sensing transformer 120A, an amplification unit 130A-3, a compensation transformer 140A, and a compensation capacitor unit 150A.

The active current compensation device 100A-3 may be an example of the active current compensation device 100A illustrated in FIG. 18. The amplification unit 130A-3 may be an example of the amplification unit 130 illustrated in FIG. 18.

The amplification unit 130A-3 of the active current compensation device 100A-3 according to an embodiment may include an integrated circuit unit 131A and a non-integrated circuit unit. From among components of the amplification unit 130A-3, other components than the integrated circuit unit 131A may be included in the non-integrated circuit unit.

The integrated circuit unit 131A may correspond to the above-described integrated circuit unit 131A. That is, the above-described integrated circuit unit 131A is also applicable to the active current compensation device 100A-3 according to the embodiment described with reference to FIG. 21. Accordingly, since a description of the integrated circuit unit 131A is redundant, the integrated circuit unit 131A will be briefly described.

As described above, the integrated circuit unit 131A may include a first transistor 11, a second transistor 12, and/or one or more resistors. In an embodiment, the first transistor 11 may be an npn BJT, and the second transistor 12 may be a pnp BJT. For example, the amplification unit 130A-3 may have a push-pull amplifier structure including an npn BJT and a pnp BJT. The integrated circuit unit 131A may further include a diode 13 in addition to the first transistor 11, the second transistor 12, and the one or more resistors. For example, one end of the diode 13 may be connected to a base terminal of the first transistor 11, and the other end of the diode 13 may be connected to a base terminal of the second transistor 12. In an optional embodiment, the diode 13 may be replaced by a resistor.

An induced current induced in a secondary side 122A by the sensing transformer 120A may be differentially input to the amplification unit 130A-3. A resistor Rin may be connected in parallel to the secondary side 122A at an input end of the amplification unit 130A-3. An input impedance of the amplification unit 130A-3 may be adjusted through the resistor Rin. Only AC signals may be selectively coupled through the capacitors Cb and Ce.

The power supply 400 supplies a DC low voltage Vdc, which is based on the second reference potential 602, to drive the amplification unit 130A-3. Cdc is a DC decoupling capacitor and may be connected in parallel to the power supply 400. Only AC signals may be coupled between both collectors of the first transistor 11 (e.g., an npn BJT) and the second transistor 12 (e.g., a pnp BJT) through Cdc.

The above-described resistor Rin and capacitors Cb, Ce, and Cdc may be included in the non-integrated circuit unit.

Meanwhile, in the sensing transformer 120A, when a turns ratio of a primary side 121A and the secondary side 122A is 1:Nsen, current induced in the secondary side 122A has a magnitude of 1/Nsen times that of the first currents I11 and I12. In addition, in the compensation transformer 140A, when a turns ratio of a primary side 141A and a secondary side 142A is 1:$N_{inj}$, current (e.g., amplified current) induced in the secondary side 142A has a magnitude of 1/$N_{inj}$ times that of current flowing in the primary side 141A. Accordingly, in order to generate compensation currents IC1 and IC2, which have the same magnitude and an opposite phase compared to the first currents I11 and I12 to cancel the first currents I11 and I12, a current gain of the amplification unit 130A-3 may be designed to be Nsen*$N_{inj}$.

Meanwhile, a current flowing through a collector and an emitter of a BJT varies according to a voltage applied between a base and the emitter of the BJT. When an input voltage of the amplification unit 130A-3 has a positive swing of greater than zero due to noise, the first transistor 11 (e.g., an npn BJT) may operate. When the input voltage of the amplification unit 130A-3 has a negative swing of less than zero due to a noise signal, the second transistor 12 (e.g., a pnp BJT) may operate.

The active current compensation device 100A-3 according to the embodiment described above may be used to compensate (or cancel) for the first currents I11 and I12 traveling from a load of a single-phase (two-wire) power system to a power source. However, the present disclosure is not limited thereto.

FIG. 22 schematically illustrates a configuration of the active current compensation device 100B according to an embodiment of the present disclosure.

Referring to FIG. 22, the active current compensation device 100B may actively compensate for first currents I11, I12, I13, and I14 input as a common-mode current with respect to each of first through fourth high-current paths 111, 112, 113, and 114 connected to the first device 300.

The active current compensation device 100B according to an embodiment may include first through fourth high-current paths 111, 112, 113, and 114, a noise coupling capacitor unit 181, a sensing transformer 120B, the amplification unit 130B, and the compensation unit 160B, a compensation distribution capacitor unit 182, and a decoupling capacitor 170B.

Unlike the current compensation devices 100A, 100A-1, 100A-2, and 100A-3 according to the above-described embodiments, the active current compensation device 100B may not be isolated from the first through fourth high-current paths 111, 112, 113, and 114. However, the same integrated circuit unit 131A as in the above-described embodiments may also be used in the active current compensation device 100B.

The active current compensation device 100B according to an embodiment may include a first high-current path 111, a second high-current path 112, a third high-current path 113, and a fourth high-current path 114 that are distinguished from each other. According to an embodiment, the first high-current path 111 may be an R-phase power line, the second high-current path 112 may be an S-phase power line, the third high-current path 113 may be a T-phase power line, and the fourth high-current path 114 may be an N-phase power line. The first currents I11, I12, I13, and I14 may be input as a common-mode current with respect to each of the first high-current path 111, the second high-current path 112, the third high-current path 113, and the fourth high-current path 114.

In an embodiment, the active current compensation device 100B may include the noise-coupling capacitor unit 181 on an input side thereof (i.e., the first device 300 side). The noise-coupling capacitor unit 181 may include X-capacitors (X-cap) for coupling noise between phases.

A primary side 121B of the sensing transformer 120B is disposed on each of the first high-current path 111, the second high-current path 112, the third high-current path 113, and the fourth high-current path 114 to generate an induced current in a secondary side 122B. Magnetic flux densities generated by the sensing transformer 120B due to the first currents I11, I12, I13, and I14 on the first through fourth high-current paths 111, 112, 113, and 114 may be reinforced with each other.

The amplification unit 130B may be divided into an integrated circuit unit 131A and a non-integrated circuit unit. In the amplification unit 130B, the other components other than the integrated circuit unit 131A may be included in the non-integrated circuit unit. For example, the components included in the non-integrated circuit unit may be commercial discrete elements, but the present disclosure is not limited thereto.

The integrated circuit unit 131A may correspond to the above-described integrated circuit unit 131A. That is, the above-described integrated circuit unit 131A is also applicable to the active current compensation device 100B according to the embodiment described with reference to FIG. 22. Accordingly, since a description of the integrated circuit unit 131A is redundant, the description thereof will be omitted.

In the amplification unit 130B, the non-integrated circuit unit may be implemented differently from the above-described embodiments. In this embodiment, the non-integrated circuit unit may include impedances Z0 and Zd, and capacitors Cb, Ce, and Cdc.

The impedances Z0 and Zd may be connected to a base side of each of first and second transistors 11 and 12. Here, the connection includes an indirect connection. The impedance Zd may be provided for high-frequency stabilization. For example, impedance Zd may be a resistor or a ferrite bead. However, the present disclosure is not limited thereto. The impedance Z0 may be provided for low-frequency stabilization. In addition, impedance Z0 may block DC signals. For example, impedance Z0 may be a series connection of a resistor and a capacitor. However, the present disclosure is not limited thereto.

Meanwhile, the amplification unit of the current compensation device 100B is not limited to the amplification unit 130B. The amplification unit of the current compensation device 100B may be implemented by one of the amplification units including the above-described amplification unit 130A, amplification unit 130A-1, amplification unit 130A-2, and amplification unit 130A-3. However, the present disclosure is not limited thereto.

The compensation unit 160B may inject a compensation current into one high-current path (e.g., the fourth high-current path 114). The compensation distribution capacitor unit 182 may be provided on an output side of the active current compensation device 100B (i.e., the second device 200 side). The compensation distribution capacitor unit 182 may include X-capacitors.

The active current compensation device 100B may include the decoupling capacitor 170B on the output side thereof (i.e., the second device 200 side). The decoupling capacitor 170B may be a Y-capacitor for impedance decoupling at an AC power terminal.

The active current compensation device 100B according to the embodiment described above may be used to compensate (or cancel) for the first currents I11, I12, I13, and I14 traveling from a load of a three-phase four-wire power system to a power source.

The active current compensation devices 100, 100A, 100A-1, 100A-2, 100A-3, and 100B according to various embodiments have little increase in size and heat generation in high-power systems as compared with passive EMI filters.

The active current compensation devices according to various embodiments include the one-chip integrated circuit unit 131 or 131A, so that the size thereof is minimized as compared with a case in which discrete semiconductor devices are included. The integrated circuit unit 131A is commonly and universally applicable to the active current compensation devices including the active current compensation devices 100, 100A, 100A-1, 100A-2, 100A-3, and 100B according to various embodiments.

The integrated circuit unit 131A and the active current compensation device including the same according to various embodiments may be used in various power electronic products regardless of a power rating. The integrated circuit unit 131A and the active current compensation device including the same according to various embodiments are expandable to a high power/high noise system.

Due to the one-chip integrated circuit unit 131A, the function of the active current compensation device may be expanded without having additional components.

The integrated circuit unit 131A according to various embodiments may have sufficient durability against an excessive voltage of the high-current path in which the active current compensation device is installed.

[4] Active Current Compensation Device Including One-Chip Integrated Circuit

Figure 23:
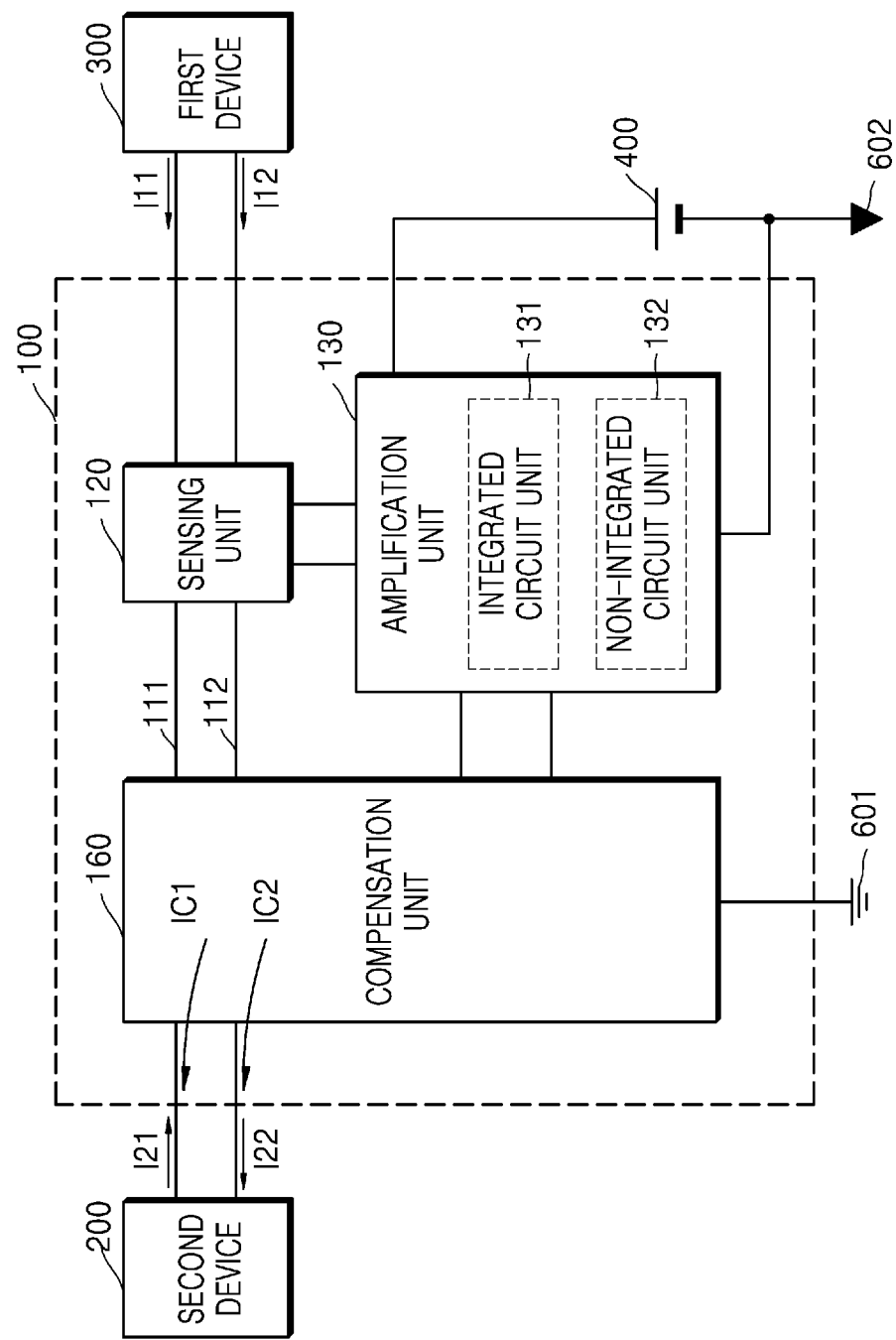
FIG. 23 schematically illustrates a configuration of a system including an active current compensation device according to an embodiment of the present disclosure.

FIG. 23 schematically illustrates a configuration of a system including an active current compensation device 100 according to an embodiment of the present disclosure. The active current compensation device 100 may actively compensate for first currents I11 and I12 (e.g., an EMI noise current) that are input as a common-mode current through two or more high-current paths 111 and 112 from a first device 300.

Referring to FIG. 23, the active current compensation device 100 may include a sensing unit 120, an amplification unit 130, and a compensation unit 160.

In the present specification, the first device 300 may be any of various types of power systems using power supplied by a second device 200. For example, the first device 300 may be a load that is driven using the power supplied by the second device 200. In addition, the first device 300 may be a load (e.g., an electric vehicle) that stores energy using the power supplied by the second device 200 and is driven using the stored energy. However, the present disclosure is not limited thereto.

In the present specification, the second device 200 may be any of various types of systems for supplying power to the first device 300 in the form of current and/or voltage. The second device 200 may be a device that supplies stored energy. However, the present disclosure is not limited thereto.

A power converter may be located on the first device 300 side. For example, the first currents I11 and I12 may be input to the current compensation device 100 due to a switching operation of the power converter. That is, the first device 300 side may correspond to a noise source and the second device 200 side may correspond to a noise receiver.

The two or more high-current paths 111 and 112 may be paths for transmitting the power supplied from the second device 200, that is, second currents I21 and I22, to the first device 300, for example, may be power lines. For example, the two or more high-current paths 111 and 112 may be a live line and a neutral line. At least some portions of the high-current paths 111 and 112 may pass through the current compensation device 100. The second currents I21 and I22 may be an alternating current having a frequency of a second frequency band. The second frequency band may be, for example, a band having a range of 50 Hz to 60 Hz.

Further, the two or more high-current paths 111 and 112 may also be paths through which noise generated by the first device 300, that is, the first currents I11 and I12, is transmitted to the second device 200. The first currents I11 and I12 may be input as a common-mode current with respect to each of the two or more high-current paths 111 and 112. The first currents I11 and I12 may be currents that are unintentionally generated in the first device 300 due to various causes. For example, the first currents I11 and I12 may be noise currents generated by virtual capacitance between the first device 300 and the surrounding environment. Alternatively, the first currents I11 and I12 may be noise currents generated due to a switching operation of the power converter of the first device 300. The first currents I11 and I12 may be currents having a frequency of a first frequency band. The first frequency band may be a frequency band higher than the second frequency band described above. The first frequency band may be, for example, a band having a range of 150 KHz to 30 MHz.

Figure 28:
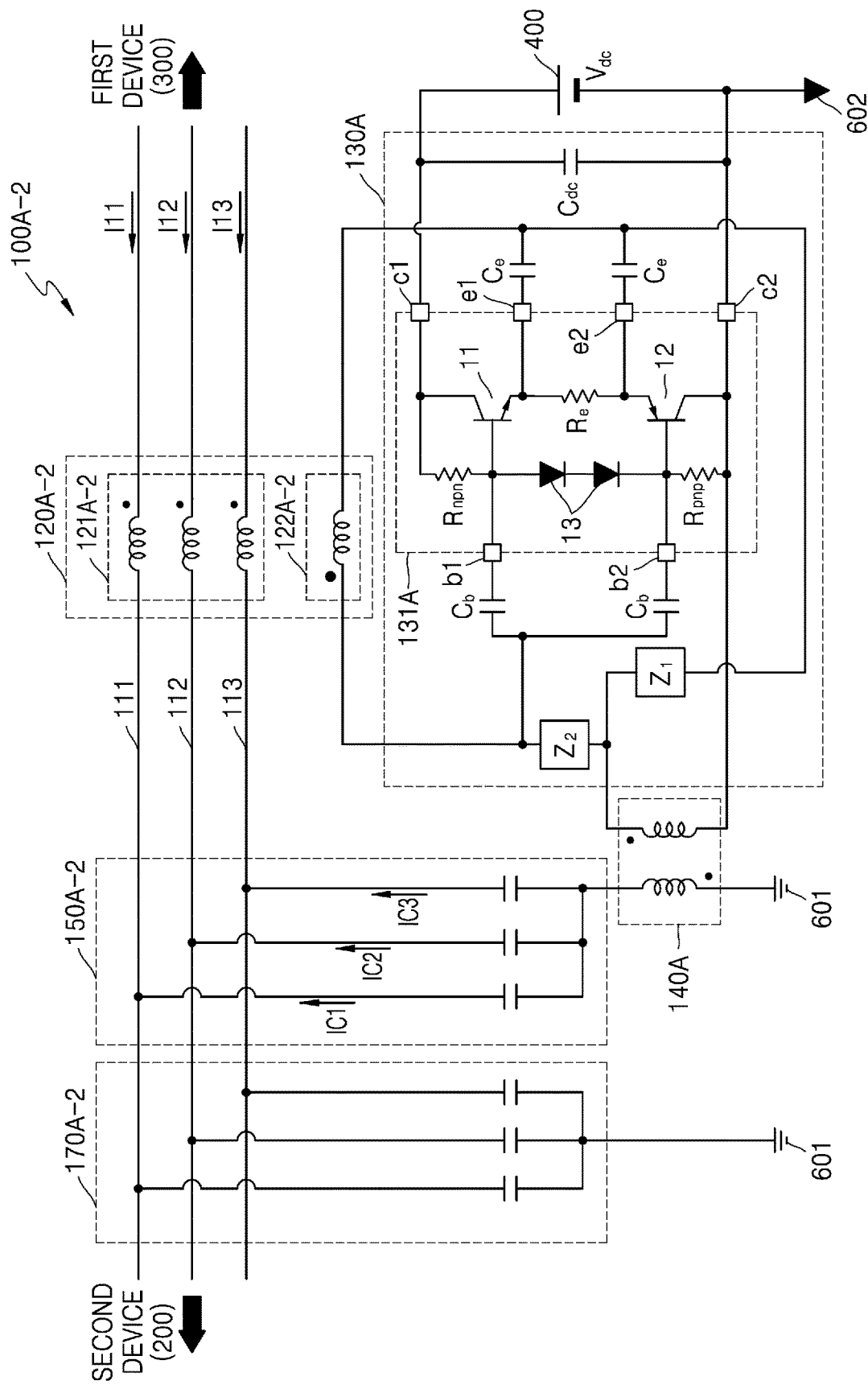
FIG. 28 schematically illustrates a configuration of an active current compensation device according to an embodiment of the present disclosure.

Meanwhile, the two or more high-current paths 111 and 112 may include two paths as shown in FIG. 23, or may include three paths as shown in FIG. 28. In addition, the two or more high-current paths 111 and 112 may include four paths. The number of the high-current paths 111 and 112 may vary depending on the type and/or form of power used by the first device 300 and/or the second device 200.

The sensing unit 120 may sense the first currents I11 and I12 on the two or more high-current paths 111 and 112 and generate an output signal corresponding to the first currents I11 and I12. That is, the sensing unit 120 may refer to a component that senses the first currents I11 and I12 on the high-current paths 111 and 112. In order for the sensing unit 120 to sense the first currents I11 and I12, at least some portion of the high-current paths 111 and 112 may pass through the sensing unit 120, but a portion of the sensing unit 120, which generates an output signal according to the sensing, may be isolated from the high-current paths 111 and 112. For example, the sensing unit 120 may be implemented as a sensing transformer. The sensing transformer may sense the first currents I11 and I12 on the high-current paths 111 and 112 in a state of being isolated from the high-current paths 111 and 112. However, the sensing unit 120 is not limited to the sensing transformer.

According to an embodiment, the sensing unit 120 may be differentially connected to input terminals of the amplification unit 130.

The amplification unit 130 may be electrically connected to the sensing unit 120, and may amplify the output signal output from the sensing unit 120 to generate an amplified output signal. The term "amplification" by the amplification unit 130, as used herein, may indicate the adjustment of the magnitude and/or phase of an object to be amplified. The amplification unit 130 may be implemented by various components, and may include active elements. In an embodiment, the amplification unit 130 may include BJTs. For example, the amplification unit 130 may include a plurality of passive elements, such as resistors and capacitors, in addition to the BJTs. However, the present disclosure is not limited thereto, and the component for the "amplification" described in the present disclosure may be used without being limited to the amplification unit 130 of the present disclosure.

According to an embodiment, a second reference potential 602 of the amplification unit 130 and a first reference potential 601 of the current compensation device 100 may be distinguished from each other. For example, when the amplification unit 130 is isolated from the high-current paths 111 and 112, the second reference potential 602 of the amplification unit 130 and the first reference potential 601 of the current compensation device 100 may be distinguished from each other.

However, the present disclosure is not limited thereto. For example, when the amplification unit 130 is not isolated from the high-current paths 111 and 112, the reference potential of the amplification unit and the reference potential of the current compensation device may not be distinguished from each other.

The amplification unit 130 according to various embodiments of the present disclosure may include a one-chip integrated circuit (IC) 131 and a non-integrated circuit unit 132. The one-chip IC 131 may include essential components of the active current compensation device 100. The essential components may include active elements. That is, the active elements included in the amplification unit 130 may be integrated into the one-chip IC 131. In the amplification unit 130, the non-integrated circuit unit 132 may not include active elements. The IC 131 may further include passive elements as well as the active elements.

The IC 131 according to an embodiment of the present disclosure may physically be one IC chip. The IC 131 according to an embodiment of the present disclosure is applicable to the active current compensation device 100 of various designs. The one-chip IC 131 according to an embodiment of the present disclosure has versatility as an independent module and is applicable to the current compensation device 100 of various designs.

The non-integrated circuit unit 132 according to an embodiment of the present disclosure may be modified according to the design of the active current compensation device 100.

The one-chip IC 131 may include terminals b1, b2, e1, and e2 to be connected to the non-integrated circuit unit 132. The IC 131 and the non-integrated circuit unit 132 may be combined together to function as the amplification unit 130. The combination of the IC 131 and the non-integrated circuit unit 132 may perform a function of generating an amplified signal from the output signal output from the sensing unit 120. The amplified signal may be input to the compensation unit 160.

Examples of the detailed configuration of the amplification unit 130 including the IC 131 and the non-integrated circuit unit 132 will be described below with reference to FIGS. 25, 27, and 28.

The amplification unit 130 may receive power from a power supply 400 that is distinguished from the first device 300 and/or the second device 200. The amplification unit 130 may receive the power from the power supply 400, and amplify the output signal output from the sensing unit 120 to generate an amplified current.

The power supply 400 may be a device that receives power from a power source that is independent of the first device 300 and the second device 200 and generates input power of the amplification unit 130. Alternatively, the power supply 400 may also be a device that receives power from any one of the first device 300 and the second device 200 and generates input power of the amplification unit 130.

The one-chip IC 131 may include a terminal c1 to be connected to the power supply 400, a terminal c2 to be connected to the second reference potential 602, and the terminals b1, b2, e1, and e2 to be connected to the non-integrated circuit unit 132. In other embodiments, the one-chip IC 131 may further include terminals for other functions.

The power supply 400 may supply a DC voltage Vdc, which is based on the second reference potential 602, to drive the amplification unit 130. A capacitor Cdc for providing decoupling for Vdc may be connected in parallel to the power supply 400. The capacitor Cdc may be connected outside the IC 131, and may be connected between the power terminal c1 and the terminal c2 corresponding to the second reference potential.

In the amplification unit 130, the other components other than the IC 131 may be included in the non-integrated circuit unit 132. Thus, the capacitor Cdc may be referred to as being included in the non-integrated circuit unit 132.

The compensation unit 160 may generate compensation currents IC1 and IC2 on the basis of the amplified output signal generated by the amplification unit 130. An output side of the compensation unit 160 may be connected to the high-current paths 111 and 112 to allow the compensation currents IC1 and IC2 to flow to the high-current paths 111 and 112.

According to an embodiment, the output side of the compensation unit 160 may be isolated from the amplification unit 130. For example, the compensation unit 160 may include a compensation transformer for the isolation. For example, the output signal of the amplification unit 130 may flow through a primary side of the compensation transformer, and the compensation current based on the output signal may be generated on a secondary side of the compensation transformer.

However, the present disclosure is not limited thereto. According to an embodiment, the output side of the compensation unit 160 may also be isolated from the amplification unit 130. In this case, the amplification unit 130 may not be isolated from the high-current paths 111 and 112.

In order to cancel the first currents I11 and I12, the compensation unit 160 may inject the compensation currents IC1 and IC2 into the high-current paths 111 and 112 through the two or more high-current paths 111 and 112, respectively. The compensation currents IC1 and IC2 may have the same magnitude and an opposite phase compared to the first currents I11 and I12.

Figure 24:
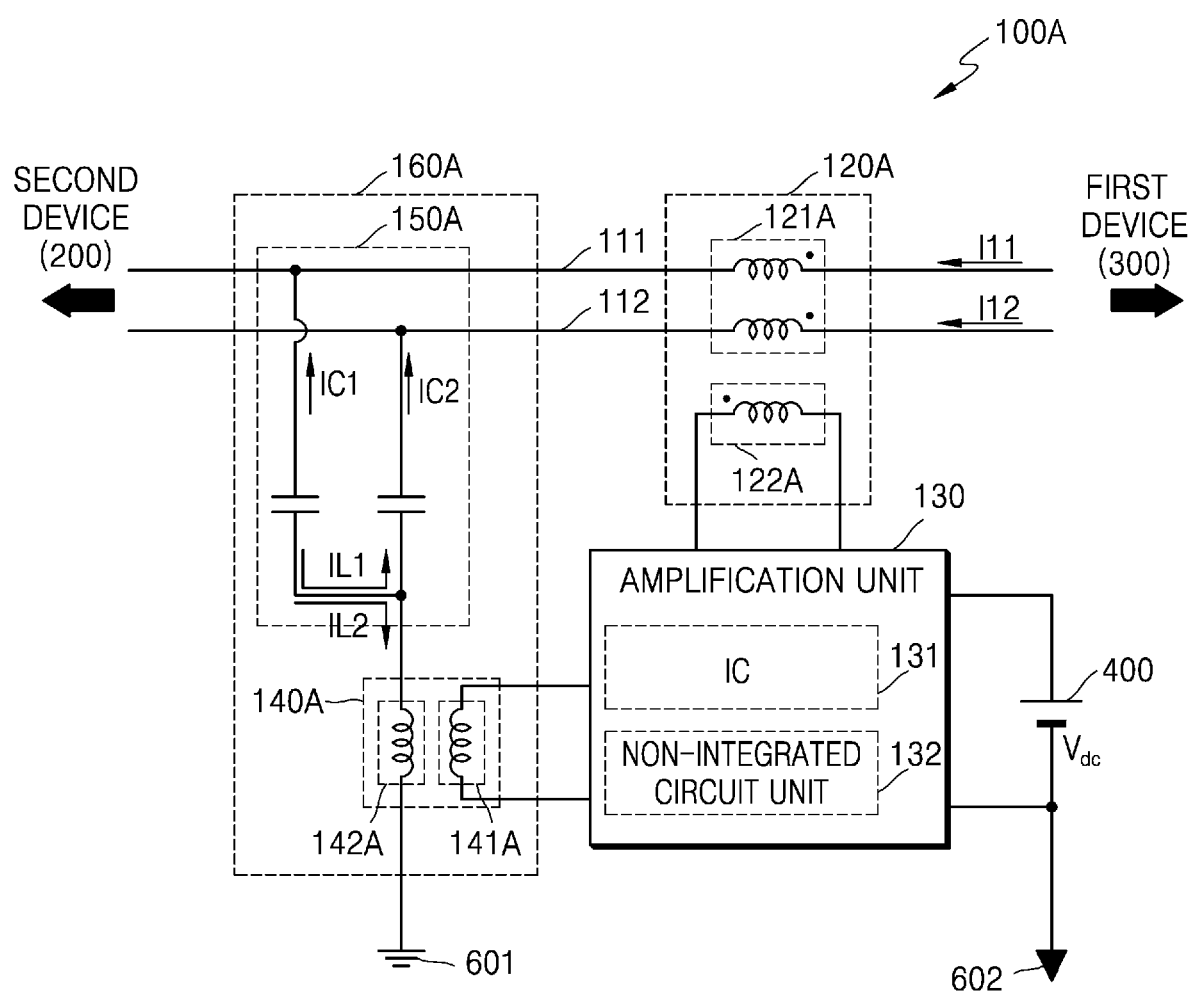
FIG. 24 illustrates a more specific example of the embodiment described with reference to FIG. 23, and schematically illustrates an active current compensation device according to an embodiment of the present disclosure.

FIG. 24 illustrates a more specific example of the embodiment described with reference to FIG. 23, and schematically illustrates an active current compensation device 100A according to an embodiment of the present disclosure. The active current compensation device 100A may actively compensate for first currents I11 and I12 (e.g., a noise current) input as a common-mode current with respect to each of two high-current paths 111 and 112 connected to the first device 300.

Referring to FIG. 24, the active current compensation device 100A may include a sensing transformer 120A, an amplification unit 130, and a compensation unit 160A.

In an embodiment, the sensing unit 120 described above may include the sensing transformer 120A. In this case, the sensing transformer 120A may be a component for sensing the first currents I11 and I12 on the high-current paths 111 and 112 in a state of being isolated from the high-current paths 111 and 112. The sensing transformer 120A may sense the first currents I11 and I12 that are noise currents input through the high-current paths 111 and 112 (e.g., power lines) from the first device 300 side.

The sensing transformer 120A may include a primary side 121A disposed on the high-current paths 111 and 112 and a secondary side 122A differentially connected to input terminals of the amplification unit 130. The sensing transformer 120A may generate an induced current, which is directed to the secondary side 122A (e.g., a secondary winding), on the basis of magnetic flux densities induced due to the first currents I11 and I12 at the primary side 121A (e.g., a primary winding) disposed on the high-current paths 111 and 112. The primary side 121A of the sensing transformer 120A may be, for example, a winding in which each of a first high-current path 111 and a second high-current path 112 is wound around one core. However, the present disclosure is not limited thereto, and the primary side 121A of the sensing transformer 120A may have a form in which the first high-current path 111 and the second high-current path 112 pass through the core.

Specifically, the sensing transformer 120A may be configured such that the magnetic flux density induced due to the first current I11 on the first high-current path 111 (e.g., a live line) and the magnetic flux density induced due to the first current I12 on the second high-current path 112 (e.g., neutral line) are overlapped (or reinforced) with each other. In this case, the second currents I21 and I22 also flow through the high-current paths 111 and 112, and thus the sensing transformer 120A may be configured such that a magnetic flux density induced due to the second current I21 on the first high-current path 111 and a magnetic flux density induced due to the second current I22 on the second high-current path 112 cancel each other. In addition, as an example, the sensing transformer 120A may be configured such that magnitudes of the magnetic flux densities, which are induced due to the first currents I11 and I12 of a first frequency band (e.g., a band having a range of 150 KHz to 30 MHz), are greater than magnitudes of the magnetic flux densities induced due to the second currents I21 and I22 of a second frequency band (for example, a band in a range of 50 Hz to 60 Hz).

As described above, the sensing transformer 120A may be configured such that the magnetic flux densities induced due to the second currents I21 and I22 may cancel each other so that only the first currents I11 and I12 may be sensed. That is, the current induced in the secondary side 122A of the sensing transformer 120A may be a current into which the first currents I11 and I12 are converted at a predetermined ratio.

For example, in the sensing transformer 120A, when a turns ratio of the primary side 121A and the secondary side 122A is 1:Nsen, and a self-inductance of the primary side 121A of the sensing transformer 120A is Lsen, the secondary side 122A may have a self-inductance of Nsen2*Lsen. In this case, the current induced in the secondary side 122A has a magnitude that is 1/Nsen times that of the first currents I11 and I12. In an example, the primary side 121$a$ and the secondary side 122$a$ of the sensing transformer 120$a$ may be coupled with a coupling coefficient of Ksen.

The secondary side 122A of the sensing transformer 120A may be connected to the input terminals of the amplification unit 130. For example, the secondary side 122A of the sensing transformer 120A may be differentially connected to the input terminals of the amplification unit 130 and provide the induced current or an induced voltage to the amplification unit 130.

The amplification unit 130 may amplify the current that is sensed by the sensing transformer 120A and induced in the secondary side 122A. For example, the amplification unit 130 may amplify the magnitude of the induced current at a predetermined ratio and/or adjust a phase of the induced current.

According to various embodiments of the present disclosure, the amplification unit 130 may include a one-chip IC 131 and a non-integrated circuit unit 132 that is a component other than the IC chip.

The IC 131 may include active elements. The IC 131 may be connected to the power supply 400, which is based on the second reference potential 602, to drive the active elements. The second reference potential 602 may be distinguished from the first reference potential 601 of the current compensation device 100A (or the compensation unit 160A).

The one-chip IC 131 may include a terminal c1 to be connected to the power supply 400, a terminal c2 to be connected to the second reference potential 602, and terminals b1, b2, e1, and e2 to be connected to the non-integrated circuit unit 132.

The compensation unit 160A may be an example of the above-described compensation unit 160. In an embodiment, the compensation unit 160A may include a compensation transformer 140A and a compensation capacitor unit 150A. The amplified current amplified by the above-described amplification unit 130 flows through a primary side 141A of the compensation transformer 140A.

The compensation transformer 140A according to an embodiment may be a component for isolating the amplification unit 130 including active elements from the high-current paths 111 and 112. That is, the compensation transformer 140A may be a component for generating compensation current (in a secondary side 142A) to be injected into the high-current paths 111 and 112 on the basis of the amplified current in a state of being isolated from the high-current paths 111 and 112.

The compensation transformer 140A may include the primary side 141A differentially connected to output terminals of the amplification unit 130 and the secondary side 142A connected to the high-current paths 111 and 112. The compensation transformer 140A may induce a compensation current, which is directed toward the secondary side 142A (e.g., a secondary winding), on the basis of a magnetic flux density induced due to the amplified current flowing through the primary side 141A (e.g., a primary winding).

In this case, the secondary side 142A may be disposed on a path connecting the compensation capacitor unit 150A, which will be described below, and the first reference potential 601 of the current compensation device 100A. That is, one end of the secondary side 142A is connected to the high-current paths 111 and 112 through the compensation capacitor unit 150A, and the other end of the secondary side 142A may be connected to the first reference potential 601 of the active current compensation device 100A. Meanwhile, the primary side 141A of the compensation transformer 140A, the amplification unit 130, and the secondary side 122A of the sensing transformer 120A may be connected to the second reference potential 602, which is distinguished from the reference potential of the other components of the active current compensation device 100A. The first reference potential 601 of the current compensation device 100A according to an embodiment and the second reference potential 602 of the amplification unit 130 may be distinguished from each other.

As described above, in the current compensation device 100A according to an embodiment, the component generating the compensation current uses a reference potential (i.e., the second reference potential 602) different from that of the other components and uses the separate power supply 400, and thus, may operate in a state of being isolated from the other components, thereby improving the reliability of the active current compensation device 100A. However, the active current compensation device including the IC 131 and the non-integrated circuit unit 132 according to the present disclosure is not limited to such an isolating structure. The active current compensation device according to an embodiment of the present disclosure may not be isolated from the high-current path.

In the compensation transformer 140A according to an embodiment, when a turns ratio of the primary side 141A and the secondary side 142A is $1:N_{inj}$, and a self-inductance of the primary side 141A of the compensation transformer 140A is Linj, the secondary side 142A may have a self-inductance of $N_{inj}^2 \ast Linj$. In this case, the current induced in the secondary side 142A has a magnitude that is $1/N_{inj}$ times that of the current (i.e., the amplified current) flowing in the primary side 141A. In an example, the primary side 141A and the secondary side 142A of the compensation transformer 140A may be coupled with a coupling coefficient of kinj.

The current converted through the compensation transformer 140A may be injected into the high-current paths 111 and 112 (e.g., power lines) through the compensation capacitor unit 150A as compensation currents IC1 and IC2. Accordingly, the compensation currents IC1 and IC2 may have the same magnitude and an opposite phase compared to the first currents I11 and I12 to cancel the first currents I11 and I12. Accordingly, a magnitude of a current gain of the amplification unit 130 may be designed to be $Nsen \ast N_{inj}$. However, since a magnetic coupling loss may occur in an actual situation, a target current gain of the amplification unit 130 may be designed to be higher than $Nsen \ast N_{inj}$.

As described above, the compensation capacitor unit 150A may provide a path through which the current generated by the compensation transformer 140A flows to each of the two high-current paths 111 and 112.

The compensation capacitor unit 150A may include Y-capacitors (Y-cap) each having one end connected to the secondary side 142A of the compensation transformer 140A and the other end connected to the high-current paths 111 and 112. For example, one ends of the two Y-caps share a node connected to the secondary side 142A of the compensation transformer 140A, and the opposite ends of the two Y-caps may have a node connected to the first high-current path 111 and the second high-current path 112.

The compensation capacitor unit 150A may allow the compensation currents IC1 and IC2 induced by the compensation transformer 140A to flow to the power line. As the compensation currents IC1 and IC2 compensate (cancel) for the first currents I11 and I12, the current compensation device 100A may reduce noise.

Meanwhile, the compensation capacitor unit 150A may be configured such that a current IL1 flowing between the two high-current paths 111 and 112 through the compensation capacitors has a magnitude less than a first threshold magnitude. In addition, the compensation capacitor unit 150A may be configured such that a current IL2 flowing between each of the two high-current paths 111 and 112 and the first reference potential 601 through the compensation capacitors has a magnitude less than a second threshold magnitude.

The active current compensation device 100A according to an embodiment may be implemented as an isolated structure by using the compensation transformer 140A and the sensing transformer 120A.

Figure 25:
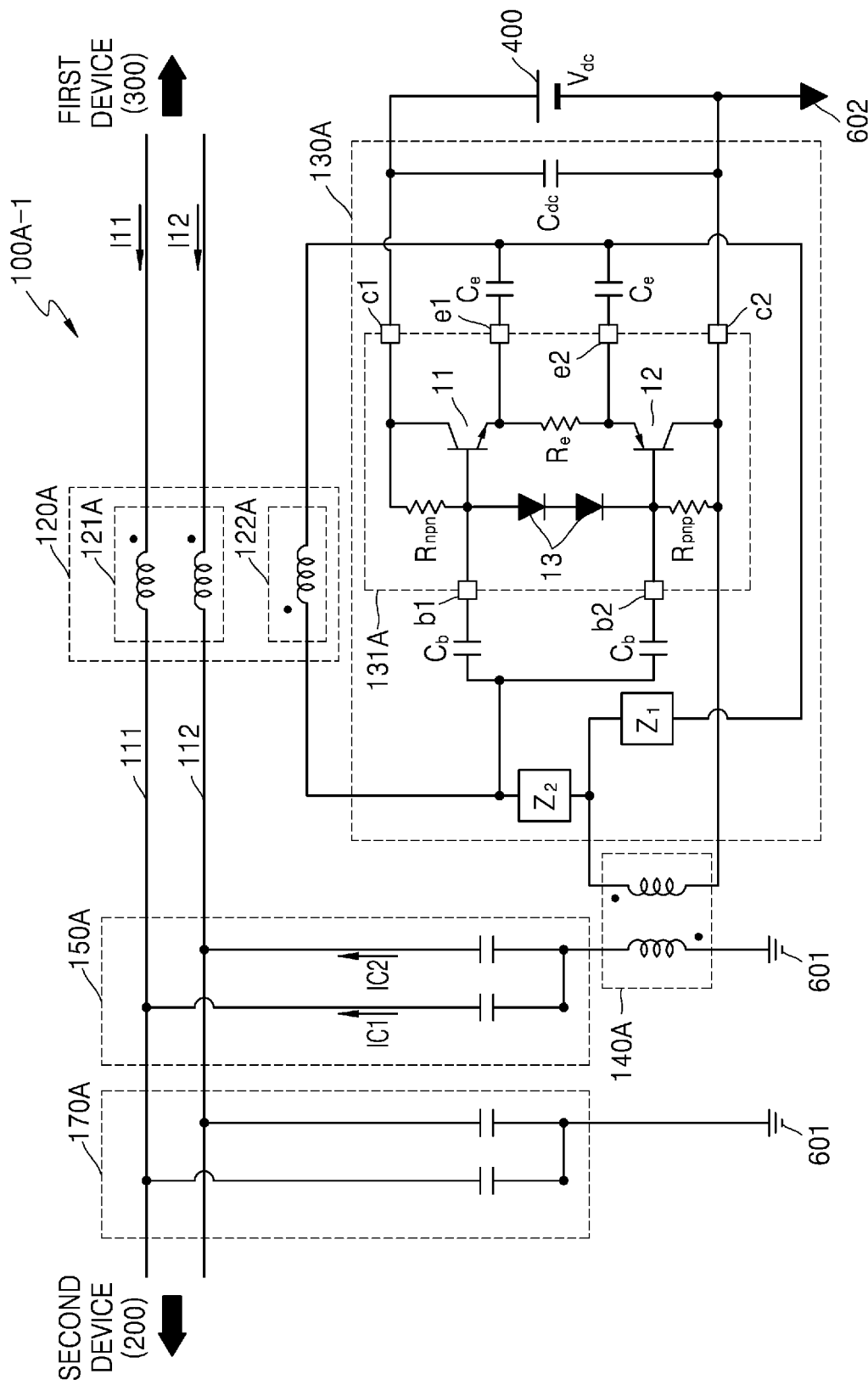
FIG. 25 illustrates a more specific example of the embodiment described with reference to FIG. 24, and schematically illustrates an active current compensation device according to an embodiment of the present disclosure.

FIG. 25 illustrates a more specific example of the embodiment described with reference to FIG. 24, and schematically illustrates an active current compensation device 100A-1 according to an embodiment of the present disclosure. The active current compensation device 100A-1, an amplification unit 130A, and an IC 131A illustrated in FIG. 25 are respectively exemplary of the active current compensation device 100A, the amplification unit 130, and the IC 131 illustrated in FIG. 24.

The active current compensation device 100A-1 according to an embodiment may include a sensing transformer 120A, the amplification unit 130A, a compensation transformer 140A, and a compensation capacitor unit 150A. In an embodiment, the active current compensation device 100A-1 may further include a decoupling capacitor unit 170A on an output side thereof (i.e., the second device 200 side). In other embodiments, the decoupling capacitor unit 170A may be omitted. Descriptions of the sensing transformer 120A, the compensation transformer 140A, and the compensation capacitor unit 150A are redundant and thus omitted.

In an embodiment, an induced current induced in a secondary side 122A by the sensing transformer 120A may be differentially input to the amplification unit 130A.

The amplification unit 130A of the active current compensation device 100A-1 according to an embodiment may include the one-chip IC 131A and a non-integrated circuit unit. In the amplification unit 130A, the other components other than the iC 131A may be included in the non-integrated circuit unit. In embodiments of the present disclosure, the IC 131A is physically implemented in one chip. Components included in the non-integrated circuit unit may be commercial discrete elements. The non-integrated circuit unit may be implemented differently depending on an embodiment. The non-integrated circuit unit may be modified so that the same one-chip IC 131A is applicable to the active current compensation device 100 of various designs.

The one-chip IC 131A may include an npn BJT 11, a pnp BJT 12, a diode 13, and one or more resistors.

In an embodiment, the one or more resistors included in the IC 131A may include Rnpn, Rpnp, and/or Re. In the IC 131A, the resistor Rnpn may connect a collector node and a base node of the npn BJT 11. In the IC 131A, then resistor Rpnp may connect a collector node and a base node of the pnp BJT 12. In the IC 131A, the resistor Re may connect an emitter node of the npn BJT 11 and an emitter node of the pnp BJT 12.

The power supply 400 may supply a DC voltage Vdc between the collector node of the npn BJT 11 and the collector node of the pnp BJT 12 to drive the amplification unit 130A. The collector node of the pnp BJT 12 may correspond to the second reference potential 602, and the collector node of the npn BJT 11 may correspond to the supply voltage Vdc of the power supply 400, which is based on the second reference potential 602.

In an embodiment, in the IC 131A, the biasing diode 13 may connect the base node of the npn BJT 11 and the base node of the pnp BJT 12. That is, one end of the diode 13 may be connected to the base node of the npn BJT 11, and the other end of the diode 13 may be connected to the base node of the pnp BJT 12.

According to embodiments of the present disclosure, the resistors Rnpn, Rpnp, and Re, and/or the biasing diode 13 included in the IC 131A may be used for DC biasing of the BJTs 11 and 12. In an embodiment of the present disclosure, the resistors Rnpn, Rpnp, and Re, and the biasing diode 13 are general-purpose components in various active current compensation devices 100 and 100A, and thus may be integrated in the one-chip IC 131A.

The one-chip IC 131A according to an embodiment of the present disclosure may include a terminal b1 corresponding to a base of the npn BJT 11 and a terminal c1 corresponding to a collector of the npn BJT 11, a terminal e1 corresponding to an emitter of the npn BJT 11, a terminal b2 corresponding to a base of the pnp BJT 12, a terminal c2 corresponding to a collector of the pnp BJT 12, and a terminal e2 corresponding to an emitter of the pnp BJT 12. However, the present disclosure is not limited thereto, and the one-chip IC 131A may further include other terminals in addition to the terminals b1, b2, c1, c2, e1, and e2.

In various embodiments, at least one of the terminals b1, b2, c1, c2, e1, and e2 of the one-chip IC 131A may be connected to the non-integrated circuit unit. The one-chip IC 131A and the non-integrated circuit unit may be combined together to function as the amplification unit 130A according to an embodiment.

In the non-integrated circuit unit, the non-integrated circuit unit may include capacitors Cb, Ce, and Cdc, and impedances Z1 and Z2.

According to an embodiment, the capacitors Cb of the non-integrated circuit unit may be respectively connected to the base terminals b1 and b2 of the one-chip IC 131A. The capacitors Ce of the non-integrated circuit unit may be respectively connected to the emitter terminals e1 and e2 of the IC 131A. In the outside of the IC 131A, the collector terminal c2 of the pnp BJT 12 may be connected to the second reference potential 602. In the outside of the IC 131A, the power supply 400 may be connected between both collector terminals c1 and c2. In the outside of the IC 131A, the capacitor Cdc of the non-integrated circuit unit may be connected between both collector terminals c1 and c2.

The capacitors Cb and Ce included in the non-integrated circuit unit may respectively block DC voltages at the base node and the emitter node of each of the BJTs 11 and 12. Only AC signals may be selectively coupled through the capacitors Cb and Ce.

The capacitor Cdc is a DC decoupling capacitor for the voltage Vdc, and may be connected in parallel with respect to the supply voltage Vdc of the power supply 400. Only AC signals may be coupled between both collectors of the npn BJT 11 and the pnp BJT 12 through the capacitors Cdc.

A current gain of the amplification unit 130A may be controlled by a ratio of the impedances Z1 and Z2. Z1 and Z2 may be flexibly designed depending on a turns ratio of each of the sensing transformer 120A and the compensation transformer 140A and a required target current gain. Accordingly, Z1 and Z2 may be implemented outside the one-chip IC 131A (i.e., in the non-integrated circuit unit).

A combination of the IC 131A and Cb, Ce, Cdc, Z1, and Z2 of the non-integrated circuit unit may function as the amplification unit 130A according to an embodiment. For example, the amplification unit 130A may have a push-pull amplifier structure including an npn BJT and a pnp BJT.

In an embodiment, the secondary side 122A side of the sensing transformer 120A may be connected between a base side and an emitter side of each of the BJTs 11 and 12. In an embodiment, a primary side 141A of the compensation transformer 140A may be connected between a collector side and the base side of each of the BJTs 11 and 12. The connection in the present embodiment includes an indirect connection.

In an embodiment, the amplification unit 130A may have a regression structure in which an output current is injected back into the base of each of the BJTs 11 and 12. Due to the regression structure, the amplification unit 130A may stably obtain a constant current gain for operating the active current compensation device 100A-1.

For example, when an input voltage of the amplification unit 130A has a positive swing of greater than zero due to a noise signal, the npn BJT 11 may operate. In this case, the operating current may flow through a first path passing through the npn BJT 11. When the input voltage of the amplification unit 130A has a negative swing of less than zero due to a noise signal, the pnp BJT 12 may operate. In this case, the operating current may flow through a second path passing through the pnp BJT 12.

In the IC 131A, an operating point of each of the BJTs may be controlled through the resistors Rnpn, Rpnp, and Re. The resistors Rnpn, Rpnp, and Re may be designed according to the operating point of the BJT.

According to an embodiment of the present disclosure, elements having temperature characteristics may be integrated in the one-chip IC 131A. According to an embodiment, the npn BJT 11, the pnp BJT 12, the biasing diode 13, Rnpn, Rpnp, and Re may be integrated into the one-chip IC 131A. When the elements are integrated into a one-chip, a size of the amplification unit 130A may be minimized as compared with a case in which discrete elements are used.

In the present document, the elements having temperature characteristics may refer to elements having certain circuit characteristics in a wide temperature range, for example, from extremely low to high temperatures. The elements having temperature characteristics may refer to elements in which element characteristics vary according to a temperature that changes in a wide temperature range. According to an embodiment of the present disclosure, by embedding the active elements having temperature characteristics in the one-chip IC 131A, it is possible to implement the one-chip IC 131A having constant (or stable) circuit characteristics even when a temperature changes. According to an embodiment of the present disclosure, it is possible to implement the amplification unit 130A and the active current compensation device 100A-1, which exhibit constant performance even when a temperature changes, by embedding the active elements having temperature characteristics in the one-chip IC 131A. That is, the one-chip IC 131A may be designed such that the amplification unit 130A exhibits constant performance even when a temperature changes. Here, the expression "the amplification unit 130A exhibits constant performance" is used as a meaning including that the amplification unit 130A maintains stable performance in a predetermined range.

In addition, according to an embodiment of the present disclosure, a temperature may be shared by the elements (e.g., the BJTs 11 and 12, the diode 13, Re, and the like) having temperature characteristics. Accordingly, characteristics according to a temperature may be easily predicted through, for example, simulation or the like. Thus, it is possible to design the amplification unit 130A that is controllable and predictable even when a temperature changes. On the other hand, when discrete elements are used as the BJTs, the diode, and the resistors, since temperature characteristics of the elements may be different, it may be difficult to predict the operation of the amplification unit.

In addition, according to an embodiment of the present disclosure, even when the number of semiconductor devices increases, the size and production cost of the IC 131A or the active current compensation device 100A may increase insignificantly. Accordingly, the one-chip IC 131A and the active current compensation device 100A may be easily mass-produced.

An inductor, the capacitors (e.g., Cb, Ce, and Cdc), Z1, and Z2 of the non-integrated circuit unit are discrete components, and may be implemented around the one-chip IC 131A.

Capacitance of each of the capacitors Cb, Ce, and Cdc required for an AC signal to couple through each of the capacitors Cb, Ce, and Cdc may be several μF or more (e.g., 10 μF). Such a capacitance value is difficult to be implemented in the one-chip IC, and thus the capacitors Cb, Ce, and Cdc may be implemented outside the IC 131A, that is, in the non-integrated circuit unit.

Depending on the design of the non-integrated circuit unit, the one-chip IC 131A may be used for the first device 300 (or the second device 200) of various power systems. For example, the one-chip IC 131A may be independent of a power rating of the first device 300, and the non-integrated circuit unit may be designed according to the power rating of the first device 300. For example, values of impedances Z1 and Z2 may be determined on the basis of a turns ratio of each of the sensing transformer 120A and the compensation transformer 140A and a target current gain of the amplification unit 130A. A configuration of the one-chip IC 131A may be independent of the turns ratio and the target current gain.

The impedances Z1 and Z2 may be implemented outside the IC, i.e., in the non-integrated circuit unit, to achieve design flexibility for various power systems or various first devices 300. Z1 and Z2 may be flexibly designed depending on the turns ratio of each of the sensing transformer 120A and the compensation transformer 140A and the required target current gain. It is possible to design various current compensation devices that allow the same IC 131A to be applied to various power systems by adjusting the impedances Z1 and Z2.

In particular, the size and impedance characteristics of the sensing transformer 120A should vary depending on a maximum rated current of the first device 300. Thus, in order to make a ratio of an injected current to a sensed noise current uniform in a wide frequency range, a proper design of Z1 and Z2 is required. Z1 and Z2 may be designed so that the ratio of the injected current to the sensed noise current becomes 1 in a wide frequency range by adjusting the turns ratio of each of the sensing transformer 120A and the compensation transformer 140A and a ratio of Z1 and Z2. To this end, the impedances Z1 and Z2 may be implemented outside the IC 131A for design flexibility. In an embodiment, Z1 may be a series connection of a resistor R1 and a capacitor C1, and Z2 may be a series connection of a resistor R2 and a capacitor C2. Since C1 and C2 are additionally implemented in series next to R1 and R2 respectively, the ratio of the injected current to the sensed noise current in a low-frequency range may exhibit better performance.

The IC 131A according to various embodiments of the present disclosure is designed in consideration of scalability, and thus may be used in various types of active current compensation devices. The same type of IC 131A may be used in various embodiments, and the non-integrated circuit unit may be designed differently depending on an embodiment.

Meanwhile, the active current compensation device 100A-1 may further include the decoupling capacitor unit 170A on an output side thereof (i.e., the second device 200 side). One ends of capacitors included in the decoupling capacitor unit 170A may be connected to a first high-current path 111 and a second high-current path 112, respectively. The opposite end of each of the capacitors may be connected to the first reference potential 601 of the current compensation device 100A-1.

The decoupling capacitor unit 170A may prevent the performance of outputting the compensation current of the active current compensation device 100A-1 from being significantly changed according to a change in an impedance value of the second device 200. An impedance ZY of the decoupling capacitor unit 170A may be designed to have a value less than a value specified in a first frequency band which is subjected to a decrease in noise reduction. As the decoupling capacitor unit 170A is coupled, the current compensation device 100A-1 may be used as an independent module in any system.

According to an embodiment, the decoupling capacitor unit 170A may be omitted from the active current compensation device 100A-1.

Figure 26:
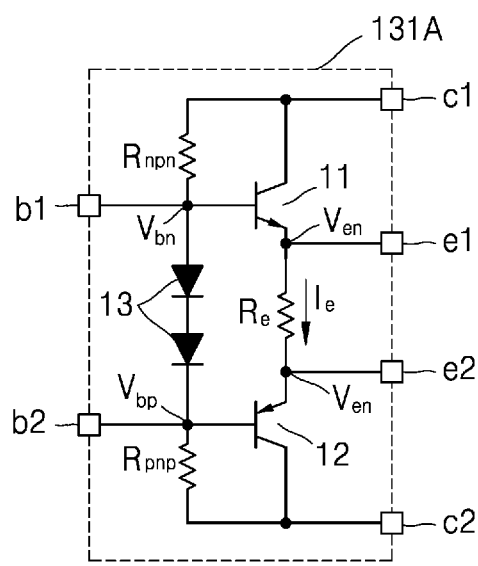
FIG. 26 schematically illustrates a one-chip IC according to an embodiment of the present disclosure.

FIG. 26 schematically illustrates the one-chip IC 131A according to an embodiment of the present disclosure. The one-chip IC 131A is the same as described above and thus will be omitted.

A DC bias circuit for BJT should be designed to have a constant DC operating point as much as possible even when a temperature changes. According to embodiments of the present disclosure, a DC bias circuit for the BJTs 11 and 12 may be designed to have a stable DC operating point in a certain range even when a temperature changes.

Referring to FIG. 26, the biasing diode 13 and the resistors Rnpn, Rpnp, and Re may be used in the DC bias design. In order to bias the BJT, a forward voltage of the biasing diode 13 may have to be equal to or slightly higher than twice a base-emitter voltage of the BJT. In an embodiment of the present disclosure, the biasing diode 13 and the resistor Re may prevent a thermal runaway of the BJTs 11 and 12.

In general, when a current flows through a BJT and heat is generated, a current gain of the BJT increases, which in turn generates more heat. The thermal runaway indicates a phenomenon in which the BJT is damaged by continuously increasing heat generated due to such a positive feedback.

According to an embodiment of the present disclosure, a DC bias current may be adjusted and the thermal runaway may be prevented from occurring by providing the resistor Re between the emitter node of the npn BJT 11 and the emitter node of the pnp BJT 12. Since the resistor Re is increased as the temperature increases, the increase in current Ie may be prevented. Accordingly, the resistor Re may act as a negative feedback element with respect to the current Ie or heat.

According to an embodiment of the present disclosure, by providing the diode 13 between the base node of the npn BJT 11 and the base node of the pnp BJT 12, the thermal runaway may be prevented from occurring. The diode 13 has a characteristic of decreasing the forward voltage compared to a forward current as a temperature increases. Accordingly, in an embodiment of the present disclosure, the diode 13 formed between the base terminals of the BJTs 11 and 12 may serve to lower the voltage between the base terminals thereof as a temperature increases. As a result, the BJTs 11 and 12 may be turned on relatively less easily when the diode 13 is present than when the diode 13 is not present. Accordingly, an increase of the current Ie in response to an increase in temperature may be relatively reduced. Thus, the diode 13 may act as a negative feedback element for the current Ie.

As described above, since the positive feedback according to a temperature and the negative feedback by resistor Re and the diode 13 act together on the BJTs 11 and 12, the BJTs 11 and 12 may maintain a constant current range even when a temperature changes.

When DC bias voltages in the npn BJT 11 and the pnp BJT 12 are well balanced, the DC emitter current Ie may be obtained as in Equation 1 below.

$$I_e \approx \frac{V_{dc} - 2V_{be} - 2R_{bias}I_d}{R_e + \frac{2R_{bias}}{h_{fe} + 1}}$$ [Equation 1]

In Equation 1, Vdc is a voltage supplied between the collector of the npn BJT 11 and the collector of the pnp BJT 12, Id is a forward bias current of the diode 13, and Vbe is a base-emitter voltage of the BJT, and hfe is a current gain of the BJT. In addition, in an embodiment, Rbias=Rnpn=Rpnp.

In an embodiment, values of Id and Vbe may be designed according to IV (current-voltage) characteristics of the diode 13 and the BJTs 11 and 12 in the customized IC 131A.

Figure 27:
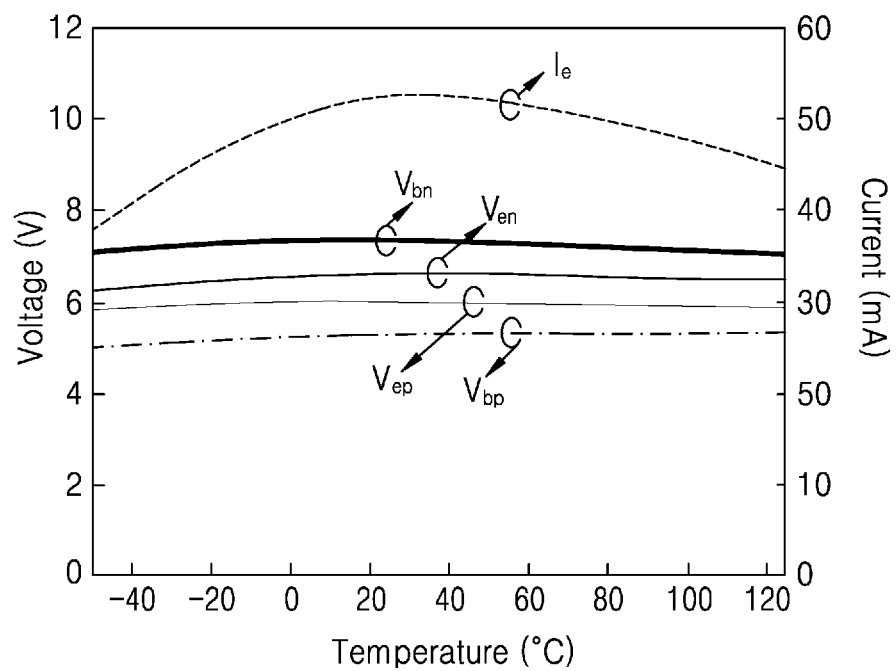
FIG. 27 illustrates simulation results of bias current and voltage of the one-chip IC shown in FIG. 26 according to a temperature.

FIG. 27 illustrates simulation results of bias current and voltage of the one-chip IC 131A shown in FIG. 26 according to a temperature. The graph shown in FIG. 27 shows a DC simulation result of the IC 131A according to a temperature change in a range of −50° C. to 125° C.

Ie is a DC emitter current, Vbn is a voltage of the base node of the npn BJT 11 with respect to the second reference potential 602 (i.e., DC ground reference), Ven is a voltage of the emitter node of the npn BJT 11 with respect to the second reference potential 602, Vbp is a voltage of the base node of the pnp BJT 12 with respect to the second reference potential 602, and Vep is a voltage of the emitter node of the pnp BJT 12 with respect to the second reference potential 602.

Referring to FIG. 27, it can be seen that Vbe (=Vbn−Ven) of the npn BJT 11 and Vbe (=Vep−Vbp) of the pnp BJT 12 are maintained at about 0.75 V in an entire temperature range. In addition, the DC bias voltage is well balanced at around 6 V, which is half of Vdc. That is, a distribution of each node voltage Vbn, Ven, Vbp, or Vep according to a temperature may be constant. As the distribution of each node voltage according to a temperature change is constant, this may advantageously affect the performance of the active current compensation device 100A-1.

According to an embodiment, it can be seen that the current Ie is maintained at a constant level in a range of about 40 to 50 mA even when the temperature is increased up to 125° C. The current Ie does not increase beyond a certain range while the temperature is increased but rather decreases slightly at 40° C. or more. In other words, it can be seen that the thermal runaway does not occur since the current Ie does not continuously increase even when the temperature is increased.

As a result, due to the fact that the bias resistor Re and the diode 13 is embedded into the one-chip IC 131A, the thermal runaway may be prevented from occurring even without using additional discrete components.

On the other hand, when the elements (e.g., the BJTs 11 and 12, the diode 13, resistor Re, and the like) having temperature characteristics are discrete elements, it is difficult for the temperature to be shared by the elements. In this case, the temperature characteristics of the resistors, the diode 13, and the BJTs 11 and 12 may be different from each other. Accordingly, it may be difficult to predict and control the bias voltage and current according to the actual temperature. In addition, in the case of configuring the amplification unit with commercial discrete elements, it is difficult to freely design I-V (current-voltage) characteristics, and thus the optimum design for the active current compensation device may be difficult to achieve. In addition, when discrete elements are used, production costs can be continuously increased according to the number of semiconductor devices.

In embodiments of the present disclosure, as the amplification unit of the active current compensation device includes the one-chip IC 131A, the emitter current Ie and the voltage may be adjusted as desired in consideration of the characteristics of a semiconductor device. In embodiments of the present disclosure, since elements having temperature characteristics are formed in the one-chip IC and a temperature is shared thereby, characteristics of the elements according to a temperature may be easily predicted. In the case of the one-chip IC 131A according to embodiments of the present disclosure, an increase in size due to an increase in the number of semiconductor devices may be insignificant, and an increase in costs due to mass production may also be insignificant.

FIG. 28 schematically illustrates a configuration of an active current compensation device 100A-2 according to an embodiment of the present disclosure. Hereinafter, descriptions of contents overlapping with contents described with reference to FIGS. 24 to 27 will be omitted.

Referring to FIG. 28, the active current compensation device 100A-2 may actively compensate for first currents I11, I12, and I13 input as a common-mode current with respect to each of first through third high-current paths 111, 112, and 113 connected to the first device 300.

To this end, the active current compensation device 100A-2 may include first through third high-current paths 111, 112, and 113, a sensing transformer 120A-2, an amplification unit 130A, a compensation transformer 140A, and a compensation capacitor unit 150A-2.

When it is described in comparison with the active current compensation devices 100A and 100A-1 according to the above-described embodiments, the active current compensation device 100A-2 according to the embodiment described with reference to FIG. 28 includes first through fourth high-current paths 111, 112, and 113, and thus has differences in the sensing transformer 120A-2 and the compensation capacitor unit 150A-2. Thus, the active current compensation device 100A-2 will now be described below focusing on differences described above.

The active current compensation device 100A-2 may include a first high-current path 111, a second high-current path 112, and a third high-current path 113 that are distinguished from each other. According to an embodiment, the first high-current path 111 may be an R-phase power line, the second high-current path 112 may be an S-phase power line, and the third high-current path 113 may be a T-phase power line. The first currents I11, I12, and I13 may be input as a common-mode current with respect to each of the first high-current path 111, the second high-current path 112, and the third high-current path 113.

A primary side 121A-2 of the sensing transformer 120A-2 may be disposed in each of the first to third high-current paths 111 to 113 to generate an induced current in a secondary side 122A-2. Magnetic flux densities generated by the sensing transformer 120A-2 due to the first currents I11, I12, and I13 on the first through third high-current paths 111, 112, and 113 may be reinforced with each other.

The amplification unit 130A of the active current compensation device 100A-2 according to the embodiment described with reference to FIG. 28, may correspond to the amplification unit 130A described above.

The compensation capacitor unit 150A-2 may provide paths through which compensation currents IC1, IC2, and IC3 generated by the compensation transformer 140A flow to the first to third high-current paths 111 to 113, respectively.

The active current compensation device 100A-2 may further include a decoupling capacitor unit 170A-2 on an output side thereof (i.e., the second device 200 side). One ends of capacitors included in the decoupling capacitor unit 170A-2 may be connected to the first high-current path 111, the second high-current path 112, and the third high-current path 113, respectively. The opposite end of each of the capacitors may be connected to the first reference potential 601 of the current compensation device 100A-2.

The decoupling capacitor unit 170A-2 may prevent the performance of outputting the compensation current of the active current compensation device 100A-2 from being significantly changed according to a change in an impedance value of the second device 200. An impedance ZY of the decoupling capacitor unit 170A-2 may be designed to have a value less than a value specified in a first frequency band for which noise reduction is to be performed. As the decoupling capacitor unit 170A-2 is coupled, the current compensation device 100A-2 may be used as an independent module in any system (e.g., a three-phase three-wire system).

According to an embodiment, the decoupling capacitor unit 170A-2 may be omitted from the active current compensation device 100A-2.

The active current compensation device 100A-2 according to the embodiment described above may be used to compensate (or cancel) for the first currents I11, I12, and I13 traveling from a load of a three-phase three-wire power system to a power source.

Of course, according to the technical spirit of the present disclosure, the active current compensation device according to various embodiments may be modified to be also applicable to a three-phase four-wire system.

The amplification unit 130A according to an embodiment of the present disclosure is applicable to the single-phase (two-wire) system shown in FIG. 25, the three-phase three-wire system shown in FIG. 28, and a three-phase four-wire system not shown in the drawing. Since a one-chip IC 131A is applicable to several systems, the IC 131A may have versatility in the active current compensation devices according to various embodiments.

The particular implementations shown and described herein are illustrative examples of the embodiments and are not intended to otherwise limit the scope of the embodiments in any way. For the sake of brevity, conventional electronics, control systems, software development and other functional aspects of the systems may not be described in detail. Further, the connecting lines or connectors shown in the drawings are intended to represent example functional relationships and/or physical or logical couplings between the various elements. It should be noted that many alternative or additional functional relationships, physical connections, or logical connections may be present in a practical device.

An active current compensation device according to various embodiments of the present disclosure configured as described above may reduce the price, area, volume, weight, and heat generation in a high-power system as compared with a passive filter configured with a CM choke.

Further, an active current compensation device according to various embodiments of the present disclosure may detect a failure or malfunction of an active circuit unit.

Further, in various embodiments of the present disclosure, one IC chip in which an active circuit unit and a malfunction detection unit are embedded together may be provided. By embedding the malfunction detection unit in the chip in which the active circuit unit is integrated, the size and price may be reduced as compared with a case of separately configuring the malfunction detection unit using commonly used commercial elements.

Further, by integrating the active circuit unit and the malfunction detection unit into the single IC chip, the IC chip may have versatility as an independent component and may be commercialized.

In addition, a current compensation device including the above-described IC chip may also be manufactured as an independent module and commercialized. The current compensation device may detect a malfunction as an independent module regardless of the characteristics of a peripheral electrical system.

An active current compensation device according to various embodiments of the present disclosure configured as described above is applicable to any of various systems by including an embedded power conversion unit.

In various embodiments of the present disclosure, by embedding an active circuit unit and the power conversion unit in one IC chip, the IC chip may have versatility as an independent component and may be commercialized.

In addition, the current compensation device including the above-described IC chip may also be manufactured as an independent module and commercialized. The active circuit unit included in the current compensation device may stably operate regardless of the characteristics of a peripheral electrical system.

An active current compensation device according to various embodiments of the present disclosure configured as described above may reduce the price, area, volume, weight, and heat generation in a high-power system as compared with a passive filter configured with a CM choke.

Further, an active current compensation device according to various embodiments of the present disclosure is minimized in size as compared with a case in which discrete semiconductor devices are included.

Further, an integrated circuit unit according to various embodiments of the present disclosure may be universally applied to active current compensation devices of various designs.

Further, the active current compensation device including the integrated circuit unit according to various embodiments of the present disclosure may be used in various power electronic products regardless of power rating. Accordingly, the active current compensation device according to various embodiments of the present disclosure is expandable to a high power/high noise system.

Further, the active current compensation device including the integrated circuit unit according to various embodiments of the present disclosure may be easily mass-produced.

Further, the active current compensation device and/or the one-chip integrated circuit unit according to various embodiments of the present disclosure may have versatility as an independent module and may be commercialized.

An active current compensation device according to embodiments of the present disclosure configured as described above may reduce the price, area, volume, weight, and heat generation in a high-power system as compared with a passive filter configured with a CM choke.

Further, an active current compensation device according to embodiments of the present disclosure may prevent a thermal runaway phenomenon. The active current compensation device according to embodiments of the present disclosure may maintain a current in a constant range against a change in temperature by utilizing both positive and negative feedback for a temperature of a BJT.

Further, in an active current compensation device according to embodiments of the present disclosure, elements having temperature characteristics are formed in a one-chip IC and a temperature is shared thereby, and thus characteristics of the elements according to a temperature may be easily predicted.

Accordingly, it is possible to design an active circuit unit (or an amplification unit) that is controllable and predictable even when the temperature changes.

An amplification unit according to embodiments of the present disclosure includes a one-chip IC, and thus may be designed so that current-voltage (I-V) characteristics are controllable as compared with a case of being configured with commercial discrete elements. That is, the one-chip IC according to embodiments of the present disclosure may be custom designed. That is, current and voltage in the one-chip IC may be controllable.

Further, even when the one-chip IC and the active current compensation device including the same according to embodiments of the present disclosure are mass-produced, an increase in production cost may be insignificant. In addition, an increase in size due to an increase in the number of semiconductor devices may be insignificant.

[5] Isolated Type Active Emi Filter Having No Additional Elements on Power Line

Figure 29:
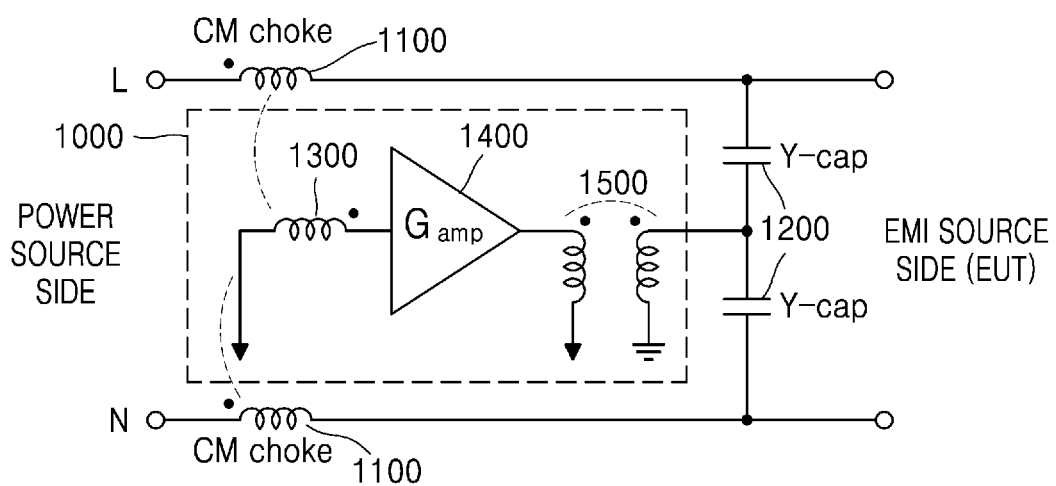
FIG. 29 is a circuit diagram illustrating a configuration of an isolated type active electromagnetic interference (EMI) filter having no additional elements on a power line according to a first embodiment of the present disclosure.

FIG. 29 is a circuit diagram illustrating a configuration of an insulated active electromagnetic interference (EMI) filter having no additional elements on a power line according to a first embodiment of the present disclosure. The first embodiment of the present disclosure includes a passive EMI filter composed of a common-mode (CM) choke 1100 and a Y-cap 1200 and an EMI filter 1000 composed of a sensing winding 1300, an amplifier 1400, and a transformer 1500.

The common-mode (CM) choke 1100 is disposed on a power source side from which power is supplied and has a form in which a live line and a neutral line, which are connected to an EMI source, are each wound with a winding.

The Y-cap 1200 is disposed on an EMI source side at which EMI occurs and includes two capacitors connected in series, and the two capacitors are connected in parallel between the live line L and the neutral line N and are commonly connected to the ground.

The sensing winding 1300 is formed by winding a coil on the CM choke 1100, and senses a noise current flowing through the CM choke 1100. When a capacitance of a parasitic circuit of the CM choke 1100 is referred to as $C_{cm}$, and a capacitance of a parasitic circuit of the sensing winding 1300 is referred to as $C_{sen}$, the number of turns $N_{sen}$ of the sensing winding 1300 may be less than a square root of $2C_{cm}/C_{sen}$.

The amplifier 1400 amplifies the noise current that is sensed through the sensing winding 1300.

The transformer 1500 is installed in front of the Y-CAP 1200, includes a primary coil that receives a signal amplified by the amplifier and a secondary coil that is isolated from the power line by being connected to the ground connected to the Y-cap 1200, and injects a signal of the secondary coil into the Y-cap 1200 as a compensation signal.

Figure 30:
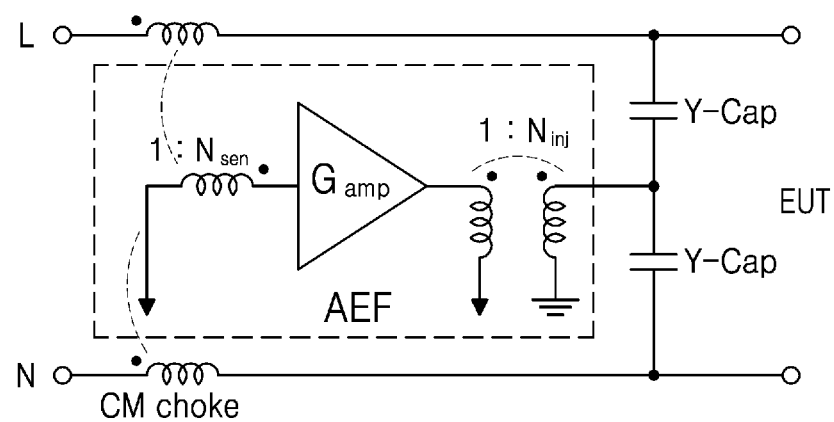
FIG. 30 is a diagram illustrating an example of the configuration of the active type EMI filter (AEF) according to the present disclosure, and illustrates a configuration in which a proposed transformer-isolated AEF is installed on a common-mode (CM) L-C EMI filter in an add-on manner.
Figure 31:
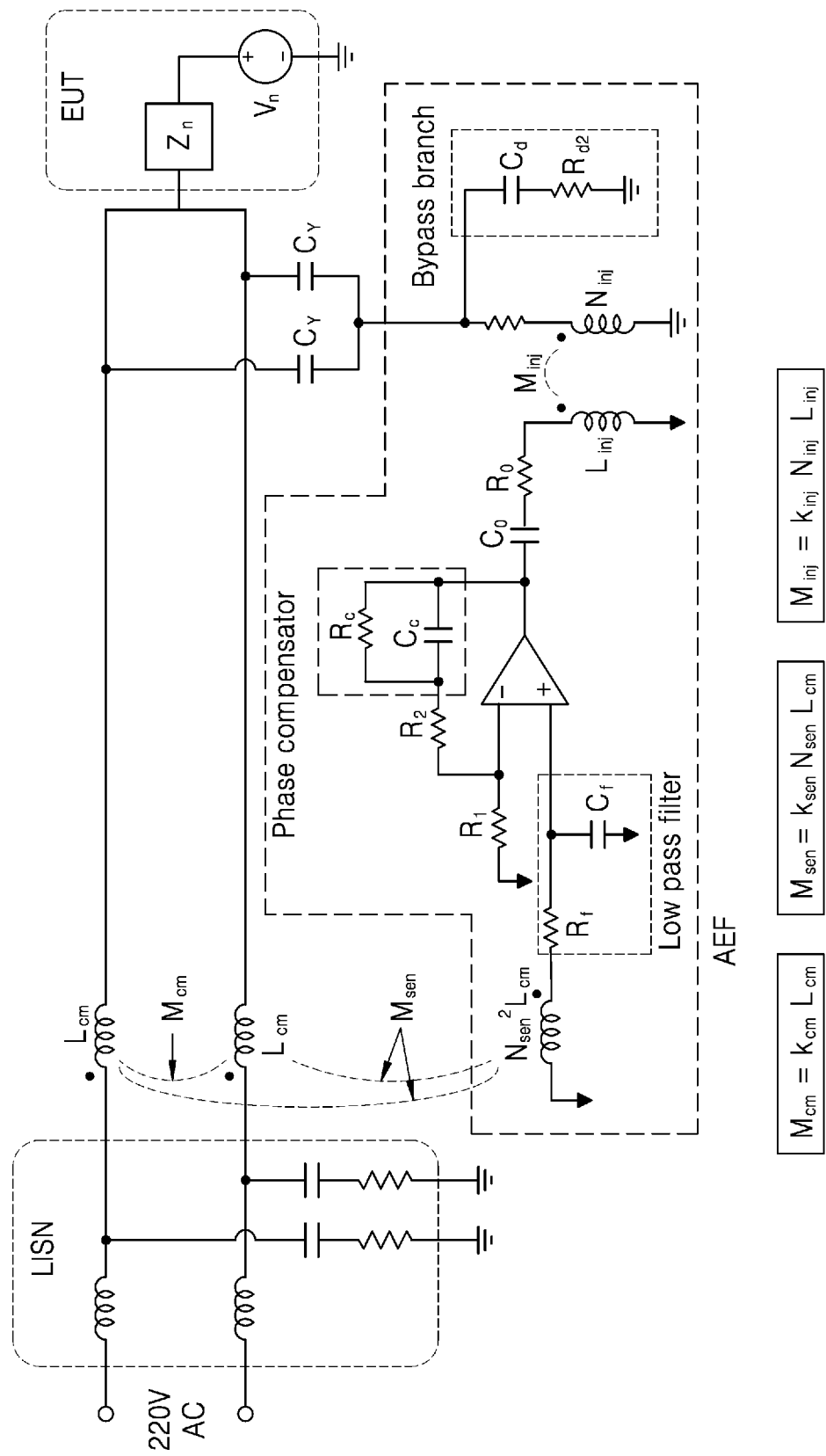
FIG. 31 illustrates a circuit model of an AEF according to one embodiment of the present disclosure.

FIG. 30 is a diagram illustrating an example of the configuration of the active type EMI filter (AEF) according to the present disclosure, and illustrates a configuration in which a proposed transformer-isolated AEF is installed on a CM L-C EMI filter in an add-on manner. FIG. 31 illustrates a circuit model of an AEF according to one embodiment of the present disclosure.

The isolated type active EMI filter having no additional elements on a power line according to the present disclosure may further include a low-pass filter to prevent stability problems that may be caused by resonance in the sensing winding in a high-frequency range. Referring to FIG. 31, the low-pass filter includes a resistor $R_f$ and a capacitor $C_f$.

One end of the resistor $R_f$ is connected to the sensing winding, and the other end thereof is connected to a positive input terminal of the amplifier. The capacitor $C_f$ has one end connected to the other end of the resistor $R_f$ and the positive input terminal of the amplifier and the other end connected the ground. The capacitor $C_f$ is located at the input terminal of the amplifier.

Further, an impedance $Z_{in,\ AEF}$ viewed from the input terminal of the amplifier 1400 toward the low-pass filter may be set to be greater than an impedance $Z_{sen,\ para}$ of parasitic RC components of the sensing winding 1300 in a frequency range of interest.

A cutoff frequency $1/2\pi R_f C_f$ of the low-pass filter may be greater than a maximum operating frequency $f_{op,\,max}$ and less than a frequency of $1/2\pi\sqrt{(1-k_{sen}^2)N_{sen}^2 L_{cm} C_{sen}}$ (where, $k_{sen}$ denotes a coupling coefficient of the sensing winding, $N_{sen}$ denotes the number of turns of the sensing winding 1300, $L_{cm}$ denotes an inductance of the CM choke 1100, and $C_{sen}$ denotes a capacitance of the parasitic circuit of the sensing winding 1300).

In addition, the isolated type active EMI filter having no additional elements on a power line according to the present disclosure may further include a bypass branch configured to serve as a bypass to avoid resonance in the transformer, increase stability by acting as a damping circuit, and mitigate performance degradation due to resonance between the Y-cap and an impedance of the EMI source. Referring to FIG. 31, the bypass branch may include a first resistor $R_{d1}$, a capacitor $C_d$, and a second resistor $R_{d2}$.

The first resistor $R_{d1}$ has one end connected to the Y-cap and the other end connected to the secondary coil of the transformer, and one end of the capacitor $C_d$ is connected to one end of the first resistor ($R_{d1}$). One end of the second resistor $R_{d2}$ is connected in series with the other end of the capacitor, and the other end thereof is connected to the ground.

Further, the isolated type active EMI filter having no additional elements on a power line according to the present disclosure may further include a phase compensator for stability in a low-frequency range.

Referring to FIG. 31, the phase compensator includes a resistor Rc and a capacitor Cc that are connected in parallel, and one ends of the resistor Rc and the capacitor Cc, which are connected in parallel, are connected to a negative input terminal of the amplifier, and the other ends of the resistor Rc and the capacitor Cc, which are connected in parallel, are connected to an output terminal of the amplifier.

The present disclosure proposes a novel structure of a fully transformer-isolated AEF. Referring to FIG. 30, the AEF according to one embodiment of the present disclosure is installed on the existing CM L-C EMI filter, which is composed of the CM-choke and the Y-cap, in an add-on manner. The structure of the AEF according to one embodiment of the present disclosure is similar to the topology of a conventional current-sense current-compensation (CSCC) AEF, but an injection transformer is added between the output terminal of the amplifier and the compensation Y-cap. The injection transformer is not installed on the main power line, so that only a compensation signal current having a small magnitude flows through the transformer. The injection transformer may be implemented in a small size because a small magnitude of current flows regardless of the operating current of an application program, so that the risk of magnetic saturation and thermal problems may be reduced. In addition, the sensing part of the AEF does not require an additional transformer, but a thin noise sensing line is additionally wound on an existing commercial CM choke. There was an attempt to add a sensing winding directly on the commercial CM choke, but the adverse effects of the sensing winding and the maximum allowable number of turns have not been examined. In summary, in terms of main novel features of the AEF according to one embodiment of the present disclosure, fully transformer-isolation may be achieved without the use of separate components on the main power line, and compact-sized design may be achieved. Due to these characteristics, the AEF according to the present disclosure is smaller in size and better in performance than other transformer-isolated CSVC AEFs.

In the present disclosure, a number of useful explicit design guidelines are provided for the complete design of the AEF according to one embodiment of the present disclosure. As will be described below, the transformer-isolated AEF is analyzed to evaluate a noise attenuation performance, appropriate design guidelines are provided for the performance and stability of the AEF on the basis of the analysis. In addition, filter insertion loss and loop gain of the AEF are measured using a vector network analyzer and verified. The reduction of CM conducted emission (CE) noise due to the AEF is also achieved in actual switched-mode power supply (SMPS) board products. In addition, the amount of current leaking to the ground is measured to confirm the safety of a use of the AEF.

An AEF according to one embodiment of the present disclosure will be analyzed. Referring to FIG. 31, $C_Y$ represents a capacitance of a Y-cap. A CM choke is modeled as Lcm and $M_{cm}$, which respectively represent a self-inductance and a mutual-inductance of a winding on a power line.

The AEF is mainly composed of a sensing winding wound on the CM choke, an amplifier, and an injection transformer. A turns ratio of the winding on the power line and the sensing winding is set to be 1:$N_{sen}$, and a self-inductance of the sensing winding is given by about $N_{sen}^2 L_{cm}$. $M_{sen}$ represents a mutual-inductance between the winding on the power line and the sensing winding at an input terminal of the AEF. Similarly, $M_{inj}$ represents a mutual-inductance of an injection transformer, and in the injection transformer, a turns ratio of a primary winding and a secondary winding is set to be 1:$N_{inj}$. Self-inductances of the primary winding and the secondary winding are respectively set to be $L_{inj}$ and $N_{inj}^2 L_{inj}$. $M_{cm}$, $M_{sen}$, and $M_{inj}$ are calculated by $k_{cm} L_{cm}$, $k_{sen} N_{sen} L_{cm}$, and $k_{inj} N_{inj} L_{inj}$, respectively. Here, $k_{cm}$, $k_{sen}$, and $k_{inj}$ represent coupling coefficients. Generally, in actual design, each of $k_e r$, $k_{sen}$, and $k_{inj}$ has a value in a range of 0.99 to 1. The amplifier is implemented as a configuration of a non-inverting operational-amplifier (OP-AMP) with resistors $R_1$ and $R_2$.

In consideration of a feedback stability of the AEF, as illustrated in FIG. 31, some additional components are required, such as a low-pass filter, a bypass branch, and a phase compensator. $R_f$ and $C_f$ constitute a low-pass filter for preventing stability problems in the OP-AMP, which may be caused by resonance in the sensing winding in a high-frequency range. $R_{d1}$, $C_d$, and $R_{d2}$ act as a bypass to avoid resonance in the injection transformer and operate as a damping circuit for securing stability, so that the performance degradation due to resonance between a noise source impedance and the Y-cap is further mitigated. $R_c$ and Cc constitute a phase compensator for securing stability in the low-frequency range.

Figure 32:
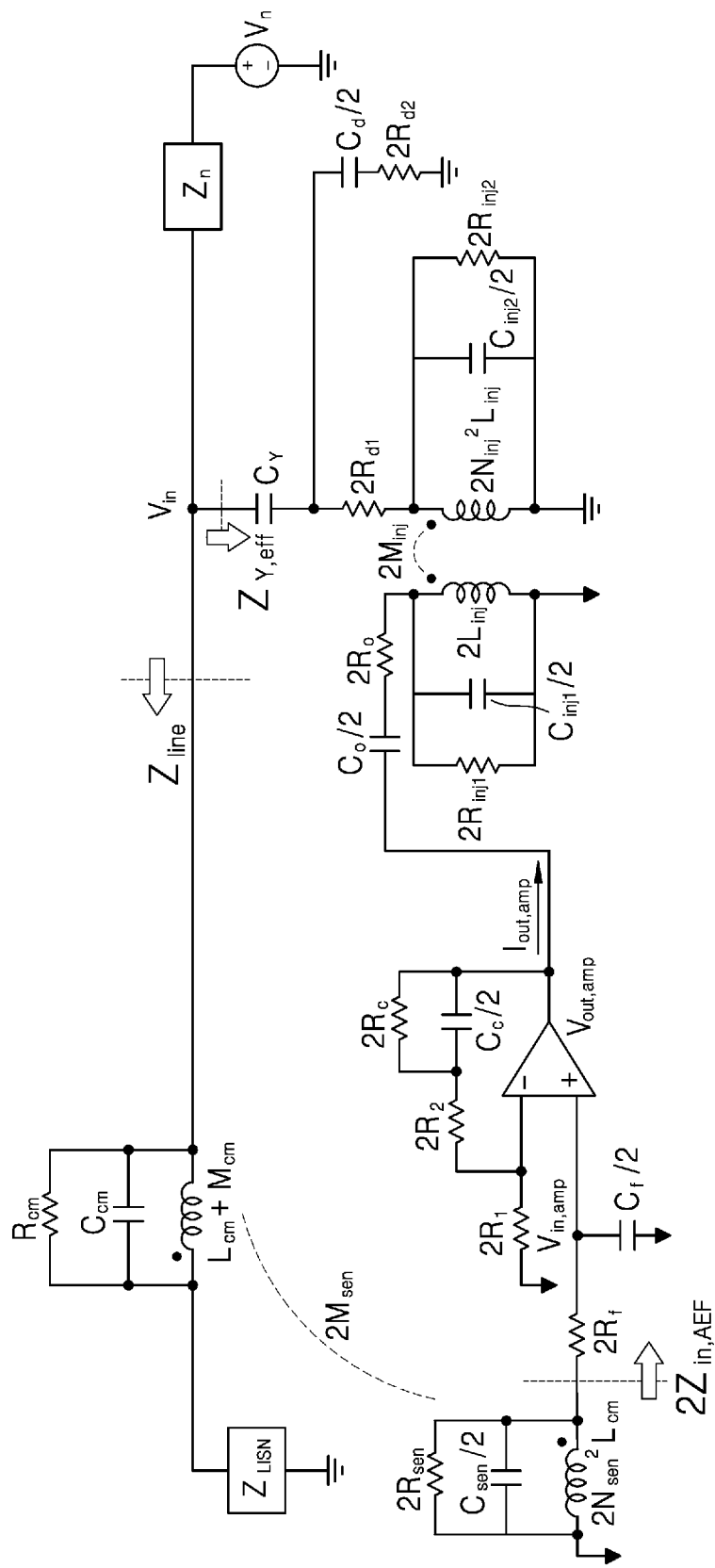
FIG. 32 illustrates an equivalent circuit for a half portion including parasitic components.

Even when a ground reference voltage of the AEF is set differently from the ground, the AEF is symmetric with respect to a zero alternating current (AC) potential, and a circuit may be divided into two portions and analyzed. FIG. 32 illustrates an equivalent circuit for a half portion including parasitic components. Referring to FIG. 32, in order to be expressed more accurately, parasitic circuit parameters of the CM choke, the sensing winding, and the injection transformer are also modeled and represented by $R_{cm}$ and $C_{cm}$, $R_{sen}$ and $C_{sen}$, and $R_{inj1}$, $C_{inj1}$, $R_{inj2}$, and $C_{inj2}$, respectively. A CM noise source of equipment under test (EUT) is modeled as $V_n$ and $Z_n$ of the Thevenin equivalent circuit, which respectively represent a CM noise source voltage and a CM noise source impedance. $Z_{LISN}$ represents an impedance of a line impedance stabilization network (LISN). $Z_{line}$, $Z_{in, AEF}$, and $Z_{Y, eff}$ each represent an impedance viewed in each direction with regard to the zero AC potential.

The operation principle of the AEF is analyzed on the basis of an equation expressing an effective inductance of the CM choke and an effective capacitance of a Y-cap branch. The effective inductance of the CM choke will be described.

An impedance viewed from a front end of the CM choke toward the power line is expressed using Kirchhoffs law and shown below, $$Z_{line} = (sL_{cm,eff}) \| R_{cm} \| \frac{1}{sC_{cm}} + Z_{LISN} \quad \text{[Equation 1]}$$

where, $$L_{cm,eff}(s) = (1 + k_{cm} - X(s))L_{cm} \quad \text{[Equation 2]}$$

$$X(s) = \frac{2M_{sen}I_{sen}}{L_{cm}I_{cm}} = \frac{2sk_{sen}^2 N_{sen}^2 L_{cm}}{sN_{sen}^2 L_{cm} + Z_{in,AEF} \| Z_{sen,para}} \quad \text{[Equation 3]}$$

$$Z_{sen,para} = R_{sen} \| \frac{1}{sC_{sen}} \quad \text{[Equation 4]}$$

$$Z_{in,AEF} \approx R_f + \frac{1}{sC_f} \quad \text{[Equation 5]}$$

where, $L_{cm,eff}$ represents the effective inductance of the CM choke, and here, an inductance cancellation item $X(s)$ appears. $X(s)$ is defined as $(2M_{sen}I_{sen})/(L_{cm}I_{cm})$, where $I_{cm}$ and $I_{sen}$ represent currents flowing through inductance branches of $L_{cm}M_{cm}$ and $2N_{sen}^2 L_{cm}$ shown in FIG. 32, respectively. $Z_{sen, para}$ represents an impedance of parasitic RC components of the sensing winding. $Z_{in, AEF}$ represents an impedance viewed from the input terminal of the amplifier toward the low-pass filter. An input impedance of the OP-AMP is assumed to be great in a frequency range of interest and is ignored in Equation 5.

Figure 33:
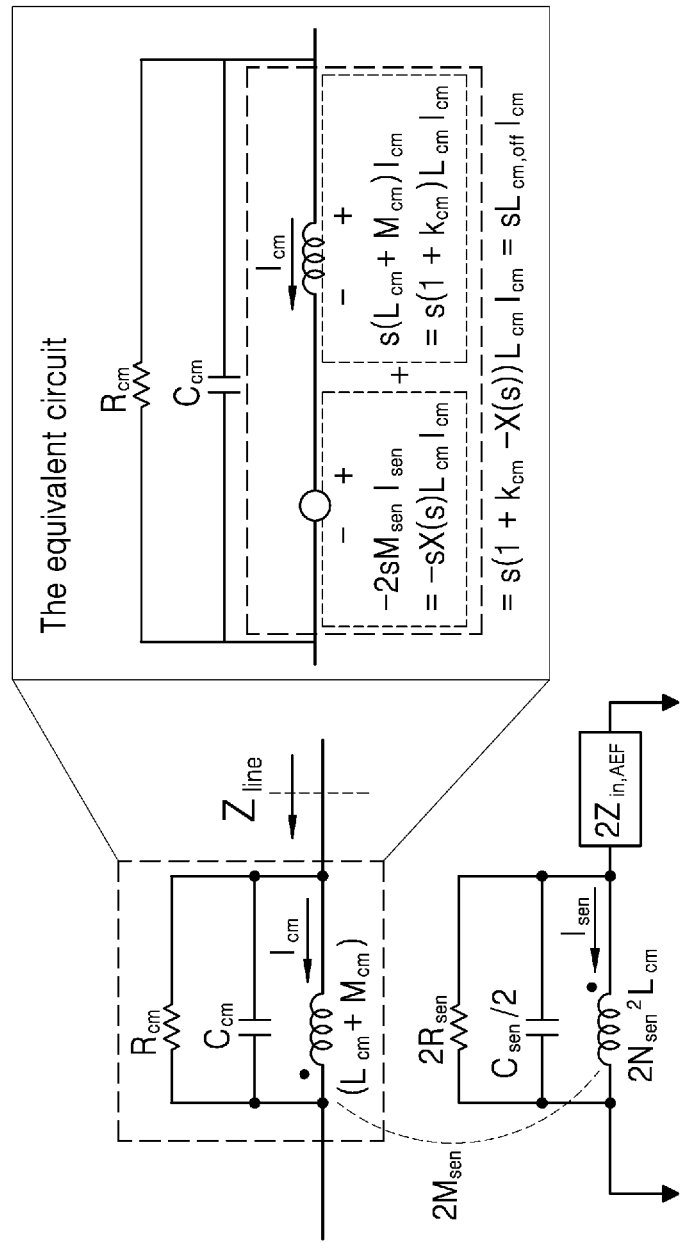
FIG. 33 illustrates an equivalent circuit model, which includes the influence of a sensing winding, of a CM choke on the power line.

FIG. 33 illustrates an equivalent circuit model, which includes the influence of the sensing winding, of the CM choke on the power line. The effect of the sensing winding on the inductance of the CM choke is summarized in FIG. 33. Referring to FIG. 33, a box on the right side of the drawing illustrates the equivalent circuit model of the CM choke on the power line in consideration of a voltage induced by $2M_{sen}$. The induced voltage of $2sM_{sen}I_{sen}$ has a polarity opposite to that of a voltage drop of $s(L_{cm}+M_{cm})I_{cm}$. A total voltage with respect to the choke inductance may be simplified as $s(1+k_{cm}-X(s))L_{cm}I_{cm}$ when $X(s)$ is defined as $(2M_{sen}I_{sen})/(L_{cm}I_{cm})$. Thus, an effective inductance $L_{cm, eff}$ of the CM choke is expressed as $(1+k_{cm}-X(s))L_{cm}$ given in Equation 2.

In the absence of the sensing winding, $k_{sen}=X(s)=0$, and thus $L_{cm, eff}$ is simply given by $(1+K_{cm}) L_{cm}$. However, in Equation 3, when $sN_{sen}^2 L_{cm}$ is much greater than $(Z_{in, AEF} Z_{sen, para})$, $K_{cm}$ and $K_{sen}$ are very close to one (1), and thus $X(s) \approx 2k_{sen}^2$, and $L_{cm, eff} \leq L_{cm}(1+k_{cm}-2k_{sen}^2)$. This means that the choke inductance may be critically affected by the current flowing through the sensing winding. Thus, in order to maintain the value of the choke inductance, the number of turns $N_{sen}$ of the sensing winding should be limited.

Next, the effective capacitance of the Y-cap will be described. An impedance viewed in a direction of a branch $Z_{Y, eff}$ of the Y-cap may be expressed as in Equations 6 to 11 below, $$Z_{Y,eff}(s) = \frac{1}{sC_Y} \cdot \frac{1+\beta(s)}{1+\alpha(s)} \quad \text{[Equation 6]}$$

where, $$\alpha(s) = sk_{inj}N_{inj}L_{inj}G_1(s)G_{amp}(s) \cdot \quad \text{[Equation 7]}$$

$$\frac{\left(R_{d2} + \frac{1}{sC_d}\right)\left(R_{inj1} \| \frac{1}{sC_{inj1}}\right)\left(R_{inj2} \| \frac{1}{sC_{inj2}}\right)}{\left\{R_{d1} + R_{d2} + \frac{1}{sC_d} + R_{inj2} \| \frac{1}{sC_{inj2}}\right\}}$$

$$\left(R_o + \frac{1}{sC_o} + R_{inj1} \| \frac{1}{sC_{inj1}}\right)A(s)$$

$$\beta(s) = sC_T\left(R_{d1} + R_{inj2} \| \frac{1}{sC_{inj2}}\right)\left(R_{d2} + \frac{1}{sC_d}\right) \times \quad \text{[Equation 8]}$$

$$\left[1 - \frac{\left(R_{inj2} \| \frac{1}{sC_{inj2}}\right)^2}{\left(R_{d1} + R_{inj2} \| \frac{1}{sC_{inj2}}\right)A(s)} \cdot \frac{R_{d2} + \frac{1}{sC_d}}{R_{d1} + R_{d2} + \frac{1}{sC_d} + R_{inj2} \| \frac{1}{sC_{inj2}}}\right.$$

$$\left.\left\{\frac{\left(R_{inj1} \| \frac{1}{sC_{inj1}}\right)^2}{R_o + \frac{1}{sC_o} + R_{inj1} \| \frac{1}{sC_{inj1}}} - R_{inj1} \| \frac{1}{sC_{inj1}} - sL_{inj}\right\}\right]$$

$$G_1(s) = \frac{V_{in,amp}}{V_{in}} = -\frac{2sk_{sen}N_{sen}L_{cm}Z_{sen,para}}{sN_{sen}^2 L_{cm} + Z_{sen,para} \| Z_{in,AEF}} \quad \text{[Equation 9]}$$

$$\frac{\frac{1}{sC_f}}{R_f + \frac{1}{sC_f} + Z_{sen,para}} \cdot \frac{R_{cm} \| \frac{1}{sC_{cm}} - Z_{line} - Z_{LISN}}{R_{cm} \| \frac{1}{sC_{cm}} Z_{line}}$$

$$G_{amp}(s) = \frac{V_{out,amp}}{V_{in,amp}} = 1 + \frac{R_2 + R_c \| \frac{1}{sC_c}}{R_1} \quad \text{[Equation 10]}$$

$$A(s) = \left\{\frac{\left(R_{inj1} \| \frac{1}{sC_{inj1}}\right)^2}{R_o + \frac{1}{sC_o} + R_{inj1} \| \frac{1}{sC_{inj1}}} - R_{inj1} \| \frac{1}{sC_{inj1}} - sL_{inj1}\right\} \quad \text{[Equation 11]}$$

$$\left\{sN_{inj}^2 L_{inj} + \left(R_{d1} + R_{d2} + \frac{1}{sC_d}\right) \| R_{inj2} \| \frac{1}{sC_{inj2}}\right\} + (sk_{inj}N_{inj}L_{inj})^2$$

where, $\alpha(s)$ and $\beta(s)$ may be physically expressed as a boosting factor and a bypass factor, respectively, as described below. $G_1(S)$ is a voltage gain from $V_{in}$ to $V_{in, amp}$, and $G_{amp}(s)$ is a gain of the amplifier from $V_{in, amp}$ to $V_{out, amp}$. It is assumed that a frequency bandwidth of the OP-AMP is sufficiently higher than a frequency range of interest. In Equation 6, the expression of $Z_{Y, eff}$ may be understood as an impedance of an effective capacitance $C_{Y, eff}(s)$, and is defined by Equation 12 below, $$C_{Y,eff}(s) = C_Y \frac{1+\alpha(s)}{1+\beta(s)}. \quad \text{[Equation 12]}$$

Figure 34A:
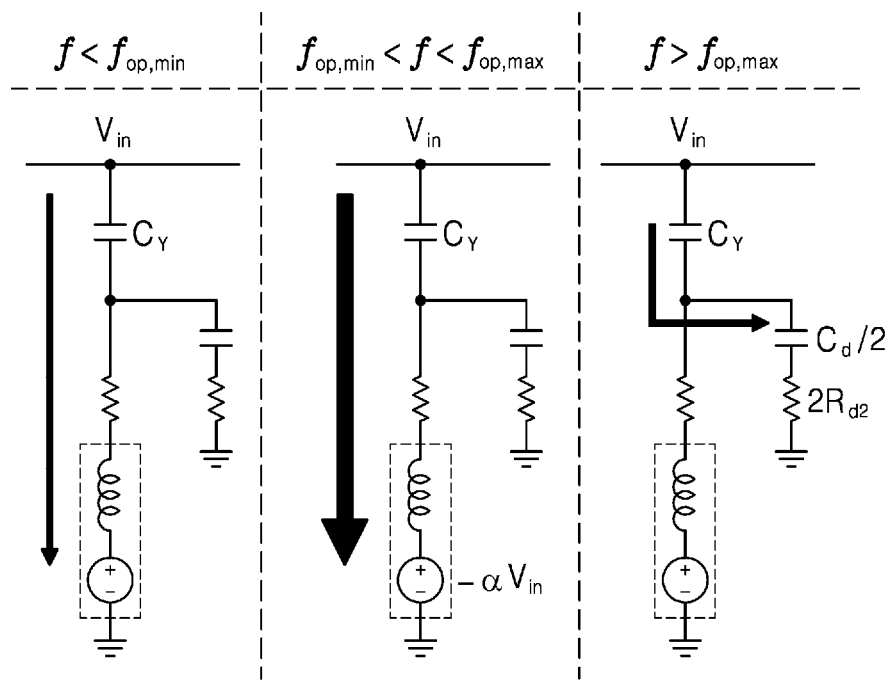
FIGS. 34A, 34B, and 34C illustrate changes in current paths and a capacitor effect $C_{Y,\,eff}(s)$ of a Y-cap due to the AEF for each frequency range.
Figure 34B:
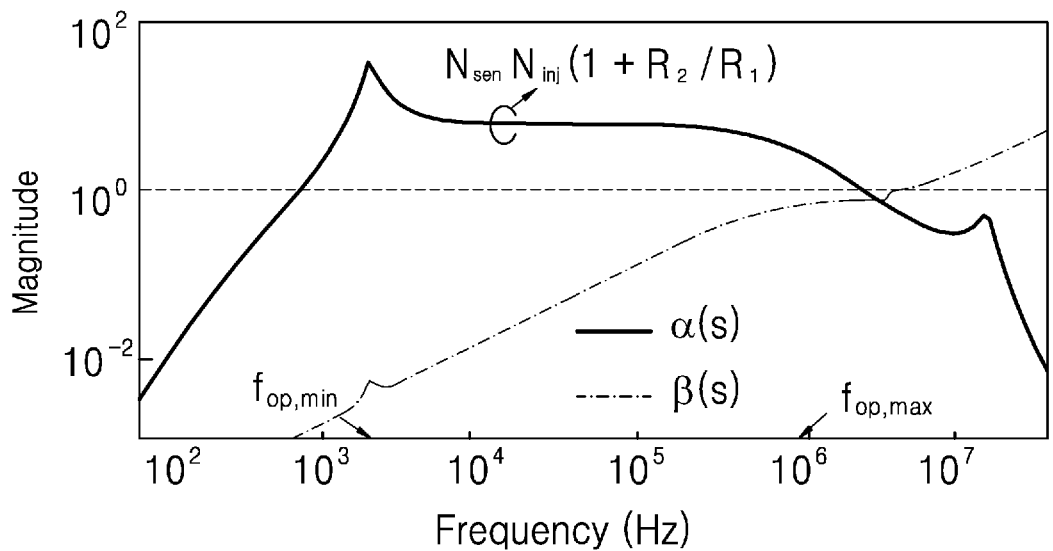
Figure 34C:
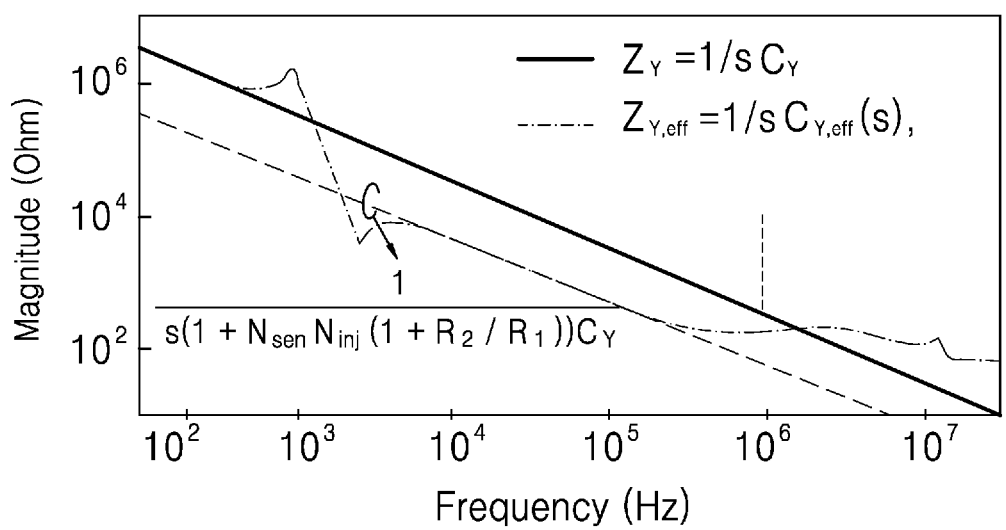

FIGS. 34A, 34B, and 34C illustrate changes in $C_{Y, eff}(s)$ according to the change in frequency, and here, FIG. 34A illustrates the operation of the AEF in the frequency range of interest, FIG. 34B is a plot of $\alpha(s)$ and $\beta(s)$, and FIG. 34C illustrates an impedance curve of $Z_{Y,\,eff}$.

The changes of $C_{Y,\,eff}(s)$ according to the change in frequency are summarized in FIGS. 34A, 34B, and 34C. The effect of the AEF on the Y-cap branch and the change in a path of the current are illustrated in FIG. 34A. A dotted box shows the effect of the AEF on $C_{Y,\,eff}$. $f_{op,\,min}$ and $f_{op,\,max}$ are minimum and maximum target operating frequencies of the AEF, respectively, that may be designed as circuit parameters of the AEF.

For example, a magnitude of each of $\alpha(s)$ and $\beta(s)$ of the appropriately designed AEF is plotted according to the frequency in FIG. 34B. The impedance $Z_{Y,eff}$ of the Y-cap branch is also plotted in FIG. 34C. $\alpha(s)$ and $\beta(s)$ are both much less than one (1) at frequencies that are sufficiently lower than $f_{op,\,min}$, and thus $Z_{Y,\,eff}$ in equation 6 is simply approximated by $1/sC_Y$. This means that the bypass circuit and the injection transformer are negligible compared to the impedance of $C_Y$, and a noise voltage, which is compensated for by the AEF, is also very small. In the operating frequency range of the AEF, which is from $f_{op,\,min}$ to $f_{op,\,max}$, $\alpha(s)$ is greater than one, but $\beta(s)$ is still much less than one. That is, as indicated by $-\alpha V_{in}$ in FIG. 34A, the AEF provides a compensation voltage to the Y-cap branch, while the bypass circuit is still negligible.

The magnitude of $\alpha(s)$ is mainly maintained at $N_{sen}N_{inj}(1+R_2/R_1)$ that is a multiplication of the voltage gains of the sensing winding, the amplifier, and the injection transformer in the operating frequency range. Accordingly, the CM current flowing through the Y-cap branch is amplified by $(1+N_{sen}N_{inj}(1+R_2/R_1))$ so that the effective capacitance is increased to $(1+N_{sen}N_{inj}(1+R_2/R_1))C_Y$ as illustrated in FIG. 34C. As the frequency increases closer to $f_{op,\,max}$, $\alpha(s)$ begins to decrease, which indicates that the compensation voltage from the AEF decreases. At the same time, $\beta(s)$ becomes similar to one (1), which means that an impedance $R_{d2}+1/sC_d$ of the bypass branch is less than an impedance of a path of the injection transformer. Thus, a CM noise current flows mainly through the bypass branch, and the impedance $Z_{Y,eff}$ is approximated by $(1/sC_Y+2(R_{d2}+1/sC_d))$.

FIG. 34C illustrates that the magnitude of $Z_{Y,eff}$ is increased to be greater than the magnitude of $1/sC_Y$ since $C_d$ and $R_{d2}$ are added to the current path in the frequency range after $f_{op,max}$. However, a damping resistor $R_{d2}$ plays an important role in mitigating resonance between the Y-cap and the CM noise source impedance. The resonance should be avoided as the performance of the entire CM filter is often greatly degraded due to resonance.

Next, the insertion loss (IL) of the entire filter will be described. The noise reduction performance of the filter is generally quantified as the IL, which is defined as a ratio of a noise voltage received by the LISN in a state in which the filter is not installed, to a noise voltage received by the LISN in a state in which the filter is installed. In FIG. 32, the IL of the entire EMI filter is derived as shown in Equation 13 below, $$IL = \frac{Z_{line}\|Z_{Y,eff} + 2Z_n}{Z_{line}\|Z_{Y,eff}} \cdot \frac{Z_{line}}{2Z_n + Z_{LISN}}. \quad \text{[Equation 13]}$$

As the frequency increases, the IL in Equation 13 begins to increase mainly at a frequency point in which $Z_{Y,\,eff}$ is less than $Z_{line}$. A low frequency boundary in the filter operation may be approximated to $1/2\pi\sqrt{L_{cm,eff}C_{Y,eff}}$. As shown in FIG. 34C, the proposed AEF greatly reduces the $Z_{Y,\,eff}$ in the target frequency range, which increases the IL of the entire filter. Further, the AEF causes the entire filter to start operating at a lower frequency.

Meanwhile, the design guidelines of the AEF provided in the present disclosure will be described. The actual design guidelines for the AEF are developed in consideration of performance and stability. First, the design of the sensing winding and the input low-pass filter is described.

The sensing winding is wound directly on the CM choke so that no separate sensing transformer is added. It is preferable not to use a separate sensing transformer in terms of size and costs. However, as described above, the inductance $L_{cm,eff}$ of the CM choke and the impedance $Z_{line}$ of the power line may be reduced due the additional sensing winding. Although the AEF according to the present disclosure properly increases $C_{Y,\,eff}$ of the Y-cap, the reduced impedance $Z_{line}$ of the power line may degrade the noise attenuation performance of the entire CM EMI filter. Thus, in order to prevent $Z_{line}$ from being reduced, an appropriate design guideline for the sensing winding is required.

$Z_{line}$ is determined mainly by the parasitic capacitance after a first magnetic resonance frequency $f_{r,\,cm}$ (given as $1/2\pi\sqrt{L_{cm,eff}C_{cm}}$) of the CM choke. Accordingly, after the frequency $f_{r,\,cm}$, the inductance cancellation item $X(s)$ has no significant influence on the magnitude of $Z_{line}$. In addition, $X(s)$ in Equation 3 is meaningful only when $sN_{sen}^2L_{cm}$ is greater than $(Z_{in,AEF}\|Z_{sen,para})$. Thus, when a frequency point, at which the $sN_{sen}^2L_{cm}$ starts to be greater than $(Z_{in,AEF}\|Z_{sen,para})$, is higher than $f_{r,cm}$, $Z_{line}$ is hardly affected by the sensing winding. Such a condition may be satisfied by the following design procedure. First, $Z_{in,AEF}$ is designed to be greater than $Z_{sen,\,para}$ at all frequency ranges of interest (e.g., 10 kHz to 30 MHz). That is, it may be expressed by a condition shown in Equation 14 below, $$\left(Z_{in,AEF} = R_f + \frac{1}{sC_f}\right) > \left(Z_{sen,para} = R_{sen}\bigg\|\frac{1}{sC_{sen}}\right) \quad \text{[Equation 14]}$$

where, $R_f$ and $C_f$ are selected to be as in Equations 15 and 16 in order to be expressed more simply, $$R_f > \frac{1}{sC_{sen}} \quad \text{[Equation 15]}$$

$$c_f < c_{sen}. \quad \text{[Equation 16]}$$

When an inequality condition in Equation 14 is sufficiently satisfied, $(Z_{in,\,AEF}\|Z_{sen,\,para}) \approx Z_{sen,\,para}$. Then, the frequency point at which $sN_{sen}^2L_{cm}$ starts to be greater than $(Z_{in,AEF}\|Z_{sen,para})$ is approximated to a resonant frequency between $N_{sen}^2L_{cm}$ and $C_{sen}$, which is show in Equation 17 below, $$f_{r,sen} \frac{1}{2\pi N_{sen}\sqrt{L_{cm}C_{sen}}} \quad \text{[Equation 17]}$$

here, $f_{r,sen}$ should be higher than $f_{r,cm}$ as shown in Equation 18 below, $$\left(f_{r,sen} = \frac{1}{2\pi N_{sen}\sqrt{L_{cm}C_{sen}}}\right) > \left(f_{r,cm} = \frac{1}{2\pi\sqrt{L_{cm,eff}C_{cm}}}\right) \quad \text{[Equation 18]}$$

so that the design guideline for the number of turns of the sensing winding is extracted as shown in Equation 19 below, $$N_{sen} < \sqrt{\frac{L_{cm,eff}C_{cm}}{L_{cm}C_{sen}}} \approx \sqrt{\frac{2C_{cm}}{C_{sen}}} \quad [\text{Equation 19}]$$

where, $L_{cm,eff}$ is approximated as $(1+k_{cm})L_{cm} \approx 2L_{cm}$. The design guideline for Equation 19 in which the maintained $Z_{line}$ is guaranteed is derived by the maximum allowable winding ratio of the sensing winding. The exact values of the parasitic capacitances of the CM choke, $C_{cm}$, and $C_{sen}$ in Equation 19 are not known before being actually designed, but Equation 19 may still provide a useful guideline for the number of turns of the sensing winding.

Figure 35A:
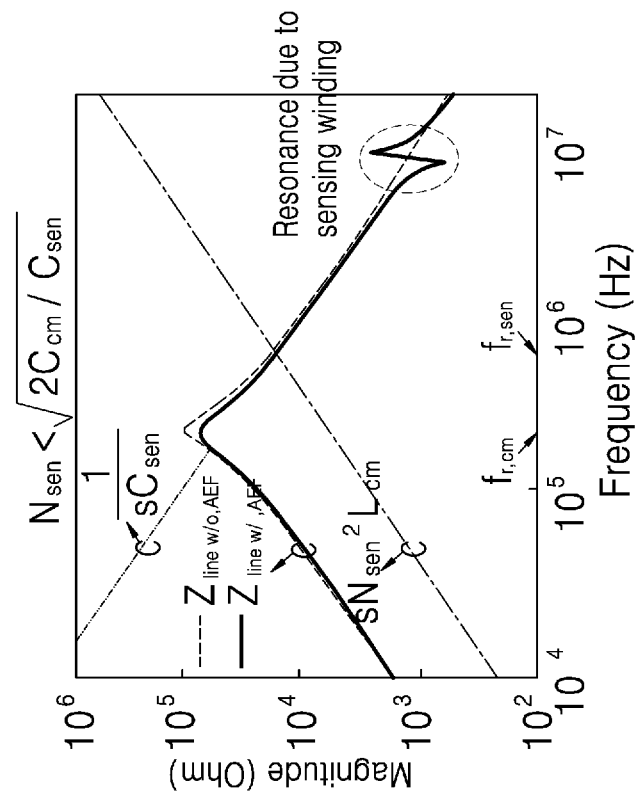
Figure 35B:
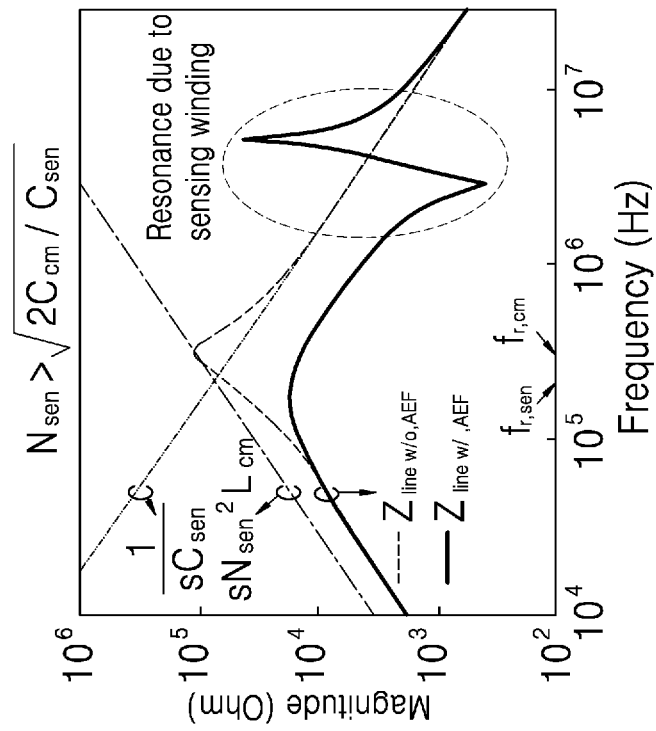

FIGS. 35A and 35B are graphas illustrating curves of the impedance $Z_{line}$ of the power line when viewed from the position of the Y-cap toward the power source, wherein FIG. 35A is a graph illustrating the curve in a case in which $N_{sen}$ violates Equation 19, and FIG. 35B is the graph the curve in a case in which $N_{sen}$ satisfies Equation 19. Examples of values are illustrated in FIG. 35. Two different values of $N_{sen}$ are tested with AEF designed by setting $C_{cm}$ and $C_{sen}$ to the same fixed value for the simple analysis. The magnitudes of the $Z_{line}$ in the case in which the AEF is included and the case in which the AEF is not included, that is, $Z_{line\ w/\ AEF}$ and is $Z_{line\ w/o\ AEF}$ are compared and illustrated. In FIG. 35A, the condition of Equation 19 is violated since $N_{sen}=2$, and $f_{r,\ sen}$ is lower than $f_{r,\ cm}$. In contrast, Equation 19 satisfies FIG. 35B as $N_{sen}=0.5$, and $f_{r,\ sen}$ is higher than $f_{r,\ cm}$. As a result, in FIG. 35A, $Z_{line,\ w/AEF}$ is significantly reduced as compared with $Z_{line,\ w/o\ AEF}$, while in FIG. 35B, $Z_{line,\ w/AEF}$ is substantially unchanged.

Further, when the AEF is used, in a high-frequency region, another resonance occurs in $Z_{line}$. The resonance occurs due to the sensing winding in a frequency of $\frac{1}{2\pi}\sqrt{(1-k_{sen}^2)N_{sen}^2L_{cm}C_{sen}}$ as illustrated in FIGS. 35A and 35B. Since the resonance adversely affects the stability of the system feedback in the high-frequency range, a low-pass filter composed of $R_f$ and $C_f$ is required at the input terminal of the OP-AMP to suppress the resonance. In the case of the low-pass filter that does not affect the performance of the AEF in the operating frequency range, a cutoff frequency of the filter should be higher than $f_{op,\ max}$, which is the maximum operating frequency, but lower than a resonant frequency in Equation 20 below, $$f_{op,max} < \frac{1}{2\pi R_f C_f} < \frac{1}{2\pi\sqrt{(1-k_{sen}^2)N_{sen}^2L_{cm}C_{sen}}}. \quad [\text{Equation 20}]$$

Equation 15, Equation 16, and Equation 20 may be guidelines for designing the low-pass filter.

Next, the design of the injection transformer and the amplifier will be described.

The design of the injection transformer and the amplifier is mainly to determine the main performance parameters $f_{op,\ min}$, $f_{op,max}$, and $C_{Y,eff}$ of the AEF in FIG. 34. A capacitor $C_o$ at an output terminal of the amplifier is used to prevent unwanted signals at frequencies lower than the target operating frequency range. $L_{in}$ and $C_o$ connected in series with $L_{inj}$ constitute a high-frequency filter, and a cutoff frequency of the high-frequency filter determines a minimum operating frequency of the AEF by being derived as in Equation 21 below, $$f_{op,min} = \frac{1}{2\pi\sqrt{L_{inj}C_o}}. \quad [\text{Equation 21}]$$

An impedance of $C_o$ connected in series with $L_{inj}$ is rapidly decreased at a frequency $f_{op,\ min}$ to increase an output current of the OP-AMP. Thus, $R_o$ should be added to the output terminal of the OP-AMP in order to limit the impedance at the resonant frequency, but should be sufficiently less than $sL_{inj}$ in all operating frequency ranges.

Meanwhile, as described with reference to FIG. 34A, the maximum operating frequency $f_{op,\ max}$ of the AEF is determined by a frequency boundary at which the impedance of the bypass branch is less than the impedance of the path of the injection transformer. Since resonance in the secondary winding of the injection transformer may cause feedback instability similar to the resonance due to the sensing winding illustrated in FIG. 35, the bypass branch should start to operate at a frequency lower than the resonant frequency. The resonance in the secondary winding occurs at a frequency of $\frac{1}{2\pi}\sqrt{(1-k_{inj}^2)N_{inj}^2L_{inj}C_{inj}^2}$, which is higher than $f_{op,\ max}$, as shown in Equation 22 below, $$f_{op,max} < \frac{1}{2\pi\sqrt{(1-k_{inj}^2)N_{inj}^2L_{inj}C_{inj2}}} \quad [\text{Equation 22}]$$

where, $f_{op,\ max}$ is determined as in Equation 23 below due to resonance between $(1-k_{inj}^2)N_{inj}^2L_{inj}$, which is an inductance part of the injection transformer, and the capacitance $C_d$ of the bypass branch, $$f_{op,max} < \frac{1}{2\pi\sqrt{(1-k_{inj}^2)N_{inj}^2L_{inj}C_d}}. \quad [\text{Equation 23}]$$

When Equation 23 is put into Equation 22, the relationship between $C_d$ and $C_{inj}^2$ is extracted as in Equation 24 below, $$C_d > C_{inj2}. \quad [\text{Equation 24}]$$

Some damping resistors $R_{d1}$ and $R_{d2}$ are required for stability at high frequencies. $R_{d2}$ of tens of ohms is recommended in terms of mitigating the resonance between Y-cap and CM noise source impedance in the high-frequency range, which will be shown in experiments below.

Assuming that the effect of resistors $R_{d1}$, $R_{d2}$, and $R_{inj}^2$ is negligible in the AEF operation at a frequency range excluding the resonance point, the condition of Equation 24 allows Equations 7 to 11 to be approximated as in Equation 25 below in a frequency range up to $f_{op,\ max}$, $$\alpha(s) \approx N_{sen}N_{inj}G_{amp}(s),\ \beta(s) \approx 0. \quad [\text{Equation 25}]$$

The effective capacitance $C_{Y,\ eff}(s)$ of the Y-cap in Equation 12 is simplified as Equation 26 below, $$C_{Y,eff}(s) \approx (1 + N_{sen}N_{inj}G_{amp}(s))C_Y. \quad [\text{Equation 26}]$$

Phase compensation elements $R_c$ and $C_c$ of $G_{amp}$ (s) should have little effect on the AEF operation, and Equation 26 is further simplified to a value that does not depend on the frequency as in FIG. 34.

$$C_{Y,eff} \approx (1 + N_{sen}N_{inj}(1 + R_2/R_1))C_Y. \quad \text{[Equation 27]}$$

Finally, several useful design guidelines for the AEF may be derived as follows. Although $N_{sen}$ is limited by Equation 19, in Equation 27, $C_{Y,\,eff}$ may be designed to be several times $C_Y$ by increasing $N_{inj}$ and gain $(1+R_2/R_1)$ of the amplifier. However, as $N_{inj}$ increases, the maximum operating frequency $f_{op,\,max}$ is reduced due to Equation 23. Further, the high amplifier gain also requires a high output voltage swing and a high gain bandwidth for the OP-AMP. Thus, appropriate values of $N_{inj}$ and $(1+R_2/R_1)$ should be selected in consideration of costs of the OP-AMP and $f_{op,\,max}$ of the AEF.

Further, the condition of Equation 22 also means that $f_{op,\,max}$ of the AEF may be adjusted by $N_{inj}$, $L_{inj}$, and $C_{inj}^2$ of the injection transformer. Since the parasitic capacitance $C_{inj}^2$ is not an independent design parameter, $N_{inj}$ and $L_{inj}$ should be designed to be small to achieve high $f_{op,\,max}$. However, small $N_{inj}$ reduces $N_{inj}C_{Y,\,eff}$, and when $L_{inj}$ is reduced, $f_{op\,min}$ is increased in Equation 21. As a result, in order for the AEF to have optimized performance, the following design process is proposed. First, $C_o$ is designed to have a high value that is allowed in a physical package of a given size, and $L_{inj}$ is lowered to the limit of Equation 21 for the target for min. Next, in order to achieve the highest $C_{Y,\,eff}$, $N_{inj}$ is increased to the limit of equation 22 for the target fop max.

Next, a stability check will be described.

The AEF is basically a feedback system with an analog input and an analog output and thus items related to stability should be carefully designed, and the stability should be guaranteed. When the system is unstable, the system may oscillate even when an EUT noise source is not applied. The feedback stability may be confirmed by the phase and gain margin of the loop gain. In order to derive the loop gain from the circuit model of FIG. 32, the feedback loop is separated from the output terminal of the OP-AMP, and a test voltage source $V_t$ is applied from the separated node to the injection transformer, and in a state in which the noise source voltage $V_n$ is not applied, a ratio of the voltage $V_{in}$ at a front end node of the CM choke to a test voltage $V_t$ may be calculated as in Equation 28 below, where, $$B(s) = \left(\left(\frac{1}{Z_n} + \frac{1}{Z_{line}}\right)^{-1} + Z_{Cy} + 2\left(R_{d2} + \frac{1}{sC_d}\right)\|R_{d1} + R_{inj2}\right) \times \quad \text{[Equation 29]}$$

$$\left\{sN_{inj}^2 L_{inj} + \left(R_{inj2}\left\|\frac{1}{sC_{inj2}}\right.\right)\right\}\|$$

$$\left(R_{d1} + R_{d2} + \frac{1}{sC_d}\right) - \frac{(sM_{inj})^2}{sL_{inj} + \left(R_n + \frac{1}{C_0}\right)\left(R_{inj1}\left\|\frac{1}{sC_{inj1}}\right.\right)} \Bigg\} -$$

$$\frac{2\left(R_{inj2}\left\|\frac{1}{sC_{inj2}}\right.\right)^2\left(R_{d2} + \frac{1}{sC_d}\right)^2}{\left(R_{d1} + R_{inj2}\left\|\frac{1}{sC_{inj2}}\right. + R_{d2} + \frac{1}{sC_d}\right)^2}.$$

The voltage gains of $(V_{in,\,amp}/V_{in})$ and $(V_{out,\,amp}/V_{in,\,amp})$ are derived as $G_1(s)$ and $G_{amp}(s)$ in Equations 9 and 10, respectively. Thus, the loop gain of the system may be expressed as in Equation 30 below, $$G_{loop}(s) = \quad \text{[Equation 30]}$$

$$\frac{V_{outamp}}{V_t} = -\frac{V_{in}}{V_t}\frac{V_{in,amp}}{V_{in}}\frac{V_{outamp}}{V_{inamp}} = G_1(s)G_2(s)G_{amp}(s).$$

The purpose of using $R_c$ and $C_c$ is to increase a phase margin of $G_{loop}(s)$ for ensuring stability in the low-frequency range because the resonance between the effective inductance $L_{cm,\,eff}$ of the choke and the effective capacitance $C_{Y,\,eff}$ of the Y-cap branch causes a risk of instability. A resonant frequency of $1/2\pi\sqrt{L_{cm,eff}C_{Y,eff}}$ determines the low frequency boundary of the filter operation and should be lower than a low-frequency limit of the CE specification in the appropriate EMI filter design. A maximum amount of phase compensation due to $R_c$ and $C_c$ is calculated by Equation 31 below, $$\max(\angle G_{loop,w/comp}(f) - \angle G_{loop,w/o\,comp}(f)) = \quad \text{[Equation 31]}$$

$$\tan^{-1}\left(\sqrt{\frac{R_c^2}{4(R_1 + R_2)(R_1 + R_2 + R_c)}}\right)$$

Equation (23)

$$G_3(s) = \frac{V_m}{V_t} = \frac{sk_{inj}N_{inj}L_{inj}\left(R_{inj1}\left\|\frac{1}{sC_{inj1}}\right.\right)\left(R_{inj2}\left\|\frac{1}{sC_{inj2}}\right.\right)}{\left(R_a + \frac{1}{sC_n} + R_{inj}\left\|\frac{1}{sC_{inj1}}\right.\right)\left(sL_{inj} + \left(R_n + \frac{1}{sC_n}\right)\|R_{inj1}\left\|\frac{1}{sC_{inj1}}\right.\right)}$$

$$\frac{R_{d2} + \frac{1}{sC_d}}{\left(\frac{1}{Z_n} + \frac{1}{Z_{line}}\right)\left(R_{d1} + R_{d2} + \frac{1}{sC_d} + R_{inj2}\left\|\frac{1}{sC_{inj2}}\right.\right)B(s)}$$

where, Equation 31 is obtained in a frequency of $$\frac{1}{2\pi R_c C_c}\sqrt{1+\frac{R_c}{R_1+R_2}}.$$

Here, $\angle G_{loop,w/comp}(S)$ represents a phase of $G_{loop}(s)$ with the phase compensator, and $\angle G_{loop,w/ocomp}(S)$ represents the phase of the $G_{loop}(s)$ without the phase compensator. By setting the frequency for the maximum phase compensation as the resonant frequency of $1/2\pi\sqrt{L_{cm,eff}C_{Y,eff}}$, other expressions in $R_c$ and $C_c$ are extracted as in Equation 32 below, $$C_c = \frac{1}{R_c}\sqrt{L_{cm,eff}C_{Y,eff}\left(1+\frac{R_c}{R_1+R_2}\right)}.\quad\text{[Equation 32]}$$

$$V_{out,amp}(s) = V_{in}(s)G_1(s)G_{amp}(s) \quad\text{[Equation 35]}$$

$$I_{out,amp}(s) = \frac{V_{in}(s)}{2}\cdot\frac{G_1(s)G_{amp}(s) + k_{inj}N_{inj}\left(sL_{inj1}\|R_{inj1}\|\frac{1}{sC_{inj1}}\right)\frac{R_{d1}+R_{d2}+\frac{1}{sC_d}+R_{inj1}\|\frac{1}{sC_{inj1}}}{\left(R_{d2}+\frac{1}{sC_d}\right)\left(R_{inj1}\|\frac{1}{sC_{inj2}}\right)}\left[1-\frac{\frac{1}{sC_r}+2\left\{\left(R_{d2}+\frac{1}{sC_d}\right)\|R_{d1}+R_{inj1}\|\frac{1}{sC_{inj1}}\right\}}{z_{t\text{-}af}}\right]}{\frac{1}{sC_o}+R_o+sL_{og1}\|R_{inj1}\|\frac{1}{sC_{inj1}}}$$

where, $$V_{in}(s) = \frac{(Z_{line}+Z_{LISV})\|Z_{Y,eff}}{2Z_n+(Z_{line}+Z_{LISV})\|Z_{Y,eff}}V_n(s). \quad\text{[Equation 36]}$$

The expressions in Equations 31 and 32 provide design guidelines for $R_c$ and $C_c$.

It should be noted that since $G_2(s)$ in Equation 28 differs depending on the EUT noise source impedance $Z_n$, the loop gain of Equation 30 also differs depending on the EUT noise source impedance $Z_n$. It can be seen that, in Equation 30, as the magnitude of $Z_n$ increases, the value of the loop gain increases, so that the gain margin tends to decrease. Thus, designing stability with an infinite value of $Z_n$ is generally to provide stability at worst-case conditions. Accordingly, in the present specification, the designed loop gain of the AEF is calculated or measured under the condition of the infinite value of $Z_n$ in order to ensure stability in any EUT application.

Figure 36A:
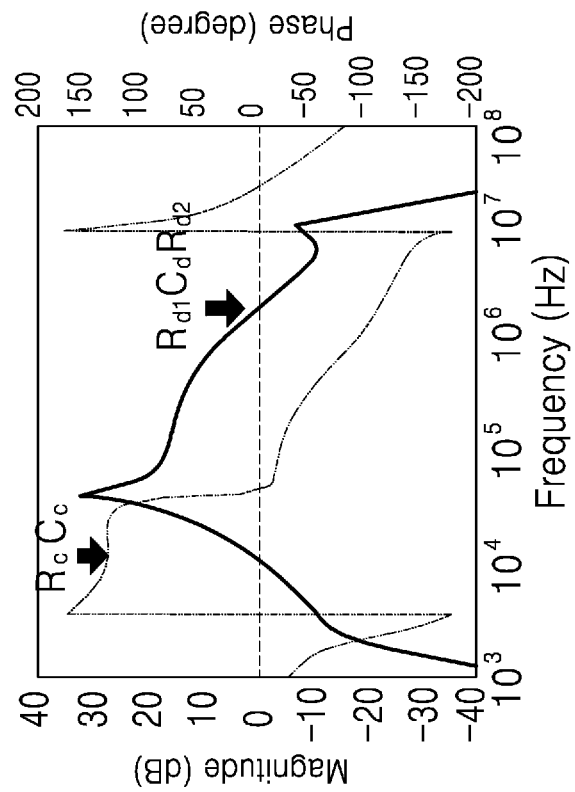
Figure 36B:
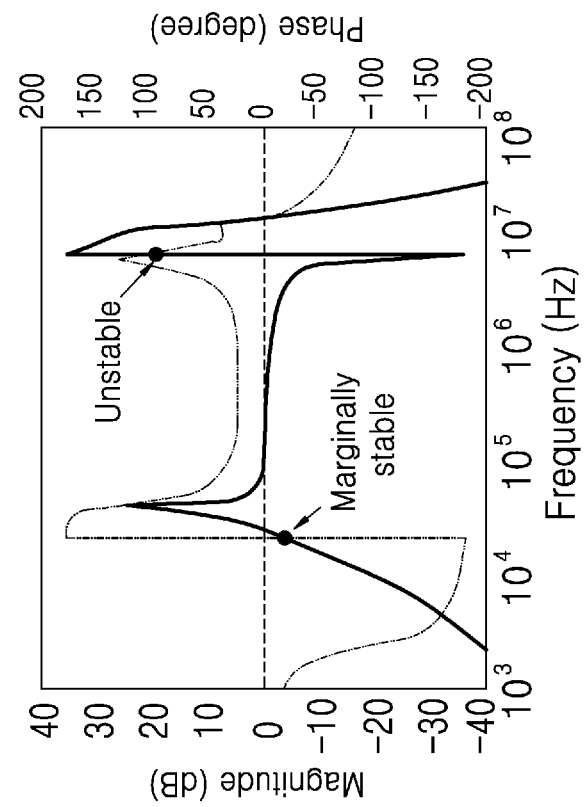

FIGS. 36A and 36B illustrate the comparison of loop gains, wherein FIG. 36A illustrates the loop gain in an unstable situation without the damping components $R_{d1}$, $C_d$, and $R_{d2}$ and the phase compensator of $R_c$ and $C_c$, and FIG. 36B illustrates the loop gain in a stable situation with the damping components $R_{d1}$, $C_d$, and $R_{d2}$ and the phase compensator of $R_c$ and $C_c$.

For example, $G_{loop}(s)$ of the filter with the AEF may be expressed using Equation as shown in FIG. 36. The bypass branch and phase compensator of $R_{d1}$, $C_d$, $R_{d2}$, $R_c$, and $C_c$ are not installed in FIG. 36A, but are installed in FIG. 36B. The effect of these components on the stability is clearly illustrated. In FIG. 36A, the instability due to an abrupt phase shift in the vicinity of 10 MHz is caused by the secondary winding of the injection transformer, and is solved by the bypass branch in the case of FIG. 36B. In FIG. 36A, the resonance between $L_{cm,\,eff}$ and $C_{Y,\,eff}$ at a low frequency of less than 100 kHz also leads to the risk of excessive phase shift and instability. As can be seen from FIG. 36B, when the phase compensator of $R_c$ and $C_c$ is used, the gain margin is greatly increased.

Next, the selection of OP-AMP and the overall design procedure will be described. In the non-inverting amplifier, an operational frequency limit $f_{OPamp}$ of the OP-AMP should be higher than a high-frequency limit $f_{CE,\,max}$ of the CE specification.

$$f_{OPamp} > f_{CE,max}. \quad\text{[Equation 33]}$$

Further, the voltage and current capacity of the OP-AMP should be sufficient to compensate for noise. In order to estimate the required OP-AMP capacity, a voltages $V_{out,\,amp}(s)$ and a current $I_{out,\,amp}(s)$ at the output terminal of the OP-AMP are calculated as shown in Equations 34 and 35, respectively, from the circuit model of FIG. 32, $V_{in}(s)$ is determined by $Z_n$ and $V_n(s)$ as well as the impedace of the filter including the AEF, so that information on a noise source model is necessary to estimate $V_{out,\,amp}(s)$ and $I_{out,\,amp}(s)$. The noise source model of the operating SMPS, $Z_n$, and $V_n$ may be extracted by a variety of previously developed measurement methods. Once $Z_n$ and $V_n(s)$ are extracted, time domain waveforms of an output voltage $v_{out,\,amp}(t)$ and an output current $i_{out,\,amp}(t)$ of the OP-AMP may be calculated from spectra of $V_{out,\,amp}(s)$ and $I_{out,\,amp}$ given in Equations 34 to 36. Thus, an output voltage capacity $v_{OPamp,\,max}$ and an output current capacity $i_{OPamp,\,max}$ of the OP-AMP should be sufficient to provide $v_{out,\,amp}(t)$ and $i_{out,\,amp}(t)$, respectively.

$$v_{OPamp,max} > \max(|v_{out,amp}(t)|) \quad\text{[Equation 37]}$$

$$i_{OPamp,max} > \max(|2i_{out,amp}(t)|). \quad\text{[Equation 38]}$$

Since $I_{out,\,amp}(s)$ is defined in the half-circuit model, a value of the current actually flowing in the OP-AMP is twice the calculated current value as shown in Equation 38.

As shown in Equation 35, when $N_{inj}$ is increased among the various design elements affecting $I_{out,\,amp}(s)$, $I_{out,\,amp}(s)$ is greatly increased in the operating frequency range of the AEF. The voltage gain of the injection transformer due to $N_{inj}$ may reduce the output voltage of the OP-AMP instead of increasing the output current thereof as described above. The injection transformer not only isolates the AEF ground from the SMPS ground, but also provides the gain and another design flexibility for the OP-AMP circuit.

Figure 37:
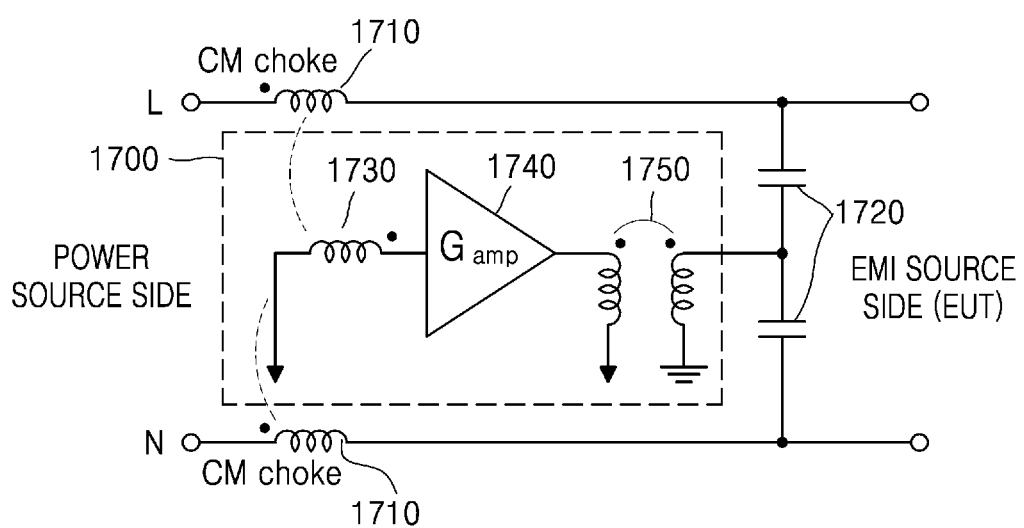
FIG. 37 is a circuit diagram illustrating a second embodiment of the isolated type active EMI filter having no additional elements on a power line according to the present disclosure.

Other embodiments of the isolated type active EMI filter having no additional elements on a power line according to the present disclosure will be described. FIG. 37 is a circuit diagram illustrating a second embodiment of the isolated type active EMI filter having no additional elements on a power line according to the present disclosure. The isolated type active EMI filter having no additional elements on a power line according the second embodiment of the present disclosure includes a CM choke 1710, a Y-cap 1720, a transformer 1750, an amplifier 1740, and a compensation winding 1730.

Referring to FIG. 37, the CM choke 1710 is disposed on a power source side from which power is supplied and has a form in which a live line and a neutral line, which are connected to an EMI source, are each wound with a winding.

The Y-cap 1720 is disposed on an EMI source side at which EMI occurs and includes two capacitors connected in series, and the two capacitors are connected in parallel between the live line and the neutral line and are commonly connected to the ground.

The transformer 1750 is installed in front of the Y-cap 1720, includes a primary coil that senses a noise voltage of the Y-CAP and a secondary coil through which the noise voltage is transformed, and is isolated from the power line.

The amplifier 1740 amplifies the noise voltage that is sensed and transformed by the transformer 1750.

The compensation winding 1730 is formed by winding a coil on the CM choke 1710, and injects the noise signal amplified by the amplifier into the CM choke 1710.

Figure 38:
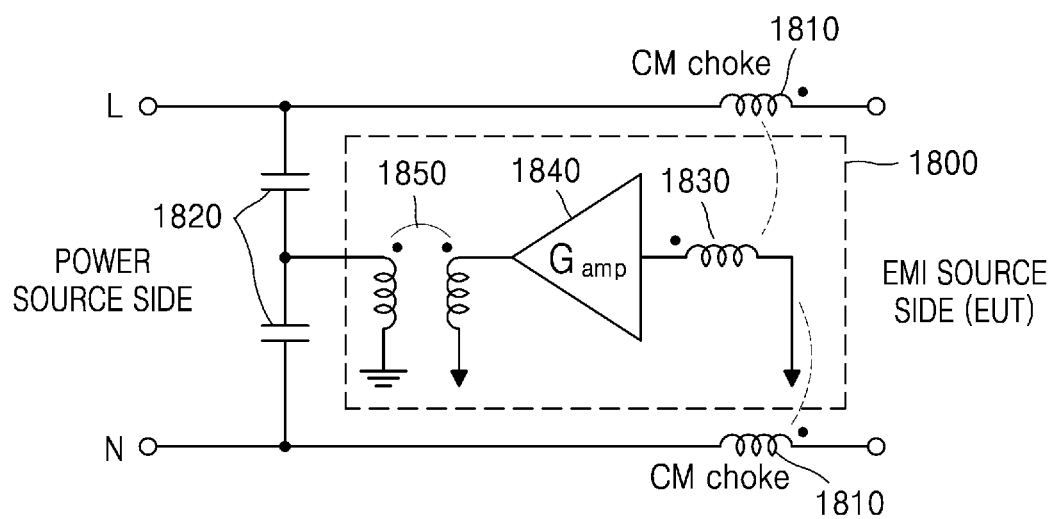
FIG. 38 is a circuit diagram illustrating a third embodiment of the isolated type active EMI filter having no additional elements on a power line according to the present disclosure.

FIG. 38 is a circuit diagram illustrating a third embodiment of the isolated type active EMI filter having no additional elements on a power line according to the present disclosure, which includes a CM choke 1810, a Y-cap 1820, a sensing winding 1830, an amplifier 1840, and a transformer 1850.

Referring to FIG. 38, the CM choke 1810 is disposed on an EMI source side at which EMI occurs and has a form in which a live line L and a neutral line N, which are connected to an EMI source, are each wound with a winding.

The Y-cap 1820 is disposed on a power source side from which power is supplied and includes two capacitors connected in series, and the two capacitors are connected in parallel between the live line L and the neutral line N and are commonly connected to the ground.

The sensing winding 1830 is formed by winding a coil on the CM choke 1810 and senses a noise current of the CM choke 1810.

The amplifier 1840 amplifies the noise current that is sensed through the sensing winding 1830.

The transformer 1850 is installed in front of the Y-CAP 1820, includes a primary coil that receives a signal amplified by the amplifier 1840 and a secondary coil that is isolated from the power line by being connected to the ground connected to the Y-cap 1820, and injects the signal transformed through the secondary coil into the Y-cap 1820 as a compensation signal.

Figure 39:
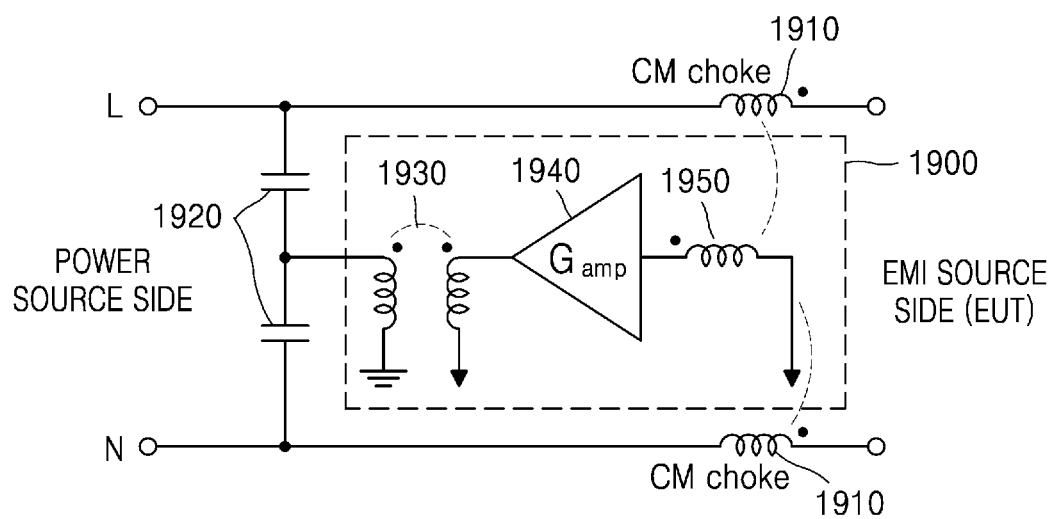
FIG. 39 is a circuit diagram illustrating a fourth embodiment of the isolated type active EMI filter having no additional elements on a power line according to the present disclosure.

FIG. 39 is a circuit diagram illustrating a fourth embodiment of the isolated type active EMI filter having no additional elements on a power line according to the present disclosure, which includes a CM choke 1910, a transformer 1930, an amplifier 1940, a Y-cap 1920, and a compensation winding 1950.

Referring to FIG. 39, the CM choke 1910 is disposed on a EMI source side at which EMI occurs and has a form in which a live line L and a neutral line N, which are connected to an EMI source, are each wound with a winding.

The Y-cap 1920 is disposed on a power source side from which power is supplied and includes two capacitors connected in series, and the two capacitors are connected in parallel between the live line and the neutral line and are commonly connected to the ground.

The transformer 1930 is installed in front of the Y-cap 1920, includes a primary coil that senses a noise voltage of the Y-CAP 1920 and a secondary coil through which the noise voltage is transformed, and is isolated from the power line.

The amplifier 1940 amplifies the noise voltage transformed by the transformer 1930.

The compensation winding 1950 is formed by winding a coil on the CM choke 1910, and injects the noise signal amplified by the amplifier 1940 into the CM choke 1910 as a compensation signal.

Figure 40:
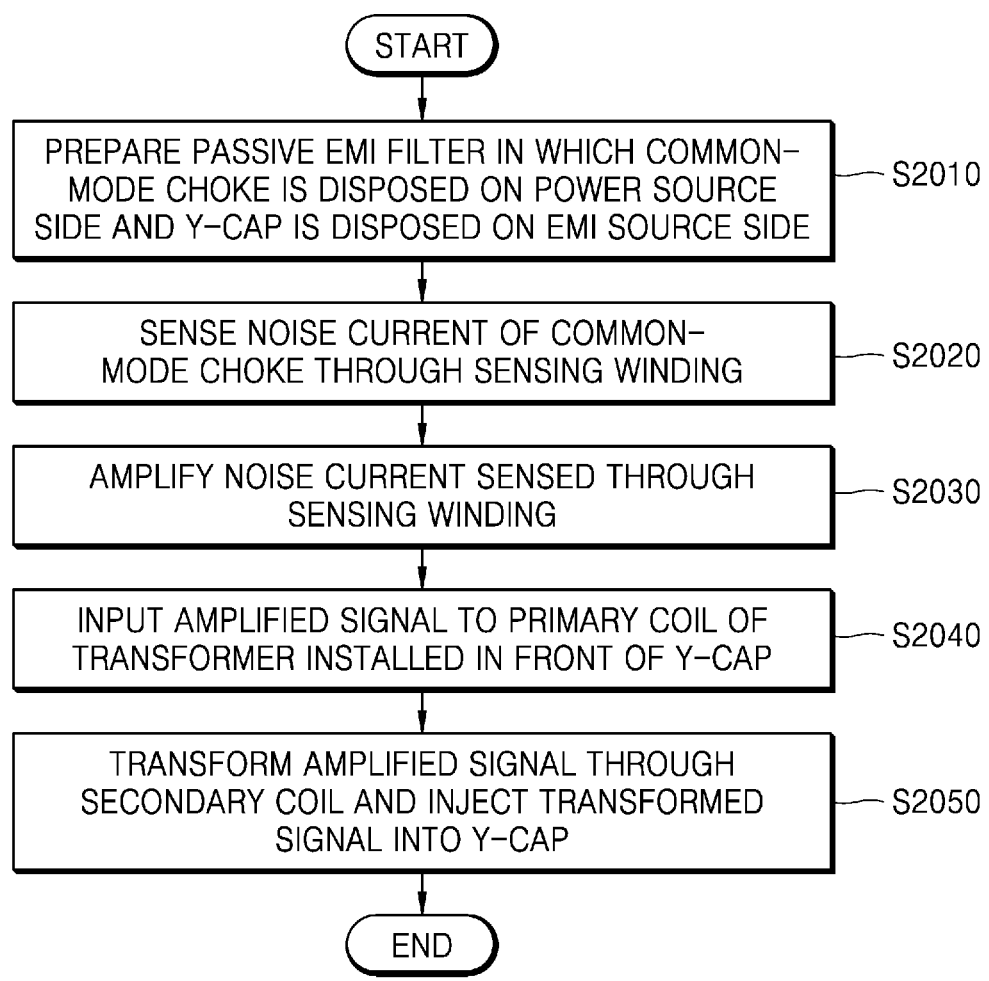
FIG. 40 is a flowchart illustrating a method of reducing EMI noise by adding active elements to a passive EMI filter, wherein the method corresponds to the first embodiment of the isolated type active EMI filter having no additional elements on a power line according to the present disclosure.

FIG. 40 is a flowchart illustrating a method of reducing EMI noise by adding active elements to a passive EMI filter, wherein the method corresponds to the first embodiment of the isolated type active EMI filter having no additional elements on a power line according to the present disclosure.

First, referring to FIGS. 1 and 12, a passive EMI filter in which a CM choke 1100 is disposed on a power source side and a Y-cap 1200 is disposed on an EMI source side is provided (S2010). That is, the CM choke 1100 is disposed on the power source side from which power is supplied and has a form in which a live line and a neutral line, which are connected to an EMI source, are each wound with a winding. The Y-cap 1200 is disposed on the EMI source side at which EMI occurs and includes two capacitors connected in series, and the two capacitors are connected in parallel between the live line L and the neutral line N and are commonly connected to the ground.

An EMI noise current of the CM choke 1100 is sensed through a sensing winding 1300 formed by winding a coil on the CM choke 1100 (S2020). The EMI noise current sensed through the sensing winding 1300 is amplified by an amplifier 1400 (S2030).

The signal, which is amplified by the amplifier 1400, is received through a primary coil of a transformer 1500 installed in front of the Y-cap 1200 (S2040). Then, the received signal is transformed through a secondary coil of the transformer 1500, and the transformed signal is injected into the Y-cap 1200 (S2050). Here, the secondary coil of the transformer 1500 is connected to the ground, which is connected to the Y-CAP 1200, and is isolated from the power line.

Figure 41:
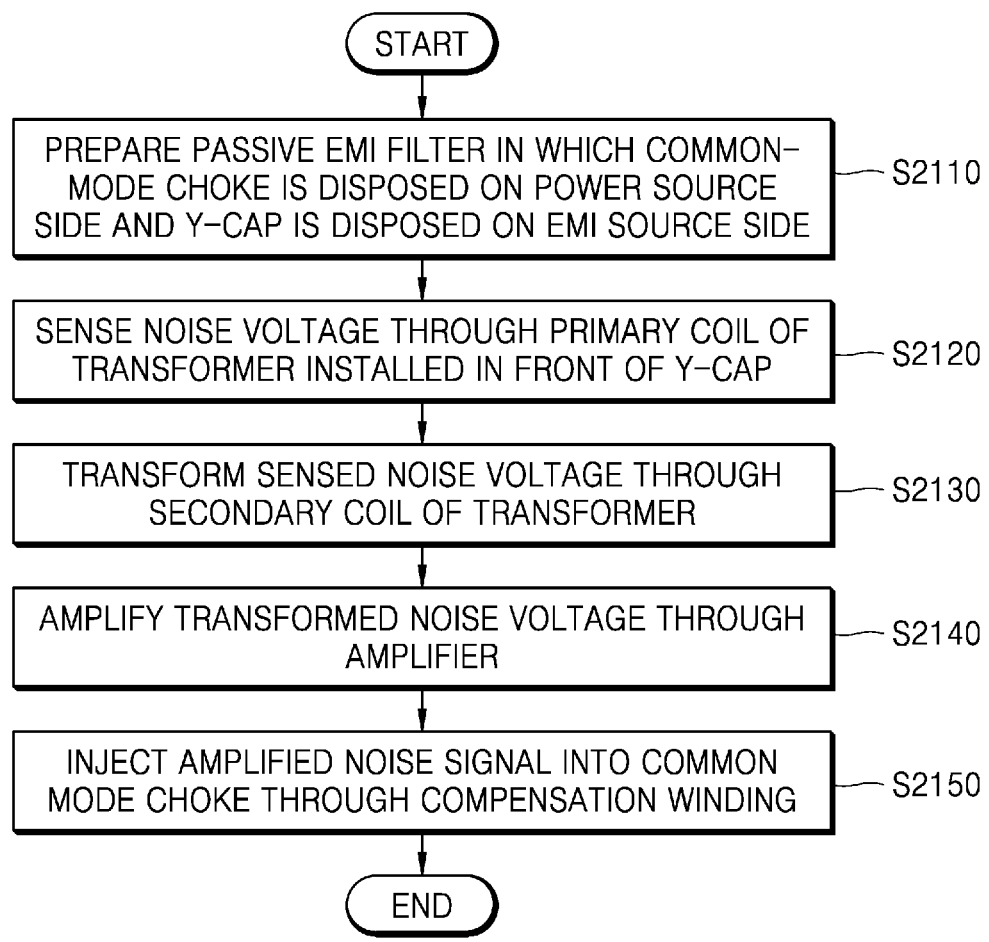
FIG. 41 is a flowchart illustrating a method of reducing EMI noise by adding active elements to a passive EMI filter, wherein the method corresponds to the second embodiment of the isolated type active EMI filter having no additional elements on a power line according to the present disclosure.

FIG. 41 is a flowchart illustrating a method of reducing EMI noise by adding active elements to a passive EMI filter, wherein the method corresponds to the second embodiment of the isolated type active EMI filter having no additional elements on a power line according to the present disclosure. First, referring to FIGS. 9 and 13, a passive EMI filter in which a CM choke 1710 is disposed on a power source side and a Y-cap 1720 is disposed on an EMI source side is provided (S2110). More specifically, the CM choke 1710 is disposed on the power source side from which power is supplied and has a form in which a live line L and a neutral line N, which are connected to an EMI source, are each wound with a winding. The Y-cap 1720 is disposed on an EMI source side at which EMI occurs and includes two capacitors connected in series, and the two capacitors are connected in parallel between the live line L and the neutral line N and are commonly connected to the ground.

A noise voltage is sensed by a primary coil of a transformer 1730 installed in front of the Y-cap 1720 using the Y-cap 1720 as a sensing capacitor (S2120). The sensed noise voltage is transformed through a secondary coil of the transformer 1730 (S2130).Here, the secondary coil of the transformer 1730 is connected to the ground, which is connected to the Y-CAP 1720, and is isolated from the power line.

The transformed voltage of the secondary coil of the transformer 1730 amplified by an amplifier 1740 (S2140). The amplified signal is injected into the CM choke through a compensation winding 1750 that is formed by winding a coil on the CM choke (S2150).

Figure 42:
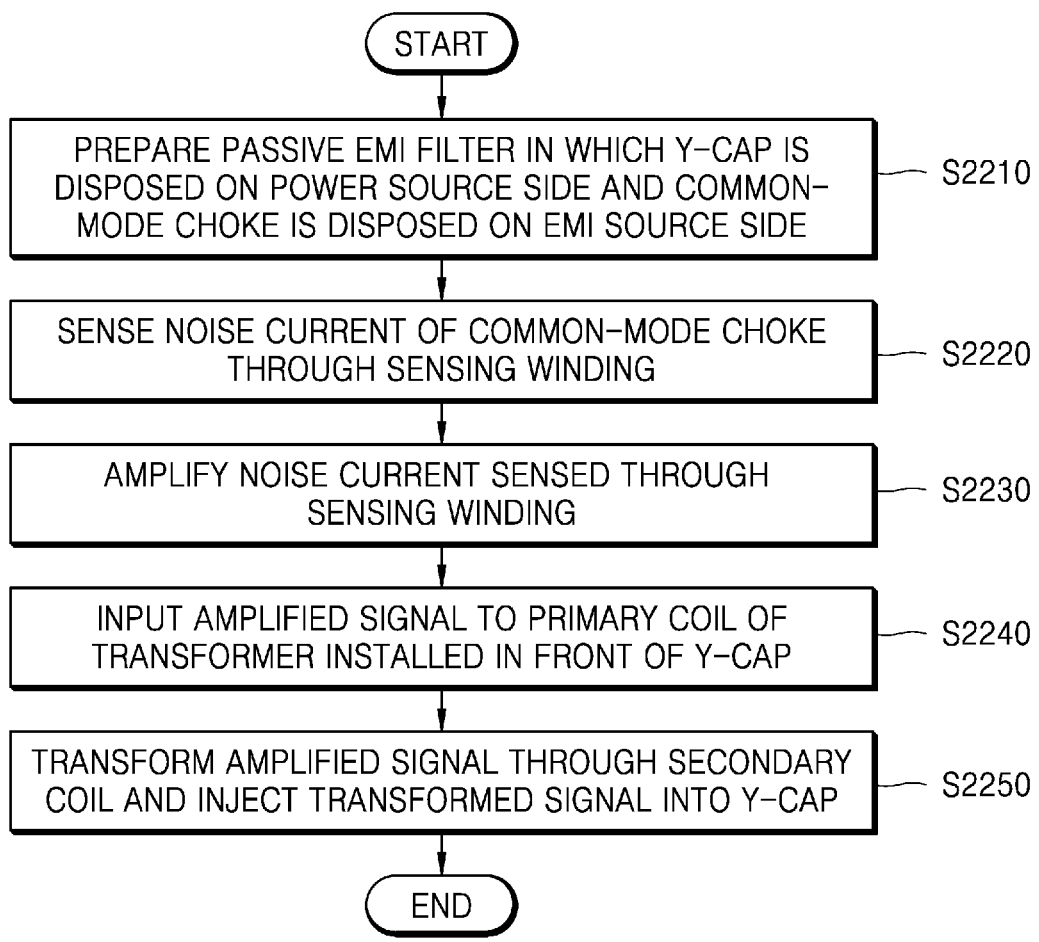
FIG. 42 is a flowchart illustrating a method of reducing EMI noise by adding active elements to a passive EMI filter, wherein the method corresponds to the third embodiment of the isolated type active EMI filter having no additional elements on a power line according to the present disclosure.

FIG. 42 is a flowchart illustrating a method of reducing EMI noise by adding active elements to a passive EMI filter, wherein the method corresponds to the third embodiment of the isolated type active EMI filter having no additional elements on a power line according to the present disclosure.

First, referring to FIGS. 10 and 14, a passive EMI filter in which a CM choke 1810 is disposed on an EMI source side and a Y-cap 1820 is disposed on a power source side is provided (S2210). More specifically, the CM choke 1810 is disposed on the EMI source side at which EMI occurs and has a form in which a live line L and a neutral line N, which are connected to an EMI source, are each wound with a winding. The Y-cap 1820 is disposed on the power source side from which power is supplied and includes two capacitors connected in series, and the two capacitors are connected in parallel between the live line L and the neutral line N and are commonly connected to the ground.

A noise current of the CM choke 1810 is sensed through a sensing winding 1830 formed by winding a coil on the CM choke 1810 (S2220). The noise current sensed through the sensing winding 1830 is amplified by an amplifier 1840 (S2230).

The signal, which is amplified by the amplifier 1840, is input to a primary coil of a transformer 1850 installed in front of the Y-cap 1820 (S2240). Afterward, the signal, which is input to the primary coil, is transformed through a secondary coil of the transformer 1850, and the transformed signal is injected into the Y-cap 1820 as a compensation signal (S2250).Here, the secondary coil of the transformer 1850 is connected to the ground, which is connected to the Y-CAP 1820, and is isolated from the power line.

Figure 43:
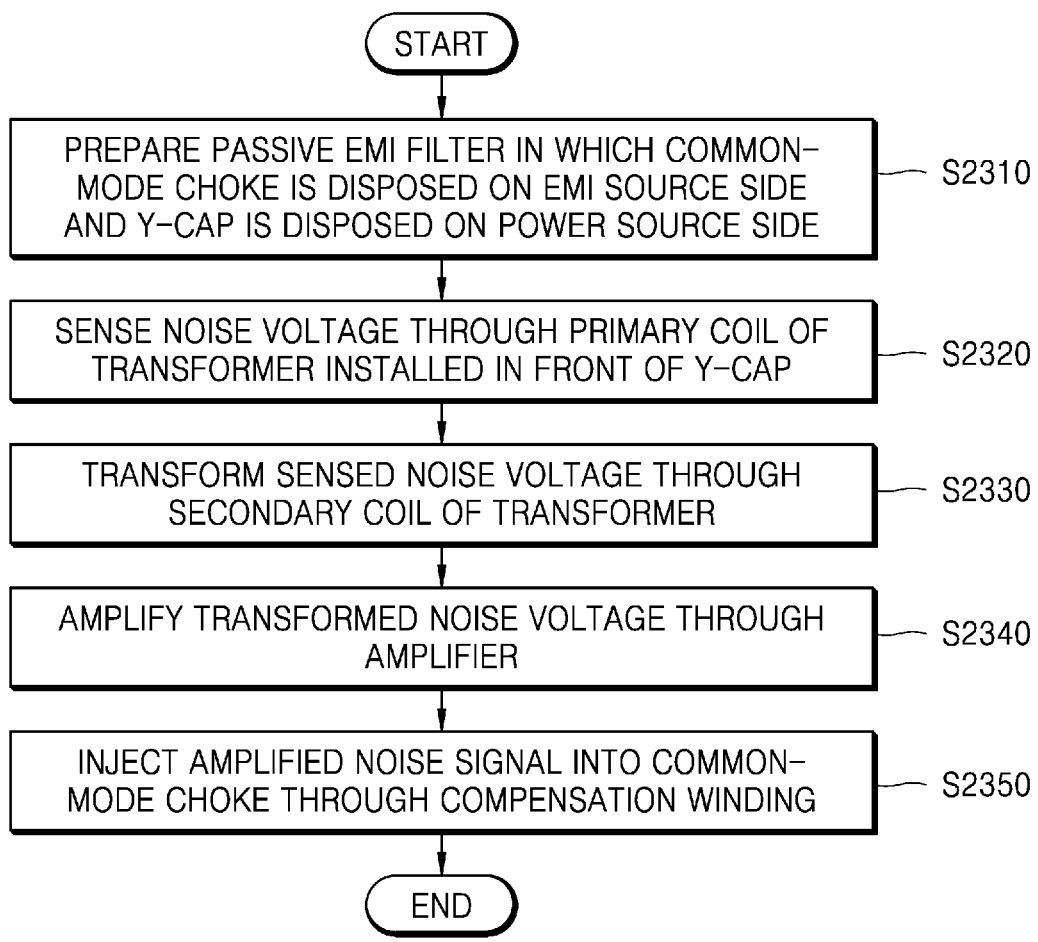
FIG. 43 is a flowchart illustrating a method of reducing EMI noise by adding active elements to a passive EMI filter, wherein the method corresponds to the fourth embodiment of the isolated type active EMI filter having no additional elements on a power line according to the present disclosure.

FIG. 43 is a flowchart illustrating a method of reducing EMI noise by adding active elements to a passive EMI filter, wherein the method corresponds to the fourth embodiment of the isolated type active EMI filter having no additional elements on a power line according to the present disclosure. First, referring to FIGS. 11 and 15, a passive EMI filter in which a CM choke 1910 is disposed on an EMI source side and a Y-cap 1920 is disposed on a power source side is provided (S2310). More specifically, the CM choke 1910 is disposed on the EMI source side at which EMI occurs and has a form in which a live line L and a neutral line N, which are connected to an EMI source, are each wound with a winding. The Y-cap 1920 is disposed on a power source side from which power is supplied and includes two capacitors connected in series, and the two capacitors are connected in parallel between the live line L and the neutral line N and are commonly connected to the ground.

A noise voltage of the Y-cap 1920 is sensed by a primary coil of a transformer 1930 installed in front of the Y-cap 1920 (S2320). The noise voltage, which is sensed by the primary coil, is transformed through a secondary coil of the transformer 1930 (S2330), and here, the secondary coil of the transformer 1930 is connected to the ground, which is connected to the Y-cap 1920, and is isolated from the power line.

The noise voltage transformed through the secondary coil is amplified by an amplifier 1940 (S2340), and the amplified noise signal is injected into the CM choke 1910 as a compensation signal through a compensation winding 1950 that is formed by winding a coil on the CM choke 1910, (S2350).

In the above, the isolated type active EMI filter having no additional elements on a power line according to the present disclosure is an active filter of a type being additionally installed in an existing passive EMI filter consisting of a common-mode choke and a Y-cap. The present disclosure proposes a choke element that is added to a power line by winding a noise sensing or compensation wire on the common-mode choke existing in the passive EMI filter. The Y-cap present in the passive EMI filter is used as a compensation or sensing capacitor, and a small transformer is installed in front of the compensation or sensing capacitor, so that the active circuit is isolated from the power line, and consequently, there is an advantage in that the active circuit is isolated from the power line without elements added to the power line.

In the isolated type active EMI filter according to the present disclosure, the sensing or compensation wire is wound with the optimum number of turns so as not to degrade the noise reduction performance of the passive EMI filter itself. The turn ratio of the transformer is adjusted and the gain of the active filter amplifier is optimized to optimize noise sensing and compensation performance through the Y-cap and the small transformer in front of the Y-cap. Various stability compensation circuits may be added to secure feedback stability in the entire feedback circuit structure for noise sensing and compensation. The active type EMI filter of the present disclosure has a feedback circuit structure in which noise is sensed and a compensation signal is injected.

According to the embodiment of the present disclosure, conductive noise in a low-frequency band is attenuated by 11 dB when only the passive filter is used, but is attenuated by 26 dB when the AEF of the present disclosure is additionally mounted. When only the passive filter is used, an expensive common-mode choke should be used or the total number of stages of the filter should be increased to sufficiently attenuate the noise in the low-frequency band.

Figure 44:
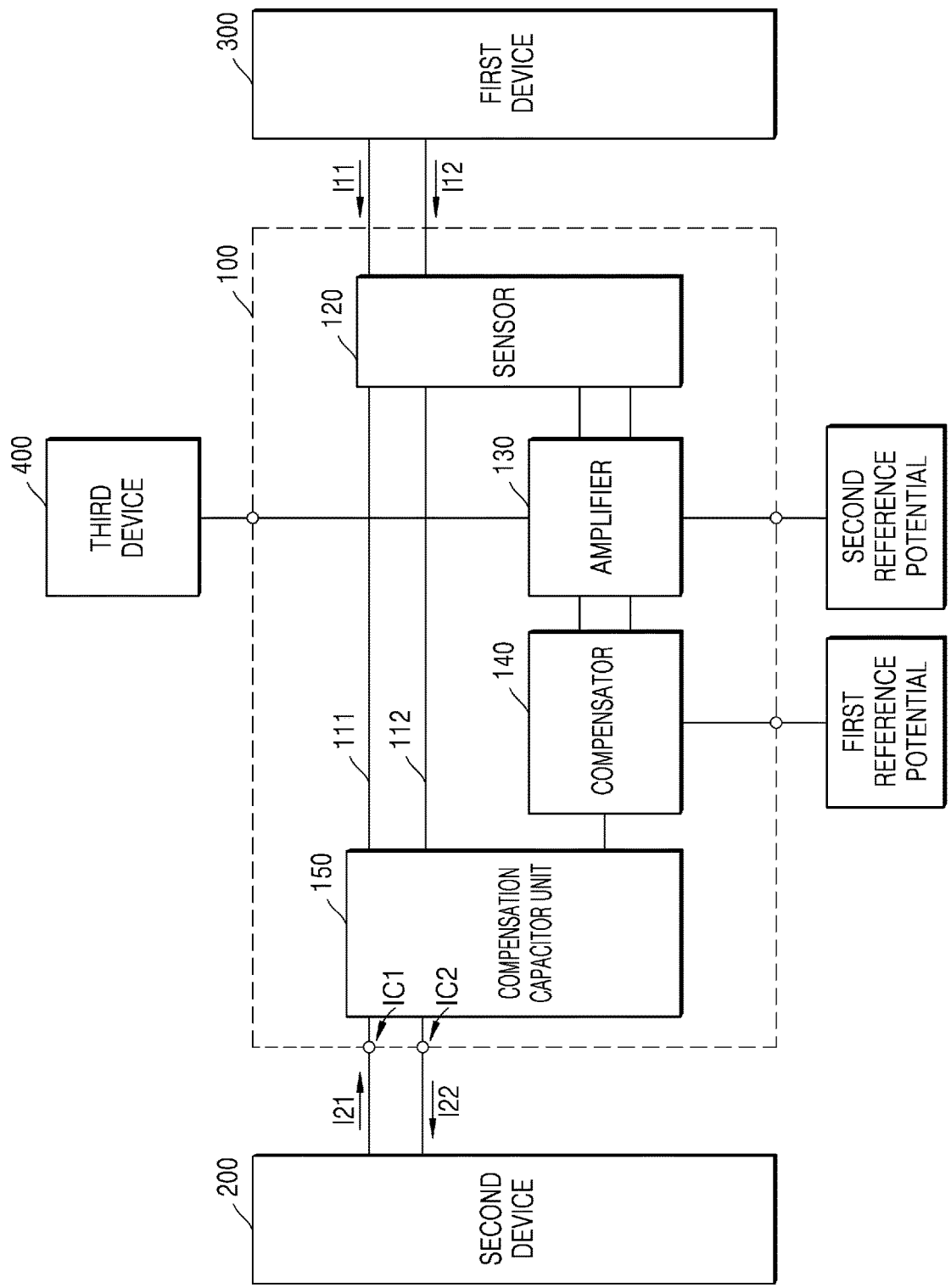
FIG. 44 is a diagram schematically illustrating a configuration of a system including a current compensation device (100) according to one embodiment of the present disclosure.

FIG. 44 is a diagram schematically illustrating a configuration of a system including a current compensation device 100 according to one embodiment of the present disclosure.

The current compensation device 100 according to one embodiment of the present disclosure may actively compensates for first currents I11 and I12 that are input as a common-mode current with respect to at least two or more high-current paths 111 and 112 connected to a first device 300. To this end, the current compensation device 100 according to one embodiment of the present disclosure may include at least two or more high-current paths 111 and 112, a sensor 120, an amplifier 130, a compensator 140, and a compensation capacitor unit 150.

The two or more high-current paths 111 and 112 may be paths in the current compensation device 100 for transmitting second currents I21 and I22 supplied from a second device 200 to the first device 300, for example, may be power lines. According to one embodiment, the two or more high-current paths 111 and 112 may be a live line and a neutral line.

As used herein, the second device 200 may be any of various types of devices for supplying power to the first device 300 in the form of current and/or voltage. For example, the second device 200 may be a device that produces and supplies power, or may also be a device (e.g., an electric vehicle charging apparatus) that supplies power generated by another device. Of course, the second device 200 may also be a device for supplying stored energy. However, this is merely exemplary, and the scope of the present disclosure is not limited thereto.

In the present specification, the first device 300 may be any of various types of devices using the power supplied by the second device 200. For example, the first device 300 may be a load that is driven using the power supplied by the second device 200. In addition, the first device 300 may be a load (e.g., an electric vehicle) that stores energy using the power supplied by the second device 200 and is driven using the stored energy. However, this is merely exemplary, and the scope of the present disclosure is not limited thereto.

As described above, each of the two or more high-current paths 111 and 112 may be a path for transmitting the power supplied by the second device 200, that is, the second currents I21 and I22 to the first device 300, and according to one embodiment, the second currents I21 and I22 may be an alternating current having a frequency of a second frequency band. At this point, the second frequency band may be, for example, a band having a range of 50 Hz to 60 Hz.

Further, each of the two or more high-current paths 111 and 112 may also be a path through which at least a portion of noise generated by the first device 300, that is, the first currents I11 and I12, is transmitted to the second device 200. In this case, the first currents I11 and I12 may be input as a common-mode current with respect to each of the two or more high-current paths 111 and 112.

The first currents I11 and I12 may be currents that are not intentionally generated in the first device 300 due to various causes. For example, the first currents I11 and I12 may be noise currents generated by virtual capacitances between the first device 300 and the surrounding environment.

The first currents I11 and I12 may be currents having a frequency of a first frequency band. In this case, the first frequency band may be a frequency band higher than the above-described second frequency band, for example, may be a band having a range of 150 KHz to 30 MHz.

Meanwhile, the two or more high-current paths 111 and 112 may include two paths as shown in FIG. 44, and may include three paths or four paths as shown in FIGS. 21 and 22. The number of the high-current paths 111 and 112 may vary depending on the form and/or type of power used by the first device 300 and/or the second device 200.

Meanwhile, the sensor 120 is electrically connected to high-current paths 111 and 112, senses the first currents I11 and I12 on the two or more high-current paths 111 and 112, and generates output signals corresponding to the first currents I11 and I12. In other words, the sensor 120 may mean a component for sensing the first currents I11 and I12 on the high-current paths 111 and 112.

According to one embodiment, the sensor 120 may be implemented as a sensing transformer. In this case, the sensing transformer may be a component for sensing the first currents I11 and I12 on the high-current paths 111 and 112 in a state of being isolated from the high-current paths 111 and 112.

According to one embodiment, the sensor 120 may be differentially connected to input terminals of the amplifier 130, which will be described below.

The amplifier 130 may be electrically connected to the sensor 120, and may amplify an output signal output from the sensor 120 to generate an amplified output signal.

The term "amplification" by the amplifier 130, as used herein, may mean that the magnitude and/or phase of an object to be amplified is adjusted.

By the amplifying operation of the amplifier 130, the current compensation device 100 may generate compensation currents IC1 and IC2 having the same magnitude and an opposite phase compared to the first currents I11 and I12, thereby compensating for the first currents I11 and I12 on the high-current paths 111 and 112.

The amplifier 130 may be implemented by various components. In one embodiment, the amplifier 130 may include an OP-AMP. In another embodiment, the amplifier 130 may include a plurality of passive elements, such as resistors and capacitors, in addition to the OP-AMP. In still another embodiment, the amplifier 130 may include bipolar junction transistors (BJTs). In yet another embodiment, the amplifier 130 may include a plurality of passive elements, such as resistors and capacitors, in addition to the BJTs. However, the above-described implementation method of the amplifier 130 is merely exemplary, and the scope of the present disclosure is not limited thereto, and the component for the "amplification" described in the present disclosure may be used without being limited to the amplifier 130 of the present disclosure.

The amplifier 130 may receive power from a third device 400, which is distinct from the first device 300 and/or the second device 200, and amplify the output signal output from the sensor to generate an amplified current. Here, the third device 400 may be a device that receives power from a power source independent of the first device 300 and the second device 200 and generates input power of the amplifier 130. Alternatively, the third device 400 may be a device that receives power from one of the first device 300 and the second device 200 and generates the input power of the amplifier 130.

The compensator 140 may be electrically connected to the amplifier 130 and generate a compensation current on the basis of the output signal amplified by the amplifier 130.

The compensator 140 may be electrically connected to a path connecting an output terminal of the amplifier 130 and a second reference potential of the amplifier 130 to generate the compensation current. The compensator 140 may be electrically connected to a path connecting the compensation capacitor unit 150 and a first reference potential of the current compensation device 100. The second reference potential of the amplifier 130 and the first reference potential of the current compensation device 100 may be different potentials.

The compensation capacitor unit 150 may provide a path through which the compensation current generated by the compensator 140 flows to each of the two or more high-current paths.

According to one embodiment, the compensation capacitor unit 150 may be implemented as a compensation capacitor unit that provides a path through which the current generated by the compensator 140 flows to each of the two or more high-current paths 111 and 112. In this case, the compensation capacitor unit 150 may include at least two or more compensation capacitors connecting the first reference potential of the current compensation device 100 and the two or more high-current paths 111 and 112, respectively.

The current compensation device 100 configured as described above may sense a current at a specific condition on the two or more high-current paths 111 and 112 and actively compensate for the current, and thus may be applied to a high-current, high-voltage, and/or high-power system even when the current compensation device 100 is miniaturized.

Hereinafter, the current compensation device 100 according to various embodiments will be described with reference to FIGS. 17 to 22 together with FIG. 44.

Figure 45:
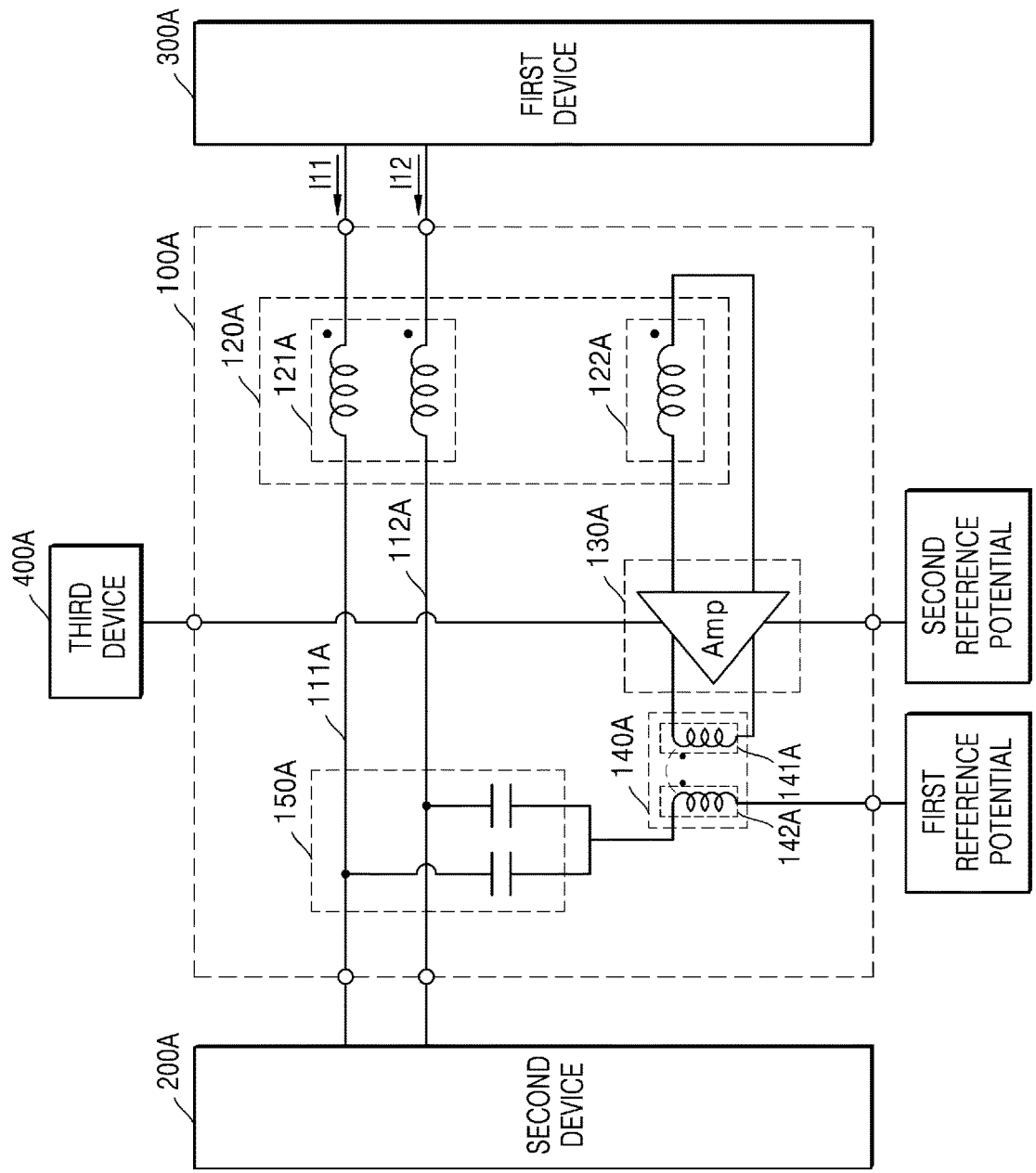
FIG. 45 is a diagram schematically illustrating a configuration of a current compensation device (100A) used in a two-line system according to one embodiment of the present disclosure.

FIG. 45 is a diagram schematically illustrating a configuration of a current compensation device 100A used in a two-line system according to one embodiment of the present disclosure.

The current compensation device 100A according to one embodiment of the present disclosure may actively compensates for first currents I11 and I12 that are input as a common-mode current with respect to each of two high-current paths 111A and 112A connected to a first device 300A.

To this end, the current compensation device 100A according to one embodiment of the present disclosure may include two high-current paths 111A and 112A, a sensing transformer 120A, an amplifier 130A, a compensation transformer 140A, and a compensation capacitor unit 150A.

In one embodiment, the sensor 120 may include the sensing transformer 120A. In this case, the sensing transformer 120A may be a component for sensing the first currents I11 and I12 on the high-current paths 111A and 112A in a state of being isolated from the high-current paths 111A and 112A.

In the sensing transformer 120A, a primary side 121A disposed on the high-current paths 111A and 112A may generate a first induced current, which is directed toward a secondary side 122A, on the basis of a first magnetic flux density induced by the first currents I11 and I12. Here, the secondary side 122A of the sensing transformer 120A may be differentially connected to input terminals of the amplifier 130, which will be described below.

Figure 46:
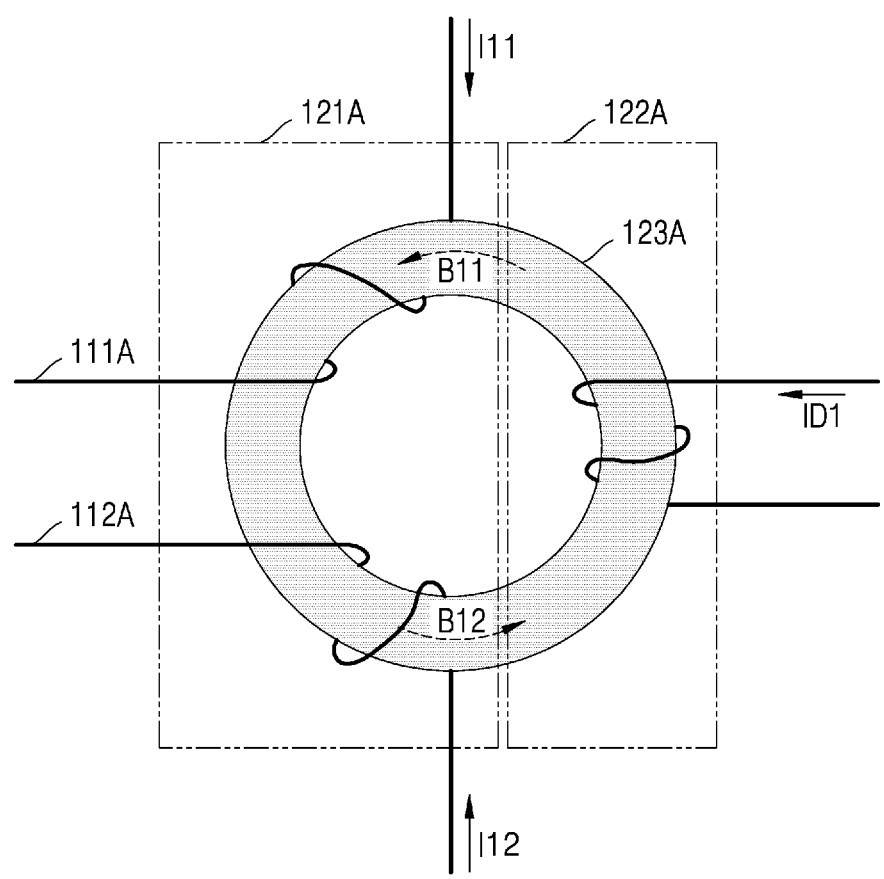
FIG. 46 a view for describing the principle in which a sensing transformer (120A) generates a first induced current (ID1).

FIG. 46 a view for describing the principle in which the sensing transformer 120A generates a first induced current ID1.

For convenience of description, the description is made on the premise that the primary side 121A and the secondary side 122A of the sensing transformer 120A are configured as shown in FIG. 46. In other words, the description is made on the premise that the high-current paths 111A and 112A and windings of the secondary side 122A are wound around a core 123A of the sensing transformer 120A in consideration of directions in which magnetic flux and/or magnetic flux densities are generated.

As the first current I11 is input to the high-current path 111A, a magnetic flux density B11 may be induced in the core 123A. Similarly, as the first current I12 is input to the high-current path 112A, a magnetic flux density B12 may be induced in the core 123A.

The induced magnetic flux densities B11 and B12 may cause the first induced current ID1 to be induced in the windings of the secondary side 122A.

As described above, the sensing transformer 120A may be configured such that the first magnetic flux densities B11 and B12 induced due to the first currents I11 and I12 may be overlapped with each other (or may be reinforced with each other), and thus may generate the first induced current ID1 corresponding to the first currents I11 and I12 at the secondary side 122A isolated from the two or more high-current paths 111A and 112A.

Meanwhile, the number of turns by which the high-current paths 111A and 112A and the winding of the secondary side 122A are wound around the core 123A may be appropriately determined according to the requirements of the system in which the current compensation device 100A is used. For example, both the high-current paths 111A and 112A and the windings of the secondary side 122A may be wound only once around the core 123A. In this case, the sensing transformer 120A may be configured in a form in which the high-current paths 111A and 112A and the windings of the secondary side 122a pass through only a central hole of the core 123A. However, this is merely exemplary, and the scope of the present disclosure is not limited thereto.

Meanwhile, the sensing transformer 120A may be configured such that second magnetic flux densities, which are induced due to the second currents I21 and I22 respectively flowing through the two or more high-current paths 111A and 112A, satisfy a predetermined magnetic flux density condition.

Figure 47:
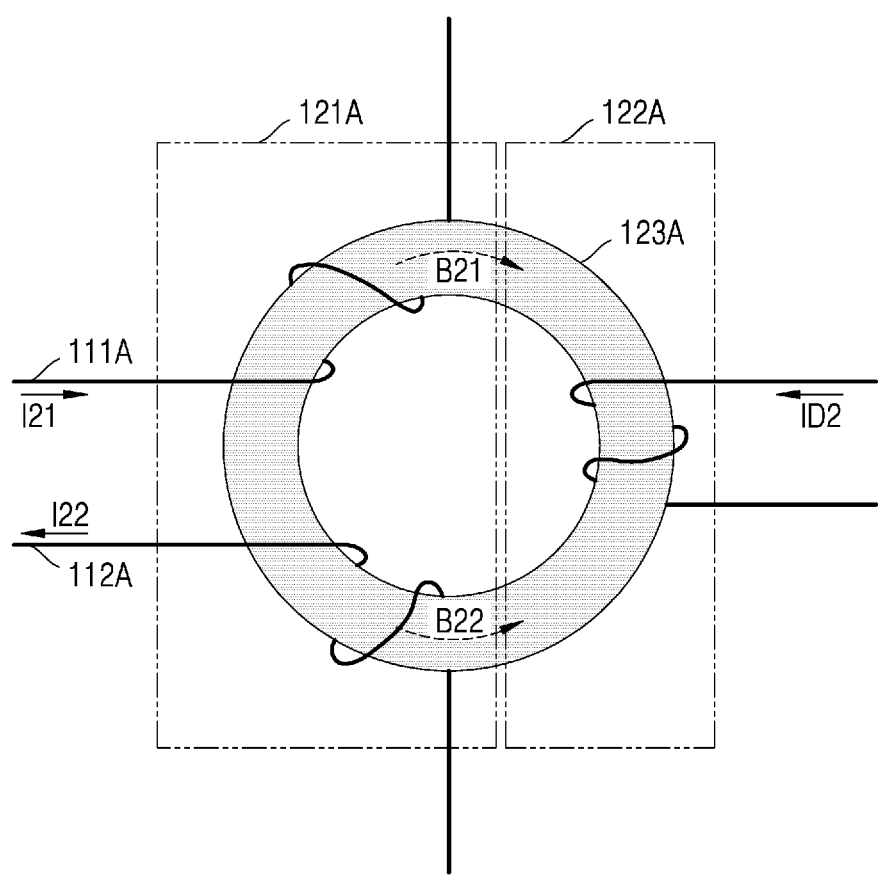
FIG. 47 is a view for describing second magnetic flux densities (B21 and B22) that are induced in the sensing transformer (120A) due to second currents (I21 and I22).

FIG. 47 is a view for describing second magnetic flux densities B21 and B22 that are induced in the sensing transformer 120A due to the second currents I21 and I22.

Similar to FIG. 46, the description is made on the premise that the primary side 121A and the secondary side 122A of the sensing transformer 120A are configured as shown in FIG. 47. In other words, the description is made on the premise that the two or more high-current paths 111A and 112A and the windings of the secondary side 122A are wound around the core 123A of the sensing transformer 120A in consideration of directions in which magnetic flux and/or magnetic flux densities are generated.

As the second current I21 is input to the high-current path 111A, the magnetic flux density B21 may be induced in the core 123A. Similarly, as the second current I22 is input (or output) to the high-current path 112A, the magnetic flux density B22 may be induced in the core 123A.

The sensing transformer 120A may be configured such that the second magnetic flux densities B21 and B22 induced due to the second currents I21 and I22 (respectively flowing through the two or more high-current paths 111A and 112A) satisfy a predetermined magnetic flux density condition. In this case, the predetermined magnetic flux density condition may be a condition in which densities cancel each other, as shown in FIG. 47.

In other words, the sensing transformer 120A may be configured such that a second induced current ID2, which is induced due to the second currents I21 and I22 respectively flowing the two or more high-current paths 111A and 112A, satisfies a predetermined condition for a second induced current. In this case, the predetermined condition for a second induced current may be a condition that a magnitude of the second induced current ID2 is less than a predetermined threshold magnitude.

As described above, the sensing transformer 120A is configured such that the second magnetic flux densities B21 and B22 induced due to the second currents I21 and I22 may cancel each other, so that only the first currents I11 and I12 are sensed.

The sensing transformer 120A may be configured such that magnitudes of the first magnetic flux densities B11 and B12, which are induced due to the first currents I11 and I12 of a first frequency band (for example, the band in a range of 150 KHz to 30 MHz), are greater than magnitudes of the second magnetic flux densities B21 and B22 induced due to the second currents I21 and I22 of a second frequency band (for example, the band in a range of 50 Hz to 60 Hz).

In the present disclosure, when a component "A" is referred to as being configured to do "B," it may mean that design parameters of the component "A" are set to be appropriate for doing "B." For example, a case in which the sensing transformer 120A is configured such that a magnitude of a magnetic flux induced due to a current in a specific frequency band is great may mean that parameters are appropriately set so that the magnitude of the magnetic flux induced due to the current in the specific frequency band is great, wherein the parameters may include a size of the sensing transformer 120A, a diameter of the core, the number of turns, a magnitude of inductance, and a magnitude of mutual-inductance, and the like.

As shown in FIG. 45, the secondary side 122A of the sensing transformer 120A may be differentially connected to the input terminals of the amplifier 130A in order to supply the first induced currents to the amplifier 130A. In addition, depending on the configuration of the amplifier 130A, the secondary side 122A of the sensing transformer 120A may be disposed on the path connecting the input terminal of the amplifier 130A and the second reference potential of the amplifier 130A.

Meanwhile, as described above, the sensor 120 is illustrated as being implemented as the sensing transformer 120A, but the scope of the present disclosure is not limited thereto. Thus, a component for sensing only the first currents I11 and I12, which are input as a common-mode current on the high-current paths 111A and 112A, may be used without limitation to the sensor 120.

The amplifier 130 may amplify the output signal output from the sensor 120 to generate the amplified output signal.

In one embodiment, the amplifier 130 may be implemented as the amplifier 130A that amplifies the first induced current generated by the sensing transformer 120A to generate the amplified current.

The term "amplification" by the amplifier 130, as used herein, may mean that the magnitude and/or phase of an object to be amplified is adjusted. For example, the amplifier 130A may change a phase of the first induced current by 180° and increase a magnitude of the first induced current by K times (where K>=1) to generate the amplified current.

By the amplifying operation of the amplifier 130A as described above, the current compensation device 100A may generate the compensation currents IC1 and IC2 having the same magnitude and an opposite phase compared to the first currents I11 and I12, thereby compensating for the first currents I11 and I12 on the high-current paths 111A and 112A.

The amplifier 130A may generate the amplified current in consideration of a voltage transformation ratio in the sensing transformer 120A and a voltage transformation ratio in the compensator 140, which will be described below.

For example, in a case in which the sensing transformer 120A transforms the first currents I11 and I12 having a magnitude of one to a first induced current having a magnitude of 1/F1, and the compensator 140 is implemented as the compensation transformer 140A that transforms an amplified current having a magnitude of one to a compensation current having a magnitude of 1/F2, the amplifier 130A may generate an amplified current having a magnitude that is F1×F2 times the magnitude of the first induced current. Here, the amplifier 130A may generate the amplified current such that the phase of the amplified current is opposite to the phase of the first induced current.

The amplifier 130A may be implemented by various components. For example, the amplifier 130A may include an OP-AMP. Alternatively, the amplifier 130A may include a plurality of passive elements, such as resistors and capacitors, in addition to the OP-AMP. Further, the amplifier 130A may include BJTs. Alternatively, the amplifier 130A may include a plurality of passive elements in addition to the BJTs. However, the above-described implementation method of the amplifier 130A is merely exemplary, and the scope of the present disclosure is not limited thereto, and the component for the "amplification" described in the present disclosure may be used without being limited to the amplifier 130A of the present disclosure.

As described above, the amplifier 130A may receive power from a third device 400A and amplify the first induced current to generate the amplified current.

The compensator 140 may generate the compensation current on the basis of the output signal amplified by the amplifier 130.

In one embodiment, the compensator 140 may include the compensation transformer 140A. In this case, the compensation transformer 140A may be a component for generating a compensation current, which is directed toward the high-current paths 111A and 112A (or a secondary side 142A to be described below), on the basis of the amplified current in a state of being isolated from the high-current paths 111A and 112A as described above.

In more detail, in the compensation transformer 140A, a primary side 141A differentially connected to output terminals of the amplifier 130A may generate the compensation current, which is directed toward the secondary side 142A, on the basis of a third magnetic flux density induced due to the amplified current generated by the amplifier 130A. In this case, the secondary side 142A may be disposed on a path connecting the compensation capacitor unit 150A to be described below and the first reference potential of the current compensation device.

Meanwhile, the primary side 141A of the compensation transformer 140A, the amplifier 130A, and the secondary side 122A of the sensing transformer 120A may be connected to the second reference potential that may be a reference potential different from those of the remaining components of the current compensation device 100A.

As described above, in the present disclosure, the components generating the compensation current may use a reference potential different from those of the remaining components and may also use a separate power, and thus may operate in an isolated state, thereby improving the reliability of the current compensation device 100A.

In one embodiment, the compensation capacitor unit 150 may be implemented as the compensation capacitor unit 150A that provides a path through which the current generated by the compensation transformer 140A flows to each of the two high-current paths 111A and 112A.

Figure 48:
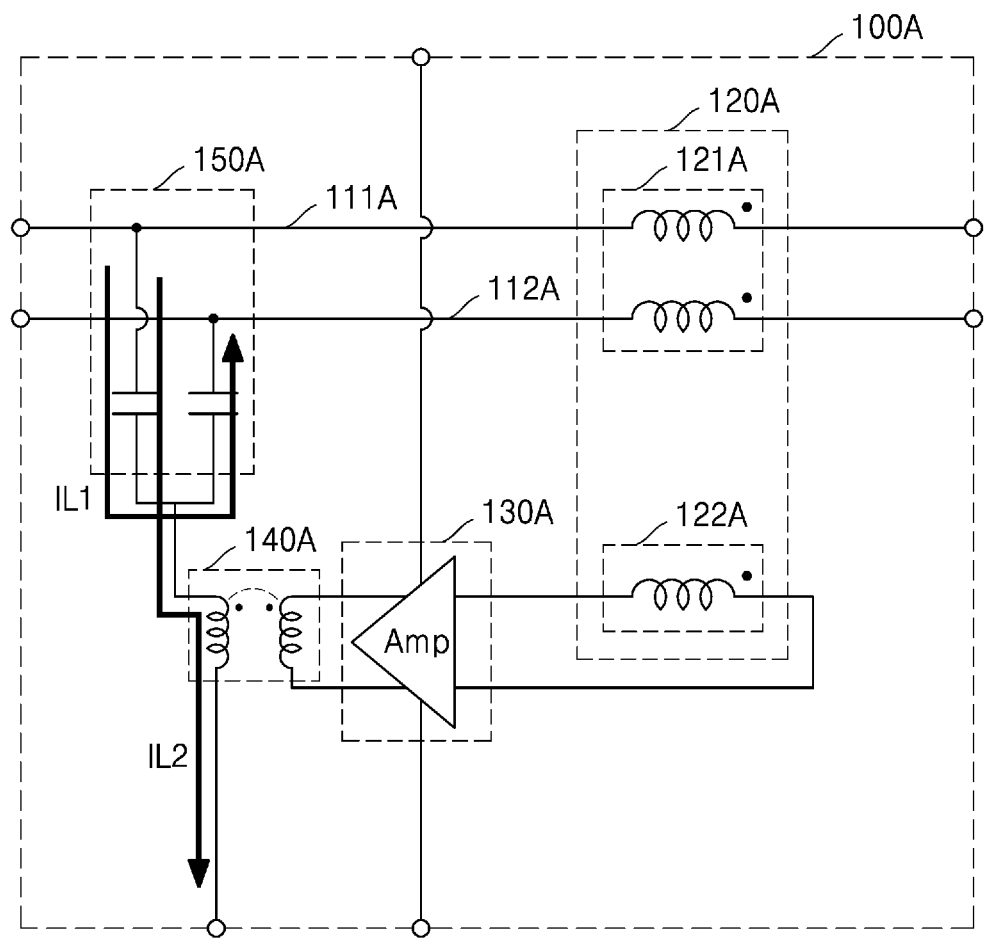
FIG. 48 is a diagram for describing currents (IL1 and IL2) flowing through a capacitor unit (150A).

FIG. 48 is a diagram for describing currents IL1 and IL2 flowing through the compensation capacitor unit 150A.

The compensation capacitor unit 150A may be configured such that the current IL1 flowing between the two high-current paths 111A and 112A through compensation capacitors satisfies a first predetermined current condition. In this case, the first predetermined current condition may be a condition in which a magnitude of the current IL1 is less than a first predetermined threshold magnitude.

Further, the compensation capacitor unit 150A may be configured such that the current IL2 flowing between the first reference potential of the current compensation device 100A and each of the two high-current paths 111A and 112A through the compensation capacitors satisfies a second current condition. In this case, the second predetermined current condition may be a condition in which a magnitude of the current IL2 is less than a second predetermined threshold magnitude.

The compensation current flowing to each of the two high-current paths 111A and 112A along the compensation capacitor unit 150A may cancel the first currents I11 and I12 on the high-current paths 111A and 112A, thereby preventing the first currents I11 and I12 from being transmitted to a second device 200A. Here, the first currents I11 and I12 and the compensation current may be currents having the same magnitude and opposite phases.

As a result, the current compensation device 100A according to one embodiment of the present disclosure may actively compensates for the first currents I11 and I12 that are input as a common-mode current with respect to each of two high-current paths 111A and 112A connected to the first device 300A, and thus may prevent the second device 200A from malfunctioning or being damaged.

Figure 49:
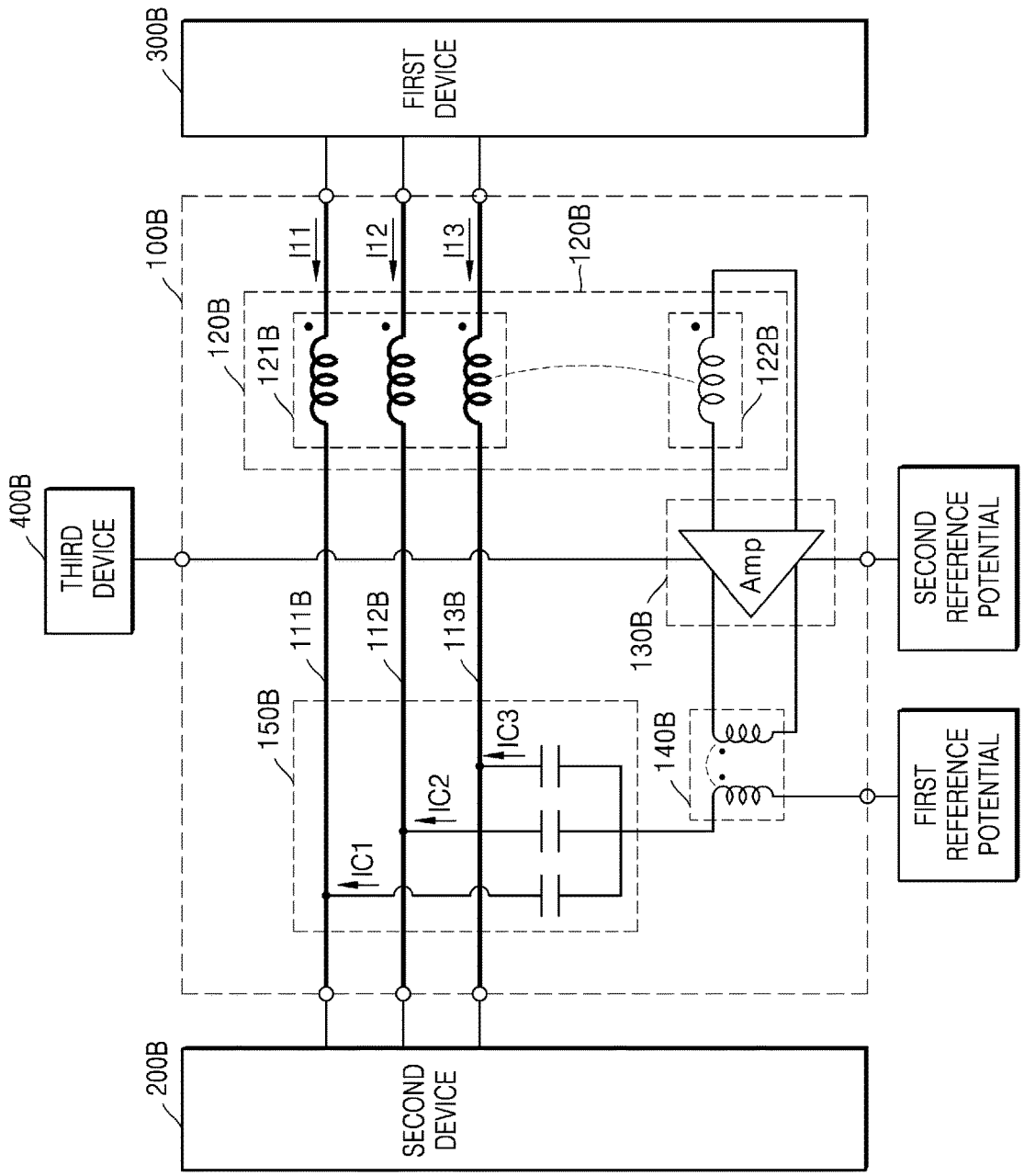
FIG. 49 is a diagram schematically illustrating a configuration of a current compensation device (100B) according to another embodiment of the present disclosure.

FIG. 49 is a diagram schematically illustrating a configuration of a current compensation device 100B according to another embodiment of the present disclosure. Hereinafter, the description of contents overlapping the contents described with reference to FIGS. 16 to 20 will be omitted.

The current compensation device 100B according to another embodiment of the present disclosure may actively compensates for first currents I11, I12, and I13 that are input as a common-mode current with respect to each of high-current paths 111B, 112B, and 113B connected to a first device 300B.

To this end, the current compensation device 100B according to another embodiment of the present disclosure may include three high-current paths 111B, 112B, and 113B, a sensing transformer 120B, an amplifier 130B, a compensation transformer 140B, and a compensation capacitor unit 150B.

When it is described in comparison with the current compensation device 100A according to the embodiment described with reference to FIGS. 17 to 20, the current compensation device 100B according to the embodiment illustrated with reference to FIG. 49 includes three high-current paths 111B, 112B, and 113B, and thus has differences in the sensing transformer 120B and the compensation capacitor unit 150B. Thus, hereinafter, the current compensation device 100B will be described focusing on the above-described differences.

The current compensation device 100B according to another embodiment of the present disclosure may include a first high-current path 111B, a second high-current path 112B, and a third high-current path 113B, which are distinct from each other. According to one embodiment, the first high-current path 111B may be an R-phase power line, the second high-current path 112B may be an S-phase power line, and the third high-current path 113B may be a T-phase power line. The first currents I11, I12, and I13 may be input as a common-mode current with respect to each of the first high-current path 111B, the second high-current path 112B, and the third high-current path 113B.

A primary side 121B of the sensing transformer 120B according to another embodiment of the present disclosure may be disposed in each of the first high-current path 111B, the second high-current path 112B, and the third high-current path 113B to generate a first induced current. Magnetic flux densities generated by the sensing transformer 120B due to the first currents I11, I12, and I13 on the three high-current paths 111B, 112B, and 113B may be reinforced with each other. The process in which the first induced current is generated due to the first currents I11, I12, and I13 is described with reference to FIG. 46, and thus a detailed description thereof will be omitted.

Meanwhile, the compensation capacitor unit 150B according to another embodiment of the present disclosure may provide paths through which compensation currents IC1, IC2, and IC3 generated by the compensation transformer flow to the first high-current path 111B, the second high-current path 112B, and the third high-current path 113B, respectively.

The current compensation device 100B according to the embodiment described above may be used to cancel (or block) the first currents I11, I12, and I13 to each other, which are traveling from a load of a three-phase three-wire power system to a power source.

Figure 50:
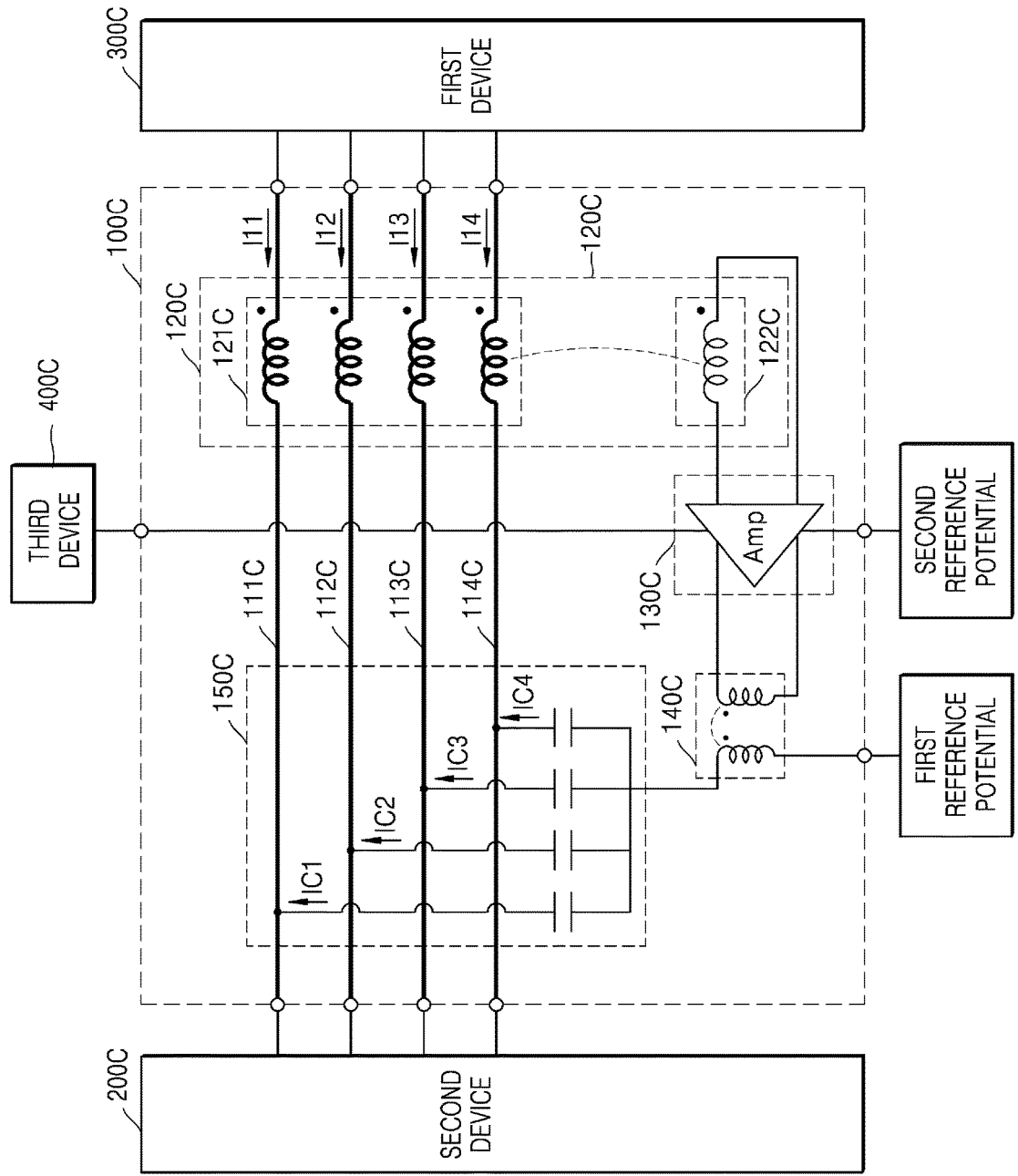
FIG. 50 is a diagram schematically illustrating a configuration of a current compensation device (100C) according to still another embodiment of the present disclosure.

FIG. 50 is a diagram schematically illustrating a configuration of a current compensation device 100C according to still another embodiment of the present disclosure. Hereinafter, the description of contents overlapping the contents described with reference to FIGS. 16 to 21 will be omitted.

The current compensation device 100C according to the embodiment may actively compensates for first currents I11, I12, I13, and I14 that are input as a common-mode current with respect to each of high-current paths 111C, 112C, 113C, and 114C connected to a first device 300C.

To this end, the current compensation device 100C according to the embodiment may include four high-current paths 111C, 112C, 113C, and 114C, a sensing transformer 120C, an amplifier 130C, a compensation transformer 140C, and a compensation capacitor unit 150C.

When it is described in comparison with the current compensation device 100A according to the embodiment described with reference to FIGS. 17 to 20 and the current compensation device 100B according to the embodiment described with reference to FIG. 50, the current compensation device 100C according to the embodiment illustrated with reference to FIG. 50 includes four high-current paths 111C, 112C, 113C, and 114C, and thus has differences in the sensing transformer 120C and the compensation capacitor unit 150C. Thus, hereinafter, the current compensation device 100C will be described focusing on the above-described differences.

First, the current compensation device 100C according to the embodiment may include a first high-current path 111C, a second high-current path 112C, a third high-current path 113C, and a fourth high-current path 114C, which are separated from each other. According to one embodiment, the first high-current path 111C may be an R-phase power line, the second high-current path 112C may be an S-phase power line, the third high-current path 113C may be a T-phase power line, and the fourth high-current path 114C may be an N-phase power line. The first currents I11, I12, I13, and I14 may be input as a common-mode current with respect to each of the first high-current path 111C, the second high-current path 112C, the third high-current path 113C, and the fourth high-current path 114C.

A primary side 121C of the sensing transformer 120C according to the embodiment may be disposed in each of the first high-current path 111C, the second high-current path 112C, the third high-current path 113C, and the fourth high-current path 114C to generate a first induced current. Magnetic flux densities generated by the sensing transformer 120C due to the first currents I11, I12, I13, and I14 on the four high-current paths 111C, 112C, 113C, and 114C may be reinforced with each other. The process in which the first induced current is generated due to the first currents I11, I12, I13, and I14 is described with reference to FIG. 46, and thus a detailed description thereof will be omitted.

Meanwhile, the compensation capacitor unit 150C according to the embodiment may provide paths through which compensation currents IC1, IC2, IC3, and 14 generated by the compensation transformer flow to the first high-current path 111C, the second high-current path 112C, the third high-current path 113C, and the fourth high-current path 114C, respectively.

The current compensation device 100C according to the embodiment described above may be used to cancel (or block) the first currents I11, I12, I13, and I14 to each other, which are traveling from a load of a three-phase four-wire power system to a power source.

Figure 51:
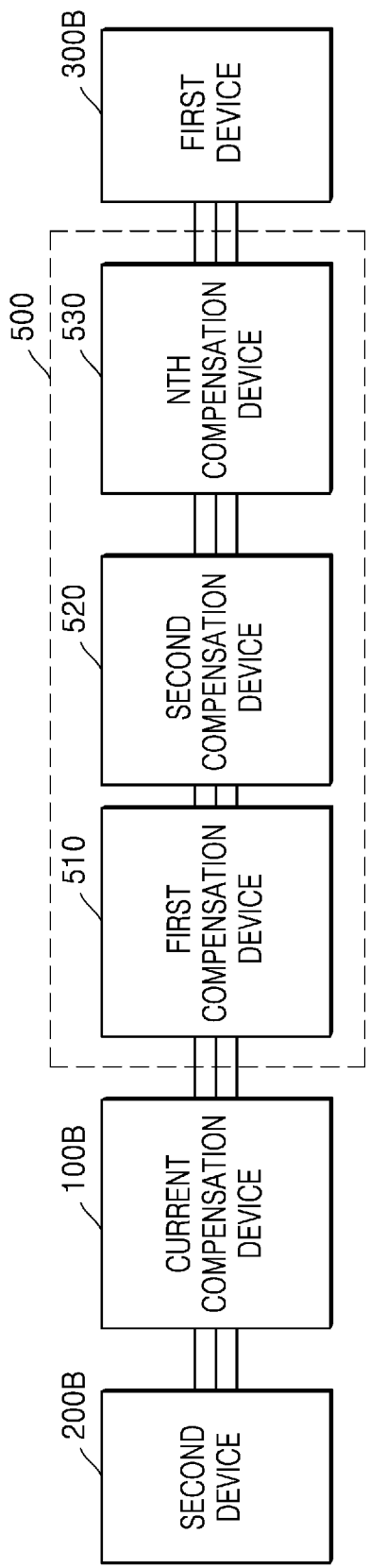
FIG. 51 is a diagram schematically illustrating a configuration of a system in which the current compensation device (100B) according to the embodiment illustrated in FIG. 49 is used.

FIG. 51 is a diagram schematically illustrating a configuration of a system in which the current compensation device 100B according to the embodiment illustrated in FIG. 49 is used.

The current compensation device 100B according to the embodiment may be used with one or more other compensation devices 500 on the high-current path connecting a second device 200B and the first device 300B.

For example, the current compensation device 100B according to the embodiment may be used in conjunction with a first compensation device 510 configured to compensate for a first current input as a common-mode current. In this case, the first compensation device 510 may be implemented as an active element similar to the current compensation device 100B, or may be implemented only as a passive element.

Further, the current compensation device 100B according to the embodiment may be used in conjunction with a second compensation device 520 configured to compensate for a third current input as a differential-mode current. In this case, the second compensation device 520 may also be implemented as an active element, or may be implemented only as a passive element.

Further, the current compensation device 100B according to the embodiment may be used in conjunction with an nth compensation device 530 configured to compensate for a voltage. In this case, the nth compensation device 530 may also be implemented as an active element, or may be implemented only as a passive element.

Meanwhile, the type or quantity and the arrangement order of the compensation devices 500 described with reference to FIG. 51 are merely exemplary, and the scope of the present disclosure is not limited thereto. Accordingly, various quantities and types of compensation devices may be further included in the system depending on the design of the system. In addition, selectively, the embodiment illustrated with reference to FIG. 51 may be equally applicable to all other embodiments of the present specification.

A current compensation device configured to actively compensate for a first current input as a common-mode current with respect to each of at least two or more high-current paths connected to a first device according to one embodiment of the present disclosure may include the at least two or more high-current paths through which a second current supplied from a second device is transmitted to the first device, a sensor configured to sense the first current on the high-current paths and generate an output signal corresponding to the first current, an amplifier configured to amplify the output signal to generate an amplified output signal, a compensator configured to generate a compensation current on the basis of the amplified output signal, and a compensation capacitor unit configured to provide a path through which the compensation current flows to each of the at least two or more high-current paths.

The sensor may include a sensing transformer having a primary side disposed on the high-current paths and a secondary side that is connected to the amplifier and outputs the output signal, and the primary side may generate a first induced current, which is the output signal, directed toward the secondary side on the basis of a first magnetic flux density induced due to the first current.

The sensing transformer may be configured such that a second magnetic flux density induced due to a second current flowing through each of the two or more high-current paths satisfies a predetermined magnetic flux density condition.

The first current may be a current in a first frequency band, the second current may a current in a second frequency band different from the first frequency band, and a magnitude of the first magnetic flux density induced in the sensing transformer on the basis of the current in the first frequency band may be greater than a magnitude of the second magnetic flux density induced in the sensing transformer on the basis of the current in the second frequency band.

The secondary side of the sensing transformer may be disposed on a path connecting an input terminal of the amplifier and a reference potential of the amplifier.

The compensator may include a compensation transformer having a primary side disposed on a path connecting an output terminal of the amplifier and the reference potential of the amplifier and a secondary side disposed on a path connecting the compensation capacitor unit and a reference potential of the current compensation device.

The amplifier may receive power from a third device, which is distinct from the second device, and amplify the output signal to generate an amplified current that is the amplified output signal.

The compensation transformer may generate the compensation current directed toward the secondary side thereof on the basis of a third magnetic flux density induced due to the amplified current, which is the amplified output signal, on the primary side thereof.

The reference potential of the amplifier may be a potential different from the reference potential of the current compensation device.

The compensation capacitor unit may include at least two or more compensation capacitors each connecting each of the at least two or more high-current paths to the reference potential of the current compensation device, and may be configured such that a current flowing between the at least two or more high-current paths through the at least two or more compensation capacitors satisfies a first predetermined current condition, and a current flowing between each of the at least two or more high-current paths and the reference potential of the current compensation device through the at least two or more compensation capacitors satisfies a second current condition.

The at least two or more high-current paths may include a first high-current path, a second high-current path, and a third high-current path which are separated from each other, and the first current may be a common-mode current input to each of the first high-current path, the second high-current path, and the third high-current path. The sensor may includes a sensing transformer, and a primary side of the sensing transformer may be disposed on each of the first high-current path, the second high-current path, and the third high-current path and generate an output signal corresponding to the first current. The compensation capacitor unit may provide paths through which the compensation current flows to each of the first high-current path, the second high-current path, and the third high-current path.

The at least two or more high-current paths may include a first high-current path, a second high-current path, a third high-current path, and a fourth high-current path which are separated from each other, and the first current may be a common-mode current input to each of the first high-current path, the second high-current path, the third high-current path, and the fourth high-current path. The sensor may include a sensing transformer.

A primary side the sensing transformer may be disposed on each of the first high-current path, the second high-current path, the third high-current path, and the fourth high-current path and generate an output signal corresponding to the first current. The compensation capacitor unit may provide paths through which the compensation current flows to each to the first high-current path, the second high-current path, the third high-current path, and the fourth high-current path.

Of course, the scope of the present disclosure is not limited by these effects.

It should be noted that the spirit of the present disclosure is not limited to the embodiments described above, and not only the claims to be described later, but also all ranges equivalent to or equivalently changed from the claims fall within the scope of the spirit of the present disclosure.

What is claimed is:

1. An active current compensation device which actively compensates for a noise occurring in a common mode in each of two or more high-current paths, the active current compensation device comprising:
    a sensing unit configured to generate an output signal corresponding to a common-mode noise current on each of the two or more high-current paths;
    a power management unit configured to receive a first voltage from a power supply for supplying power and convert the first voltage into a second voltage having a specified magnitude;
    an amplification unit driven by the second voltage and configured to amplify the output signal to generate an amplified current; and
    a compensation unit configured to generate a compensation current on the basis of the amplified current and allow the compensation current to flow to the each of two or more high-current paths,
    wherein active elements included in the amplification unit and active elements included in the power management unit are embedded in one integrated circuit (IC) chip.

2. The active current compensation device of claim 1, wherein
    the power management unit includes
    a power conversion unit configured to generate a switching signal for outputting the second voltage having a constant magnitude from the first voltage having any magnitude,
    a feedback unit configured to transmit a voltage signal output from the power conversion unit back to the power conversion unit so that the power management unit outputs the second voltage having a constant magnitude, and
    a filter unit configured to pass only a direct current (DC) component of the voltage signal.

3. The active current compensation device of claim 2, wherein
    the power conversion unit is embedded in the one IC chip, and
    the filter unit and at least a portion of the feedback unit are commercial discrete elements disposed outside the one IC chip.

4. The active current compensation device of claim 3, wherein the power conversion unit includes a regulator configured to generate a DC low voltage for driving an internal circuit of the power conversion unit.

5. The active current compensation device of claim 4, wherein the power conversion unit includes a pulse width modulation circuit configured to generate the switching signal using the DC low voltage provided from the regulator, and a first switch and a second switch that are selectively turned on according to the switching signal.

6. The active current compensation device of claim 1, wherein
    a high current supplied by a second device is transmitted to a first device through the two or more high-current paths, and
    the power supply is a power supply device of the first device or the second device.

* * * * *